US009847850B2

(12) United States Patent
Henry et al.

(10) Patent No.: US 9,847,850 B2

(45) Date of Patent: Dec. 19, 2017

(54) METHOD AND APPARATUS FOR ADJUSTING A MODE OF COMMUNICATION IN A COMMUNICATION NETWORK

(71) Applicant: AT&T INTELLECTUAL PROPERTY I, LP, Atlanta, GA (US)

(72) Inventors: Paul Shala Henry, Holmdel, NJ (US); Robert Bennett, Southold, NY (US); Irwin Gerszberg, Kendall Park, NJ (US); Farhad Barzegar, Branchburg, NJ (US); Donald J Barnickel, Flemington, NJ (US); Thomas M. Willis, III, Tinton Falls, NJ (US)

(73) Assignee: AT&T Intellectual Property I, L.P., Atlanta, GA (US)

( * ) Notice: Subject to any disclaimer, the term of this patent is extended or adjusted under 35 U.S.C. 154(b) by 0 days.

(21) Appl. No.: 15/176,207

(22) Filed: Jun. 8, 2016

(65) Prior Publication Data

US 2016/0365943 A1 Dec. 15, 2016

Related U.S. Application Data

(63) Continuation of application No. 14/513,246, filed on Oct. 14, 2014.

(51) Int. Cl.

*H04B 3/00* (2006.01)
*H04L 25/00* (2006.01)
(Continued)

(52) U.S. Cl.

CPC .......... *H04L 1/0025* (2013.01); *G01R 31/021* (2013.01); *G01R 31/08* (2013.01);
(Continued)

(58) Field of Classification Search

CPC .......... H04L 1/0025; H04B 3/52; H04B 3/54; H04B 2203/5425; G01R 31/021; G01R 31/08; H02J 13/002; H04W 72/0453
(Continued)

(56) References Cited

U.S. PATENT DOCUMENTS

| | | | |
|---|---|---|---|
| 395,814 | A | 1/1889 | Henry et al. |
| 529,290 | A | 11/1894 | Harry et al. |

(Continued)

FOREIGN PATENT DOCUMENTS

| | | |
|---|---|---|
| AU | 565039 B2 | 9/1987 |
| AU | 582630 B2 | 4/1989 |

(Continued)

OTHER PUBLICATIONS

International Search Report and Written Opinion in PCT/US2016/028417, dated Jul. 5, 2016, 13 pages.

(Continued)

*Primary Examiner* — Phuong Phu

(74) *Attorney, Agent, or Firm* — Guntin & Gust, PLC; Robert Gingher

(57) ABSTRACT

Aspects of the subject disclosure may include, for example, a waveguide system for detecting a condition that adversely affects a propagation of electromagnetic waves generated by the waveguide system on a surface of the wire, and adjusting characteristics of the electromagnetic waves generated by the waveguide system to reduce adverse effects caused by the condition. Other embodiments are disclosed.

21 Claims, 26 Drawing Sheets

1414
1420
1418
1412
Network Management System 1601
Communications Interface 1408
Waveguide 1406
Central Office 1411
Power Line 1410
Sensors 1404
a. Temperature sensor
b. Disturbance detection sensor
c. Loss of energy sensor
d. Noise sensor
e. Vibration sensor
f. Weather sensors
g. Image sensor
Power Mgmt Sys 1405
Waveguide System 1402

(51) Int. Cl.
*H04L 1/00* (2006.01)
*H04B 3/52* (2006.01)
*G01R 31/02* (2006.01)
*G01R 31/08* (2006.01)
*H02J 13/00* (2006.01)
*H04B 3/54* (2006.01)
*H04W 72/04* (2009.01)

(52) U.S. Cl.
CPC .............. *H02J 13/002* (2013.01); *H04B 3/52* (2013.01); *H04B 3/54* (2013.01); *H04W 72/0453* (2013.01); *H04B 2203/5425* (2013.01)

(58) Field of Classification Search
USPC ........................................ 375/257, 296, 346
See application file for complete search history.

(56) References Cited

U.S. PATENT DOCUMENTS 1,721,785 A 7/1929 Meyer
1,798,613 A 3/1931 Manson et al.
1,860,123 A 5/1932 Yagi
2,058,611 A 10/1936 Merkle et al.
2,106,770 A 2/1938 Southworth et al.
2,129,711 A 9/1938 Southworth
2,129,714 A 9/1938 Southworth et al.
2,147,717 A 2/1939 Schelkunoff
2,187,908 A 1/1940 McCreary
2,199,083 A 4/1940 Schelkunoff
2,232,179 A 2/1941 King
2,283,935 A 5/1942 King
2,398,095 A 4/1946 Katzin
2,402,622 A 6/1946 Hansen
2,405,242 A 8/1946 Southworth et al.
2,407,068 A 9/1946 Fiske et al.
2,407,069 A 9/1946 Fiske
2,410,113 A 10/1946 Edwin, Jr.
2,411,338 A 11/1946 Roberts
2,415,089 A 2/1947 Feldman et al.
2,415,807 A 2/1947 Barrow et al.
2,419,205 A 4/1947 Feldman et al.
2,420,007 A 5/1947 Olden
2,422,058 A 6/1947 Whinnery
2,432,134 A 12/1947 Bagnall
2,461,005 A 2/1949 Southworth
2,471,021 A 5/1949 Bradley
2,488,400 A 11/1949 Harder
2,513,205 A 6/1950 Roberts et al.
2,514,679 A 7/1950 Southworth
2,519,603 A 8/1950 Reber
2,540,839 A 2/1951 Southworth
2,541,843 A 2/1951 Tiley et al.
2,542,980 A 2/1951 Barrow
2,557,110 A 6/1951 Jaynes
2,562,281 A 7/1951 Mumford
2,596,190 A 5/1952 Wiley
2,599,864 A 6/1952 Robertson-Shersby-Ha et al.
2,659,817 A 11/1953 Cutler et al.
2,667,578 A 1/1954 Carlson et al.
2,677,055 A 4/1954 Allen
2,685,068 A 7/1954 Goubau
2,688,732 A 9/1954 Kock
2,691,766 A 10/1954 Clapp
2,706,279 A 4/1955 Aron
2,711,514 A 6/1955 Rines
2,723,378 A 11/1955 Clavier et al.
2,727,232 A 12/1955 Pryga
2,735,092 A 2/1956 Brown
2,737,632 A 3/1956 Grieg et al.
2,740,826 A 4/1956 Bondon
2,745,101 A 5/1956 Marie
2,748,350 A 5/1956 Miller et al.
2,749,545 A 6/1956 Kostriza
2,754,513 A 7/1956 Goubau
2,761,137 A 8/1956 Atta et al.
2,769,147 A 10/1956 Black et al.
2,769,148 A 10/1956 Clogston et al.
2,770,783 A 11/1956 Thomas et al.
2,794,959 A 6/1957 Fox
2,805,415 A 9/1957 Berkowitzbernard
2,806,177 A 9/1957 Haeff et al.
2,806,972 A 9/1957 Sensiper
2,810,111 A 10/1957 Cohn
2,819,451 A 1/1958 Sims et al.
2,820,083 A 1/1958 Hendrix
2,825,060 A 2/1958 Ruze et al.
2,835,871 A 5/1958 Raabe
2,851,686 A 9/1958 Hagaman et al.
2,867,776 A 1/1959 Wilkinson, Jr.
2,883,135 A 4/1959 Smalley et al.
2,883,136 A 4/1959 Smalley et al.
2,900,558 A 8/1959 Watkins et al.
2,910,261 A 10/1959 Ward et al.
2,912,695 A 11/1959 Cutler
2,914,741 A 11/1959 Unger
2,915,270 A 12/1959 Gladsden et al.
2,921,277 A 1/1960 Goubau
2,925,458 A 2/1960 Lester et al.
2,933,701 A 4/1960 Lanctot et al.
2,946,970 A 7/1960 Hafner et al.
2,949,589 A 8/1960 Hafner
2,960,670 A 11/1960 Marcatili et al.
2,970,800 A 2/1961 Smalley et al.
2,972,148 A 2/1961 Rupp et al.
2,974,297 A 3/1961 Ros
2,981,949 A 4/1961 Elliott et al.
2,990,151 A 6/1961 Phillips et al.
2,993,205 A 7/1961 Cooper et al.
3,016,520 A 1/1962 Adam et al.
3,025,478 A 3/1962 Marcatili et al.
3,028,565 A 4/1962 Walker et al.
3,040,278 A 6/1962 Griemsmann et al.
3,045,238 A 7/1962 Cheston et al.
3,046,550 A 7/1962 Schlaud et al.
3,047,822 A 7/1962 Lakatos et al.
3,065,945 A 11/1962 Newsome et al.
3,072,870 A 1/1963 Walker
3,077,569 A 2/1963 Ikrath et al.
3,096,462 A 7/1963 Joseph et al.
3,101,472 A 8/1963 Goubau
3,109,175 A 10/1963 Lloyd
3,129,356 A 4/1964 Phillips
3,134,951 A 5/1964 Huber et al.
3,146,297 A 8/1964 Hahne
3,146,453 A 8/1964 Hagaman
3,201,724 A 8/1965 Hafner
3,205,462 A 9/1965 Meinke
3,218,384 A 11/1965 Shaw
3,219,954 A 11/1965 Rutelli
3,234,559 A 2/1966 Bartholoma et al.
3,255,454 A 6/1966 Walter et al.
3,296,364 A 1/1967 Jefferson et al.
3,296,685 A 1/1967 Menahem et al.
3,310,808 A 3/1967 Friis et al.
3,316,344 A 4/1967 Toms et al.
3,316,345 A 4/1967 Toms et al.
3,318,561 A 5/1967 Robertson, Jr. et al.
3,321,763 A 5/1967 Ikrath et al.
3,329,958 A 7/1967 Anderson et al.
3,351,947 A 11/1967 Hart et al.
3,355,738 A 11/1967 Algeo et al.
3,369,788 A 2/1968 Eisele
3,389,394 A 6/1968 Lewis et al.
3,392,388 A 7/1968 Tsuneo et al.
3,392,395 A 7/1968 Hannan
3,411,112 A 11/1968 Honig et al.
3,413,637 A 11/1968 Goebels, Jr. et al.
3,413,642 A 11/1968 Cook
3,414,903 A 12/1968 Bartlett et al.
3,419,827 A 12/1968 Webb et al.
3,420,596 A 1/1969 Osterberg
3,427,573 A 2/1969 White et al.
3,448,455 A 6/1969 Alfandari et al.

(56) References Cited

U.S. PATENT DOCUMENTS 3,453,617 A 7/1969 Brickey et al.
3,459,873 A 8/1969 Harris et al.
3,465,346 A 9/1969 Patterson et al.
3,474,995 A 10/1969 Amidon et al.
3,482,251 A 12/1969 Bowes
3,487,158 A 12/1969 Killian
3,495,262 A 2/1970 Robert et al.
3,500,422 A 3/1970 Grady et al.
3,509,463 A 4/1970 Woodward et al.
3,522,560 A 8/1970 Hayany
3,524,192 A 8/1970 Sakiotis et al.
3,529,205 A 9/1970 Miller
3,530,481 A 9/1970 Tanaka et al.
3,531,803 A 9/1970 Hudspeth et al.
3,536,800 A 10/1970 Hubbard
3,555,553 A 1/1971 Boyns
3,557,341 A 1/1971 Sochilin et al.
3,566,317 A 2/1971 Theodore
3,568,204 A 3/1971 Blaisdell
3,569,979 A 3/1971 Munk et al.
3,573,838 A 4/1971 Ajioka
3,588,754 A 6/1971 Theodore
3,588,755 A 6/1971 Kunio et al.
3,589,121 A 6/1971 Mulvey
3,594,494 A 7/1971 Ross et al.
3,599,219 A 8/1971 Hansen et al.
3,603,904 A 9/1971 Hafner
3,603,951 A 9/1971 Bracken et al.
3,609,247 A 9/1971 Halstead
3,623,114 A 11/1971 Seaton
3,624,655 A 11/1971 Yamada et al.
3,638,224 A 1/1972 Bailey et al.
3,653,622 A 4/1972 Farmer
3,666,902 A 5/1972 Owen et al.
3,668,459 A 6/1972 Symons et al.
3,668,574 A 6/1972 Barlow
3,672,202 A 6/1972 Barber et al.
3,683,299 A 8/1972 Vzyatyshev et al.
3,686,596 A 8/1972 Albee
3,693,922 A 9/1972 Gueguen
3,699,574 A 10/1972 Plunk et al.
3,700,442 A 10/1972 Li et al.
3,703,690 A 11/1972 Ravenscroft et al.
3,704,001 A 11/1972 Sloop
3,725,937 A 4/1973 Schreiber
3,753,086 A 8/1973 Shoemaker et al.
3,760,127 A 9/1973 Grossi et al.
3,765,021 A 10/1973 Chiron et al.
3,772,528 A 11/1973 Anderson et al.
3,775,769 A 11/1973 Heeren et al.
3,787,872 A 1/1974 Kauffman
3,796,970 A 3/1974 Snell
3,806,931 A 4/1974 Wright
3,833,909 A 9/1974 Schaufelberger
3,835,407 A 9/1974 Yariv et al.
3,845,426 A 10/1974 Barlow
3,858,214 A 12/1974 Jones
3,877,032 A 4/1975 Rosa
3,888,446 A 6/1975 O'Brien et al.
3,896,380 A 7/1975 Martin
3,906,508 A 9/1975 Foldes
3,911,415 A 10/1975 Whyte
3,921,949 A 11/1975 Coon
3,925,763 A 12/1975 Wadhwani et al.
3,935,577 A 1/1976 Hansen et al.
3,936,836 A 2/1976 Wheeler et al.
3,936,838 A 2/1976 Foldes et al.
3,952,984 A 4/1976 Dimitry et al.
3,956,751 A 5/1976 Herman
3,959,794 A 5/1976 Chrepta et al.
3,973,087 A 8/1976 Fong et al.
3,973,240 A 8/1976 Fong et al.
3,976,358 A 8/1976 Thompson et al.
3,983,560 A 9/1976 MacDougall et al.
4,010,799 A 3/1977 Kern et al.
4,012,743 A 3/1977 Maciejewski et al.
4,020,431 A 4/1977 Saunders et al.
4,026,632 A 5/1977 Hill et al.
4,030,048 A 6/1977 Foldes et al.
4,030,953 A 6/1977 Rutschow et al.
4,031,536 A 6/1977 Alford et al.
4,035,054 A 7/1977 Lattanzi et al.
4,047,180 A 9/1977 Kuo et al.
4,079,361 A 3/1978 Woode et al.
4,080,600 A 3/1978 Toman et al.
4,099,184 A 7/1978 Rapshys et al.
4,114,121 A 9/1978 Barlow et al.
4,115,782 A 9/1978 Han et al.
4,123,759 A 10/1978 Hines et al.
4,125,768 A 11/1978 Jackson et al.
4,129,841 A 12/1978 Hildebrand et al.
4,129,872 A 12/1978 Toman et al.
4,141,015 A 2/1979 Wong et al.
4,149,170 A 4/1979 Campbell et al.
4,155,108 A 5/1979 Tuttle et al.
4,156,241 A 5/1979 Mobley et al.
4,166,669 A 9/1979 Leonberger et al.
4,175,257 A 11/1979 Smith et al.
4,188,595 A 2/1980 Cronson et al.
4,190,137 A 2/1980 Shimada et al.
4,191,953 A 3/1980 Woode et al.
4,195,302 A 3/1980 Leupelt et al.
4,210,357 A 7/1980 Adachi et al.
4,216,449 A 8/1980 Kach
4,220,957 A 9/1980 Britt et al.
4,231,042 A 10/1980 Turrin et al.
4,234,753 A 11/1980 Clutter
4,238,974 A 12/1980 Fawcett et al.
4,246,584 A 1/1981 Noerpel et al.
4,247,858 A 1/1981 Eichweber et al.
4,250,489 A 2/1981 Dudash et al.
4,268,804 A 5/1981 Spinner et al.
4,274,097 A 6/1981 Krall et al.
4,274,112 A 6/1981 Leysieffer et al.
4,278,955 A 7/1981 Lunden et al.
4,293,833 A 10/1981 Popa et al.
4,298,877 A 11/1981 Sletten et al.
4,300,242 A 11/1981 Nava et al.
4,307,938 A 12/1981 Dyott et al.
4,316,646 A 2/1982 Siebens et al.
4,319,074 A 3/1982 Yaste et al.
4,329,690 A 5/1982 Parker et al.
4,333,082 A 6/1982 Susman et al.
4,335,613 A 6/1982 Luukkala et al.
4,336,719 A 6/1982 Lynnworth
4,345,256 A 8/1982 Rainwater et al.
4,366,565 A 12/1982 Herskowitz
4,367,446 A 1/1983 Hall et al.
4,378,143 A 3/1983 Winzer et al.
4,384,289 A 5/1983 Fernandes et al.
4,398,058 A 8/1983 Gerth et al.
4,398,121 A 8/1983 Chodorow et al.
4,413,263 A 11/1983 Amitay et al.
4,447,811 A 5/1984 Hamid et al.
4,458,250 A 7/1984 Bodnar et al.
4,463,329 A 7/1984 Suzuki et al.
4,468,672 A 8/1984 Dragone et al.
4,475,209 A 10/1984 Udren
4,477,814 A 10/1984 Brumbaugh et al.
4,482,899 A 11/1984 Dragone et al.
4,488,156 A 12/1984 DuFort et al.
4,491,386 A 1/1985 Negishi et al.
4,495,498 A 1/1985 Petrelis et al.
4,516,130 A 5/1985 Dragone
4,525,432 A 6/1985 Saito et al.
4,525,693 A 6/1985 Suzuki et al.
4,533,875 A 8/1985 Lau et al.
4,541,303 A 9/1985 Kuzunishi et al.
4,550,271 A 10/1985 Lau et al.
4,553,112 A 11/1985 Saad et al.
4,556,271 A 12/1985 Hubbard
4,558,325 A 12/1985 Stroem et al.
4,565,348 A 1/1986 Larsen
4,567,401 A 1/1986 Barnett et al.

(56) References Cited

U.S. PATENT DOCUMENTS 4,568,943 A 2/1986 Bowman
4,573,215 A 2/1986 Oates et al.
4,589,424 A 5/1986 Vaguine et al.
4,598,262 A 7/1986 Chen et al.
4,599,598 A 7/1986 Komoda et al.
4,604,624 A 8/1986 Amitay et al.
4,604,627 A 8/1986 Saad et al.
4,605,914 A 8/1986 Harman et al.
4,618,867 A 10/1986 Gans et al.
4,634,858 A 1/1987 Gerdt et al.
4,636,753 A 1/1987 Geller et al.
4,638,322 A 1/1987 Lamberty et al.
4,641,916 A 2/1987 Oestreich et al.
4,642,651 A 2/1987 Kuhn et al.
4,644,365 A 2/1987 Horning et al.
4,647,329 A 3/1987 Oono et al.
4,660,050 A 4/1987 Phillips et al.
4,665,660 A 5/1987 Krall et al.
4,672,384 A 6/1987 Roy et al.
4,673,943 A 6/1987 Hannan
4,680,558 A 7/1987 Ghosh et al.
4,694,599 A 9/1987 Hart et al.
4,704,611 A 11/1987 Edwards et al.
4,715,695 A 12/1987 Nishimura et al.
4,717,974 A 1/1988 Baumeister et al.
4,730,172 A 3/1988 Bengeult
4,730,888 A 3/1988 Darcie et al.
4,731,810 A 3/1988 Watkins
4,735,097 A 4/1988 Lynnworth et al.
4,743,915 A 5/1988 Rammos et al.
4,743,916 A 5/1988 Bengeult
4,745,377 A 5/1988 Stern et al.
4,746,241 A 5/1988 Burbank, III et al.
4,749,244 A 6/1988 Luh
4,755,830 A 7/1988 Plunk et al.
4,757,324 A 7/1988 Dhanjal et al.
4,758,962 A 7/1988 Fernandes
4,764,738 A 8/1988 Fried et al.
4,772,891 A 9/1988 Svy
4,777,457 A 10/1988 Ghosh et al.
4,785,304 A 11/1988 Stern et al.
4,786,911 A 11/1988 Svy et al.
4,786,913 A 11/1988 Barendregt et al.
4,788,553 A 11/1988 Phillips et al.
4,792,771 A 12/1988 Siu et al.
4,792,812 A 12/1988 Rinehart et al.
4,566,012 A 1/1989 Choung et al.
4,799,031 A 1/1989 Lang et al.
4,800,350 A 1/1989 Bridges et al.
4,801,937 A 1/1989 Fernandes
4,808,950 A 2/1989 Apostolos et al.
4,818,963 A 4/1989 Green et al.
4,818,990 A 4/1989 Fernandes
4,825,221 A 4/1989 Suzuki et al.
4,829,310 A 5/1989 Losee et al.
4,829,314 A 5/1989 Barbier et al.
4,831,346 A 5/1989 Brooker et al.
4,832,148 A 5/1989 Becker et al.
4,835,517 A 5/1989 Van Der et al.
4,839,659 A 6/1989 Stern et al.
4,845,508 A 7/1989 Krall et al.
4,847,610 A 7/1989 Ozawa et al.
4,849,611 A 7/1989 Whitney et al.
4,851,788 A 7/1989 Ives et al.
4,855,749 A 8/1989 DeFonzo et al.
4,866,454 A 9/1989 Droessler et al.
4,873,534 A 10/1989 Wohlleben et al.
4,875,026 A 10/1989 Walter et al.
4,879,544 A 11/1989 Maki et al.
4,881,028 A 11/1989 Bright et al.
4,886,980 A 12/1989 Fernandes et al.
4,897,663 A 1/1990 Kusano et al.
4,904,996 A 2/1990 Fernandes
4,915,468 A 4/1990 Kim et al.
4,916,460 A 4/1990 Powell et al.
4,922,180 A 5/1990 Saffer et al.
4,929,962 A 5/1990 Begout et al.
4,931,808 A 6/1990 Munson et al.
4,932,620 A 6/1990 Foy
4,946,202 A 8/1990 Perricone et al.
4,965,856 A 10/1990 Swanic
4,977,593 A 12/1990 Ballance
4,977,618 A 12/1990 Allen
4,989,011 A 1/1991 Rosen et al.
4,998,095 A 3/1991 Shields
5,003,318 A 3/1991 Hall et al.
5,006,846 A 4/1991 Granville et al.
5,006,859 A 4/1991 Wong et al.
5,015,914 A 5/1991 Ives et al.
5,017,936 A 5/1991 Massey et al.
5,017,937 A 5/1991 Newham et al.
5,018,180 A 5/1991 Shoulders
5,019,832 A 5/1991 Ekdahl et al.
5,036,335 A 7/1991 Jairam et al.
H956 H 8/1991 Reindel
5,042,903 A 8/1991 Jakubowski et al.
5,043,538 A 8/1991 Hughey et al.
5,043,629 A 8/1991 Doane et al.
5,044,722 A 9/1991 Voser et al.
5,045,820 A 9/1991 Oehlerking et al.
5,057,106 A 10/1991 Kasevich et al.
5,065,760 A 11/1991 Krause et al.
5,065,969 A 11/1991 McLean et al.
5,072,228 A 12/1991 Kuwahara et al.
5,082,349 A 1/1992 Cordova-Plaza et al.
5,086,467 A 2/1992 Malek
5,107,231 A 4/1992 Knox et al.
5,109,232 A 4/1992 Monte et al.
5,113,197 A 5/1992 Luh et al.
5,117,237 A 5/1992 Legg
5,121,129 A 6/1992 Lee et al.
5,126,750 A 6/1992 Wang et al.
5,132,968 A 7/1992 Cephus
5,134,251 A 7/1992 Martin et al.
5,134,423 A 7/1992 Haupt et al.
5,134,965 A 8/1992 Tokuda et al.
5,136,671 A 8/1992 Dragone et al.
5,142,767 A 9/1992 Adams et al.
5,148,509 A 9/1992 Kannabiran et al.
5,152,861 A 10/1992 Hann
5,153,676 A 10/1992 Bergh et al.
5,166,698 A 11/1992 Ashbaugh et al.
5,174,164 A 12/1992 Wilheim et al.
5,175,560 A 12/1992 Lucas et al.
5,182,427 A 1/1993 McGaffigan et al.
5,187,409 A 2/1993 Ito et al.
5,193,774 A 3/1993 Rogers et al.
5,198,823 A 3/1993 Litchford et al.
5,212,755 A 5/1993 Holmberg et al.
5,214,394 A 5/1993 Wong et al.
5,214,438 A 5/1993 Smith et al.
5,216,616 A 6/1993 Masters
5,218,657 A 6/1993 Tokudome et al.
5,235,662 A 8/1993 Prince et al.
5,239,537 A 8/1993 Sakauchi
5,241,321 A 8/1993 Tsao et al.
5,241,701 A 8/1993 Andoh et al.
5,248,876 A 9/1993 Kerstens et al.
5,254,809 A 10/1993 Martin
5,265,266 A 11/1993 Trinh
5,266,961 A 11/1993 Milroy et al.
5,276,455 A 1/1994 Fitzsimmons et al.
5,278,687 A 1/1994 Jannson et al.
5,280,297 A 1/1994 Profera et al.
5,291,211 A 3/1994 Tropper et al.
5,298,911 A 3/1994 Li et al.
5,299,773 A 4/1994 Bertrand et al.
5,304,999 A 4/1994 Roberts et al.
5,311,596 A 5/1994 Scott et al.
5,327,149 A 7/1994 Kuffer et al.
5,329,285 A 7/1994 McCandless et al.
5,341,088 A 8/1994 David
5,345,522 A 9/1994 Vali et al.
5,347,287 A 9/1994 Speciale et al.

(56) References Cited

U.S. PATENT DOCUMENTS 5,352,984 A 10/1994 Piesinger et al.
5,353,036 A 10/1994 Baldry
5,359,338 A 10/1994 Hatcher et al.
5,371,623 A 12/1994 Eastmond et al.
5,379,455 A 1/1995 Koschek et al.
5,380,224 A 1/1995 Dicicco
5,381,160 A 1/1995 Landmeier
5,389,442 A 2/1995 Kathiresan et al.
5,400,040 A 3/1995 Lane et al.
5,402,140 A 3/1995 Rodeffer et al.
5,402,151 A 3/1995 Duwaer
5,404,146 A 4/1995 Rutledge et al.
5,410,318 A 4/1995 Wong et al.
5,412,654 A 5/1995 Perkins
5,428,364 A 6/1995 Lee et al.
5,428,818 A 6/1995 Meidan et al.
5,434,575 A 7/1995 Jelinek et al.
5,440,660 A 8/1995 Dombrowski et al.
5,451,969 A 9/1995 Toth et al.
5,457,469 A 10/1995 Diamond et al.
5,473,336 A 12/1995 Harman et al.
5,479,176 A 12/1995 Zavrel et al.
5,481,268 A 1/1996 Higgins
5,482,525 A 1/1996 Kajioka et al.
5,486,839 A 1/1996 Rodeffer et al.
5,488,380 A 1/1996 Harvey et al.
5,495,546 A 2/1996 Bottoms et al.
5,499,308 A 3/1996 Arai et al.
5,499,311 A 3/1996 DeCusatis et al.
5,502,392 A 3/1996 Arjavalingam et al.
5,512,906 A 4/1996 Speciale et al.
5,513,176 A 4/1996 Dean et al.
5,514,965 A 5/1996 Westwood et al.
5,515,059 A 5/1996 How et al.
5,519,408 A 5/1996 Schnetzer et al.
5,528,208 A 6/1996 Kobayashi et al.
5,539,421 A 7/1996 Hong et al.
5,543,000 A 8/1996 Lique
5,557,283 A 9/1996 Sheen
5,559,359 A 9/1996 Reyes
5,566,022 A 10/1996 Segev
5,566,196 A 10/1996 Scifres
5,576,721 A 11/1996 Hwang et al.
5,586,054 A 12/1996 Jensen et al.
5,592,183 A 1/1997 Henf
5,600,630 A 2/1997 Takahashi et al.
5,603,089 A 2/1997 Searle et al.
5,619,015 A 4/1997 Kirma
5,621,421 A 4/1997 Kolz et al.
5,627,879 A 5/1997 Russell et al.
5,628,050 A 5/1997 McGraw et al.
5,630,223 A 5/1997 Bahu et al.
5,637,521 A 6/1997 Rhodes et al.
5,640,168 A 6/1997 Heger et al.
5,646,936 A 7/1997 Shah et al.
5,650,788 A 7/1997 Jha
5,652,554 A 7/1997 Krieg et al.
5,663,693 A 9/1997 Doughty et al.
5,671,304 A 9/1997 Duguay
5,677,699 A 10/1997 Strickland
5,677,909 A 10/1997 Heide
5,680,139 A 10/1997 Huguenin et al.
5,682,256 A 10/1997 Motley et al.
5,684,495 A 11/1997 Dyott et al.
5,686,930 A 11/1997 Brydon
5,724,168 A 3/1998 Oschmann et al.
5,726,980 A 3/1998 Rickard et al.
5,748,153 A 5/1998 McKinzie, III et al.
5,750,941 A 5/1998 Ishikawa et al.
5,757,323 A 5/1998 Spencer et al.
5,767,807 A 6/1998 Pritchett et al.
5,768,689 A 6/1998 Borg
5,769,879 A 6/1998 Levay et al.
5,784,033 A 7/1998 Boldissar, Jr. et al.
5,784,034 A 7/1998 Konishi et al.
5,784,683 A 7/1998 Sistanizadeh et al.
5,787,673 A 8/1998 Noble
5,793,334 A 8/1998 Harrison et al.
5,800,494 A 9/1998 Campbell et al.
5,805,983 A 9/1998 Naidu et al.
5,809,395 A 9/1998 Hamilton-Piercy et al.
5,812,524 A 9/1998 Moran et al.
5,818,390 A 10/1998 Hill
5,818,396 A 10/1998 Harrison et al.
5,818,512 A 10/1998 Fuller
5,845,391 A 12/1998 Bellus et al.
5,848,054 A 12/1998 Mosebrook et al.
5,850,199 A 12/1998 Wan et al.
5,854,608 A 12/1998 Leisten
5,859,618 A 1/1999 Miller, II et al.
5,861,843 A 1/1999 Sorace et al.
5,867,763 A 2/1999 Dean et al.
5,870,060 A 2/1999 Chen et al.
5,872,544 A 2/1999 Schay et al.
5,872,547 A 2/1999 Martek
5,872,812 A 2/1999 Saito et al.
5,873,324 A 2/1999 Kaddas et al.
5,886,666 A 3/1999 Schellenberg et al.
5,889,449 A 3/1999 Fiedziuszko et al.
5,890,055 A 3/1999 Chu et al.
5,892,480 A 4/1999 Killen et al.
5,898,133 A 4/1999 Bleich et al.
5,898,830 A 4/1999 Wesinger, Jr. et al.
5,900,847 A 5/1999 Ishikawa et al.
5,903,373 A 5/1999 Welch et al.
5,905,438 A 5/1999 Weiss et al.
5,905,949 A 5/1999 Hawkes et al.
5,910,790 A 6/1999 Ohmuro et al.
5,917,977 A 6/1999 Barrett et al.
5,922,081 A 7/1999 Seewig et al.
5,926,128 A 7/1999 Brash et al.
5,933,422 A 8/1999 Suzuki
5,936,589 A 8/1999 Kawahata
5,948,044 A 9/1999 Varley et al.
5,948,108 A 9/1999 Lu et al.
5,952,964 A 9/1999 Chan et al.
5,952,972 A 9/1999 Ittipiboon et al.
5,952,984 A 9/1999 Kuramoto et al.
5,955,992 A 9/1999 Shattil
5,959,578 A 9/1999 Kreutel et al.
5,959,590 A 9/1999 Sanford et al.
5,973,641 A 10/1999 Smith et al.
5,977,650 A 11/1999 Rickard et al.
5,978,738 A 11/1999 Brown et al.
5,982,276 A 11/1999 Stewart
5,986,331 A 11/1999 Letavic et al.
5,987,099 A 11/1999 O'Neill et al.
5,990,848 A 11/1999 Annamaa et al.
5,994,984 A 11/1999 Stancil et al.
5,994,998 A 11/1999 Fisher et al.
6,005,694 A 12/1999 Liu
6,005,758 A 12/1999 Spencer et al.
6,009,124 A 12/1999 Smith
6,011,520 A 1/2000 Howell et al.
6,011,524 A 1/2000 Jervis et al.
6,014,110 A 1/2000 Bridges et al.
6,018,659 A 1/2000 Ayyagari et al.
6,023,619 A 2/2000 Kaminsky
6,026,173 A 2/2000 Svenson et al.
6,026,208 A 2/2000 Will et al.
6,026,331 A 2/2000 Feldberg et al.
6,031,455 A 2/2000 Grube et al.
6,034,638 A 3/2000 Thiel et al.
6,037,894 A 3/2000 Pfizenmaier et al.
6,038,425 A 3/2000 Jeffrey et al.
6,049,647 A 4/2000 Register et al.
6,057,802 A 5/2000 Nealy et al.
6,061,035 A 5/2000 Kinasewitz et al.
6,063,234 A 5/2000 Chen et al.
6,075,451 A 6/2000 Lebowitz et al.
6,075,493 A 6/2000 Sugawara et al.
6,076,044 A 6/2000 Brown
6,078,297 A 6/2000 Kormanyos et al.
6,088,001 A 7/2000 Burger et al.

(56) References Cited

U.S. PATENT DOCUMENTS 6,095,820 A 8/2000 Luxon et al.
6,100,846 A 8/2000 Li et al.
6,103,031 A 8/2000 Aeschbacher et al.
6,107,897 A 8/2000 Hewett et al.
6,111,553 A 8/2000 Steenbuck et al.
6,114,998 A 9/2000 Schefte et al.
6,121,885 A 9/2000 Masone et al.
6,122,753 A 9/2000 Masuo et al.
6,140,911 A 10/2000 Fisher et al.
6,140,976 A 10/2000 Locke et al.
6,142,434 A 11/2000 Brinkman et al.
6,146,330 A 11/2000 Tujino et al.
6,150,612 A 11/2000 Grandy et al.
6,151,145 A 11/2000 Srivastava et al.
6,154,488 A 11/2000 Hunt
6,158,383 A 12/2000 Watanabe et al.
6,163,296 A 12/2000 Lier et al.
6,166,694 A 12/2000 Ying et al.
6,167,055 A 12/2000 Ganek et al.
6,175,917 B1 1/2001 Arrow et al.
6,177,801 B1 1/2001 Chong et al.
6,184,828 B1 2/2001 Shoki et al.
6,195,058 B1 2/2001 Nakamura et al.
6,195,395 B1 2/2001 Frodsham et al.
6,198,440 B1 3/2001 Ha et al.
6,208,161 B1 3/2001 Suda et al.
6,208,308 B1 3/2001 Lemons et al.
6,208,903 B1 3/2001 Richards et al.
6,211,836 B1 4/2001 Manasson et al.
6,211,837 B1 4/2001 Crouch et al.
6,215,443 B1 4/2001 Komatsu et al.
6,219,006 B1 4/2001 Rudish
6,222,503 B1 4/2001 Gietema et al.
6,225,960 B1 5/2001 Collins et al.
6,229,327 B1 5/2001 Boll et al.
6,236,365 B1 5/2001 Leblanc et al.
6,239,377 B1 5/2001 Nishikawa et al.
6,239,379 B1 5/2001 Cotter et al.
6,239,761 B1 5/2001 Guo et al.
6,241,045 B1 6/2001 Reeve et al.
6,243,049 B1 6/2001 Chandler et al.
6,246,821 B1 6/2001 Hemken et al.
6,252,553 B1 6/2001 Solomon et al.
6,259,337 B1 7/2001 Wen et al.
6,266,016 B1 7/2001 Bergstedt et al.
6,266,025 B1 7/2001 Popa et al.
6,268,835 B1 7/2001 Toland et al.
6,271,790 B2 8/2001 Smith et al.
6,271,799 B1 8/2001 Rief et al.
6,271,952 B1 8/2001 Epworth et al.
6,278,357 B1 8/2001 Croushore et al.
6,278,370 B1 8/2001 Underwood et al.
6,281,769 B1 8/2001 Fiedziuszko et al.
6,281,855 B1 8/2001 Aoki et al.
6,282,354 B1 8/2001 Jones et al.
6,283,425 B1 9/2001 Liljevik
6,285,325 B1 9/2001 Nalbandian et al.
6,292,139 B1 9/2001 Yamamoto et al.
6,292,143 B1 9/2001 Romanofsky et al.
6,292,153 B1 9/2001 Aiello et al.
6,300,898 B1 10/2001 Schneider et al.
6,300,906 B1 10/2001 Rawnick et al.
6,301,420 B1 10/2001 Greenaway et al.
6,308,085 B1 10/2001 Shoki et al.
6,311,288 B1 10/2001 Heeren et al.
6,317,028 B1 11/2001 Valiulis et al.
6,317,092 B1 11/2001 de Schweinitz et al.
6,320,509 B1 11/2001 Brady et al.
6,320,553 B1 11/2001 Ergene et al.
6,323,819 B1 11/2001 Ergene et al.
6,329,959 B1 12/2001 Varadan et al.
6,335,993 B1 1/2002 Takahashi et al.
6,348,683 B1 2/2002 Verghese et al.
6,351,247 B1 2/2002 Linstrom et al.
6,357,709 B1 3/2002 Parduhn et al.
6,362,788 B1 3/2002 Louzir
6,362,789 B1 3/2002 Trumbull et al.
6,366,238 B1 4/2002 DeMore et al.
6,373,436 B1 4/2002 Chen et al.
6,373,441 B1 4/2002 Porath et al.
6,376,824 B1 4/2002 Michenfelder et al.
6,380,822 B1 4/2002 Lindgren et al.
6,388,564 B1 5/2002 Piercy et al.
6,396,440 B1 5/2002 Chen et al.
6,404,773 B1 6/2002 Williams et al.
6,404,775 B1 6/2002 Leslie
6,421,021 B1 7/2002 Rupp et al.
6,433,736 B1 8/2002 Timothy et al.
6,433,741 B2 8/2002 Tanizaki et al.
6,436,536 B2 8/2002 Peruzzotti et al.
6,441,723 B1 8/2002 Mansfield, Jr. et al.
6,445,351 B1 9/2002 Baker et al.
6,445,774 B1 9/2002 Kidder et al.
6,452,467 B1 9/2002 McEwan
6,452,569 B1 9/2002 Park et al.
6,452,923 B1 9/2002 Gerszberg et al.
6,455,769 B1 9/2002 Belli et al.
6,456,251 B1 9/2002 Rao et al.
6,462,700 B1 10/2002 Schmidt et al.
6,463,295 B1 10/2002 Yun et al.
6,469,676 B1 10/2002 Fehrenbach et al.
6,473,049 B2 10/2002 Takeuchi et al.
6,480,168 B1 11/2002 Lam et al.
6,483,470 B1 11/2002 Hohnstein et al.
6,489,928 B2 12/2002 Sakurada
6,489,931 B2 12/2002 Liu et al.
6,492,957 B2 12/2002 Carillo, Jr. et al.
6,501,433 B2 12/2002 Popa et al.
6,507,573 B1 1/2003 Brandt et al.
6,510,152 B1 1/2003 Gerszberg et al.
6,515,635 B2 2/2003 Chiang et al.
6,522,305 B2 2/2003 Sharman et al.
6,531,991 B2 3/2003 Adachi et al.
6,532,215 B1 3/2003 Muntz et al.
6,534,996 B1 3/2003 Amrany et al.
6,535,169 B2 3/2003 Fourdeux et al.
6,542,739 B1 4/2003 Garner
6,549,106 B2 4/2003 Martin et al.
6,549,173 B1 4/2003 King et al.
6,552,693 B1 4/2003 Leisten et al.
6,559,811 B1 5/2003 Cash et al.
6,563,981 B2 5/2003 Weisberg et al.
6,567,573 B1 5/2003 Domash et al.
6,573,803 B1 6/2003 Ziegner et al.
6,573,813 B1 6/2003 Joannopoulos et al.
6,580,295 B2 6/2003 Takekuma et al.
6,584,084 B1 6/2003 Barany et al.
6,584,252 B1 6/2003 Schier et al.
6,587,077 B2 7/2003 Vail et al.
6,593,893 B2 7/2003 Hou et al.
6,594,238 B1 7/2003 Wallentin et al.
6,596,944 B1 7/2003 Clark et al.
6,600,456 B2 7/2003 Gothard et al.
6,606,057 B2 8/2003 Chiang et al.
6,606,066 B1 8/2003 Fawcett et al.
6,606,077 B2 8/2003 Ebling et al.
6,611,252 B1 8/2003 DuFaux et al.
6,614,237 B2 9/2003 Ademian et al.
6,631,229 B1 10/2003 Norris et al.
6,634,225 B1 10/2003 Reime et al.
6,639,484 B2 10/2003 Tzuang et al.
6,639,566 B2 10/2003 Knop et al.
6,642,887 B2 11/2003 Owechko et al.
6,643,254 B1 11/2003 Abe et al.
6,650,296 B2 11/2003 Wong et al.
6,653,598 B2 11/2003 Sullivan et al.
6,653,848 B2 11/2003 Adamian et al.
6,657,437 B1 12/2003 LeCroy et al.
6,659,655 B2 12/2003 Dair et al.
6,661,391 B2 12/2003 Ohara et al.
6,668,104 B1 12/2003 Mueller-Fiedler et al.
6,670,921 B2 12/2003 Sievenpiper et al.
6,671,824 B1 12/2003 Hyland et al.
6,677,899 B1 1/2004 Lee et al.

(56) References Cited

U.S. PATENT DOCUMENTS 6,680,903 B1 1/2004 Moriguchi et al.
6,683,580 B2 1/2004 Kuramoto
6,686,832 B2 2/2004 Abraham et al.
6,686,873 B2 2/2004 Patel et al.
6,686,875 B1 2/2004 Wolfson et al.
6,697,027 B2 2/2004 Mahon et al.
6,697,030 B2 2/2004 Gleener
6,703,981 B2 3/2004 Meitzler et al.
6,714,165 B2 3/2004 Verstraeten
6,720,935 B2 4/2004 Lamensdorf et al.
6,725,035 B2 4/2004 Jochim et al.
6,727,470 B2 4/2004 Reichle et al.
6,727,891 B2 4/2004 Moriya et al.
6,728,439 B2 4/2004 Weisberg et al.
6,728,552 B2 4/2004 Chatain et al.
6,731,210 B2 5/2004 Swanson et al.
6,731,649 B1 5/2004 Silverman
6,737,934 B2 5/2004 Yamada
6,741,705 B1 5/2004 Nelson et al.
6,747,557 B1 6/2004 Petite et al.
6,750,827 B2 6/2004 Manasson et al.
6,751,441 B1 6/2004 Murray
6,753,813 B2 6/2004 Kushihi et al.
6,754,470 B2 6/2004 Hendrickson et al.
6,755,312 B2 6/2004 Dziedzic et al.
6,756,538 B1 6/2004 Murga-Gonzalez et al.
6,763,195 B1 7/2004 Willebrand et al.
6,765,479 B2 7/2004 Stewart et al.
6,768,454 B2 7/2004 Kingsley et al.
6,768,456 B1 7/2004 Lalezari et al.
6,768,471 B2 7/2004 Bostwick et al.
6,768,474 B2 7/2004 Hunt et al.
6,771,216 B2 8/2004 Patel et al.
6,771,225 B2 8/2004 Tits et al.
6,771,739 B1 8/2004 Beamon et al.
6,774,859 B2 8/2004 Schantz et al.
6,778,729 B1 8/2004 Guy et al.
6,788,865 B2 9/2004 Kawanishi et al.
6,788,951 B2 9/2004 Aoki et al.
6,789,119 B1 9/2004 Zhu et al.
6,792,290 B2 9/2004 Proctor, Jr. et al.
6,798,223 B2 9/2004 Huang et al.
6,806,710 B1 10/2004 Renz et al.
6,809,633 B2 10/2004 Cern et al.
6,809,695 B2 10/2004 Le Bayon et al.
6,812,895 B2 11/2004 Anderson et al.
6,819,744 B1 11/2004 Galli et al.
6,822,615 B2 11/2004 Quan et al.
6,839,032 B2 1/2005 Teshirogi et al.
6,839,160 B2 1/2005 Tsuda et al.
6,839,846 B2 1/2005 Mangold et al.
6,842,157 B2 1/2005 Phelan et al.
6,842,430 B1 1/2005 Melnik et al.
6,850,128 B2 2/2005 Park
6,853,351 B1 2/2005 Mohuchy et al.
6,856,273 B1 2/2005 Bognar et al.
6,859,185 B2 2/2005 Royalty et al.
6,859,187 B2 2/2005 Ohlsson et al.
6,859,590 B1 2/2005 Zaccone
6,861,998 B2 3/2005 Louzir
6,864,851 B2 3/2005 McGrath et al.
6,864,853 B2 3/2005 Judd et al.
6,867,744 B2 3/2005 Toncich et al.
6,868,258 B2 3/2005 Hayata et al.
6,870,465 B1 3/2005 Song et al.
6,873,265 B2 3/2005 Bleier et al.
6,885,674 B2 4/2005 Hunt et al.
6,886,065 B2 4/2005 Sides et al.
6,888,623 B2 5/2005 Clements
6,901,064 B2 5/2005 Billhartz et al.
6,904,218 B2 6/2005 Sun et al.
6,906,676 B2 6/2005 Killen et al.
6,906,681 B2 6/2005 Hoppenstein et al.
6,909,893 B2 6/2005 Aoki et al.
6,917,974 B1 7/2005 Stytz et al.
6,920,289 B2 7/2005 Zimmerman et al.
6,920,315 B1 7/2005 Wilcox et al.
6,920,407 B2 7/2005 Phillips et al.
6,922,135 B2 7/2005 Abraham et al.
6,924,732 B2 8/2005 Yokoo et al.
6,924,776 B2 8/2005 Le et al.
6,928,194 B2 8/2005 Mai et al.
6,933,887 B2 8/2005 Regnier et al.
6,934,655 B2 8/2005 Jones et al.
6,937,595 B2 8/2005 Barzegar et al.
6,943,553 B2 9/2005 Zimmermann et al.
6,944,555 B2 9/2005 Blackett et al.
6,947,147 B2 9/2005 Motamedi et al.
6,947,376 B1 9/2005 Deng et al.
6,947,635 B2 9/2005 Kohns et al.
6,948,371 B2 9/2005 Tanaka et al.
6,950,567 B2 9/2005 Kline et al.
6,952,143 B2 10/2005 Kinayman et al.
6,952,183 B2 10/2005 Yuanzhu et al.
6,956,506 B2 10/2005 Koivumaeki et al.
6,958,729 B1 10/2005 Metz et al.
6,965,302 B2 11/2005 Mollenkopf et al.
6,965,355 B1 11/2005 Durham et al.
6,965,784 B2 11/2005 Kanamaluru et al.
6,967,627 B2 11/2005 Roper et al.
6,970,502 B2 11/2005 Kim et al.
6,970,682 B2 11/2005 Crilly, Jr. et al.
6,972,729 B2 12/2005 Wang et al.
6,980,091 B2 12/2005 White, II et al.
6,982,611 B2 1/2006 Cope et al.
6,982,679 B2 1/2006 Kralovec et al.
6,983,174 B2 1/2006 Hoppenstein et al.
6,985,118 B2 1/2006 Killen et al.
6,992,639 B1 1/2006 Lier et al.
6,999,667 B2 2/2006 Jang et al.
7,008,120 B2 3/2006 Zaborsky et al.
7,009,471 B2 3/2006 Elmore
7,012,489 B2 3/2006 Fisher et al.
7,012,572 B1 3/2006 Schaffner et al.
7,016,585 B2 3/2006 Diggle, III et al.
7,019,704 B2 3/2006 Weiss et al.
7,023,400 B2 4/2006 Hill et al.
7,026,917 B2 4/2006 Berkman et al.
7,027,003 B2 4/2006 Sasaki et al.
7,027,454 B2 4/2006 Dent et al.
7,032,016 B2 4/2006 Cerami et al.
7,038,636 B2 5/2006 Larouche et al.
7,039,048 B1 5/2006 Monta et al.
7,042,403 B2 5/2006 Sievenpiper et al.
7,042,416 B2 5/2006 Kingsley et al.
7,042,420 B2 5/2006 Ebling et al.
7,054,286 B2 5/2006 Ertel et al.
7,054,376 B1 5/2006 Rubinstain et al.
7,054,513 B2 5/2006 Herz et al.
7,055,148 B2 5/2006 Marsh et al.
7,057,558 B2 6/2006 Yasuho et al.
7,057,573 B2 6/2006 Ohira et al.
7,058,524 B2 6/2006 Hayes et al.
7,061,370 B2 6/2006 Cern et al.
7,061,891 B1 6/2006 Kilfoyle et al.
7,064,726 B2 6/2006 Kitamori et al.
7,068,998 B2 6/2006 Zavidniak et al.
7,069,163 B2 6/2006 Gunther et al.
7,075,414 B2 7/2006 Giannini et al.
7,075,485 B2 7/2006 Song et al.
7,075,496 B2 7/2006 Hidai et al.
7,082,321 B2 7/2006 Kuwahara et al.
7,084,742 B2 8/2006 Haines et al.
7,088,221 B2 8/2006 Chan
7,088,306 B2 8/2006 Chiang et al.
7,098,405 B2 8/2006 Glew et al.
7,098,773 B2 8/2006 Berkman et al.
7,102,581 B1 9/2006 West et al.
7,106,265 B2 9/2006 Robertson et al.
7,106,270 B2 9/2006 Iigusa et al.
7,106,273 B1 9/2006 Brunson et al.
7,109,939 B2 9/2006 Lynch et al.
7,110,678 B2 9/2006 Willebrand et al.
7,113,002 B2 9/2006 Otsuka et al.

(56) References Cited

U.S. PATENT DOCUMENTS 7,113,134 B1 9/2006 Berkman et al.
7,119,755 B2 10/2006 Harvey et al.
7,120,338 B2 10/2006 Gunn, III et al.
7,120,345 B2 10/2006 Naitou et al.
7,122,012 B2 10/2006 Bouton et al.
7,123,191 B2 10/2006 Goldberg et al.
7,123,801 B2 10/2006 Fitz et al.
7,125,512 B2 10/2006 Crump et al.
7,126,557 B2 10/2006 Warnagiris et al.
7,126,711 B2 10/2006 Fruth
7,127,348 B2 10/2006 Smitherman et al.
7,130,516 B2 10/2006 Wu et al.
7,132,950 B2 11/2006 Stewart et al.
7,133,930 B2 11/2006 Sabio et al.
7,134,012 B2 11/2006 Doyle et al.
7,134,135 B2 11/2006 Cerami et al.
7,136,397 B2 11/2006 Sharma et al.
7,136,772 B2 11/2006 Duchi et al.
7,137,605 B1 11/2006 Guertler et al.
7,138,767 B2 11/2006 Chen et al.
7,138,958 B2 11/2006 Syed et al.
7,139,328 B2 11/2006 Thomas et al.
7,145,440 B2 12/2006 Gerszberg et al.
7,145,552 B2 12/2006 Hollingsworth et al.
7,151,497 B2 12/2006 Crystal et al.
7,151,508 B2 12/2006 Schaffner et al.
7,155,238 B2 12/2006 Katz et al.
7,161,934 B2 1/2007 Buchsbaum et al.
7,164,354 B1 1/2007 Panzer et al.
7,167,139 B2 1/2007 Kim et al.
7,171,087 B2 1/2007 Takahashi et al.
7,171,308 B2 1/2007 Campbell et al.
7,171,493 B2 1/2007 Shu et al.
7,176,589 B2 2/2007 Rouquette et al.
7,180,459 B2 2/2007 Damini et al.
7,180,467 B2 2/2007 Fabrega-Sanchez
7,183,922 B2 2/2007 Mendolia et al.
7,183,991 B2 2/2007 Bhattacharyya et al.
7,183,998 B2 2/2007 Wilhelm et al.
7,193,562 B2 3/2007 Kish et al.
7,194,528 B1 3/2007 Davidow et al.
7,199,680 B2 4/2007 Fukunaga et al.
7,200,391 B2 4/2007 Chung et al.
7,200,658 B2 4/2007 Goeller et al.
7,205,950 B2 4/2007 Imai et al.
7,212,163 B2 5/2007 Huang et al.
7,215,220 B1 5/2007 Jia et al.
7,215,928 B2 5/2007 Gage et al.
7,218,285 B2 5/2007 Davis et al.
7,224,170 B2 5/2007 Graham et al.
7,224,243 B2 5/2007 Cope et al.
7,224,272 B2 5/2007 White, II et al.
7,224,320 B2 5/2007 Cook et al.
7,224,985 B2 5/2007 Caci et al.
7,228,123 B2 6/2007 Moursund et al.
7,234,413 B2 6/2007 Suzuki et al.
7,234,895 B2 6/2007 Richardson et al.
7,239,284 B1 7/2007 Staal et al.
7,243,610 B2 7/2007 Ishii et al.
7,248,148 B2 7/2007 Kline et al.
7,250,772 B2 7/2007 Furse et al.
7,255,821 B2 8/2007 Priedeman, Jr. et al.
7,259,657 B2 8/2007 Mollenkopf et al.
7,260,424 B2 8/2007 Schmidt et al.
7,266,154 B2 9/2007 Gundrum et al.
7,266,275 B2 9/2007 Hansen et al.
7,268,722 B2 9/2007 Gottwald et al.
7,272,281 B2 9/2007 Stahulak et al.
7,272,362 B2 9/2007 Jeong et al.
7,274,305 B1 9/2007 Luttrell
7,274,936 B2 9/2007 Stern-Berkowitz et al.
7,276,990 B2 10/2007 Sievenpiper et al.
7,280,033 B2 10/2007 Berkman et al.
7,280,803 B2 10/2007 Nelson et al.
7,282,922 B2 10/2007 Lo et al.
7,286,099 B1 10/2007 Lier et al.
7,289,449 B1 10/2007 Rubinstein et al.
7,289,704 B1 10/2007 Wagman et al.
7,289,828 B2 10/2007 Cha et al.
7,292,125 B2 11/2007 Mansour et al.
7,292,196 B2 11/2007 Waterhouse et al.
7,295,161 B2 11/2007 Gaucher et al.
7,297,869 B2 11/2007 Hiller et al.
7,301,440 B2 11/2007 Mollenkopf
7,301,508 B1 11/2007 O'Loughlin et al.
7,307,357 B2 12/2007 Kopp et al.
7,307,596 B1 12/2007 West et al.
7,308,264 B2 12/2007 Stern-Berkowitz et al.
7,308,370 B2 12/2007 Mason, Jr. et al.
7,309,873 B2 12/2007 Ishikawa
7,310,065 B2 12/2007 Anguera et al.
7,310,335 B1 12/2007 Garcia-Luna-Aceves et al.
7,311,605 B2 12/2007 Moser
7,312,686 B2 12/2007 Bruno
7,313,087 B2 12/2007 Patil et al.
7,313,312 B2 12/2007 Kimball et al.
7,315,224 B2 1/2008 Gurovich et al.
7,315,678 B2 1/2008 Siegel
7,318,564 B1 1/2008 Marshall et al.
7,319,717 B2 1/2008 Zitting et al.
7,321,291 B2 1/2008 Gidge et al.
7,321,707 B2 1/2008 Noda et al.
7,324,046 B1 1/2008 Wu et al.
7,324,817 B2 1/2008 Iacono et al.
7,329,815 B2 2/2008 Johnston et al.
7,333,064 B1 2/2008 Timothy et al.
7,333,593 B2 2/2008 Beamon et al.
7,339,466 B2 3/2008 Mansfield et al.
7,339,897 B2 3/2008 Larsson et al.
7,340,768 B2 3/2008 Rosenberger et al.
7,345,623 B2 3/2008 McEwan et al.
7,346,244 B2 3/2008 Gowan et al.
7,346,359 B2 3/2008 Damarla et al.
7,353,293 B2 4/2008 Hipfinger et al.
7,355,560 B2 4/2008 Nagai et al.
7,358,808 B2 4/2008 Berkman et al.
7,358,921 B2 4/2008 Snyder et al.
7,369,085 B1 5/2008 Jacomb-Hood et al.
7,369,095 B2 5/2008 Thudor et al.
7,376,191 B2 5/2008 Melick et al.
7,380,272 B2 5/2008 Sharp et al.
7,381,089 B2 6/2008 Hosler, Sr.
7,382,232 B2 6/2008 Gidge et al.
7,383,577 B2 6/2008 Hrastar et al.
7,388,450 B2 6/2008 Camiade et al.
7,397,422 B2 7/2008 Tekawy et al.
7,398,946 B1 7/2008 Marshall
7,400,304 B2 7/2008 Lewis et al.
7,403,169 B2 7/2008 Svensson et al.
7,406,337 B2 7/2008 Kim et al.
7,408,426 B2 8/2008 Broyde et al.
7,408,507 B1 8/2008 Paek et al.
7,408,923 B1 8/2008 Khan et al.
7,410,606 B2 8/2008 Atkinson et al.
7,417,587 B2 8/2008 Iskander et al.
7,418,178 B2 8/2008 Kudou et al.
7,418,273 B2 8/2008 Suyama et al.
7,420,474 B1 9/2008 Elks et al.
7,420,525 B2 9/2008 Colburn et al.
7,423,604 B2 9/2008 Nagai et al.
7,426,554 B2 9/2008 Kennedy et al.
7,427,927 B2 9/2008 Borleske et al.
7,430,257 B1 9/2008 Shattil et al.
7,430,932 B2 10/2008 Mekhanoshin et al.
7,443,334 B2 10/2008 Rees et al.
7,444,404 B2 10/2008 Wetherall et al.
7,446,567 B2 11/2008 Otsuka et al.
7,450,000 B2 11/2008 Gidge et al.
7,450,001 B2 11/2008 Berkman
7,453,352 B2 11/2008 Kline et al.
7,453,393 B2 11/2008 Duivenvoorden et al.
7,456,650 B2 11/2008 Lee et al.
7,459,834 B2 12/2008 Knowles et al.
7,460,834 B2 12/2008 Johnson et al.

(56) References Cited

U.S. PATENT DOCUMENTS 7,463,877 B2 12/2008 Iwamura
7,465,879 B2 12/2008 Glew et al.
7,466,225 B2 12/2008 White, II et al.
7,468,657 B2 12/2008 Yaney
7,477,285 B1 1/2009 Johnson et al.
7,479,776 B2 1/2009 Renken et al.
7,479,841 B2 1/2009 Stenger et al.
7,486,247 B2 2/2009 Ridgway et al.
7,490,275 B2 2/2009 Zerbe et al.
7,492,317 B2 2/2009 Tinsley et al.
7,496,674 B2 2/2009 Jorgensen et al.
7,498,822 B2 3/2009 Lee et al.
7,502,619 B1 3/2009 Katz et al.
7,504,938 B2 3/2009 Eiza et al.
7,508,834 B2 3/2009 Berkman et al.
7,509,009 B2 3/2009 Suzuki et al.
7,509,675 B2 3/2009 Aaron et al.
7,511,662 B2 3/2009 Mathews et al.
7,512,090 B2 3/2009 Benitez Pelaez et al.
7,515,041 B2 4/2009 Eisold et al.
7,516,487 B1 4/2009 Szeto et al.
7,518,529 B2 4/2009 O'Sullivan et al.
7,518,952 B1 4/2009 Padden et al.
7,519,323 B2 4/2009 Mohebbi et al.
7,522,115 B2 4/2009 Waltman et al.
7,522,812 B2 4/2009 Zitting
7,525,501 B2 4/2009 Black et al.
7,525,504 B1 4/2009 Song et al.
7,531,803 B2 5/2009 Mittleman et al.
7,532,792 B2 5/2009 Skovgaard et al.
7,535,867 B1 5/2009 Kilfoyle et al.
7,539,381 B2 5/2009 Li et al.
7,541,981 B2 6/2009 Piskun et al.
7,545,818 B2 6/2009 Chen et al.
7,546,214 B2 6/2009 Rivers, Jr. et al.
7,548,212 B2 6/2009 Chekroun et al.
7,551,921 B2 6/2009 Petermann et al.
7,554,998 B2 6/2009 Simonsson et al.
7,555,182 B2 6/2009 Martin et al.
7,555,186 B2 6/2009 De Montmorillon et al.
7,555,187 B2 6/2009 Bickham et al.
7,557,563 B2 7/2009 Cowan et al.
7,561,025 B2 7/2009 Gerszberg et al.
7,567,154 B2 7/2009 Elmore
7,567,740 B2 7/2009 Bayindir et al.
7,570,137 B2 8/2009 Kintis et al.
7,570,470 B2 8/2009 Holley
7,577,398 B2 8/2009 Tennant et al.
7,580,643 B2 8/2009 Moore et al.
7,581,702 B2 9/2009 Wheeler et al.
7,583,074 B1 9/2009 Lynch et al.
7,583,233 B2 9/2009 Goldberg et al.
7,584,470 B2 9/2009 Barker et al.
7,589,630 B2 9/2009 Drake et al.
7,589,686 B2 9/2009 Balzovsky et al.
7,590,404 B1 9/2009 Johnson
7,591,020 B2 9/2009 Kammer et al.
7,591,792 B2 9/2009 Bouton et al.
7,593,067 B2 9/2009 Taguchi et al.
7,596,222 B2 9/2009 Jonas et al.
7,598,844 B2 10/2009 Corcoran et al.
7,602,333 B2 10/2009 Hiramatsu et al.
7,602,815 B2 10/2009 Houghton et al.
7,605,768 B2 10/2009 Ebling et al.
7,620,370 B2 11/2009 Barak et al.
7,625,131 B2 12/2009 Zienkewicz et al.
7,626,489 B2 12/2009 Berkman et al.
7,626,542 B2 12/2009 Kober et al.
7,627,300 B2 12/2009 Abramov et al.
7,633,442 B2 12/2009 Lynch et al.
7,634,250 B1 12/2009 Prasad et al.
7,639,201 B2 12/2009 Marklein et al.
7,640,562 B2 12/2009 Bouilloux-Lafont et al.
7,640,581 B1 12/2009 Brenton et al.
7,653,363 B2 1/2010 Karr et al.
RE41,147 E 2/2010 Pang et al.
7,656,167 B1 2/2010 McLean et al.
7,656,358 B2 2/2010 Haziza et al.
7,660,244 B2 2/2010 Kadaba et al.
7,660,252 B1 2/2010 Huang et al.
7,660,328 B1 2/2010 Oz et al.
7,664,117 B2 2/2010 Lou et al.
7,669,049 B2 2/2010 Wang et al.
7,671,701 B2 3/2010 Radtke
7,671,820 B2 3/2010 Tokoro et al.
7,672,271 B2 3/2010 Lee et al.
7,676,679 B2 3/2010 Weis et al.
7,680,478 B2 3/2010 Willars et al.
7,680,516 B2 3/2010 Lovberg et al.
7,680,561 B2 3/2010 Rodgers et al.
7,683,848 B2 3/2010 Musch et al.
7,684,383 B1 3/2010 Thompson et al.
7,693,079 B2 4/2010 Cerami et al.
7,693,162 B2 4/2010 McKenna et al.
7,693,939 B2 4/2010 Wu et al.
7,697,417 B2 4/2010 Chen et al.
7,701,931 B2 4/2010 Kajiwara
7,705,747 B2 4/2010 Twitchell, Jr.
7,710,346 B2 5/2010 Bloss et al.
7,714,536 B1 5/2010 Silberg et al.
7,714,709 B1 5/2010 Daniel et al.
7,714,725 B2 5/2010 Medve et al.
7,715,672 B2 5/2010 Dong et al.
7,716,660 B2 5/2010 Mackay et al.
7,724,782 B2 5/2010 Wang et al.
7,728,772 B2 6/2010 Mortazawi et al.
7,729,285 B2 6/2010 Yoon et al.
7,733,094 B2 6/2010 Bright et al.
7,734,717 B2 6/2010 Saarimäki et al.
7,737,903 B1 6/2010 Rao et al.
7,739,402 B2 6/2010 Graham et al.
7,743,403 B2 6/2010 McCarty et al.
7,747,356 B2 6/2010 Andarawis et al.
7,747,774 B2 6/2010 Aaron et al.
7,750,244 B1 7/2010 Melding et al.
7,750,763 B2 7/2010 Praβmayer et al.
7,751,054 B2 7/2010 Backes et al.
7,760,978 B2 7/2010 Fishteyn et al.
7,761,079 B2 7/2010 Mollenkopf et al.
7,764,943 B2 7/2010 Radtke et al.
7,773,664 B2 8/2010 Myers et al.
7,782,156 B2 8/2010 Woods et al.
7,783,195 B2 8/2010 Riggsby et al.
7,786,894 B2 8/2010 Polk et al.
7,786,945 B2 8/2010 Baldauf et al.
7,786,946 B2 8/2010 Diaz et al.
7,791,549 B2 9/2010 Clymer et al.
7,792,016 B2 9/2010 Arai et al.
7,795,877 B2 9/2010 Radtke et al.
7,795,994 B2 9/2010 Radtke et al.
7,796,025 B2 9/2010 Berkman et al.
7,796,122 B2 9/2010 Shih et al.
7,796,890 B1 9/2010 Johnson
7,797,367 B1 9/2010 Girod et al.
7,805,029 B2 9/2010 Bayindir et al.
7,808,441 B2 10/2010 Parsche et al.
7,809,223 B2 10/2010 Miyabe et al.
7,812,686 B2 10/2010 Woods et al.
7,812,778 B2 10/2010 Hasegawa et al.
7,813,344 B2 10/2010 Cheswick
7,817,063 B2 10/2010 Hawkins et al.
7,825,793 B1 11/2010 Spillman et al.
7,825,867 B2 11/2010 Tuttle et al.
7,826,602 B1 11/2010 Hunyady et al.
7,827,610 B2 11/2010 Wang et al.
7,830,228 B2 11/2010 Evans et al.
7,834,270 B2 11/2010 Zhu et al.
7,835,128 B2 11/2010 Divan et al.
7,835,600 B1 11/2010 Yap et al.
7,843,375 B1 11/2010 Rennie et al.
7,844,081 B2 11/2010 McMakin et al.
7,848,517 B2 12/2010 Britz et al.
7,852,752 B2 12/2010 Kano
7,852,837 B1 12/2010 Au et al.

(56) References Cited

U.S. PATENT DOCUMENTS 7,853,267 B2 12/2010 Jensen et al.
7,855,612 B2 12/2010 Zienkewicz et al.
7,856,007 B2 12/2010 Corcoran et al.
7,869,391 B2 1/2011 Lee et al.
7,872,610 B2 1/2011 Motzer et al.
7,872,611 B2 1/2011 Müller et al.
7,873,249 B2 1/2011 Kachmar et al.
7,876,174 B2 1/2011 Radtke et al.
7,884,285 B2 2/2011 Spencer
7,884,648 B2 2/2011 Broyde et al.
7,885,542 B2 2/2011 Riggsby et al.
7,889,129 B2 2/2011 Fox et al.
7,889,148 B2 2/2011 Diaz et al.
7,889,149 B2 2/2011 Peebles et al.
7,890,053 B2 2/2011 Washiro
7,893,789 B2 2/2011 Paynter et al.
7,894,770 B2 2/2011 Washiro et al.
7,898,480 B2 3/2011 Rebeiz et al.
7,899,403 B2 3/2011 Aaron
7,903,918 B1 3/2011 Rickham et al.
7,903,972 B2 3/2011 Riggsby et al.
7,906,973 B1 3/2011 Orr et al.
7,907,097 B2 3/2011 Syed et al.
7,915,980 B2 3/2011 Hardacker et al.
7,916,081 B2 3/2011 Lakkis et al.
7,928,750 B2 4/2011 Miller et al.
7,929,940 B1 4/2011 Dianda et al.
7,930,750 B1 4/2011 Gauvin et al.
7,937,699 B2 5/2011 Schneider et al.
7,940,207 B1 5/2011 Kienzle et al.
7,940,731 B2 5/2011 Gao et al.
7,956,818 B1 6/2011 Hsu et al.
7,958,120 B2 6/2011 Muntz et al.
7,961,710 B2 6/2011 Lee et al.
7,962,957 B2 6/2011 Keohane et al.
7,965,842 B2 6/2011 Whelan et al.
7,970,365 B2 6/2011 Martin et al.
7,970,937 B2 6/2011 Shuster et al.
7,971,053 B2 6/2011 Gibson, Sr. et al.
7,973,296 B2 7/2011 Quick et al.
7,974,387 B2 7/2011 Lutz et al.
7,983,740 B2 7/2011 Culver et al.
7,986,711 B2 7/2011 Horvath et al.
7,990,146 B2 8/2011 Lazar et al.
7,990,329 B2 8/2011 Deng et al.
7,991,877 B2 8/2011 Keohane et al.
7,992,014 B2 8/2011 Langgood et al.
7,994,996 B2 8/2011 Rebeiz et al.
7,994,999 B2 8/2011 Maeda et al.
7,997,546 B1 8/2011 Andersen et al.
8,010,116 B2 8/2011 Scheinert
8,013,694 B2 9/2011 Sagala et al.
8,019,288 B2 9/2011 Yu et al.
8,022,885 B2 9/2011 Smoyer et al.
8,022,887 B1 9/2011 Zarnaghi et al.
8,023,410 B2 9/2011 O'Neill
8,027,391 B2 9/2011 Matsubara et al.
8,036,207 B2 10/2011 Chen et al.
8,049,576 B2 11/2011 Broyde et al.
8,054,199 B2 11/2011 Addy
8,059,576 B2 11/2011 Vavik et al.
8,059,593 B2 11/2011 Shih et al.
8,060,308 B2 11/2011 Breed
8,063,832 B1 11/2011 Weller et al.
8,064,744 B2 11/2011 Atkins et al.
8,064,944 B2 11/2011 Yun et al.
8,065,099 B2 11/2011 Gibala et al.
8,069,483 B1 11/2011 Matlock et al.
8,072,323 B2 12/2011 Kodama et al.
8,072,386 B2 12/2011 Lier et al.
8,073,810 B2 12/2011 Maes
8,077,049 B2 12/2011 Yaney et al.
8,077,113 B2 12/2011 Renilson et al.
8,081,854 B2 12/2011 Yoon et al.
8,089,356 B2 1/2012 Moore
8,089,404 B2 1/2012 Nichols et al.
8,089,952 B2 1/2012 Spade et al.
8,090,258 B2 1/2012 DeLew et al.
8,090,379 B2 1/2012 Lambert et al.
8,094,081 B1 1/2012 Boone et al.
8,094,985 B2 1/2012 Imamura et al.
8,095,093 B2 1/2012 Takinami et al.
8,098,198 B2 1/2012 Thiesen et al.
8,102,324 B2 1/2012 Tuau et al.
8,102,779 B2 1/2012 Kim et al.
8,106,749 B2 1/2012 Ina et al.
8,106,849 B2 1/2012 Reavis et al.
RE43,163 E 2/2012 Anderson
8,111,148 B2 2/2012 Parker et al.
8,112,649 B2 2/2012 Potkonjak et al.
8,116,598 B2 2/2012 Filley et al.
8,120,488 B2 2/2012 Bloy et al.
8,121,624 B2 2/2012 Cai et al.
8,125,282 B2 2/2012 Bao et al.
8,125,399 B2 2/2012 McKinzie et al.
8,126,393 B2 2/2012 Wu et al.
8,129,817 B2 3/2012 Jou et al.
8,131,125 B2 3/2012 Molin et al.
8,131,266 B2 3/2012 Cai et al.
8,132,239 B2 3/2012 Wahl
8,134,424 B2 3/2012 Kato et al.
8,134,458 B2 3/2012 Lund
8,135,050 B1 3/2012 Stadler et al.
8,140,113 B2 3/2012 Rofougaran et al.
8,150,311 B2 4/2012 Hart et al.
8,151,306 B2 4/2012 Rakib
8,156,520 B2 4/2012 Casagrande et al.
8,159,316 B2 4/2012 Miyazato et al.
8,159,342 B1 4/2012 Medina, III et al.
8,159,385 B2 4/2012 Farneth et al.
8,159,394 B2 4/2012 Hayes et al.
8,159,742 B2 4/2012 McKay et al.
8,159,933 B2 4/2012 Henry
8,159,955 B2 4/2012 Larsson et al.
8,160,064 B2 4/2012 Kokernak et al.
8,160,530 B2 4/2012 Corman et al.
8,160,825 B1 4/2012 Roe, Jr. et al.
8,164,531 B2 4/2012 Lier et al.
8,171,146 B2 5/2012 Chen et al.
8,172,173 B2 5/2012 Carlson et al.
8,173,943 B2 5/2012 Vilo et al.
8,175,535 B2 5/2012 Mu et al.
8,175,649 B2 5/2012 Saban
8,179,787 B2 5/2012 Knapp et al.
8,180,917 B1 5/2012 Yan et al.
8,184,015 B2 5/2012 Lilien et al.
8,184,059 B2 5/2012 Bunch et al.
8,184,311 B2 5/2012 Sakai et al.
8,184,523 B2 5/2012 Belotserkovsky et al.
8,185,062 B2 5/2012 Rofougaran et al.
8,188,855 B2 5/2012 Sharma et al.
8,199,762 B2 6/2012 Michelson et al.
8,203,501 B2 6/2012 Kim et al.
8,212,635 B2 7/2012 Miller, II et al.
8,212,722 B2 7/2012 Ngo et al.
8,213,758 B2 7/2012 Dong et al.
8,218,929 B2 7/2012 Bickham et al.
8,222,919 B2 7/2012 Broyde et al.
8,222,977 B2 7/2012 Oyama et al.
8,225,379 B2 7/2012 van de Groenendaal et al.
8,233,905 B2 7/2012 Vaswani et al.
8,237,617 B1 8/2012 Johnson et al.
8,238,824 B2 8/2012 Washiro
8,238,840 B2 8/2012 Iio et al.
8,242,358 B2 8/2012 Park et al.
8,243,603 B2 8/2012 Gossain et al.
8,249,028 B2 8/2012 Porras et al.
8,251,307 B2 8/2012 Goossen et al.
8,253,516 B2 8/2012 Miller, II et al.
8,255,952 B2 8/2012 Boylan et al.
8,258,743 B2 9/2012 Tyler et al.
8,259,028 B2 9/2012 Hills et al.
8,264,417 B2 9/2012 Snow et al.
8,269,583 B2 9/2012 Miller, II et al.

(56) References Cited

U.S. PATENT DOCUMENTS 8,284,102 B2 10/2012 Hayes et al.
8,287,323 B2 10/2012 Kiesow et al.
8,295,301 B2 10/2012 Yonge, III et al.
8,300,538 B2 10/2012 Kim et al.
8,300,640 B2 10/2012 Al-Banna et al.
8,316,228 B2 11/2012 Winslow et al.
8,316,364 B2 11/2012 Stein et al.
8,324,990 B2 12/2012 Vouloumanos
8,325,034 B2 12/2012 Moore et al.
8,325,636 B2 12/2012 Binder
8,325,693 B2 12/2012 Binder et al.
8,330,259 B2 12/2012 Soler et al.
8,335,596 B2 12/2012 Raman et al.
8,340,438 B2 12/2012 Anderson et al.
8,343,145 B2 1/2013 Brannan et al.
8,344,829 B2 1/2013 Miller, II et al.
8,354,970 B2 1/2013 Armbrecht et al.
8,359,124 B2 1/2013 Zhou et al.
8,362,775 B2 1/2013 Speckner et al.
8,363,313 B2 1/2013 Nakaguma et al.
8,369,667 B2 2/2013 Rose et al.
8,373,095 B2 2/2013 Huynh et al.
8,373,597 B2 2/2013 Schadler et al.
8,374,821 B2 2/2013 Rousselle et al.
8,384,600 B2 2/2013 Huang et al.
8,385,978 B2 2/2013 Leung et al.
8,386,198 B2 2/2013 Lancaster
8,390,307 B2 3/2013 Slupsky et al.
8,390,402 B2 3/2013 Kunes et al.
8,405,567 B2 3/2013 Park et al.
8,406,239 B2 3/2013 Hurwitz et al.
8,406,593 B2 3/2013 Molin et al.
8,407,687 B2 3/2013 Moshir et al.
8,412,130 B2 4/2013 Suematsu et al.
8,414,326 B2 4/2013 Bowman
8,415,884 B2 4/2013 Chen et al.
8,428,033 B2 4/2013 Hettstedt et al.
8,433,168 B2 4/2013 Filippov et al.
8,433,338 B1 4/2013 Flynn et al.
8,434,103 B2 4/2013 Tsuchida et al.
8,437,383 B2 5/2013 Wiwel et al.
8,452,101 B2 5/2013 Ishikawa et al.
8,452,555 B2 5/2013 Hayward et al.
8,457,027 B2 6/2013 Dougherty et al.
8,458,453 B1 6/2013 Mahalingaiah et al.
8,462,063 B2 6/2013 Gummalla et al.
8,467,363 B2 6/2013 Lea et al.
8,468,244 B2 6/2013 Redlich et al.
8,471,513 B2 6/2013 Han
8,472,327 B2 6/2013 DelRegno et al.
8,484,137 B2 7/2013 Johnson et al.
8,484,511 B2 7/2013 Tidwell et al.
8,495,718 B2 7/2013 Han et al.
8,497,749 B2 7/2013 Elmore
8,503,845 B2 8/2013 Winzer et al.
8,504,135 B2 8/2013 Bourqui et al.
8,505,057 B2 8/2013 Rogers
8,509,114 B1 8/2013 Szajdecki
8,514,980 B2 8/2013 Kuhtz
8,515,383 B2 8/2013 Prince et al.
8,516,129 B1 8/2013 Skene et al.
8,516,470 B1 8/2013 Joshi et al.
8,516,474 B2 8/2013 Lamba et al.
8,519,892 B2 8/2013 Ding et al.
8,520,578 B2 8/2013 Rayment et al.
8,520,636 B2 8/2013 Xu
8,520,931 B2 8/2013 Tateno et al.
8,528,059 B1 9/2013 Saluzzo et al.
8,532,023 B2 9/2013 Buddhikot et al.
8,532,046 B2 9/2013 Hu et al.
8,532,492 B2 9/2013 Sadowski et al.
8,536,857 B2 9/2013 Nero, Jr. et al.
8,537,068 B2 9/2013 Call et al.
8,537,705 B2 9/2013 Afkhamie et al.
8,538,428 B2 9/2013 Bartlett et al.
8,539,540 B2 9/2013 Zenoni
8,539,569 B2 9/2013 Mansour
8,542,968 B2 9/2013 Dong et al.
8,545,322 B2 10/2013 George et al.
8,548,294 B2 10/2013 Toge et al.
8,553,646 B2 10/2013 Kumar
8,561,104 B1 10/2013 Dow et al.
8,561,181 B1 10/2013 Sobel et al.
8,565,568 B2 10/2013 Bigot-Astruc et al.
8,566,058 B2 10/2013 Pupalaikis et al.
8,572,247 B2 10/2013 Larson et al.
8,572,639 B2 10/2013 Ficco
8,572,661 B2 10/2013 Strong et al.
8,578,076 B2 11/2013 van der Linden et al.
8,578,486 B2 11/2013 Lifliand et al.
8,582,502 B2 11/2013 Conte et al.
8,584,195 B2 11/2013 Sherlock et al.
8,587,490 B2 11/2013 Niver et al.
8,587,492 B2 11/2013 Runyon et al.
8,588,567 B2 11/2013 Kamps et al.
8,588,840 B2 11/2013 Truong et al.
8,588,991 B1 11/2013 Forbes, Jr.
8,593,238 B2 11/2013 Miller, II et al.
8,594,956 B2 11/2013 McBee et al.
8,595,141 B2 11/2013 Hao et al.
8,599,150 B2 12/2013 Philipp
8,600,602 B1 12/2013 Watson et al.
8,604,982 B2 12/2013 Gummalla et al.
8,604,999 B2 12/2013 Abumrad et al.
8,605,361 B2 12/2013 Batchko et al.
8,605,579 B2 12/2013 Abraham et al.
8,612,550 B2 12/2013 Yoo et al.
8,613,020 B2 12/2013 Knudson et al.
8,615,190 B2 12/2013 Lu
8,625,547 B1 1/2014 Miller et al.
8,629,811 B2 1/2014 Gaynor et al.
8,639,260 B2 1/2014 Fox et al.
8,639,390 B2 1/2014 Tamarkin et al.
8,639,934 B2 1/2014 Kruglick
8,644,219 B2 2/2014 Nishizaka et al.
8,653,906 B2 2/2014 Mahon et al.
8,655,396 B2 2/2014 Malladi et al.
8,656,458 B2 2/2014 Heffez et al.
8,660,526 B1 2/2014 Heiderscheit et al.
8,660,698 B2 2/2014 Phillips et al.
8,665,102 B2 3/2014 Salewske et al.
8,666,553 B2 3/2014 Phillips et al.
8,670,946 B2 3/2014 Salazar et al.
8,674,630 B1 3/2014 Cornelius et al.
8,676,186 B2 3/2014 Niu
8,680,450 B2 3/2014 Pritchard et al.
8,680,706 B2 3/2014 Zyren et al.
8,681,463 B2 3/2014 Franks et al.
8,686,911 B2 4/2014 Kim et al.
8,687,650 B2 4/2014 King
8,688,153 B2 4/2014 Komori et al.
8,699,454 B2 4/2014 Hapsari et al.
8,699,461 B2 4/2014 Qian et al.
8,705,925 B2 4/2014 Terada et al.
8,706,026 B2 4/2014 Truong et al.
8,707,432 B1 4/2014 Rathi et al.
8,711,538 B2 4/2014 Woodworth et al.
8,711,732 B2 4/2014 Johnson et al.
8,711,806 B2 4/2014 Lim et al.
8,711,857 B2 4/2014 Jackson et al.
8,712,200 B1 4/2014 Abernathy et al.
8,719,938 B2 5/2014 Demeter et al.
8,723,730 B2 5/2014 Lu et al.
8,724,102 B2 5/2014 Urban et al.
8,729,857 B2 5/2014 Stählin et al.
8,731,358 B2 5/2014 Pare et al.
8,732,476 B1 5/2014 Van et al.
8,736,502 B1 5/2014 Mehr et al.
8,737,793 B2 5/2014 Imamura et al.
8,738,318 B2 5/2014 Spillane
8,742,997 B2 6/2014 McPeak et al.
8,743,004 B2 6/2014 Haziza
8,749,449 B2 6/2014 Caldwell et al.
8,750,097 B2 6/2014 Maenpaa et al.

(56) References Cited

U.S. PATENT DOCUMENTS 8,750,664 B2 6/2014 Huang et al.
8,754,852 B2 6/2014 Lee et al.
8,755,659 B2 6/2014 Imamura et al.
8,760,354 B2 6/2014 Flannery et al.
8,761,792 B2 6/2014 Sennett et al.
8,763,097 B2 6/2014 Bhatnagar et al.
8,766,657 B2 7/2014 DeJean et al.
8,767,071 B1 7/2014 Marshall
8,769,622 B2 7/2014 Chang et al.
8,773,312 B1 7/2014 Diaz et al.
8,780,012 B2 7/2014 Llombart Juan et al.
8,782,195 B2 7/2014 Foti
8,786,284 B2 7/2014 Sirigiri et al.
8,786,514 B2 7/2014 Dickie et al.
8,789,091 B2 7/2014 Eldering et al.
8,792,760 B2 7/2014 Choi et al.
8,792,933 B2 7/2014 Chen et al.
8,793,363 B2 7/2014 Sater et al.
8,793,742 B2 7/2014 Macrae et al.
8,797,207 B2 8/2014 Kienzle et al.
8,797,848 B2 8/2014 Kim et al.
8,804,667 B2 8/2014 Wang
8,806,202 B2 8/2014 Shoemake et al.
8,810,404 B2 8/2014 Bertoncini et al.
8,810,421 B2 8/2014 Deaver, Sr. et al.
8,810,468 B2 8/2014 Cannon et al.
8,811,278 B2 8/2014 Hori et al.
8,811,912 B2 8/2014 Austin et al.
8,812,050 B1 8/2014 Bencheikh et al.
8,812,154 B2 8/2014 Vian et al.
8,817,741 B2 8/2014 Shaheen
8,824,380 B2 9/2014 Jetcheva et al.
8,825,239 B2 9/2014 Cooper et al.
8,829,934 B2 9/2014 Sellathamby et al.
8,830,112 B1 9/2014 Buehler et al.
8,831,506 B2 9/2014 Claret et al.
8,836,503 B2 9/2014 Girod et al.
8,836,607 B2 9/2014 Cook et al.
8,839,350 B1 9/2014 Shapcott et al.
8,847,840 B1 9/2014 Diaz et al.
8,847,846 B1 9/2014 Diaz et al.
8,856,239 B1 10/2014 Oliver et al.
8,856,530 B2 10/2014 Lamberg et al.
8,863,245 B1 10/2014 Abhyanker
8,866,691 B2 10/2014 Montgomery et al.
8,866,695 B2 10/2014 Jefferson et al.
8,867,226 B2 10/2014 Colomb et al.
8,867,798 B2 10/2014 Shuster
8,872,032 B2 10/2014 Su et al.
8,875,224 B2 10/2014 Gross et al.
8,878,740 B2 11/2014 Coupland et al.
8,880,765 B2 11/2014 Seal et al.
8,881,588 B2 11/2014 Baer et al.
8,885,689 B2 11/2014 Blasco et al.
8,886,229 B2 11/2014 Agrawal et al.
8,887,212 B2 11/2014 Dua
8,890,759 B2 11/2014 Pantea et al.
8,893,246 B2 11/2014 El-Moussa et al.
8,897,215 B2 11/2014 Hazani et al.
8,897,499 B2 11/2014 Rekimoto
8,897,697 B1 11/2014 Bennett
8,901,916 B2 12/2014 Rodriguez et al.
8,903,214 B2 12/2014 Alkeskjold
8,907,222 B2 12/2014 Stranskky
8,907,845 B2 12/2014 Jones
8,908,502 B2 12/2014 Hayashitani
8,908,573 B1 12/2014 Wang et al.
8,913,862 B1 12/2014 Emmerich et al.
8,917,210 B2 12/2014 Shamim et al.
8,917,215 B2 12/2014 Pohl
8,917,964 B2 12/2014 Blew et al.
8,918,108 B2 12/2014 Van Heeswyk et al.
8,918,135 B2 12/2014 Kang et al.
8,922,447 B2 12/2014 Gao et al.
8,925,079 B2 12/2014 Miyake et al.
8,929,841 B2 1/2015 Rofougaran et al.
8,934,747 B2 1/2015 Smith et al.
8,937,577 B2 1/2015 Gerini et al.
8,938,144 B2 1/2015 Hennink et al.
8,938,255 B2 1/2015 Dalla et al.
8,941,912 B2 1/2015 Ichii et al.
8,947,258 B2 2/2015 Reid et al.
8,948,235 B2 2/2015 Proctor, Jr. et al.
8,948,690 B2 2/2015 Duerksen et al.
8,952,678 B2 2/2015 Giboney et al.
8,955,051 B2 2/2015 Marzii
8,955,075 B2 2/2015 Smith et al.
8,957,818 B2 2/2015 Chen et al.
8,957,821 B1 2/2015 Matyas et al.
8,958,356 B2 2/2015 Lu et al.
8,958,665 B2 2/2015 Ziari et al.
8,958,812 B2 2/2015 Weiguo
8,958,980 B2 2/2015 Hagan et al.
8,963,790 B2 2/2015 Brown et al.
8,964,433 B2 2/2015 Hai-Maharsi
8,966,609 B2 2/2015 Lee et al.
8,968,287 B2 3/2015 Shroff et al.
8,970,438 B2 3/2015 Hager et al.
8,984,113 B2 3/2015 Li et al.
8,989,788 B2 3/2015 Kim et al.
8,994,473 B2 3/2015 Levi et al.
8,994,474 B2 3/2015 Mahon et al.
8,996,188 B2 3/2015 Frader-thompson et al.
8,996,728 B2 3/2015 Cochinwala et al.
9,000,353 B2 4/2015 Seo et al.
9,001,689 B1 4/2015 Ponnampalam et al.
9,001,717 B2 4/2015 Chun et al.
9,003,492 B2 4/2015 Katar
9,008,208 B2 4/2015 Khandani
9,008,513 B2 4/2015 Kim et al.
9,009,460 B2 4/2015 Chen
9,013,361 B1 4/2015 Lam et al.
9,014,621 B2 4/2015 Mohebbi
9,015,139 B2 4/2015 Wong
9,015,467 B2 4/2015 Buer
9,019,164 B2 4/2015 Syed et al.
9,019,595 B2 4/2015 Jain et al.
9,019,846 B2 4/2015 Shetty et al.
9,019,892 B2 4/2015 Zhou et al.
9,020,555 B2 4/2015 Sheikh et al.
9,021,251 B2 4/2015 Chawla
9,021,575 B2 4/2015 Martini
RE45,514 E 5/2015 Brown
9,024,831 B2 5/2015 Wang et al.
9,031,725 B1 5/2015 Diesposti
9,037,516 B2 5/2015 Abhyanker
9,042,245 B2 5/2015 Tzannes et al.
9,042,812 B1 5/2015 Bennett et al.
9,054,782 B2 * 6/2015 Hunter .................. H04B 3/462
9,065,172 B2 6/2015 Lewry et al.
9,065,177 B2 6/2015 Alexopoulos
9,066,224 B2 6/2015 Schwengler
9,070,962 B2 6/2015 Kobayashi
9,070,964 B1 6/2015 Schuss et al.
9,079,349 B2 7/2015 Slafer
9,082,307 B2 7/2015 Sharawi
9,083,083 B2 7/2015 Hills et al.
9,083,425 B1 7/2015 Moussouris et al.
9,083,581 B1 7/2015 Addepalli et al.
9,084,124 B2 7/2015 Nickel et al.
9,092,962 B1 7/2015 Merrill et al.
9,092,963 B2 7/2015 Fetzer et al.
9,094,407 B1 7/2015 Matthieu
9,094,840 B2 7/2015 Liu et al.
9,098,325 B2 8/2015 Reddin
9,099,787 B2 8/2015 Blech
9,103,864 B2 8/2015 Ali
9,105,981 B2 8/2015 Syed
9,106,617 B2 8/2015 Kshirsagar et al.
9,112,281 B2 8/2015 Bresciani et al.
9,113,347 B2 8/2015 Henry
9,119,127 B1 8/2015 Henry
9,119,179 B1 8/2015 Firoiu et al.
9,128,941 B2 9/2015 Shulman

(56) References Cited

U.S. PATENT DOCUMENTS 9,130,641 B2 9/2015 Mohebbi
9,134,945 B2 9/2015 Husain
9,137,485 B2 9/2015 Bar-Niv et al.
9,142,334 B2 9/2015 Muto et al.
9,143,084 B2 9/2015 Perez et al.
9,143,196 B2 9/2015 Schwengler
9,148,186 B1 9/2015 Murphy et al.
9,154,641 B2 10/2015 Shaw
9,157,954 B2 10/2015 Nickel
9,158,418 B2 10/2015 Oda et al.
9,158,427 B1 10/2015 Wang
9,167,535 B2 10/2015 Christoffersson et al.
9,171,458 B2 10/2015 Salter
9,173,217 B2 10/2015 Teng et al.
9,178,282 B2 11/2015 Mittleman et al.
9,194,930 B2 11/2015 Pupalaikis
9,219,594 B2 11/2015 Khlat
9,201,556 B2 12/2015 Free et al.
9,202,371 B2 12/2015 Jain
9,203,149 B2 12/2015 Henderson et al.
9,204,112 B2 12/2015 Pasteris et al.
9,204,418 B2 12/2015 Siomina et al.
9,207,168 B2 12/2015 Lovely et al.
9,209,902 B2 12/2015 Willis, III et al.
9,210,192 B1 12/2015 Pathuri et al.
9,210,586 B2 12/2015 Catovic et al.
9,213,905 B2 12/2015 Lange et al.
9,219,307 B2 12/2015 Takahashi et al.
9,225,396 B2 12/2015 Maltsev et al.
9,229,956 B2 1/2016 Ke et al.
9,235,763 B2 1/2016 Brown et al.
9,240,835 B2 1/2016 Cune et al.
9,244,117 B2 1/2016 Khan et al.
9,246,231 B2 1/2016 Ju
9,246,334 B2 1/2016 Lo et al.
9,253,588 B2 2/2016 Schmidt et al.
9,260,244 B1 2/2016 Cohn
9,264,204 B2 2/2016 Seo et al.
9,265,078 B2 2/2016 Lim et al.
9,270,013 B2 2/2016 Ley
9,271,185 B2 2/2016 Abdelmonem et al.
9,276,303 B2 3/2016 Chang et al.
9,276,304 B2 3/2016 Behan
9,277,331 B2 3/2016 Chao et al.
9,281,564 B2 3/2016 Vincent
9,282,144 B2 3/2016 Tebay et al.
9,287,605 B2 3/2016 Daughenbaugh et al.
9,288,844 B1 3/2016 Akhavan-saraf et al.
9,289,177 B2 3/2016 Samsudin et al.
9,293,798 B2 3/2016 Ye
9,293,801 B2 3/2016 Courtney et al.
9,302,770 B2 4/2016 Cohen et al.
9,306,682 B2 4/2016 Singh
9,312,929 B2 4/2016 Forenza et al.
9,315,663 B2 4/2016 Appleby
9,319,311 B2 4/2016 Wang et al.
9,324,003 B2 4/2016 France et al.
9,324,020 B2 4/2016 Nazarov
9,325,067 B2 4/2016 Ali et al.
9,325,516 B2 4/2016 Frei et al.
9,326,316 B2 4/2016 Yonge et al.
9,334,052 B2 5/2016 Ubhi et al.
9,337,895 B2 5/2016 Turner et al.
9,338,823 B2 5/2016 Saban et al.
9,346,560 B2 5/2016 Wang
9,350,063 B2 5/2016 Herbsommer et al.
9,351,182 B2 5/2016 Elliott et al.
9,356,358 B2 5/2016 Hu et al.
9,362,629 B2 6/2016 Miller et al.
9,363,333 B2 6/2016 Basso et al.
9,363,690 B1 6/2016 Suthar et al.
9,363,761 B2 6/2016 Venkatraman
9,366,743 B2 6/2016 Doshi et al.
9,368,275 B2 6/2016 McBee et al.
9,369,177 B2 6/2016 Hui et al.
9,372,228 B2 6/2016 Gavin et al.
9,379,527 B2 6/2016 Jean et al.
9,379,556 B2 7/2016 Haensgen et al.
9,380,857 B2 7/2016 Davis et al.
9,391,874 B2 7/2016 Corti et al.
9,393,683 B2 7/2016 Kimberlin et al.
9,394,716 B2 7/2016 Butler
9,397,380 B2 7/2016 Kudela et al.
9,400,941 B2 7/2016 Meier et al.
9,401,863 B2 7/2016 Hui et al.
9,404,750 B2 8/2016 Rios et al.
9,413,519 B2 8/2016 Khoshnood et al.
9,414,126 B1 8/2016 Zinevich
9,417,731 B2 8/2016 Premont et al.
9,419,712 B2 8/2016 Heidler
9,421,869 B1 8/2016 Ananthanarayanan et al.
9,422,139 B1 8/2016 Bialkowski et al.
9,432,478 B2 8/2016 Gibbon et al.
9,432,865 B1 8/2016 Jadunandan et al.
9,439,092 B1 9/2016 Chukka et al.
9,443,417 B2 9/2016 Wang
9,458,974 B2 10/2016 Townsend, Jr. et al.
9,459,746 B2 10/2016 Zarraga et al.
9,461,706 B1 10/2016 Bennett et al.
9,465,397 B2 10/2016 Forbes, Jr. et al.
9,467,219 B2 10/2016 Vilhar
9,467,870 B2 10/2016 Bennett
9,476,932 B2 10/2016 Furse et al.
9,478,865 B1 10/2016 Willis et al.
9,479,241 B2 10/2016 Pabla
9,479,266 B2 10/2016 Henry et al.
9,479,299 B2 10/2016 Kim et al.
9,479,392 B2 10/2016 Anderson et al.
9,479,535 B2 10/2016 Cohen et al.
9,490,869 B1 11/2016 Henry
9,490,913 B2 11/2016 Berlin
9,495,037 B2 11/2016 King-Smith
9,496,921 B1 11/2016 Corum
9,497,572 B2 11/2016 Britt et al.
9,503,170 B2 11/2016 Vu
9,503,189 B2 11/2016 Henry et al.
9,509,415 B1 11/2016 Henry et al.
9,510,203 B2 11/2016 Jactat et al.
9,515,367 B2 12/2016 Herbsommer et al.
9,544,006 B2 1/2017 Henry et al.
2001/0030789 A1 10/2001 Jiang et al.
2002/0002040 A1 1/2002 Kline et al.
2002/0008672 A1 1/2002 Gothard et al.
2002/0011960 A1 1/2002 Yuanzhu et al.
2002/0021716 A1 2/2002 Terk et al.
2002/0024424 A1 2/2002 Burns et al.
2002/0027481 A1 3/2002 Fiedziuszko et al.
2002/0040439 A1 4/2002 Kellum et al.
2002/0057223 A1 5/2002 Hook
2002/0061217 A1 5/2002 Hillman et al.
2002/0069417 A1 6/2002 Kliger et al.
2002/0083194 A1 6/2002 Bak et al.
2002/0091807 A1 7/2002 Goodman et al.
2002/0099949 A1 7/2002 Fries et al.
2002/0101852 A1 8/2002 Say et al.
2002/0111997 A1 8/2002 Herlihy et al.
2002/0156917 A1 10/2002 Nye et al.
2002/0186694 A1 12/2002 Mahajan et al.
2002/0197979 A1 12/2002 Vanderveen et al.
2003/0002125 A1 1/2003 Fuse et al.
2003/0002476 A1 1/2003 Chung et al.
2003/0010528 A1 1/2003 Niles
2003/0022694 A1 1/2003 Olsen et al.
2003/0038753 A1 2/2003 Mahon et al.
2003/0049003 A1 3/2003 Ahmad et al.
2003/0054793 A1 3/2003 Manis et al.
2003/0054811 A1 3/2003 Han et al.
2003/0061346 A1 3/2003 Pekary et al.
2003/0094976 A1 5/2003 Miyashita et al.
2003/0095208 A1 5/2003 Chouraqui et al.
2003/0134660 A1 7/2003 Himmel et al.
2003/0137464 A1 7/2003 Foti et al.
2003/0151548 A1 8/2003 Kingsley et al.
2003/0152331 A1 8/2003 Dair et al.

(56) References Cited

U.S. PATENT DOCUMENTS

2003/0164794 A1 9/2003 Haynes et al.
2003/0188308 A1 10/2003 Kizuka
2003/0189974 A1* 10/2003 Ferry ...................... H04B 1/50 375/219
2003/0190110 A1 10/2003 Kline et al.
2003/0193365 A1 10/2003 Loheit et al.
2003/0202756 A1 10/2003 Hurley et al.
2003/0210197 A1 11/2003 Cencich et al.
2003/0224784 A1 12/2003 Hunt et al.
2004/0005039 A1 1/2004 White et al.
2004/0015725 A1 1/2004 Boneh et al.
2004/0023640 A1 2/2004 Ballai et al.
2004/0024913 A1 2/2004 Ikeda et al.
2004/0037566 A1 2/2004 Willebrand et al.
2004/0048596 A1 3/2004 Wyrzykowska et al.
2004/0054425 A1 3/2004 Elmore
2004/0084582 A1 5/2004 Kralic et al.
2004/0085153 A1 5/2004 Fukunaga et al.
2004/0090312 A1 5/2004 Manis et al.
2004/0091032 A1 5/2004 Duchi et al.
2004/0100343 A1 5/2004 Tsu et al.
2004/0104410 A1 6/2004 Gilbert et al.
2004/0109608 A1 6/2004 Love et al.
2004/0113756 A1 6/2004 Mollenkopf et al.
2004/0113757 A1 6/2004 White, II et al.
2004/0119564 A1 6/2004 Itoh et al.
2004/0131310 A1 7/2004 Walker et al.
2004/0163135 A1 8/2004 Giaccherini et al.
2004/0165669 A1 8/2004 Otsuka et al.
2004/0169572 A1 9/2004 Elmore et al.
2004/0196784 A1 10/2004 Larsson et al.
2004/0198228 A1 10/2004 Raghothaman et al.
2004/0208591 A1 10/2004 Willebrand et al.
2004/0212481 A1 10/2004 Abraham et al.
2004/0213147 A1 10/2004 Wiese et al.
2004/0213189 A1 10/2004 Alspaugh et al.
2004/0213294 A1 10/2004 Hughes et al.
2004/0242185 A1 12/2004 Lee et al.
2004/0250069 A1 12/2004 Kosamo et al.
2005/0002408 A1 1/2005 Lee et al.
2005/0005854 A1 1/2005 Suzuki et al.
2005/0017825 A1 1/2005 Hansen
2005/0031267 A1 2/2005 Sumimoto et al.
2005/0046511 A1 3/2005 Stenberg et al.
2005/0063422 A1 3/2005 Lazar et al.
2005/0068223 A1 3/2005 Vavik et al.
2005/0069321 A1 3/2005 Sullivan et al.
2005/0074208 A1 4/2005 Badcock et al.
2005/0097396 A1 5/2005 Wood
2005/0102185 A1 5/2005 Barker et al.
2005/0111533 A1 5/2005 Berkman et al.
2005/0141808 A1 6/2005 Cheben et al.
2005/0143868 A1 6/2005 Whelan et al.
2005/0151659 A1 7/2005 Donovan et al.
2005/0159187 A1 7/2005 Mendolia et al.
2005/0164666 A1 7/2005 Lang et al.
2005/0168326 A1 8/2005 White et al.
2005/0169056 A1 8/2005 Berkman
2005/0169401 A1 8/2005 Abraham et al.
2005/0175113 A1 8/2005 Okuyama et al.
2005/0177463 A1 8/2005 Crutchfield et al.
2005/0190101 A1 9/2005 Hiramatsu et al.
2005/0208949 A1 9/2005 Chiueh et al.
2005/0212626 A1 9/2005 Takamatsu et al.
2005/0219126 A1 10/2005 Rebeiz et al.
2005/0219135 A1 10/2005 Lee et al.
2005/0220180 A1 10/2005 Barlev
2005/0226353 A1 10/2005 Gebara et al.
2005/0249245 A1 11/2005 Hazani et al.
2005/0258920 A1* 11/2005 Elmore .................... H01P 3/10 333/240
2006/0034724 A1 2/2006 Hamano et al.
2006/0038660 A1 2/2006 Doumuki et al.
2006/0053486 A1 3/2006 Wesinger et al.
2006/0071776 A1 4/2006 White et al.
2006/0077906 A1 4/2006 Maegawa et al.
2006/0082516 A1 4/2006 Strickland et al.
2006/0085813 A1 4/2006 Giraldin et al.
2006/0094439 A1 5/2006 Christian et al.
2006/0106741 A1 5/2006 Janarthanan et al.
2006/0111047 A1 5/2006 Louberg et al.
2006/0113425 A1 6/2006 Rader et al.
2006/0114925 A1 6/2006 Gerszberg et al.
2006/0119528 A1 6/2006 Bhattacharyya et al.
2006/0120399 A1 6/2006 Claret et al.
2006/0128322 A1 6/2006 Igarashi et al.
2006/0132380 A1 6/2006 Imai et al.
2006/0153878 A1 7/2006 Savarino et al.
2006/0172781 A1 8/2006 Mohebbi et al.
2006/0176124 A1 8/2006 Mansour et al.
2006/0181394 A1 8/2006 Clarke et al.
2006/0187023 A1 8/2006 Iwamura et al.
2006/0192672 A1 8/2006 Gidge et al.
2006/0220833 A1 10/2006 Berkman et al.
2006/0221995 A1 10/2006 Berkman et al.
2006/0232493 A1 10/2006 Huang et al.
2006/0238347 A1 10/2006 Parkinson et al.
2006/0239501 A1 10/2006 Petrovic et al.
2006/0244672 A1 11/2006 Avakian et al.
2006/0249622 A1 11/2006 Steele et al.
2006/0255930 A1 11/2006 Berkman et al.
2006/0286927 A1 12/2006 Berkman et al.
2007/0002771 A1 1/2007 Berkman et al.
2007/0022475 A1 1/2007 Rossi et al.
2007/0025265 A1 2/2007 Porras et al.
2007/0025386 A1 2/2007 Riedel et al.
2007/0040628 A1 2/2007 Kanno et al.
2007/0041464 A1 2/2007 Kim et al.
2007/0041554 A1 2/2007 Newman
2007/0054622 A1 3/2007 Berkman
2007/0063914 A1 3/2007 Becker et al.
2007/0090185 A1 4/2007 Lewkowitz et al.
2007/0103333 A1 5/2007 Michalski et al.
2007/0105508 A1 5/2007 Tong et al.
2007/0135044 A1 6/2007 Rhodes et al.
2007/0144779 A1 6/2007 Vicente et al.
2007/0164908 A1 7/2007 Turchinetz et al.
2007/0185621 A1 8/2007 Gilmore et al.
2007/0189182 A1 8/2007 Berkman et al.
2007/0201540 A1 8/2007 Berkman et al.
2007/0202913 A1 8/2007 Ban et al.
2007/0211689 A1 9/2007 Campero et al.
2007/0211786 A1 9/2007 Shattil et al.
2007/0216596 A1 9/2007 Lewis et al.
2007/0223381 A1 9/2007 Radtke et al.
2007/0226779 A1 9/2007 Yokomitsu et al.
2007/0229184 A1 10/2007 Liu et al.
2007/0229231 A1 10/2007 Hurwitz et al.
2007/0252998 A1 11/2007 Berthold et al.
2007/0257858 A1 11/2007 Liu et al.
2007/0258484 A1 11/2007 Tolaio et al.
2007/0268124 A1 11/2007 Berkman et al.
2007/0268846 A1 11/2007 Proctor et al.
2007/0300280 A1 12/2007 Turner et al.
2008/0002652 A1 1/2008 Gupta et al.
2008/0003872 A1 1/2008 Chen et al.
2008/0007416 A1 1/2008 Cern et al.
2008/0008116 A1 1/2008 Buga et al.
2008/0043655 A1 2/2008 Lee et al.
2008/0055149 A1 3/2008 Rees et al.
2008/0060832 A1 3/2008 Razavi et al.
2008/0064331 A1 3/2008 Washiro et al.
2008/0077336 A1 3/2008 Fernandes et al.
2008/0080389 A1 4/2008 Hart et al.
2008/0084937 A1 4/2008 Barthold et al.
2008/0094298 A1 4/2008 Kralovec et al.
2008/0101798 A1 5/2008 Healey et al.
2008/0120667 A1 5/2008 Zaltsman
2008/0122723 A1 5/2008 Rofougaran et al.
2008/0130639 A1 6/2008 Costa-Requena et al.
2008/0133922 A1 6/2008 Williams et al.
2008/0143491 A1 6/2008 Deaver et al.
2008/0150790 A1 6/2008 Voigtlaender et al.
2008/0151916 A1 6/2008 Jetcheva et al.

(56) References Cited

U.S. PATENT DOCUMENTS

2008/0153416 A1 6/2008 Washiro et al.
2008/0177678 A1 7/2008 Di Martini et al.
2008/0191851 A1 8/2008 Koga et al.
2008/0211727 A1 9/2008 Elmore et al.
2008/0238796 A1 10/2008 Rofougaran et al.
2008/0247716 A1 10/2008 Thomas et al.
2008/0252522 A1 10/2008 Asbridge et al.
2008/0253723 A1 10/2008 Stokes et al.
2008/0255782 A1 10/2008 Bilac et al.
2008/0258993 A1 10/2008 Gummalla et al.
2008/0266060 A1 10/2008 Takei et al.
2008/0267076 A1 10/2008 Laperi et al.
2008/0279199 A1 11/2008 Park et al.
2008/0280574 A1 11/2008 Rofougaran et al.
2008/0313691 A1 12/2008 Cholas
2009/0002137 A1 1/2009 Radtke et al.
2009/0007189 A1 1/2009 Gutknecht
2009/0007190 A1 1/2009 Weber et al.
2009/0007194 A1 1/2009 Brady, Jr. et al.
2009/0009408 A1 1/2009 Rofougaran et al.
2009/0015239 A1 1/2009 Georgiou et al.
2009/0054056 A1 2/2009 Gil et al.
2009/0054737 A1 2/2009 Magar et al.
2009/0061940 A1 3/2009 Scheinert et al.
2009/0067441 A1 3/2009 Ansari et al.
2009/0079660 A1 3/2009 Elmore
2009/0085726 A1 4/2009 Radtke et al.
2009/0088907 A1 4/2009 Lewis et al.
2009/0093267 A1 4/2009 Ariyur et al.
2009/0109981 A1 4/2009 Keselman
2009/0125351 A1 5/2009 Davis, Jr. et al.
2009/0129301 A1 5/2009 Belimpasakis et al.
2009/0135848 A1 5/2009 Chan et al.
2009/0138931 A1 5/2009 Lin et al.
2009/0140852 A1 6/2009 Stolarczyk et al.
2009/0144417 A1 6/2009 Kisel et al.
2009/0171780 A1 7/2009 Aldrey et al.
2009/0175195 A1 7/2009 Macauley et al.
2009/0181664 A1 7/2009 Kuruvilla et al.
2009/0201133 A1 8/2009 Bruns et al.
2009/0202020 A1 8/2009 Hafeez et al.
2009/0210901 A1 8/2009 Hawkins et al.
2009/0212938 A1 8/2009 Swaim et al.
2009/0250449 A1 10/2009 Petrenko et al.
2009/0254971 A1 10/2009 Herz et al.
2009/0258652 A1 10/2009 Lambert et al.
2009/0284435 A1 11/2009 Elmore et al.
2009/0286482 A1 11/2009 Gorokhov et al.
2009/0289863 A1 11/2009 Lier et al.
2009/0304124 A1 12/2009 Graef et al.
2009/0311960 A1 12/2009 Farahani et al.
2009/0315668 A1 12/2009 Leete, III et al.
2009/0320058 A1 12/2009 Wehmeyer et al.
2009/0325479 A1 12/2009 Chakrabarti et al.
2009/0325628 A1 12/2009 Becker et al.
2010/0002618 A1 1/2010 Eichinger et al.
2010/0002731 A1 1/2010 Kimura et al.
2010/0013696 A1 1/2010 Schmitt et al.
2010/0026607 A1 2/2010 Imai et al.
2010/0039339 A1 2/2010 Kuroda et al.
2010/0045447 A1 2/2010 Mollenkopf et al.
2010/0052799 A1 3/2010 Watanabe et al.
2010/0053019 A1 3/2010 Ikawa et al.
2010/0057894 A1 3/2010 Glasser
2010/0080203 A1 4/2010 Reynolds et al.
2010/0085036 A1 4/2010 Banting et al.
2010/0090887 A1 4/2010 Cooper et al.
2010/0091712 A1 4/2010 Lu et al.
2010/0100918 A1 4/2010 Egan, Jr. et al.
2010/0111521 A1 5/2010 Kim et al.
2010/0119234 A1 5/2010 Suematsu et al.
2010/0121945 A1 5/2010 Gerber et al.
2010/0127848 A1 5/2010 Mustapha et al.
2010/0141527 A1 6/2010 Lalezari et al.
2010/0142435 A1 6/2010 Kim et al.
2010/0150215 A1 6/2010 Black et al.
2010/0153990 A1 6/2010 Ress et al.
2010/0169937 A1 7/2010 Atwal et al.
2010/0175080 A1 7/2010 Yuen et al.
2010/0176894 A1 7/2010 Tahara et al.
2010/0177894 A1 7/2010 Yasuma et al.
2010/0185614 A1 7/2010 O'Brien et al.
2010/0201313 A1 8/2010 Vorenkamp et al.
2010/0214183 A1 8/2010 Stoneback et al.
2010/0214185 A1 8/2010 Sammoura et al.
2010/0220024 A1 9/2010 Snow et al.
2010/0224732 A1 9/2010 Olson et al.
2010/0225426 A1 9/2010 Unger et al.
2010/0232539 A1 9/2010 Han et al.
2010/0243633 A1 9/2010 Huynh et al.
2010/0253450 A1 10/2010 Kim et al.
2010/0256955 A1 10/2010 Pupalaikis et al.
2010/0265877 A1 10/2010 Foxworthy et al.
2010/0266063 A1 10/2010 Harel et al.
2010/0283693 A1 11/2010 Xie et al.
2010/0284446 A1 11/2010 Mu et al.
2010/0319068 A1 12/2010 Abbadessa et al.
2010/0327880 A1 12/2010 Stein et al.
2011/0018704 A1 1/2011 Burrows et al.
2011/0040861 A1 2/2011 Van der Merwe et al.
2011/0042120 A1 2/2011 Otsuka et al.
2011/0043051 A1 2/2011 Meskens et al.
2011/0053498 A1 3/2011 Nogueira-Nine
2011/0068893 A1 3/2011 Lahiri et al.
2011/0068988 A1 3/2011 Monte et al.
2011/0080301 A1 4/2011 Chang et al.
2011/0083399 A1 4/2011 Lettkeman et al.
2011/0103274 A1 5/2011 Vavik et al.
2011/0107364 A1 5/2011 Lajoie et al.
2011/0109499 A9 5/2011 Kienzle et al.
2011/0109936 A1 5/2011 Coffee et al.
2011/0110404 A1 5/2011 Washiro
2011/0118888 A1 5/2011 White et al.
2011/0130135 A1 6/2011 Trigui et al.
2011/0132658 A1 6/2011 Miller, II et al.
2011/0133865 A1 6/2011 Miller, II et al.
2011/0133867 A1 6/2011 Miller, II et al.
2011/0136432 A1 6/2011 Miller, II et al.
2011/0140911 A1 6/2011 Pant et al.
2011/0141555 A1 6/2011 Fermann et al.
2011/0143673 A1 6/2011 Landesman et al.
2011/0148578 A1 6/2011 Aloi et al.
2011/0148687 A1 6/2011 Wright et al.
2011/0164514 A1 7/2011 Afkhamie et al.
2011/0165847 A1 7/2011 Kawasaki et al.
2011/0169336 A1 7/2011 Yerazunis et al.
2011/0172000 A1 7/2011 Quigley et al.
2011/0173447 A1 7/2011 Zhang et al.
2011/0182174 A1 7/2011 Pi et al.
2011/0187578 A1 8/2011 Farneth et al.
2011/0199265 A1 8/2011 Lin et al.
2011/0201269 A1 8/2011 Hobbs et al.
2011/0208450 A1 8/2011 Salka et al.
2011/0214176 A1 9/2011 Burch et al.
2011/0219402 A1 9/2011 Candelore et al.
2011/0220394 A1 9/2011 Szylakowski et al.
2011/0225046 A1 9/2011 Eldering et al.
2011/0228814 A1 9/2011 Washiro et al.
2011/0235536 A1 9/2011 Nishizaka et al.
2011/0268085 A1 11/2011 Barany et al.
2011/0274396 A1 11/2011 Nakajima et al.
2011/0286506 A1 11/2011 Libby et al.
2011/0291878 A1 12/2011 McLaughlin et al.
2011/0294509 A1 12/2011 Kim et al.
2011/0311231 A1 12/2011 Ridgway et al.
2011/0316645 A1 12/2011 Takeuchi et al.
2012/0002973 A1 1/2012 Bruzzi et al.
2012/0015382 A1 1/2012 Weitz et al.
2012/0015654 A1 1/2012 Palanki et al.
2012/0019420 A1 1/2012 Caimi et al.
2012/0019427 A1 1/2012 Ishikawa et al.
2012/0038520 A1 2/2012 Cornwell et al.
2012/0039366 A1 2/2012 Wood et al.
2012/0046891 A1 2/2012 Yaney et al.

(56) References Cited

U.S. PATENT DOCUMENTS

2012/0054571 A1 3/2012 Howard
2012/0068903 A1 3/2012 Thevenard et al.
2012/0077485 A1 3/2012 Shin et al.
2012/0078452 A1 3/2012 Daum et al.
2012/0084807 A1 4/2012 Thompson et al.
2012/0091820 A1 4/2012 Campanella et al.
2012/0092161 A1 4/2012 West et al.
2012/0093078 A1 4/2012 Perlman et al.
2012/0102568 A1 4/2012 Tarbotton et al.
2012/0105246 A1 5/2012 Sexton et al.
2012/0105637 A1 5/2012 Yousefi et al.
2012/0109545 A1 5/2012 Meynardi et al.
2012/0109566 A1 5/2012 Adamian et al.
2012/0117584 A1 5/2012 Gordon
2012/0129566 A1 5/2012 Lee et al.
2012/0133373 A1 5/2012 Ali et al.
2012/0137332 A1 5/2012 Kumar et al.
2012/0144420 A1 6/2012 Del Sordo et al.
2012/0146861 A1 6/2012 Armbrecht et al.
2012/0153087 A1 6/2012 Collette et al.
2012/0154239 A1 6/2012 Bar-Sade et al.
2012/0161543 A1 6/2012 Reuven et al.
2012/0176906 A1 7/2012 Hartenstein et al.
2012/0181258 A1 7/2012 Shan et al.
2012/0190386 A1 7/2012 Anderson
2012/0197558 A1 8/2012 Henig et al.
2012/0201145 A1 8/2012 Ree et al.
2012/0214538 A1 8/2012 Kim et al.
2012/0224807 A1 9/2012 Winzer et al.
2012/0226394 A1 9/2012 Marcus et al.
2012/0235864 A1 9/2012 Lu et al.
2012/0235881 A1 9/2012 Pan et al.
2012/0250534 A1 10/2012 Langer et al.
2012/0250752 A1 10/2012 McHann et al.
2012/0263152 A1 10/2012 Fischer et al.
2012/0267863 A1 10/2012 Kiestet al.
2012/0268340 A1 10/2012 Capozzoli et al.
2012/0270507 A1 10/2012 Qin et al.
2012/0272741 A1 11/2012 Xiao et al.
2012/0274528 A1 11/2012 McMahon et al.
2012/0287922 A1 11/2012 Heck et al.
2012/0299671 A1 11/2012 Ikeda et al.
2012/0304294 A1 11/2012 Fujiwara et al.
2012/0306587 A1 12/2012 Strid et al.
2012/0306708 A1 12/2012 Henderson et al.
2012/0313895 A1 12/2012 Haroun et al.
2012/0319903 A1 12/2012 Huseth et al.
2012/0322380 A1 12/2012 Nannarone et al.
2012/0322492 A1 12/2012 Koo et al.
2012/0324018 A1 12/2012 Metcalf et al.
2012/0327908 A1 12/2012 Gupta et al.
2012/0329523 A1 12/2012 Stewart et al.
2012/0330756 A1 12/2012 Morris et al.
2013/0002409 A1 1/2013 Molina et al.
2013/0003876 A1 1/2013 Bennett
2013/0010679 A1 1/2013 Ma et al.
2013/0015922 A1 1/2013 Liu et al.
2013/0016022 A1 1/2013 Heiks et al.
2013/0023302 A1 1/2013 Sivanesan et al.
2013/0039624 A1 2/2013 Scherer et al.
2013/0064178 A1 3/2013 Cs et al.
2013/0064311 A1 3/2013 Turner et al.
2013/0070621 A1 3/2013 Marzetta et al.
2013/0077612 A1 3/2013 Khorami et al.
2013/0077664 A1 3/2013 Lee et al.
2013/0080290 A1 3/2013 Kamm
2013/0086639 A1 4/2013 Sondhi et al.
2013/0093638 A1 4/2013 Shoemaker et al.
2013/0095875 A1 4/2013 Reuven et al.
2013/0108206 A1 5/2013 Sasaoka et al.
2013/0109317 A1 5/2013 Kikuchi et al.
2013/0117852 A1 5/2013 Stute et al.
2013/0120548 A1 5/2013 Li et al.
2013/0122828 A1 5/2013 Choi et al.
2013/0124365 A1 5/2013 Pradeep
2013/0127678 A1 5/2013 Chandler et al.
2013/0136410 A1 5/2013 Sasaoka et al.
2013/0144750 A1 6/2013 Brown
2013/0148194 A1 6/2013 Altug et al.
2013/0159153 A1 6/2013 Lau et al.
2013/0159856 A1 6/2013 Ferren
2013/0160122 A1 6/2013 Choi et al.
2013/0162490 A1 6/2013 Blech et al.
2013/0166690 A1 6/2013 Shatzkamer et al.
2013/0169499 A1 7/2013 Lin et al.
2013/0173807 A1 7/2013 De Groot et al.
2013/0178998 A1 7/2013 Gadiraju et al.
2013/0182804 A1 7/2013 Yutaka et al.
2013/0185552 A1 7/2013 Steer et al.
2013/0187636 A1 7/2013 Kast et al.
2013/0191052 A1 7/2013 Fernandez et al.
2013/0201006 A1 8/2013 Kummetz et al.
2013/0201904 A1 8/2013 Toskala et al.
2013/0205370 A1 8/2013 Kalgi et al.
2013/0207681 A1 8/2013 Slupsky et al.
2013/0207859 A1 8/2013 Legay et al.
2013/0219308 A1 8/2013 Britton et al.
2013/0230235 A1 9/2013 Tateno et al.
2013/0234904 A1 9/2013 Blech et al.
2013/0234961 A1 9/2013 Garfinkel et al.
2013/0235845 A1 9/2013 Kovvali et al.
2013/0235871 A1 9/2013 Brzozowski et al.
2013/0241726 A1 9/2013 Hunter et al.
2013/0262656 A1 10/2013 Cao et al.
2013/0262857 A1 10/2013 Neuman et al.
2013/0263263 A1 10/2013 Narkolayev et al.
2013/0265732 A1 10/2013 Herbsommer et al.
2013/0266026 A1 10/2013 McCormack et al.
2013/0268414 A1 10/2013 Lehtiniemi
2013/0271349 A1 10/2013 Wright et al.
2013/0278464 A1 10/2013 Xia et al.
2013/0279523 A1 10/2013 Denney et al.
2013/0279561 A1 10/2013 Jin et al.
2013/0279868 A1 10/2013 Zhang et al.
2013/0279914 A1 10/2013 Brooks et al.
2013/0285864 A1 10/2013 Clymer et al.
2013/0303089 A1 11/2013 Wang et al.
2013/0305369 A1 11/2013 Karta et al.
2013/0306351 A1 11/2013 Lambert et al.
2013/0307645 A1 11/2013 Mita et al.
2013/0311661 A1 11/2013 McPhee
2013/0314182 A1 11/2013 Takeda et al.
2013/0321225 A1 12/2013 Pettus et al.
2013/0326063 A1 12/2013 Burch et al.
2013/0326494 A1 12/2013 Nunez et al.
2013/0330050 A1 12/2013 Yang et al.
2013/0335165 A1 12/2013 Arnold et al.
2013/0336370 A1 12/2013 Jovanovic et al.
2013/0336418 A1 12/2013 Tomeba et al.
2013/0341094 A1 12/2013 Taherian et al.
2013/0342287 A1 12/2013 Randall et al.
2013/0343213 A1 12/2013 Reynolds et al.
2013/0343351 A1 12/2013 Sambhwani et al.
2014/0003394 A1 1/2014 Rubin et al.
2014/0003775 A1 1/2014 Ko et al.
2014/0007076 A1 1/2014 Kim et al.
2014/0009270 A1 1/2014 Yamazaki et al.
2014/0009822 A1 1/2014 Dong et al.
2014/0015705 A1 1/2014 Ebihara
2014/0019576 A1 1/2014 Lobo et al.
2014/0026170 A1 1/2014 Francisco et al.
2014/0028184 A1 1/2014 Voronin et al.
2014/0028190 A1 1/2014 Voronin et al.
2014/0028532 A1 1/2014 Ehrenberg et al.
2014/0032005 A1 1/2014 Iwamura
2014/0036694 A1 2/2014 Courtice et al.
2014/0041925 A1 2/2014 Siripurapu et al.
2014/0043189 A1 2/2014 Lee et al.
2014/0043977 A1 2/2014 Wiley et al.
2014/0044139 A1 2/2014 Dong et al.
2014/0050212 A1 2/2014 Braz et al.
2014/0052810 A1 2/2014 Osorio et al.
2014/0056130 A1 2/2014 Grayson et al.
2014/0057576 A1 2/2014 Liu et al.

(56) References Cited

U.S. PATENT DOCUMENTS

2014/0062784 A1 3/2014 Rison et al.
2014/0071818 A1 3/2014 Wang et al.
2014/0072064 A1 3/2014 Lemson et al.
2014/0072299 A1 3/2014 Stapleton et al.
2014/0077995 A1 3/2014 Artemenko et al.
2014/0086080 A1 3/2014 Hui et al.
2014/0086152 A1 3/2014 Bontu et al.
2014/0102743 A1 4/2014 Doneker et al.
2014/0112184 A1 4/2014 Chai
2014/0114635 A1 4/2014 Sato et al.
2014/0124236 A1 5/2014 Vu et al.
2014/0126914 A1 5/2014 Berlin et al.
2014/0130111 A1 5/2014 Nulty et al.
2014/0132728 A1 5/2014 Verano et al.
2014/0139375 A1 5/2014 Faragher et al.
2014/0143055 A1 5/2014 Johnson
2014/0146902 A1 5/2014 Liu et al.
2014/0148107 A1 5/2014 Maltsev et al.
2014/0155054 A1 6/2014 Henry et al.
2014/0165145 A1 6/2014 Baentsch et al.
2014/0169186 A1 6/2014 Zhu et al.
2014/0177692 A1 6/2014 Yu et al.
2014/0179302 A1 6/2014 Polehn et al.
2014/0189677 A1 7/2014 Curzi et al.
2014/0189732 A1 7/2014 Shkedi et al.
2014/0191913 A1 7/2014 Ge et al.
2014/0204000 A1 7/2014 Sato et al.
2014/0204754 A1 7/2014 Jeong et al.
2014/0207844 A1 7/2014 Mayo et al.
2014/0208272 A1 7/2014 Vats et al.
2014/0211883 A1* 7/2014 Chai .................... H04L 1/0034 375/296
2014/0222997 A1 8/2014 Mermoud et al.
2014/0223527 A1 8/2014 Bortz et al.
2014/0225129 A1 8/2014 Inoue et al.
2014/0227905 A1 8/2014 Knott et al.
2014/0227966 A1 8/2014 Artemenko et al.
2014/0233900 A1 8/2014 Hugonnot et al.
2014/0241718 A1 8/2014 Jiang et al.
2014/0254516 A1 9/2014 Lee et al.
2014/0254896 A1 9/2014 Zhou et al.
2014/0254979 A1 9/2014 Zhang et al.
2014/0266946 A1 9/2014 Stevenson et al.
2014/0266953 A1 9/2014 Yen et al.
2014/0267700 A1 9/2014 Wang et al.
2014/0269260 A1 9/2014 Xue
2014/0269691 A1 9/2014 Xue et al.
2014/0269972 A1 9/2014 Rada et al.
2014/0273873 A1 9/2014 Huynh et al.
2014/0285277 A1 9/2014 Herbsommer et al.
2014/0285293 A1 9/2014 Schuppener et al.
2014/0285294 A1 9/2014 Haroun et al.
2014/0285373 A1 9/2014 Kuwahara et al.
2014/0285389 A1 9/2014 Fakharzadeh et al.
2014/0286189 A1 9/2014 Kang et al.
2014/0286235 A1 9/2014 Chang et al.
2014/0286284 A1 9/2014 Lim et al.
2014/0287702 A1 9/2014 Schuppener et al.
2014/0299349 A1 10/2014 Yamaguchi et al.
2014/0304498 A1 10/2014 Gonuguntla et al.
2014/0317229 A1 10/2014 Hughes et al.
2014/0320364 A1 10/2014 Gu et al.
2014/0321273 A1 10/2014 Morrill et al.
2014/0325594 A1 10/2014 Klein et al.
2014/0334773 A1 11/2014 Mathai et al.
2014/0334789 A1 11/2014 Matsuo et al.
2014/0340271 A1 11/2014 Petkov et al.
2014/0343883 A1 11/2014 Libby et al.
2014/0349696 A1 11/2014 Hyde et al.
2014/0351571 A1 11/2014 Jacobs
2014/0355525 A1 12/2014 Barzegar et al.
2014/0355989 A1 12/2014 Finckelstein
2014/0357269 A1 12/2014 Zhou et al.
2014/0359275 A1 12/2014 Murugesan et al.
2014/0362374 A1 12/2014 Santori
2014/0362694 A1 12/2014 Rodrigues
2014/0368301 A1 12/2014 Herbsommer et al.
2014/0369430 A1 12/2014 Parnell
2014/0372068 A1 12/2014 Seto et al.
2014/0373053 A1 12/2014 Leley et al.
2014/0376655 A1 12/2014 Ruan et al.
2015/0008996 A1 1/2015 Jessup et al.
2015/0009089 A1 1/2015 Pesa
2015/0016260 A1 1/2015 Chow et al.
2015/0017473 A1 1/2015 Verhoeven et al.
2015/0022399 A1 1/2015 Flannery et al.
2015/0026460 A1 1/2015 Walton
2015/0029065 A1 1/2015 Cheng
2015/0036610 A1 2/2015 Kim et al.
2015/0042526 A1 2/2015 Zeine
2015/0048238 A1 2/2015 Kawai
2015/0049998 A1 2/2015 Dumais
2015/0061859 A1 3/2015 Matsuoka et al.
2015/0065166 A1 3/2015 Ward et al.
2015/0070231 A1 3/2015 Kim et al.
2015/0071594 A1 3/2015 Register
2015/0073594 A1 3/2015 Trujillo et al.
2015/0077740 A1 3/2015 Fuse
2015/0078756 A1 3/2015 Soto et al.
2015/0084660 A1 3/2015 Knierim et al.
2015/0084703 A1 3/2015 Sanduleanu
2015/0084814 A1 3/2015 Rojanski et al.
2015/0091650 A1 4/2015 Nobbe
2015/0094104 A1 4/2015 Wilmhoff et al.
2015/0098387 A1 4/2015 Garg et al.
2015/0099555 A1 4/2015 Krishnaswamy et al.
2015/0102972 A1 4/2015 Scire-Scappuzzo et al.
2015/0103685 A1 4/2015 Butchko et al.
2015/0104005 A1 4/2015 Holman
2015/0105115 A1 4/2015 Hata et al.
2015/0109178 A1 4/2015 Hyde et al.
2015/0116154 A1 4/2015 Artemenko
2015/0185425 A1 4/2015 Gundel et al.
2015/0122886 A1 5/2015 Koch
2015/0126107 A1 5/2015 Bennett et al.
2015/0130675 A1 5/2015 Parsche
2015/0138022 A1 5/2015 Takahashi
2015/0138144 A1 5/2015 Tanabe
2015/0153248 A1 6/2015 Hayward et al.
2015/0156266 A1 6/2015 Gupta
2015/0162988 A1 6/2015 Henry et al.
2015/0171522 A1 6/2015 Liu et al.
2015/0172036 A1 6/2015 Katar et al.
2015/0181449 A1 6/2015 Didenko et al.
2015/0195349 A1 7/2015 Cardamore
2015/0195719 A1 7/2015 Rahman
2015/0201228 A1 7/2015 Hasek
2015/0207527 A1 7/2015 Eliaz et al.
2015/0214615 A1 7/2015 Patel et al.
2015/0215268 A1 7/2015 Dinha
2015/0223078 A1 8/2015 Bennett et al.
2015/0223113 A1 8/2015 Matsunaga
2015/0223160 A1 8/2015 Ho
2015/0230109 A1 8/2015 Turner et al.
2015/0234122 A1 8/2015 Andle
2015/0236778 A1 8/2015 Jalali
2015/0236779 A1 8/2015 Jalali
2015/0237519 A1 8/2015 Ghai
2015/0249965 A1 9/2015 Dussmann et al.
2015/0263424 A1 9/2015 Sanford
2015/0271830 A1 9/2015 Shin et al.
2015/0276577 A1 10/2015 Ruege et al.
2015/0277569 A1 10/2015 Sprenger
2015/0280328 A1 10/2015 Sanford et al.
2015/0284079 A1 10/2015 Matsuda
2015/0288532 A1 10/2015 Veyseh et al.
2015/0289247 A1 10/2015 Liu et al.
2015/0303892 A1 10/2015 Desclos
2015/0304045 A1 10/2015 Henry et al.
2015/0304869 A1 10/2015 Johnson et al.
2015/0311951 A1 10/2015 Hariz
2015/0312774 A1 10/2015 Lau
2015/0318610 A1 11/2015 Lee et al.
2015/0323948 A1 11/2015 Jeong

(56) References Cited

U.S. PATENT DOCUMENTS

2015/0325913 A1 11/2015 Vagman
2015/0326274 A1 11/2015 Flood
2015/0326287 A1 11/2015 Kazmi et al.
2015/0333386 A1 11/2015 Kaneda et al.
2015/0333804 A1 11/2015 Yang et al.
2015/0334769 A1 11/2015 Kim et al.
2015/0339912 A1 11/2015 Farrand et al.
2015/0344136 A1 12/2015 Dahlstrom
2015/0349415 A1 12/2015 Iwanaka
2015/0356482 A1 12/2015 Whipple et al.
2015/0356848 A1 12/2015 Hatch
2015/0369660 A1 12/2015 Yu
2015/0370251 A1 12/2015 Siegel et al.
2015/0373557 A1 12/2015 Bennett et al.
2015/0380814 A1 12/2015 Boutayeb et al.
2015/0382208 A1 12/2015 Elliott et al.
2015/0382363 A1 12/2015 Wang et al.
2016/0006129 A1 1/2016 Haziza
2016/0012460 A1 1/2016 Kruglick
2016/0014749 A1 1/2016 Kang et al.
2016/0021545 A1 1/2016 Shaw
2016/0026301 A1 1/2016 Zhou et al.
2016/0029009 A1 1/2016 Lu et al.
2016/0038074 A1 2/2016 Brown et al.
2016/0043478 A1 2/2016 Hartenstein
2016/0044705 A1 2/2016 Gao
2016/0050028 A1 2/2016 Henry et al.
2016/0056543 A1 2/2016 Kwiatkowski
2016/0063642 A1 3/2016 Luciani et al.
2016/0064794 A1 3/2016 Henry et al.
2016/0065252 A1 3/2016 Preschutti
2016/0065335 A1 3/2016 Koo et al.
2016/0066191 A1 3/2016 Li
2016/0068265 A1 3/2016 Hoareau et al.
2016/0068277 A1 3/2016 Manitta
2016/0069934 A1 3/2016 Saxby et al.
2016/0070265 A1 3/2016 Liu et al.
2016/0072173 A1 3/2016 Herbsommer et al.
2016/0072191 A1 3/2016 Iwai
2016/0072287 A1 3/2016 Jia
2016/0079769 A1 3/2016 Corum et al.
2016/0079771 A1 3/2016 Corum
2016/0079809 A1 3/2016 Corum et al.
2016/0080035 A1 3/2016 Fuchs et al.
2016/0080839 A1 3/2016 Fuchs et al.
2016/0082460 A1 3/2016 McMaster et al.
2016/0087344 A1 3/2016 Artemenko et al.
2016/0088498 A1 3/2016 Sharawi
2016/0094420 A1 3/2016 Clemm et al.
2016/0094879 A1 3/2016 Gerszberg et al.
2016/0069935 A1 4/2016 Kreikebaum et al.
2016/0099749 A1 4/2016 Bennett et al.
2016/0100324 A1 4/2016 Henry et al.
2016/0103199 A1 4/2016 Rappaport
2016/0105218 A1 4/2016 Henry et al.
2016/0105233 A1 4/2016 Jalali
2016/0105239 A1 4/2016 Henry et al.
2016/0105255 A1 4/2016 Henry et al.
2016/0111890 A1 4/2016 Corum et al.
2016/0112092 A1 4/2016 Henry et al.
2016/0112093 A1 4/2016 Barzegar
2016/0112094 A1 4/2016 Stuckman et al.
2016/0112115 A1 4/2016 Henry et al.
2016/0112132 A1 4/2016 Henry et al.
2016/0112133 A1 4/2016 Henry et al.
2016/0112135 A1 4/2016 Henry et al.
2016/0112263 A1 4/2016 Henry et al.
2016/0116914 A1 4/2016 Mucci
2016/0118717 A1 4/2016 Britz et al.
2016/0124071 A1 5/2016 Baxley et al.
2016/0127931 A1 5/2016 Baxley et al.
2016/0131347 A1 5/2016 Hill et al.
2016/0134006 A1 5/2016 Ness et al.
2016/0135132 A1 5/2016 Donepudi et al.
2016/0135184 A1 5/2016 Zavadsky et al.
2016/0137311 A1 5/2016 Peverill et al.
2016/0139731 A1 5/2016 Kim
2016/0149312 A1 5/2016 Henry et al.
2016/0149614 A1 5/2016 Barzegar
2016/0149636 A1 5/2016 Gerszberg et al.
2016/0149665 A1 5/2016 Henry et al.
2016/0149731 A1 5/2016 Henry et al.
2016/0149753 A1 5/2016 Gerszberg et al.
2016/0150427 A1 5/2016 Ramanath
2016/0153938 A1 6/2016 Balasubramaniam et al.
2016/0164571 A1 6/2016 Bennett et al.
2016/0164573 A1 6/2016 Birk et al.
2016/0165472 A1 6/2016 Gopalakrishnan et al.
2016/0165478 A1 6/2016 Yao et al.
2016/0174040 A1 6/2016 Roberts et al.
2016/0179134 A1 6/2016 Ryu
2016/0181701 A1 6/2016 Sangaran et al.
2016/0182161 A1 6/2016 Barzegar
2016/0182981 A1 6/2016 Minarik et al.
2016/0188291 A1 6/2016 Vilermo et al.
2016/0189101 A1 6/2016 Kantor et al.
2016/0197392 A1 7/2016 Henry et al.
2016/0197409 A1 7/2016 Henry et al.
2016/0197630 A1 7/2016 Kawasaki
2016/0197642 A1 7/2016 Henry et al.
2016/0207627 A1 7/2016 Hoareau et al.
2016/0211566 A1 7/2016 Kikuchi et al.
2016/0212065 A1 7/2016 To et al.
2016/0212641 A1 7/2016 Kong et al.
2016/0214717 A1 7/2016 De Silva
2016/0218407 A1 7/2016 Henry et al.
2016/0218437 A1 7/2016 Guntupalli
2016/0221039 A1 8/2016 Fuchs et al.
2016/0224235 A1 8/2016 Forsstrom
2016/0226681 A1 8/2016 Henry et al.
2016/0244165 A1 8/2016 Patrick et al.
2016/0248149 A1 8/2016 Kim et al.
2016/0248165 A1 8/2016 Henry
2016/0248509 A1 8/2016 Henry
2016/0249233 A1 8/2016 Murray
2016/0252970 A1 9/2016 Dahl
2016/0261309 A1 9/2016 Henry
2016/0261310 A1 9/2016 Fuchs et al.
2016/0261312 A1 9/2016 Fuchs et al.
2016/0269156 A1 9/2016 Barzegar et al.
2016/0276725 A1 9/2016 Barnickel et al.
2016/0277939 A1 9/2016 Bertrand et al.
2016/0285508 A1 9/2016 Bennett et al.
2016/0285512 A1 9/2016 Henry et al.
2016/0294444 A1 10/2016 Gerszberg et al.
2016/0294517 A1 10/2016 Barzegar et al.
2016/0295431 A1 10/2016 Henry et al.
2016/0306361 A1 10/2016 Shalom et al.
2016/0315659 A1 10/2016 Henry
2016/0315660 A1 10/2016 Henry
2016/0315661 A1 10/2016 Henry
2016/0315662 A1 10/2016 Henry
2016/0322691 A1 11/2016 Bennett et al.
2016/0329957 A1 11/2016 Schmid et al.
2016/0336091 A1 11/2016 Henry et al.
2016/0336092 A1 11/2016 Henry et al.
2016/0336636 A1 11/2016 Henry et al.
2016/0336996 A1 11/2016 Henry
2016/0336997 A1 11/2016 Henry
2016/0351987 A1 12/2016 Henry
2016/0359523 A1 12/2016 Bennett
2016/0359524 A1 12/2016 Bennett et al.
2016/0359529 A1 12/2016 Bennett et al.
2016/0359530 A1 12/2016 Bennett
2016/0359541 A1 12/2016 Bennett
2016/0359542 A1 12/2016 Bennett
2016/0359543 A1 12/2016 Bennett et al.
2016/0359544 A1 12/2016 Bennett
2016/0359546 A1 12/2016 Bennett
2016/0359547 A1 12/2016 Bennett et al.
2016/0359649 A1 12/2016 Bennett et al.
2016/0360511 A1 12/2016 Barzegar
2016/0360533 A1 12/2016 Bennett et al.
2016/0365175 A1 12/2016 Bennett et al.

(56) References Cited

U.S. PATENT DOCUMENTS

| | | | |
|---|---|---|---|
| 2016/0365893 | A1 | 12/2016 | Bennett et al. |
| 2016/0365894 | A1 | 12/2016 | Bennett et al. |
| 2016/0365897 | A1 | 12/2016 | Gross |
| 2016/0365916 | A1 | 12/2016 | Bennett et al. |
| 2016/0365966 | A1 | 12/2016 | Bennett et al. |
| 2016/0366586 | A1 | 12/2016 | Gross et al. |
| 2016/0366587 | A1 | 12/2016 | Gross |
| 2016/0373164 | A1 | 12/2016 | Kawasaki et al. |
| 2016/0373937 | A1 | 12/2016 | Bennett et al. |
| 2016/0380327 | A1 | 12/2016 | Henry |
| 2016/0380328 | A1 | 12/2016 | Henry |
| 2016/0380358 | A1 | 12/2016 | Henry |
| 2016/0380701 | A1 | 12/2016 | Henry et al. |
| 2016/0380702 | A1 | 12/2016 | Henry et al. |
| 2017/0018174 | A1 | 1/2017 | Gerszberg |
| 2017/0018332 | A1 | 1/2017 | Barzegar et al. |
| 2017/0018830 | A1 | 1/2017 | Henry et al. |
| 2017/0018831 | A1 | 1/2017 | Henry et al. |
| 2017/0018832 | A1 | 1/2017 | Henry et al. |
| 2017/0018833 | A1 | 1/2017 | Henry et al. |
| 2017/0018851 | A1 | 1/2017 | Henry et al. |
| 2017/0018852 | A1 | 1/2017 | Adriazola et al. |
| 2017/0018856 | A1 | 1/2017 | Henry |
| 2017/0019130 | A1 | 1/2017 | Henry et al. |
| 2017/0019131 | A1 | 1/2017 | Henry et al. |
| 2017/0019150 | A1 | 1/2017 | Henry et al. |
| 2017/0019189 | A1 | 1/2017 | Henry et al. |
| 2017/0025728 | A1 | 1/2017 | Henry et al. |
| 2017/0025732 | A1 | 1/2017 | Henry et al. |
| 2017/0025734 | A1 | 1/2017 | Henry et al. |
| 2017/0025839 | A1 | 1/2017 | Henry et al. |
| 2017/0026063 | A1 | 1/2017 | Henry |
| 2017/0026082 | A1 | 1/2017 | Henry et al. |
| 2017/0026084 | A1 | 1/2017 | Henry et al. |
| 2017/0026129 | A1 | 1/2017 | Henry |
| 2017/0033464 | A1 | 2/2017 | Henry et al. |
| 2017/0033465 | A1 | 2/2017 | Henry et al. |
| 2017/0033466 | A1 | 2/2017 | Henry et al. |
| 2017/0033834 | A1 | 2/2017 | Gross |
| 2017/0033835 | A1 | 2/2017 | Bennett et al. |
| 2017/0033953 | A1 | 2/2017 | Henry et al. |
| 2017/0033954 | A1 | 2/2017 | Henry et al. |
| 2017/0034042 | A1 | 2/2017 | Gross et al. |
| 2017/0041081 | A1 | 2/2017 | Henry et al. |
| 2017/0047662 | A1 | 2/2017 | Henry et al. |
| 2017/0063430 | A1 | 3/2017 | Shala |
| 2017/0064715 | A1 | 3/2017 | Niewczas |
| 2017/0069944 | A1 | 3/2017 | Henry |
| 2017/0075677 | A1 | 3/2017 | Gross et al. |
| 2017/0077998 | A1 | 3/2017 | Gerszberg et al. |
| 2017/0078063 | A1 | 3/2017 | Gerszberg |
| 2017/0078064 | A1 | 3/2017 | Gerszberg et al. |
| 2017/0079024 | A1 | 3/2017 | Gerszberg |
| 2017/0079036 | A1 | 3/2017 | Gerszberg |
| 2017/0079037 | A1 | 3/2017 | Gerszberg et al. |
| 2017/0079038 | A1 | 3/2017 | Gerszberg et al. |
| 2017/0079039 | A1 | 3/2017 | Gerszberg et al. |
| 2017/0085003 | A1 | 3/2017 | Johnson et al. |
| 2017/0085295 | A1 | 3/2017 | Stuckman |
| 2017/0085336 | A1 | 3/2017 | Henry |
| 2017/0093693 | A1 | 3/2017 | Barzegar et al. |
| 2017/0093807 | A1 | 3/2017 | Gross et al. |
| 2017/0098881 | A1 | 4/2017 | Barnickel et al. |
| 2017/0098884 | A1 | 4/2017 | Barnickel et al. |
| 2017/0098889 | A1 | 4/2017 | Henry |
| 2017/0099079 | A1 | 4/2017 | Gross |
| 2017/0110795 | A1 | 4/2017 | Henry |
| 2017/0110804 | A1 | 4/2017 | Henry et al. |
| 2017/0111805 | A1 | 4/2017 | Barzegar et al. |
| 2017/0117937 | A1 | 4/2017 | Henry |
| 2017/0117938 | A1 | 4/2017 | Henry |
| 2017/0117939 | A1 | 4/2017 | Gerszberg et al. |
| 2017/0117941 | A1 | 4/2017 | Gerszberg et al. |
| 2017/0127290 | A1 | 5/2017 | Uelk et al. |
| 2017/0141856 | A1 | 5/2017 | Barzegar et al. |
| 2017/0149489 | A1 | 5/2017 | Bennett |
| 2017/0163526 | A1 | 6/2017 | Henry |
| 2017/0179563 | A1 | 6/2017 | Henry et al. |
| 2017/0179608 | A1 | 6/2017 | Henry et al. |
| 2017/0179609 | A1 | 6/2017 | Henry |
| 2017/0180801 | A1 | 6/2017 | Gerszberg et al. |

FOREIGN PATENT DOCUMENTS

| | | | |
|---|---|---|---|
| AU | 606303 | B2 | 1/1991 |
| AU | 7261000 | A | 4/2001 |
| AU | 760272 | B2 | 5/2003 |
| AU | 2005227368 | B2 | 2/2009 |
| AU | 2010101079 | A4 | 11/2010 |
| AU | 2007215252 | B2 | 1/2011 |
| AU | 201400748 | | 3/2014 |
| AU | 2014200748 | A1 | 3/2014 |
| CA | 1136267 | A1 | 11/1982 |
| CA | 1211813 | A1 | 9/1986 |
| CA | 1328009 | C | 3/1994 |
| CA | 2260380 | C | 12/2000 |
| CA | 2449596 | A1 | 6/2005 |
| CA | 2515560 | A1 | 2/2007 |
| CA | 2664573 | A1 | 4/2008 |
| CA | 2467988 | C | 11/2010 |
| CA | 101075702 | B | 2/2011 |
| CA | 2777147 | A1 | 4/2011 |
| CA | 102280709 | A | 12/2011 |
| CA | 2814529 | A1 | 4/2012 |
| CA | 2787580 | A1 | 2/2013 |
| CA | 2927054 | A1 | 5/2015 |
| CA | 2940976 | | 9/2015 |
| CN | 2116969 | U | 9/1992 |
| CN | 1155354 | C | 7/1997 |
| CN | 1411563 | A | 4/2003 |
| CN | 1126425 | C | 10/2003 |
| CN | 2730033 | Y | 9/2005 |
| CN | 1833397 | A | 9/2006 |
| CN | 1885736 | A | 12/2006 |
| CN | 201048157 | Y | 4/2008 |
| CN | 201146495 | Y | 11/2008 |
| CN | 201207179 | Y | 3/2009 |
| CN | 100502181 | C | 6/2009 |
| CN | 201282193 | Y | 7/2009 |
| CN | 101834011 | U | 4/2010 |
| CN | 1823275 | B | 5/2010 |
| CN | 101785201 | A | 7/2010 |
| CN | 1820482 | B | 12/2010 |
| CN | 101978613 | A | 2/2011 |
| CN | 102130698 | A | 7/2011 |
| CN | 102136634 | A | 7/2011 |
| CN | 201985870 | U | 9/2011 |
| CN | 102208716 | A | 10/2011 |
| CN | 102280704 | A | 12/2011 |
| CN | 202093126 | U | 12/2011 |
| CN | 102351415 | A | 2/2012 |
| CN | 102396111 | A | 3/2012 |
| CN | 202253536 | U | 5/2012 |
| CN | 102544736 | A | 7/2012 |
| CN | 102590893 | A | 7/2012 |
| CN | 102694351 | A | 9/2012 |
| CN | 202424729 | U | 9/2012 |
| CN | 101662076 | B | 11/2012 |
| CN | 102017692 | B | 4/2013 |
| CN | 103078673 | A | 5/2013 |
| CN | 103117118 | A | 5/2013 |
| CN | 103163881 | A | 6/2013 |
| CN | 203204743 | U | 9/2013 |
| CN | 1863244 | B | 10/2013 |
| CN | 101958461 | B | 11/2013 |
| CN | 103700442 | A | 4/2014 |
| CN | 103943925 | A | 7/2014 |
| CN | 104052742 | A | 9/2014 |
| CN | 104064844 | A | 9/2014 |
| CN | 203813973 | U | 9/2014 |
| CN | 104091987 | A | 10/2014 |
| CN | 104092028 | A | 10/2014 |
| CN | 203931626 | U | 11/2014 |
| CN | 203950607 | U | 11/2014 |

(56) References Cited

FOREIGN PATENT DOCUMENTS

| | | | |
|---|---|---|---|
| CN | 1 041 81 552 | A | 12/2014 |
| CN | 204538183 | | 8/2015 |
| CN | 102412442 | B | 10/2015 |
| CN | 204760545 | U | 11/2015 |
| CN | 105262551 | A | 1/2016 |
| CN | 205265924 | | 1/2016 |
| CN | 105359572 | A | 2/2016 |
| CN | 105453340 | | 3/2016 |
| CN | 105594138 | A | 5/2016 |
| CN | 104162995 | B | 6/2016 |
| CN | 105813193 | A | 7/2016 |
| DE | 3504546 | A1 | 8/1986 |
| DE | 3533204 | A1 | 3/1987 |
| DE | 3533211 | A1 | 3/1987 |
| DE | 3827956 | A1 | 3/1989 |
| DE | 4027367 | C1 | 7/1991 |
| DE | 4225595 | C1 | 9/1993 |
| DE | 19501448 | A1 | 7/1996 |
| DE | 19939832 | A1 | 2/2001 |
| DE | 10043761 | C2 | 11/2002 |
| DE | 102004024356 | A1 | 9/2005 |
| DE | 69732676 | T2 | 4/2006 |
| DE | 4337835 | B4 | 5/2008 |
| DE | 102007049914 | A1 | 4/2009 |
| DE | 102012004998 | A1 | 7/2013 |
| DE | 102012203816 | A1 | 9/2013 |
| EP | 0102846 | | 3/1984 |
| EP | 0110478 | | 6/1984 |
| EP | 0136818 | | 4/1985 |
| EP | 0280379 | | 8/1988 |
| EP | 0330303 | | 8/1989 |
| EP | 0331248 | | 9/1989 |
| EP | 0342149 | | 11/1989 |
| EP | 0391719 | | 4/1990 |
| EP | 425979 | A2 | 5/1991 |
| EP | 0485467 | | 5/1992 |
| EP | 272785 | B1 | 2/1994 |
| EP | 0651487 | | 10/1994 |
| EP | 0371660 | | 4/1996 |
| EP | 0756392 | | 1/1997 |
| EP | 834722 | A2 | 4/1998 |
| EP | 0840464 | | 5/1998 |
| EP | 0871241 | B1 | 10/1998 |
| EP | 0890132 | | 1/1999 |
| EP | 755092 | A3 | 4/1999 |
| EP | 0896380 | | 10/1999 |
| EP | 676648 | B1 | 5/2000 |
| EP | 1085599 | A2 | 3/2001 |
| EP | 0907983 | B1 | 6/2001 |
| EP | 0756786 | | 8/2001 |
| EP | 1127283 | A1 | 8/2001 |
| EP | 1129550 | A1 | 9/2001 |
| EP | 1184930 | A1 | 3/2002 |
| EP | 1195847 | A2 | 4/2002 |
| EP | 1237303 | A2 | 9/2002 |
| EP | 1296146 | A1 | 3/2003 |
| EP | 0772061 | | 7/2003 |
| EP | 1346431 | A1 | 9/2003 |
| EP | 1249056 | B1 | 1/2004 |
| EP | 1376755 | A1 | 1/2004 |
| EP | 1401048 | A1 | 3/2004 |
| EP | 1454422 | A1 | 9/2004 |
| EP | 1488397 | A1 | 12/2004 |
| EP | 1509970 | | 3/2005 |
| EP | 1371108 | B1 | 6/2005 |
| EP | 1550327 | A2 | 7/2005 |
| EP | 1341255 | B8 | 8/2005 |
| EP | 1577687 | A1 | 9/2005 |
| EP | 1312135 | B1 | 11/2005 |
| EP | 1608110 | A1 | 12/2005 |
| EP | 1624685 | A2 | 2/2006 |
| EP | 1642468 | A2 | 4/2006 |
| EP | 1647072 | A1 | 4/2006 |
| EP | 1608110 | B1 | 10/2006 |
| EP | 1793508 | A1 | 6/2007 |
| EP | 1842265 | A1 | 10/2007 |
| EP | 1898532 | A2 | 3/2008 |
| EP | 1930982 | A1 | 6/2008 |
| EP | 1953940 | A1 | 8/2008 |
| EP | 1696509 | B1 | 10/2009 |
| EP | 2159749 | A1 | 3/2010 |
| EP | 2165550 | A1 | 3/2010 |
| EP | 1166599 | B1 | 5/2010 |
| EP | 1807950 | A4 | 1/2011 |
| EP | 2404347 | A2 | 1/2012 |
| EP | 2472671 | A1 | 7/2012 |
| EP | 1817855 | B1 | 1/2013 |
| EP | 2568528 | A2 | 3/2013 |
| EP | 2302735 | B1 | 9/2013 |
| EP | 2472737 | B1 | 9/2013 |
| EP | 2640115 | A1 | 9/2013 |
| EP | 2016643 | B1 | 7/2014 |
| EP | 2760081 | A1 | 7/2014 |
| EP | 2804259 | A1 | 11/2014 |
| EP | 2507939 | B1 | 12/2014 |
| EP | 2680452 | B1 | 1/2015 |
| EP | 2838155 | A1 | 2/2015 |
| EP | 2846480 | A1 | 3/2015 |
| EP | 2849524 | A1 | 3/2015 |
| EP | 2850695 | A1 | 3/2015 |
| EP | 2853902 | A1 | 4/2015 |
| EP | 2854361 | A1 | 4/2015 |
| EP | 2870802 | A1 | 5/2015 |
| EP | 2710400 | A4 | 6/2015 |
| EP | 3076482 | A1 | 10/2016 |
| FR | 2119804 | A1 | 8/1972 |
| FR | 2214161 | A1 | 8/1974 |
| FR | 2416562 | A1 | 8/1979 |
| FR | 2583226 | A1 | 12/1986 |
| FR | 2691602 | A1 | 11/1993 |
| FR | 2849728 | A1 | 7/2004 |
| FR | 2841387 | B1 | 4/2006 |
| FR | 2893717 | A1 | 5/2007 |
| FR | 2946466 | B1 | 3/2012 |
| FR | 2986376 | B1 | 10/2014 |
| FR | 3034203 | | 9/2016 |
| GB | 175489 | A | 2/1922 |
| GB | 462804 | A | 3/1937 |
| GB | 529290 | A | 11/1940 |
| GB | 603119 | A | 10/1945 |
| GB | 589603 | A | 6/1947 |
| GB | 640181 | A | 7/1950 |
| GB | 663166 | A | 12/1951 |
| GB | 667290 | A | 2/1952 |
| GB | 668827 | A | 3/1952 |
| GB | 682115 | A | 11/1952 |
| GB | 682817 | A | 11/1952 |
| GB | 731473 | A | 6/1955 |
| GB | 746111 | A | 3/1956 |
| GB | 751153 | A | 6/1956 |
| GB | 767506 | A | 2/1957 |
| GB | 835976 | A | 6/1960 |
| GB | 845492 | A | 8/1960 |
| GB | 859951 | A | 1/1961 |
| GB | 889856 | A | 2/1962 |
| GB | 905417 | a | 9/1962 |
| GB | 993561 | A | 5/1965 |
| GB | 1004318 | A | 9/1965 |
| GB | 1076772 | A | 7/1967 |
| GB | 1141390 | A | 1/1969 |
| GB | 1298387 | A | 11/1972 |
| GB | 1383549 | A | 2/1974 |
| GB | 1370669 | A | 10/1974 |
| GB | 1422956 | A | 1/1976 |
| GB | 1424351 | A | 2/1976 |
| GB | 1468310 | A | 3/1977 |
| GB | 1469840 | A | 4/1977 |
| GB | 1527228 | A | 10/1978 |
| GB | 2010528 | A | 6/1979 |
| GB | 2045055 | A | 10/1980 |
| GB | 1580627 | A | 12/1980 |
| GB | 1584193 | A | 2/1981 |
| GB | 2227369 | A | 7/1990 |
| GB | 2247990 | A | 3/1992 |

(56) References Cited

FOREIGN PATENT DOCUMENTS

| | | | |
|---|---|---|---|
| GB | 2368468 | A | 5/2002 |
| GB | 2362472 | B | 10/2003 |
| GB | 2393370 | A | 3/2004 |
| GB | 2394364 | B | 6/2005 |
| GB | 2414862 | A | 12/2005 |
| GB | 2411554 | B | 1/2006 |
| GB | 705192 DO | | 4/2007 |
| GB | 714974 DO | | 9/2007 |
| GB | 718597 DO | | 10/2007 |
| GB | 2474037 | A | 4/2011 |
| GB | 2476787 | A | 7/2011 |
| GB | 2474605 | B | 9/2011 |
| GB | 2485355 | A | 5/2012 |
| GB | 2481715 | B | 1/2014 |
| GB | 2507269 | A | 4/2014 |
| GB | 2476149 | B | 7/2014 |
| GB | 2532207 | A | 5/2016 |
| IN | 261253 | A1 | 6/2014 |
| IN | 7352/CHENP/2015 | A | 7/2016 |
| IN | 201647015348 | A | 8/2016 |
| JP | S50109642 | | 9/1975 |
| JP | 55124303 | U | 9/1980 |
| JP | 55138902 | U | 10/1980 |
| JP | 574601 | | 1/1982 |
| JP | 61178682 | U | 11/1986 |
| JP | 61260702 | A | 11/1986 |
| JP | 62110303 | U | 7/1987 |
| JP | 62190903 | U | 8/1987 |
| JP | 02214307 | A | 8/1990 |
| JP | 03167906 | A | 7/1991 |
| JP | 0653894 | | 8/1991 |
| JP | 04369905 | A | 12/1992 |
| JP | 3001844 | U | 9/1994 |
| JP | 077769 | | 1/1995 |
| JP | 7212126 | | 11/1995 |
| JP | 0829545 | | 2/1996 |
| JP | 08167810 | A | 6/1996 |
| JP | 08196022 | A | 7/1996 |
| JP | 08316918 | A | 11/1996 |
| JP | 2595339 | B2 | 4/1997 |
| JP | 2639531 | B2 | 8/1997 |
| JP | 10206183 | A | 8/1998 |
| JP | 10271071 | A | 10/1998 |
| JP | 116928 | A | 1/1999 |
| JP | 1114749 | A | 1/1999 |
| JP | 11239085 | A | 8/1999 |
| JP | 11313022 | A | 11/1999 |
| JP | 2000077889 | A | 3/2000 |
| JP | 2000216623 | A | 8/2000 |
| JP | 2000244238 | A | 9/2000 |
| JP | 2001217634 | A | 8/2001 |
| JP | 2002029247 | A | 1/2002 |
| JP | 2002111579 | A | 4/2002 |
| JP | 2002236174 | A | 8/2002 |
| JP | 200328219 | A | 1/2003 |
| JP | 2003008336 | A | 1/2003 |
| JP | 2003057464 | A | 2/2003 |
| JP | 2003511677 | A | 3/2003 |
| JP | 3411428 | B2 | 6/2003 |
| JP | 2003324309 | A | 11/2003 |
| JP | 3480153 | B2 | 12/2003 |
| JP | 2003344883 | A | 12/2003 |
| JP | 2004521379 | A | 7/2004 |
| JP | 2004253853 | A | 9/2004 |
| JP | 2004274656 | A | 9/2004 |
| JP | 2004297107 | A | 10/2004 |
| JP | 2004304659 | A | 10/2004 |
| JP | 2005503709 | A | 2/2005 |
| JP | 2005110231 | A | 4/2005 |
| JP | 2005182469 | A | 7/2005 |
| JP | 3734975 | B2 | 1/2006 |
| JP | 2006153878 | A | 6/2006 |
| JP | 2006163886 | A | 6/2006 |
| JP | 2006166399 | A | 6/2006 |
| JP | 2007042009 | A | 2/2007 |
| JP | 2007072945 | A | 3/2007 |
| JP | 3938315 | B2 | 6/2007 |
| JP | 2007174017 | A | 7/2007 |
| JP | 2007259001 | A | 10/2007 |
| JP | 4025674 | B2 | 12/2007 |
| JP | 2008017263 | A | 1/2008 |
| JP | 2008021483 | A | 1/2008 |
| JP | 4072280 | B2 | 4/2008 |
| JP | 4142062 | B2 | 8/2008 |
| JP | 2008209965 | A | 9/2008 |
| JP | 2008218362 | A | 9/2008 |
| JP | 2009004986 | A | 1/2009 |
| JP | 4252573 | B2 | 4/2009 |
| JP | 4259760 | B2 | 4/2009 |
| JP | 2009124229 | A | 6/2009 |
| JP | 2010045471 | A | 2/2010 |
| JP | 2010192992 | A | 9/2010 |
| JP | 2010541468 | A | 12/2010 |
| JP | 2011160446 | A | 8/2011 |
| JP | 2012058162 | A | 3/2012 |
| JP | 2012090242 | A | 5/2012 |
| JP | 2012175680 | A | 9/2012 |
| JP | 2012205104 | A | 10/2012 |
| JP | 2012248035 | A | 12/2012 |
| JP | 2013046412 | A | 3/2013 |
| JP | 2013110503 | A | 6/2013 |
| JP | 5230779 | B2 | 7/2013 |
| JP | 2014045237 | A | 3/2014 |
| JP | 5475475 | B2 | 4/2014 |
| JP | 5497348 | B2 | 5/2014 |
| JP | 5618072 | B2 | 11/2014 |
| JP | 2015095520 | A | 5/2015 |
| JP | 2015188174 | | 10/2015 |
| KR | 20000074034 | | 12/2000 |
| KR | 20020091917 | | 12/2002 |
| KR | 100624049 | B1 | 9/2006 |
| KR | 200425873 | Y1 | 9/2006 |
| KR | 100636388 | B1 | 10/2006 |
| KR | 100725002 | B1 | 6/2007 |
| KR | 100849702 | B1 | 7/2008 |
| KR | 100916077 | B1 | 8/2009 |
| KR | 100952976 | B1 | 4/2010 |
| KR | 100989064 | B1 | 10/2010 |
| KR | 101060584 | B1 | 8/2011 |
| KR | 101070364 | B1 | 9/2011 |
| KR | 101212354 | B1 | 12/2012 |
| KR | 101259715 | B1 | 4/2013 |
| KR | 101288770 | B1 | 7/2013 |
| KR | 20140104097 | A | 8/2014 |
| KR | 101435538 | B1 | 9/2014 |
| KR | 101447809 | B1 | 10/2014 |
| KR | 20150087455 | | 7/2015 |
| KR | 101549622 | | 9/2015 |
| KR | 200479199 | Y1 | 12/2015 |
| KR | 101586236 | B1 | 1/2016 |
| KR | 101606803 | | 1/2016 |
| KR | 101607420 | B1 | 3/2016 |
| NL | 69072 | | 1/1945 |
| RU | 2129746 | C1 | 4/1999 |
| RU | 2432647 01 | | 10/2011 |
| TW | 201537432 | | 10/2015 |
| WO | 8301711 | A1 | 5/1983 |
| WO | 9116770 | A1 | 10/1991 |
| WO | 9210014 | | 6/1992 |
| WO | 9323928 | | 11/1993 |
| WO | 9424467 | A1 | 10/1994 |
| WO | 9523440 | A1 | 8/1995 |
| WO | 9529537 | A1 | 11/1995 |
| WO | 199529537 | | 11/1995 |
| WO | 9603801 | A1 | 2/1996 |
| WO | 199619089 | | 6/1996 |
| WO | 9639729 | A1 | 12/1996 |
| WO | WO 96/41157 | | 12/1996 |
| WO | 9735387 | A1 | 9/1997 |
| WO | 9737445 | A1 | 10/1997 |
| WO | 9829853 | A1 | 7/1998 |
| WO | 9859254 | A1 | 12/1998 |
| WO | WO 98/57207 | | 12/1998 |
| WO | 9923848 | A2 | 5/1999 |

(56) References Cited

FOREIGN PATENT DOCUMENTS

| | | | |
|---|---|---|---|
| WO | 9948230 | A1 | 9/1999 |
| WO | 199945310 | | 9/1999 |
| WO | 9967903 | A1 | 12/1999 |
| WO | 0070891 | A1 | 11/2000 |
| WO | 2000/74428 | A1 | 12/2000 |
| WO | W02001014985 | A1 | 3/2001 |
| WO | 0128159 | A2 | 4/2001 |
| WO | 0131746 | A1 | 5/2001 |
| WO | 0145206 | A1 | 6/2001 |
| WO | 0192910 | A2 | 12/2001 |
| WO | 02061467 | A2 | 8/2002 |
| WO | 02061971 | A1 | 8/2002 |
| WO | 03/005629 | | 1/2003 |
| WO | 2003009083 | | 1/2003 |
| WO | 03012614 | A1 | 2/2003 |
| WO | 200326166 | | 3/2003 |
| WO | 03026462 | A1 | 4/2003 |
| WO | 03044981 | A1 | 5/2003 |
| WO | 2003088418 | | 10/2003 |
| WO | 03099740 | A1 | 12/2003 |
| WO | 2004011995 | A1 | 2/2004 |
| WO | 2004038891 | A2 | 5/2004 |
| WO | 2004/051804 | | 6/2004 |
| WO | 2004051804 | A1 | 6/2004 |
| WO | 2004054159 | A2 | 6/2004 |
| WO | 2004077746 | A1 | 9/2004 |
| WO | 2005015686 | A1 | 2/2005 |
| WO | 2005072469 | A2 | 8/2005 |
| WO | 2006012610 | A2 | 2/2006 |
| WO | 2006061865 | A1 | 6/2006 |
| WO | 2006085804 | A1 | 8/2006 |
| WO | 2006102419 | A2 | 9/2006 |
| WO | 2006111809 | A1 | 10/2006 |
| WO | 2006116396 | A2 | 11/2006 |
| WO | 2006122041 | A2 | 11/2006 |
| WO | 2006125279 | A1 | 11/2006 |
| WO | 2007000777 | B1 | 2/2007 |
| WO | 2006050331 | A3 | 3/2007 |
| WO | 2007031435 | A1 | 3/2007 |
| WO | 2007071797 | A1 | 6/2007 |
| WO | 2007148097 | A2 | 12/2007 |
| WO | 2008003939 | A1 | 1/2008 |
| WO | 2007094944 | A3 | 3/2008 |
| WO | 2007149746 | A3 | 4/2008 |
| WO | 2008044062 | A1 | 4/2008 |
| WO | 2008055084 | A2 | 5/2008 |
| WO | 2008061107 | A2 | 5/2008 |
| WO | 2008069358 | A1 | 6/2008 |
| WO | 2008070957 | A1 | 6/2008 |
| WO | 2008102987 | A1 | 8/2008 |
| WO | 2008117973 | A1 | 10/2008 |
| WO | 2008155769 | A2 | 12/2008 |
| WO | 2009014704 | A1 | 1/2009 |
| WO | 2007098061 | A3 | 2/2009 |
| WO | 2009031794 | A1 | 3/2009 |
| WO | 2009035285 | A2 | 3/2009 |
| WO | 2009090602 | A1 | 7/2009 |
| WO | 2009123404 | A4 | 10/2009 |
| WO | 2009131316 | A2 | 10/2009 |
| WO | 2010017549 | A1 | 2/2010 |
| WO | 2010050892 | A1 | 5/2010 |
| WO | 2010147806 | A1 | 12/2010 |
| WO | 2011006210 | A1 | 1/2011 |
| WO | 2011032605 | A1 | 3/2011 |
| WO | 2011085650 | A1 | 7/2011 |
| WO | 2011137793 | A1 | 11/2011 |
| WO | 2012/007831 | | 1/2012 |
| WO | 2012038816 | A1 | 3/2012 |
| WO | 2012050069 | A1 | 4/2012 |
| WO | 2012064333 | A1 | 5/2012 |
| WO | 2012113219 | A1 | 8/2012 |
| WO | 2012171205 | A1 | 12/2012 |
| WO | 2012172565 | A1 | 12/2012 |
| WO | 2013013162 | A2 | 1/2013 |
| WO | 2013013465 | A1 | 1/2013 |
| WO | 2013023226 | A1 | 2/2013 |
| WO | 2013028197 | A1 | 2/2013 |
| WO | WO 2013/017822 | | 2/2013 |
| WO | 2013035110 | A2 | 3/2013 |
| WO | 2013073548 | | 5/2013 |
| WO | 2013073548 | A1 | 5/2013 |
| WO | 2013100912 | A1 | 7/2013 |
| WO | 2013112353 | A1 | 8/2013 |
| WO | 2013115802 | A1 | 8/2013 |
| WO | 2013121682 | A1 | 8/2013 |
| WO | 2013123445 | A1 | 8/2013 |
| WO | 2013/138627 | | 9/2013 |
| WO | 2013136213 | A1 | 9/2013 |
| WO | 2013138627 | A1 | 9/2013 |
| WO | 2013157978 | A1 | 10/2013 |
| WO | 2013172502 | A1 | 11/2013 |
| WO | 2014/018434 | | 1/2014 |
| WO | 2014011438 | A1 | 1/2014 |
| WO | 2014018434 | A2 | 1/2014 |
| WO | 2014/045236 | | 3/2014 |
| WO | 2014065952 | A1 | 5/2014 |
| WO | 2014069941 | A1 | 5/2014 |
| WO | 2014083500 | A1 | 6/2014 |
| WO | 2014092644 | A1 | 6/2014 |
| WO | 2014094559 | A1 | 6/2014 |
| WO | 2014096868 | A1 | 6/2014 |
| WO | 2014099340 | A2 | 6/2014 |
| WO | 2013076499 | A3 | 7/2014 |
| WO | 2014112994 | A1 | 7/2014 |
| WO | 2014128253 | A1 | 8/2014 |
| WO | 2014137546 | A1 | 9/2014 |
| WO | 2014145862 | A2 | 9/2014 |
| WO | 2014147002 | A1 | 9/2014 |
| WO | 2014197926 | A1 | 12/2014 |
| WO | 2015002658 | A1 | 1/2015 |
| WO | 2015006636 | A1 | 1/2015 |
| WO | 2015008442 | A1 | 1/2015 |
| WO | 2015024006 | A1 | 2/2015 |
| WO | 2015027033 | A1 | 2/2015 |
| WO | 2015035463 | A1 | 3/2015 |
| WO | 2015/055230 | | 4/2015 |
| WO | 2015052478 | | 4/2015 |
| WO | 2015052480 | | 4/2015 |
| WO | 2015069090 | A1 | 5/2015 |
| WO | 2015069431 | A2 | 5/2015 |
| WO | 2015077644 | | 5/2015 |
| WO | 2015088650 | A1 | 6/2015 |
| WO | 2015120626 | | 8/2015 |
| WO | 2015123623 | A1 | 8/2015 |
| WO | 2015132618 | A1 | 9/2015 |
| WO | 2015167566 | A1 | 11/2015 |
| WO | 2015175054 | A2 | 11/2015 |
| WO | 2015197580 | A1 | 12/2015 |
| WO | 2016003291 | A1 | 1/2016 |
| WO | 2016004003 | | 1/2016 |
| WO | 2016009402 | A2 | 1/2016 |
| WO | WO 2016/012889 | | 1/2016 |
| WO | 2016027007 | A1 | 2/2016 |
| WO | 2016028767 | | 2/2016 |
| WO | 2016/043949 | | 3/2016 |
| WO | 2016032592 | A1 | 3/2016 |
| WO | 2016036951 | A1 | 3/2016 |
| WO | 2016043949 | A1 | 3/2016 |
| WO | 2016048214 | A1 | 3/2016 |
| WO | 2016048257 | A1 | 3/2016 |
| WO | 2016053572 | A1 | 4/2016 |
| WO | 2016053573 | A1 | 4/2016 |
| WO | 2016060761 | A1 | 4/2016 |
| WO | 2016060762 | A1 | 4/2016 |
| WO | 2016061021 | A1 | 4/2016 |
| WO | 2016064502 | A1 | 4/2016 |
| WO | 2016064505 | A1 | 4/2016 |
| WO | 2016064516 | A1 | 4/2016 |
| WO | 2016064700 | A2 | 4/2016 |
| WO | WO 2016/064502 | | 4/2016 |
| WO | 2016073072 | A1 | 5/2016 |
| WO | 2016081125 | | 5/2016 |
| WO | 2016081128 | | 5/2016 |
| WO | 2016081129 | A1 | 5/2016 |

(56) References Cited

FOREIGN PATENT DOCUMENTS

| | | | |
|---|---|---|---|
| WO | 2016081134 | | 5/2016 |
| WO | 2016081136 | | 5/2016 |
| WO | 2015090382 | | 6/2016 |
| WO | 2016086306 | A1 | 6/2016 |
| WO | 2016089491 | | 6/2016 |
| WO | 2016089492 | A1 | 6/2016 |
| WO | 2016096029 | A1 | 6/2016 |
| WO | 2016122409 | A1 | 8/2016 |
| WO | 2016133672 | A1 | 8/2016 |
| WO | WO 2016/125161 | | 8/2016 |
| WO | WO 2016/133509 | | 8/2016 |
| WO | 2016145411 | | 9/2016 |
| WO | WO 2016/137982 | | 9/2016 |
| WO | 2016161637 | A1 | 10/2016 |
| WO | 2016169058 | A1 | 10/2016 |
| WO | 2016171907 | | 10/2016 |
| WO | 2016176030 | | 11/2016 |
| WO | 2016200492 | | 12/2016 |
| WO | 2016200579 | | 12/2016 |
| WO | 2017/011099 | | 1/2017 |
| WO | 2017011100 | | 1/2017 |
| WO | 2017011101 | | 1/2017 |
| WO | 2017011102 | | 1/2017 |
| WO | 2017011103 | | 1/2017 |
| WO | 2017011227 | | 1/2017 |
| WO | 2017014840 | | 1/2017 |
| WO | 2017014842 | | 1/2017 |
| WO | 2017023412 | | 2/2017 |
| WO | 2017023413 | | 2/2017 |
| WO | 2017023417 | | 2/2017 |
| WO | WO 2017/048417 | | 3/2017 |
| WO | WO 2017058468 | | 3/2017 |
| WO | 2017058477 | | 4/2017 |
| WO | 2017065898 | | 4/2017 |

OTHER PUBLICATIONS

International Search Report PCT/US2016/036292 dated Sep. 13, 2016.

PCT/US16/027397 International Search Report & Written Opinion dated Jun. 24, 2016.

PCT/US16/027398 International Search Report and Written Opinion dated Jun. 24, 2016.

PCT/US16/027403 International Search Report & Written Opinion dated Jun. 22, 2016.

PCT/US16/028395 International Search Report and Written Opinion dated Jun. 29, 2016.

PCT/US16/032441 International Search Report and Written Opinion dated Jul. 29, 2016.

PCT/US16/036284 International Search Report & Written Opinion dated Sep. 8, 2016.

PCT/US16/036388 International Search Report and Written Opinion dated Aug. 30, 2016.

PCT/US2016/036285 International Search Report and Written Opinion dated Aug. 23, 2016.

PCT/US2016/036288 International Search Report & Written Opinion dated Sep. 1, 2016.

PCT/US2016/036290 International Search Report & Written Opinion dated Aug. 11, 2016.

PCT/US2016/036293 International Search Report & Written Opinion dated Sep. 15, 2016.

"24 Volt D.C Flashing Light With Built-in Antenna 433Mhz, DEA+ Product Guide", Meteor electrical, meteorelectrical.com, Code: LUMY/24A, Jul. 28, 2010, 3 pages.

"A Dielectric Lens Antenna with Enhanced Aperture Efficiency for Industrial Radar Applications", Computer Simulation Technology, cst.com, May 10, 2011, 3 pages.

"A New Approach to Outdoor DAS Network Physical Layer Using E-Line Technology", Corridor Systems, Mar. 2011, 5 pages.

"About Firelight Media Group", www.insurancetechnologies.com/Products/Products_firelight_overview.html, Firelight Insurance Technologies, LLC, Apr. 19, 2015, 4 pages.

"Alternative Local Loop Technologies: A Review", Organisation for Economic Co-Operation and Development, Paris, OCDE/GD(96)181, https://www.oecd.org/sti/2090965.pdf, 1996, 25 pages.

"An Improved Solid Dielectric Lens Impulse Radiating Antenna", SBIR/STTR, DoD, sbir.gov, 2004, 3 pages.

"Asahi Multi-Core Fiber Cable", Industrial Fiber optics, i-fiberoptics.com, http://i-fiberoptics.com/multi-core-fiber-cable.php, Apr. 26, 2015, 2 pages.

"Beam Adaptive Algorithms for Smart Antennas Computer Science Essay", Ukessays, ukessays.com, Mar. 23, 2015, 21 pages.

"Broadband Negligible Loss Metamaterials", Computer Electmagnetics and Antennas Research Laboratory, cearl.ee.psu.edu., May 15, 2012, 3 pages.

"Broadband Over Power Lines (BPL): Developments and Policy Issues", Organisation for Economic Co-operation and Development, Directorate for Science, Technology and Industry, Committee for Information, Computer and Communications Policy, Jun. 2, 2009, 35 pages.

"Broadband: Bringing Home the Bits: Chapter 4 Technology Options and Economic Factors", The National Academies Press, nap.edu, 2002, 61 pages.

"Cisco Aironet 1500 Series Access Point Large Pole Mounting Kit Instructions", www.cisco.com/c/en/us/td/docs/wireless/antenna/installation/guide/18098.html, 2008, 9 pages.

"Cisco IP VSAT Satellite WAN Network Module for Cisco Integrated Services Routers", www.cisco.com/c/en/us/products/collateral/interfaces-modules/ip-vsatsatellite-wan-module/product_data_sheet0900aecd804bbf6f.html, Jul. 23, 2014, 6 pages.

"Cloud Management", Cisco Meraki, cisco.com., Sep. 11, 2015, 2 pages.

"Decryption: Identify & Control Encrypted Traffic", Palo Alto Networks, paloaltonetworks.com, Mar. 7, 2011, 4 pages.

"Delivering broadband over existing wiring", Cabling Installation & Maintenance, cablinginstall.com, May 1, 2002, 6 pages.

"Denso", Winn & Coales (Denso) Ltd. UK, denso.net, http://www.denso.net/voidfiller/voidpump.htm, 2015, 1 page.

"Doubly-fed Cage-cone Combined Broadband Antennas for Marine Applications", http://www.edatop.com/down/paper/antenna/c%E5%A4%A9%E7%BA%BF%E8%AE%BE%E8%AE%A1-890w5nebp5ilpq.pdf, 2007, 7 pages.

"Electronic Business Fulfillment FireLight ®", Firelight Media Group LLC, firelightmedia.net http://www .firelightmedia .net/fmg/index.php/home, Apr. 19, 2015, 2 pages.

"Elliptical Polarization", Wikipedia, http://en.wikipedia.org/wiki/Elliptical_polarization, Apr. 21, 2015, 3 pages.

"Energy-Harvesting Power Supply", http://sdpm.arizona.edu/projects/project-publi/upid/38a8cf3b42f35576de25de1f6dcc20f3, Discloses a project to harvest energy from a power line and that a device was built that clamps onto a power line., 2016, 1 page.

"Harvest energy from powerline", www.physicsforums.com/threads/harvest-energy-from-powerline.685148/, Discussion thread about harvesting power from powerlines that includes the suggestion of clamping a device to the power line., 2013, 8 pages.

"How to Use STUF", STUF Page Link Info, crossdevices.com, http://www.crossdevices.com/cross_devices_010.htm, 2015, 1 page.

"Identity Management", Tuomas Aura CSE-C3400 Information Security, Aalto University, Autumn 2014, 33 pgs.

"IEEE Standard for Information technology—Local and metropolitan area networks—Specific requirements", Part 15.4: Wireless Medium Access Control (MAC) and Physical Layer (PHY) Specifications for Low Rate Wireless Personal Area Networks (WPANs), in IEEE Std 802.15.4, (Revision of IEEE Std 802.15.4-2003), Sep. 7, 2006, 1-320.

"International Preliminary Report on Patentability", PCT/US2014/039746, dated Dec. 10, 2015.

"International Preliminary Report on Patentability", PCT/US2014/060841, dated May 19, 2016, 8 pages.

"International Preliminary Report on Patentability & Written Opinion", PCT/US2014/061445, dated Jun. 23, 2016, 9 pages.

"International Search Report & Written Opinion", PCT/US2015/034827, dated Sep. 30, 2015.

(56) References Cited

OTHER PUBLICATIONS

"International Search Report & Written Opinion", PCT/US2015/056316, dated Jan. 21, 2016.
"International Search Report & Written Opinion", PCT/US2015/056320, dated Jan. 29, 2016.
"International Search Report & Written Opinion", PCT/US2015/056365, dated Jan. 22, 2016.
"International Search Report & Written Opinion", PCT/US2015/056368, dated Jan. 25, 2016.
"International Search Report & Written Opinion", PCT/US2015/056598, dated Jan. 28, 2016.
"International Search Report & Written Opinion", PCT/US2015/056615, dated Jan. 21, 2016.
"International Search Report & Written Opinion", PCT/US2015/056626, dated Jan. 21, 2016.
"International Search Report & Written Opinion", PCT/US2015/056632, dated Jan. 26, 2016.
"International Search Report & Written Opinion", PCT/US2016/013988, dated Apr. 8, 2016.
"International Search Report & Written Opinion", PCT/US2016/035384, dated Oct. 31, 2016.
"International Search Report & Written Opinion", PCT/US2016/020001, dated May 23, 2016.
"International Search Report & Written Opinion", PCT/US2016/026860, dated Jun. 1, 2016.
"International Search Report & Written Opinion", PCT/US2016/026318, dated Jun. 15, 2016.
"International Search Report & Written Opinion", PCT/US2016/028412, dated Jun. 27, 2016,.
"International Search Report & Written Opinion", PCT/US2016/028206, dated Jun. 29, 2016.
"International Search Report & Written Opinion", PCT/US16/033182, dated Jul. 12, 2016.
"International Search Report & Written Opinion", PCT/US2016/036551, dated Aug. 11, 2016.
"International Search Report & Written Opinion", PCT/US2016/036798, dated Aug. 11, 2016.
"International Search Report & Written Opinion", PCT/US2016/028205, dated Aug. 16, 2016.
"International Search Report & Written Opinion", PCT/US2016/032460, dated Aug. 17, 2016.
"International Search Report & Written Opinion", PCT/US2016/036303, dated Aug. 24, 2016.
"International Search Report & Written Opinion", PCT/2016/035383, dated Sep. 2, 2016.
"International Search Report & Written Opinion", PCT/US2016/036286, dated Sep. 13, 2016.
"International Search Report & Written Opinion", PCT/US2014/039746, dated Jan. 12, 2015.
"International Search Report & Written Opinion", PCT/US2014/060841, dated Jan. 7, 2015.
"International Search Report & Written Opinion", PCT/US2015/039848, dated Oct. 20, 2015.
"International Search Report & Written Opinion", PCT/US2015/047315, dated Oct. 30, 2015.
"International Search Report & Written Opinion", PCT/US2015/048454, dated Nov. 11, 2015.
"International Search Report & Written Opinion", PCT/US2015/049928, dated Nov. 16, 2015.
"International Search Report & Written Opinion", PCT/US2015/049932, dated Nov. 16, 2015.
"International Search Report & Written Opinion", PCT/US2015/049927, dated Nov. 24, 2015.
"International Search Report & Written Opinion", PCT/US2015/051193, dated Nov. 27, 2015.
"International Search Report & Written Opinion", PCT/US2015/051146, dated Dec. 15, 2015.
"International Search Report & Written Opinion", PCT/US2015/051183, dated Dec. 15, 2015.
"International Search Report & Written Opinion", PCT/US2015/051194, dated Dec. 15, 2015.
"International Search Report & Written Opinion", PCT/US2015/051578, dated Dec. 17, 2015.
"International Search Report & Written Opinion", PCT/US2015/051583, dated Dec. 21, 2015.
"International Search Report & Written Opinion", PCT/US2015/048458, dated Dec. 23, 2015.
"International Search Report & Written Opinion", PCT/US2015/051213, dated Dec. 4, 2015.
"International Search Report & Written Opinion", PCT/US2015/051163, dated Dec. 7, 2015.
"International Search Report & Written Opinion", PCT/US2014/061445, dated Feb. 10, 2015.
"International Search Report & Written Opinion", PCT/US16/28207, dated Jun. 15, 2016.
"International Search Report & Written Opinion", PCT/US2016/015501, dated Apr. 29, 2016, 11 pages.
"International Search Report & Written Opinion", PCT/US2015/047225, dated Nov. 6, 2015, Nov. 6, 2015.
"International Search Report and Written Opinion", PCT/US2016/028197, dated Jun. 24, 2016.
"International Search Report and Written Opinion", PCT/US2016/036289, dated Aug. 11, 2016.
"International Search Report and Written Opinion", PCT/US2016/036295, dated Aug. 30, 2016.
"International Search Report and Written Opinion", PCT/US2016/030964, dated Aug. 4, 2016.
"International Search Report and Written Opinion", PCT/US2016/036553, dated Aug. 30, 2016, 1-14.
"International Search Report and Written opinion", PCT/US2016/036556, dated Sep. 22, 2016.
"International Searching Authority", International Search Report and Written Opinion, dated Sep. 28, 2016, 1-12.
"Invitation to Pay Additional Fees & Partial Search Report", PCT/US2016/028205, dated Jun. 22, 2016.
"Invitation to Pay Additional Fees & Partial Search Report", PCT/US2016/032430, dated Jun. 22, 2016.
"Invitation to Pay Additional Fees and, Where Applicable, Protest Fee", PCT/US2016/035384, dated Aug. 31, 2016, 7 pages.
"Ipitek All-Optical Sensors", www.ipitek.com/solutions-by-industry/all-optical-sensors, dated Jun. 2, 2014, 3 pages.
"Lens Antennas", Altair, feko.info, Jun. 30, 2014, 2 pages.
"Micromem Demonstrates UAV Installation of Power Line Monitoring Mounting System", MicroMem, micromem.com, dated Mar. 4, 2015, 1-3.
"PCT International Search Report", dated Oct. 24, 2016, 1-13.
"PCT International Search Report & Written Opinion", PCT/US2016/026193, dated Jun. 1, 2016.
"PCT International Search Report and Written Opinion", dated Oct. 10, 2016, 1-15.
"PCT Search Report and Written opinion", PCT/US2016/036297, dated Sep. 5, 2016.
"PCT/US2016/040992 International Search Report & Written Opinion dated Oct. 17, 2016".
"Quickly identify malicious traffics: Detect", lancope.com, Mar. 15, 2015, 8 pages.
"Radar at St Andrews", mmwaves.epr, st-andrews.ac.uk, Feb. 4, 2011.
"Resilience to Smart Meter Disconnect Attacks", ADSC Illinois at Singapore PTE Ltd., http://publish.illinois.edu/integrativesecurityassessment/resiliencetosmartmeterdisconnectattacks, 2015.
"RF Sensor Node Development Platform for 6LoWPAN and 2.4 GHz Applications", http://www.ti.com/tool/TIDM-RF-Sensornode., Jun. 2, 2014.
"Smart Out-Of-Band Management", Open Gear, opengear.com., Sep. 2015.
"Tapered waveguide", Lumerical Solutions, Inc., docs.lumerical.com., 2010.
"Tapered Waveguides Improve Fiber Light Coupling Efficiency", Tech Briefs, techbriefs.com, Molex Inc., Downers Grove, Illinois and KiloLambda Technologies Ltd., Tel Aviv, Israel., Jan. 1, 2006.

(56) References Cited

OTHER PUBLICATIONS

"The world's first achievement of microwave electric-field measurement utilizing an optical electric-field sensor mounted on an optical fiber, within a microwave discharge ion engine boarded on asteroid explorers etc.", Investigation of internal phenomena and performance improvement in microwave discharge ion engines, Japan Aerospace Exploration Agency (JAXA), Nippon Telegraph and Telephone Corporation, Aug. 7, 2013, 4 pages.
"Transducer", IEEE Std 100-2000, Sep. 21, 2015, 1154.
"Troubleshooting Problems Affecting Radio Frequency Communication", cisco.com, Oct. 19, 2009.
"Waveguide Bragg Microcavity", lumerical.com, Sep. 2016.
"Wireless powerline sensor", wikipedia.org, http://en.wikipedia.org/wiki/Wireless_powerline_sensor, 2014, 3 pages.
Ace, "Installing Satellite Accessories", www.acehardware.com, May 8, 2006, 4 pages.
Adabo, Geraldo J. "Long Range Unmanned Aircraft System for Power Line Inspection of Brazilian Electrical System", Journal of Energy and Power Engineering 8 (2014), Feb. 28, 2014, 394-398.
Aerohive Networks, "HiveManager Network Management System", www.aerohive.com, Sep. 2015, 3 pages.
Akiba, Shigeyuki et al., "Photonic Architecture for Beam Forming of RF Phased Array Antenna", Optical Fiber Communication Conference. Optical Society of America., Abstract Only, 2014.
Alam, M N et al., "Novel surface wave exciters for power line fault detection and communications", Antennas and Propagation (Apsursi), IEEE International Symposium on, IEEE, pp. 1139-1142, Jul. 3, 2011.
Alam, M. N. et al., "Novel Surface Wave Exciters for Power Line Fault Detection and Communications", Department of Electrical Engineering, University of South Carolina, Antennas and Propagation (APSURSI), 2011 IEEE International Symposium, IEEE, 2011, 1-4.
Alam, M.N. et al., "Novel surface wave exciters for power line fault detection and communications", 2011 IEEE International Symposium, 2011.
Alam, MD N. et al., "Design and Application of Surface Wave Sensors for nonintrusive Power Line Fault Detection", IEEE Sensors Journal, IEEE Service Center, New York, NY, US, vol. 13, No. 1, Jan. 1, 2013, 339-347.
Ali, Muhammad Q. et al., "Randomizing AMI configuration for proactive defense in smart grid", Smart Grid Communications (SmartGridComm), IEEE International Conference on. IEEE, Abstract Only, http://ieeexplore.ieee.org/xpl/login.jsp?tp=&arnumber=6688027, 2013.
Ali, Tariq et al., "Diagonal and Vertical Routing Protocol for Underwater Wireless Sensor Network", Procedia-Social and Behavioral Sciences 129, 2014, 372-379.
Angove, Alex "Direct Bury Duct Assemblies, MPB 302 3+—Ribbonet Microducts", Ericsson, archive.ericsson.net, Jul. 30, 2014.
Angove, Alex "How the NBN Differs from ADSL2+, Cable and Wireless", Whistle Out, whistleout.com.au, Jul. 30, 2014.
Antenna Magus, "Waveguide-fed Conical Horn", www.antennamagus.com, Aug. 2015, 1 page.
Antennamagus, "Parabolic focus pattern fed reflector with shroud", antennamagus.com, Jul. 4, 2014, 2 pages.
Arage, Alebel et al., "Measurement of wet antenna effects on millimetre wave propagation", Radar, IEEE Conference on IEEE., Abstract Only, 2006.
Ares-Pena, Francisco J. et al., "A simple alternative for beam reconfiguration of array antennas", Progress in Electromagnetics Research 88, 2008, 227-240.
Arthur, Joseph Kweku "Improving QoS in UMTS Network in Accra Business District Using Tower-Less Towers", IPASJ International Journal of Electrical Engineering (IIJEE), vol. 2, Issue 11., Nov. 2014.
Asadallahi, Sina et al., "Performance comparison of CSMA/CA Advanced Infrared (Alr) and a new pointtomultipoint optical MAC protocol", Wireless Communications and Mobile Computing Conference (IWCMC), 2012 8th International. IEEE, Abstract Only, 2012.
A-Tech Fabrication, "Dual Antenna Boom Assembly", http://web.archive.org/web/20090126192215/http://atechfabrication.com/products/dual_antenna_boom.htm, 2009, 2 pages.
Atlas Sound, "Bi-Axial PA Horn with Gimbal Mount", MCM Electronics, mcmelectronics.com, 2011, 555-13580.
Atmel, "Power Line Communications", www.atmel.com/products/smartenergy/powerlinecommunications/default.aspx, 2015.
Atwater, Harry A. "The promise of plasmonics", Scientific American 296.4, 2007, 56-62.
Babakhani, Aydin "Direct antenna modulation (DAM) for on-chip mm-wave transceivers", Diss. California Institute of Technology, 2008.
Bach, Christian "Current Sensor—Power Line Monitoring for Energy Demand Control", Application Note 308, http://www.enocean.com/fileadmin/redaktion/pdf/app_notes/AN308_CURRENT_SENSOR_Jan09.pdf, Jan. 2009, 4 pages.
Barlow, H. M. et al., "Surface Waves", 621.396.11 : 538.566, Paper No. 1482 Radio Section, 1953, pp. 329-341.
Barron, Ashleigh L. "Integrated Multicore Fibre Devices for Optical Trapping", Diss. Heriot-Watt University, 2014, 11-15.
Beal, J.C. et al., "Coaxial-slot surface-wave launcher", Electronics Letters 4.25: 557559, Abstract Only, 1968.
Benevent, Evangåline "Transmission lines in MMIC technology", UniversitáMediterranea di Reggio Calabria, Jan. 28, 2010.
Beninca, "Flashing Light: IR Lamp", www.beninca.com/en/news/2015/02/23/lampeggiante-irlamp.html, Feb. 23, 2015.
Berweger, Samuel et al., "Light on the Tip of a Needle: Plasmonic Nanofocusing for Spectroscopy on the Nanoscale", The Journal of Physical Chemistry Letters; pubs.acs.org/JPCL, 2012, 945-952.
Bhushan, Naga "Network densification: the dominant theme for wireless evolution into 5G", Communications Magazine, IEEE 52.2: 82-89, 2014.
Bing, Benny "Ubiquitous Broadband Access Networks with Peer-to-Peer Application Support", Evolving the Access Network: 27-36, 2006.
Bing, Benny "Ubiquitous Broadband Access Networks with Peer-to-Peer Application Support", Evolving the Access Network, 2006, 27-36.
Blanco-Redondo, Andrea et al., "Coupling midinfrared light from a photonic crystal waveguide to metallic transmission lines", Applied Physics Letters 104.1, 2014.
Blattenberger, Kirt "DroneBased Field Measurement System (dBFMS)", RF Cafe, rfcafe.com, Jul. 29, 2014.
Bock, James et al., "Optical coupling", Journal of Physics: Conference Series. vol. 155. No. 1. IOP Publishing, 2009.
Bowen, Leland H. et al., "A Solid Dielectric Lens Impulse Radiating Antenna with High Dielectric Constant Surrounded by a Cylindrical Shroud", Sensor and Simulation Note 498, Introduction, Apr. 2005, 3 pages.
Brambilla, Gilberto et al., "Ultra-low-loss optical fiber nanotapers", Optoelectronics Research Centre, University of Southampton; http://www.orc.soton.ac.uk, vol. 12, No. 10, May 7, 2004, 2258-2263.
Bridges, Greg E. et al., "Plane wave coupling to multiple conductor transmission lines above a lossy earth", Compatibility, IEEE Transactions on 31.1, Abstract Only, 1989, 21-33.
Brooke, Gary H. "Properties of surface waveguides with discontinuities and perturbations in cross-section", Diss. University of British Columbia, 1977.
Brown, J. et al., "The launching of radial cylindrical surface waves by a circumferential slot", Proceedings of the IEE Part B: Radio and Electronic Engineering 106.26: 123128., Abstract Only, 1959.
Brown-Iposs, "Integrated Radio Masts Fully camouflaged Outdoor-Wi-Fi APs in GRP-lamp poles", www.brown-iposs.com, Mar. 21, 2014, 4 pages.
Bruno, Joseph "Interference Reduction in Wireless Networks", Computing Research Topics, Computing Sciences Department, Villanova University, Nov. 14, 2007, 8 pages.
Burkhart, Martin et al., "Does Topology Control Reduce Interference?", Department of Computer Science, ETH Zurich, Proceed-

(56) References Cited

OTHER PUBLICATIONS ings of the 5th ACM international symposium on Mobile ad hoc networking and computing, 2004, 11 pages.
Callis, et al., "An In-Line Power Monitor for HE11 Low Loss Transmission Lines", Proceedings of the 29th International Conference on Infrared and Millimeter Waves (IRMMW), Karlsruhe, Germany, 2004.
Campista, Miguel E. et al., "Improving the Data Transmission Throughput Over the Home Electrical Wiring", The IEEE Conference on Local Computer Networks 30th Anniversary, 2005, 1-8.
Capece, P. et al., "FDTD Analysis of a Circular Coaxial Feeder for Reflector Antenna", Antennas and Propagation Society International Symposium, IEEE Digest, vol. 3, 1997, pp. 1570-1573.
Carroll, John M. et al., "Developing the Blacksburg electronic village", Communications of the ACM 39.12: 69-74, 1996.
Chandra, Shekar "Transmission Line Fault Detection & Indication through GSM", IRD India, ISSN (Online): 2347 - 2812, vol. 2, Iss. 5, 2014.
Chen, Dong et al., "A trust management model based on fuzzy reputation for internet of things", Computer Science and Information Systems 8.4: 12071228, Abstract Only, 2011, 1 page.
Chen, Yingying "Detecting and Localizing Wireless Spoofing Attacks", Sensor, Mesh and Ad Hoc Communications and Networks, Secon'07, 4th Annual IEEE Communications Society Conference on IEEE, 2007, 10 pages.
Chiba, Jiro "Experimental Studies of the Losses and Radiations Due to Bends in the Goubau Line", IEEE Transactions on Microwave Theory and Techniques, Feb. 1977, 94-100.
Chiba, Jiro "On the Equivalent Circuit for the G-Line Above Ground", International Wroclaw Symposium on Electromagnetic Compatibility, 1998, 78-82.
Choudhury, Romit R. "Utilizing Beamforming Antennas for Wireless Mult-hop Networks", www.slideserve.com, Sep. 20, 2012, 4 pages.
Chu, Eunmi et al., "Self-organizing and self-healing mechanisms in cooperative small cell networks", PIMRC, 2013, 6 pages.
Cimini, Carlos Alberto et al., "Temperature profile of progressive damaged overhead electrical conductors", Journal of Electrical Power & Energy Systems 49, 2013, 280-286.
Cliff, Oliver M. et al., "Online localization of radio-tagged wildlife with an autonomous aerial robot system", Proceedings of Robotics Science and Systems XI, 2015, 1317.
Communication Power Solutions, I, "Power Communication", www.cpspower.biz/services/powercommunications, Oct. 2013, 6 pages.
Comsol, "Fast Numerical Modeling of a Conical Horns Lens Antenna", comsol.com, Application ID: 18695, Sep. 16, 2016, 3 pages.
Costantine, Joseph et al., "The analysis of a reconfigurable antenna with a rotating feed using graph models", Antennas and Wireless Propagation Letters, vol. 8, 2009, 943-946.
Covington, Michael J. et al., "Threat implications of the internet of things", 2013 5th International Conference on IEEE Cyber Conflict (CyCon), Abstract Only, 2013, 1 page.
Cradle Point, "Out-of-Band Management", www.cradlepoint.com, Sep. 2015, 7 pages.
Crane, Robert K. "Analysis of the effects of water on the ACTS propagation terminal antenna", Antennas and Propagation, IEEE Transactions on 50.7: 954965, Abstract Only, 2002, 1 page.
Crosswell, "Aperture excited dielectric antennas", http://ntrs.nasa.gov/archive/nasa/casi.ntrs.nasa.gov/19740017567.pdf, 1974, 128 pages.
Cypress Perform, "Powerline Communication", www.cypress.com, Apr. 23, 2015, 2 pages.
Daniel, Kai et al., "Using Public Network Infrastructures for UAV Remote Sensing in Civilian Security Operations", Homeland Security Affairs, Supplement 3, Mar. 2011, 11 pages.
Darktrace, "www.darktrace.com", Jul. 10, 2014, 4 pages.
De Freitas, Carvalho et al., "Unmanned Air Vehicle Based Localization and Range Estimation of WiFi Nodes", 2014, 109 pages.
De Sabata, Aldo et al., "Universitatea "Politehnica"", din Timi§oara Facultatea de Electronicā§i Telecomunicatii, 2012, 149 pages.
Debord, Benoit et al., "Generation and confinement of microwave gas-plasma in photonic dielectric microstructure", Optics express 21.21, 2013, 25509-25516.
Deilmann, Michael "Silicon oxide permeation barrier coating and sterilization of PET bottles by pulsed low-pressure microwave plasmas", Diss, 2008.
Deng, Chuang et al., "Unmanned Aerial Vehicles for Power Line Inspection: A Cooperative Way in Platforms and Communications", Journal of Communicatinos Vol No. 9, No. 9, Sep. 2014, 687-692.
Dini, Gianluca et al., "MADAM: Multilevel Anomaly Detector for Android Malware", MMMACNS. vol. 12, 2012.
Doane, J.L. et al., "Oversized rectangular waveguides with modefree bends and twists for broadband applications", Microwave Journal 32(3), Abstract Only, 1989, 153-160.
Doelitzscher, et al., "ViteraaS: Virtual cluster as a service", Cloud Computing Technology and Science (CloudCom), 2011 IEEE Third International Conference, 2011.
Dooley, Kevin "Out-of-Band Management", auvik, auvik.com., Apr. 12, 2014.
Doshi, D.A. et al., "Real Time Fault Failure Detection in Power Distribution Line using Power Line Communication", International Journal of Engineering Science 4834, 2016.
Dostert, Klaus "Frequency-hopping spread-spectrum modulation for digital communications over electrical power lines", Selected Areas in Communications, IEEE Journal on 8.4, Abstract Only, 1990, 700-710.
Dragoo, R.E. et al., "Fiber Optic Data Bus for the AN/GYQ21(V)", Harris Corp, U.S. Communications Syst. Div. Chart, Microcopy Resolution Test, 1980.
Dutton, Harry Jr. "Understanding Optical Communications", International Technical Support Organization, SG24-5230-00., Sep. 1998.
Ehyaie, Danial "Novel Approaches to the Design of Phased Array Antennas", Diss. The University of Michigan, 2011.
Ehyaie, Danial "Novel Approaches to the Design of Phased Array Antennas", Diss., The University of Michigan, 2011.
Electric Power Research Institut, "Examination of the Exacter Outage-Avoidance System", www.epri.com/abstracts/Pages/ProductAbstract.aspx?ProductId=000000000001020393, Nov. 30, 2009, 2 pages.
Eline Corridor Systems, "How is ELine Different?", www.corridor.biz/ELine_is_different.html, Apr. 23, 2015, 1 page.
Elmore, Glenn et al., "A Surface Wave Transmission Line", QEX, May/Jun. 2012, pp. 3-9.
Elmore, Glenn "Introduction to the Propagating Wave on a Single Conductor", www.corridor.biz, Jul. 27, 2009, 30 pages.
Eom, Seung-Hyun et al., "Pattern switchable antenna system using inkjet-printed directional bow-tie for bi-direction sensing applications", Sensors 15.12, 2015, 31171-31179.
EPRI—Electronic Power Research, "Product Abstract—Program on Technology Innovation: Study on the Integration of High Temperature Superconducting DC Cables Within the Eastern and West urn North American Power Grids", epri.com, Product ID:10203, Nov. 25, 2009, 2 pages.
Erickson, Katherine "Conductive cylindrical surface waveguides", 2012.
Erickson, Katherine "Conductive cylindrical surface waveguides", www.ideals.illinois.edu/bitstream/handle/2142/30914, 2012.
Erickson, Katherine "Conductive cylindrical surface waveguides", www.ideals.illinois.edu/bitstream/handle/2142/30914/Erickson_Katherine. pdf?sequence=1, 2012.
Eskelinen, Harri "DFM (A)—aspects for a horn antenna design", Lappeenranta University of Technology, 2004.
Eskelinen, P. "A low-cost microwave rotary joint", International Radar Conference, 13-17, Abstract Only, Oct. 2014, 1-4.
Farzaneh, Masoud et al., "Systems for Prediction and Monitoring of Ice Shedding, Anti-Cicing and De-Icing for Power Line Conductors and Ground Wires", Dec. 1, 2010, 1-100.
Feko, "mmWave Axial Choke Horn Antenna with Lens", Sep. 24, 2013, 2 pages.

(56) References Cited

OTHER PUBLICATIONS

Feng, Taiming et al., "Design of a survivable hybrid wireless-optical broadband-access network", Journal of Optical Communications and Networking 3.5, 2011, 458-464.
Feng, Wei et al., "Downlink power allocation for distributed antenna systems in a multi-cell environment", 2009 5th International Conference on Wireless Communications, Networking and Mobile Computing. IEEE, 2009.
Fenn, Alan J. et al., "A Terrestrial Air Link for Evaluating Dual-Polarization Techniques in Satellite Communications", vol. 9, No. 1, The Lincoln Laboratory Journal, 1996, 3-18.
Fenye, Bao et al., "Dynamic trust management for internet of things applications", Proceedings of the 2012 international workshop on Selfaware internet of things. ACM, Abstract Only, 2012, 1 page.
Fiorelli, Riccardo et al., "ST7580 power line communication systemonchip design guide", AN4068 Application note, ST, st.com, Doc Id 022923 Rev 2, Jul. 2012.
Fitzgerald, William D. "A 35-GHz Beam Waveguide System for the Millimeter-Wave Radar", The Lincoln Laboratory Journal, vol. 5, No. 2, 1992, 245-272.
Ford, Steven "AT&T's new antenna system will boost cellular coverage at Walt Disney World", Orlando Sentinel, orlandosentinel.com, Mar. 9, 2014.
Freyer, Dan "Combating the Challenges of Ka-Band Signal Degradation", SatMagazine, satmagzine.com., Sep. 2014.
Friedman, M et al., "Low-loss RF transport over long distances", IEEE Transactions on Microwave Theory and Techniques, Jan. 1, 2001, 341-348.
Friedman, M et al., "Low-Loss RF Transport Over Long Distances", IEEE Transactions on Microwave Theory and Techniques, vol. 49, No. 2, Feb. 2001, 8 pages.
Friedman, M. et al., "Low-Loss RF Transport Over Long Distances", IEEE Transactions on Microwave Theory an Techniques, vol. 49, No. 2, Feb. 2001, 341-348.
Fromm, W. et al., "A new microwave rotary joint", 1958 IRE International Convention Record, 21-25, 6:78-82, Abstract Only, Mar. 1966, 2 pages.
Garcia-Etxarri, Aitzol et al., "A combination of concave/convex surfaces for fieldenhancement optimization: the indented nanocone", Optics express 20.23, 2012, 2520125212.
Geterud, Erik "Design and Optimization of Wideband Hat-Fed Reflector Antenna with Radome for Satellite Earth Station", http://publications.lib.chalmers.se/records/fulltext/163718.pdf, Discloses Frequency Selective Surfaces for antenna coverings for weather protection (table of materials on p. 29-30; pp. 37-46)., 2012.
Ghazisaidi, Navid et al., "Survivability analysis of next-generation passive optical networks and fiber-wireless access networks", Reliability, IEEE Transactions on 60.2, 2011, 479-492.
Gigamon, "Out-of-Band Security Solution", www.gigamon.com, Aug. 3, 2014, 7 pages.
Gloeckler, R "Phased Array for Millimeter Wave Frequencies", International Journal of Infrared and Millimeter Waves, Springer, vol. 11, No. 2, Feb. 1, 1990.
Goldsmith, P.F. "Quasi-optical techniques", Proceedings of the IEEE., vol . 80, No. 11, Nov. 1, 1992.
Golrezaei, Negin et al., "FemtoCaching: Wireless Video Content Delivery through Distributed Caching Helpers", Infocom, Proceedings IEEE, 2012.
Gomes, Nathan J. et al., "Radio-over-fiber transport for the support of wireless broadband services", Journal of Optical Networking 8.2: 156-178., 2009.
Gonthier, François et al., "Mode coupling in nonuniform fibers: comparison between coupled-mode theory and finite-difference beam-propagation method simulations", JOSA B 8.2: 416421, Abstract Only, 1991, 3 pages.
Gritzalis, Dimitris et al., "The Sphinx enigma in critical VoIP infrastructures: Human or botnet?", Information, Intelligence, Systems and Applications (IISA), 2013 Fourth International Conference, IEEE, 2013.
Guo, Shuo "Detecting Faulty Nodes with Data Errors for Wireless Sensor Networks", 2014.
Hadi, Ghozali S. et al., "Autonomous UAV System Development for Payload Dropping Mission", The Journal of Instrumentation, Automation and Systems, vol. 1, No. 2, 2014, pp. 72-22.
Haider, Muhammad Kumail et al., "Mobility resilience and overhead constrained adaptation in directional 60 GHz WLANs: protocol design and system implementation", Proceedings of the 17th ACM International Symposium on Mobile Ad Hoc Networking and Computing. ACM, 2016.
Halligan, Matthew S. "Maximum crosstalk estimation and modeling of electromagnetic radiation from PCB/highdensity connector interfaces", http://scholarsmine.mst.edu/cgi/viewcontent.cgiarticle=3326&context=doctoral_dissertations, 2014.
Han, Chong et al., "Crosslayer communication module for the Internet of Things", Computer Networks 57.3: 622633, Abstract Only, 2013, 1 page.
Hanashi, Abdalla M. et al., "Effect of the Dish Angle on the Wet Antenna Attenuation", IEEE, 2014, 1-4.
Haroun, Ibrahim et al., "WLANs meet fiber optics-Evaluating 802.11 a WLANs over fiber optics links", RF Des. Mag: 36-39., 2003.
Hassan, Karim "Fabrication and characterization of thermo-plasmonic routers for telecom applications", Diss. Univ. de Bourgogne., 2014.
Hassan, Maaly A. "Interference reduction in mobile ad hoc and sensor networks", Journal of Engineering and Computer Innovations vol. 2(7), Sep. 2011, 138-154.
Hassani, Alireza et al., "Porous polymer fibers for low-loss Terahertz guiding", Optics express 16.9, 2008, 6340-6351.
Hautakorpi, Jani et al., "Requirements from Session Initiation Protocol (SIP) Session Border Control (SBC) Deployments", RFC5853, IETF, 2010.
Hawrylyshen, A. et al., "Sipping Working Group", J. Hautakorpi, Ed. Internet-Draft G. Camarillo Intended status: Informational Ericsson Expires: Dec. 18, 2008 R. Penfield Acme Packet, 2008.
Hays, Phillip "SPG-49 Tracking Radar", http://web.archive.org/web/20150314053758/http://www.okieboat.com/SPG-49%20description.html, 2015.
Heo, Joon et al., "Identity-Based Mutual Device Authentication Schemes for PLC Systems", IEEE International Symposium on Power Line Communications and Its Applications, 2008, pp. 47-51.
Hoss, R.J. et al., "Manufacturing Methods and Technology Program for Ruggedized Tactical Fiber Optic Cable", No. ITT-80-03-078. ITT Electrooptical Products Div Roanoke VA., 1980.
Howard, Courtney "UAV command, control & communications", Military & Aerospace Electronics, militaryaerospace.com, Jul. 11, 2013, 15 pages.
Huth, G. K. "Integrated source and channel encoded digital communication system design study", http://ntrs.nasa.gov/archive/nasa/casi.ntrs.nasa.gov/19750003064.pdf, 1974.
Infoexpress, "Detecting and Preventing MAC Spoofing", Network Access Control Solutions, 2014, 1 page.
Ippolito, Louis J. "Propagation effects handbook for satellite systems design. A summary of propagation impairments on 10 to 100 GHz satellite links with techniques for system design", 1989, Abstract Only, 1989, 1 page.
Islam, M. T. "Coplanar Waveguide Fed Microstrip Patch Antenna", Information Technology Journal 9.2 (2010): 367-370., 2010, 367-370.
Izumiyama, Hidetaka et al., "Multicast over satellite", Applications and the Internet, (Saint 2002). Proceedings. Symposium on. IEEE, 2002.
Jackson, Mark "Timico CTO Hit by Slow FTTC Broadband Speeds After Copper Corrosion", ISP review, ispreview.co.uk, Mar. 5, 2013.
Jaeger, Raymond et al., "Radiation Performance of Germanium Phosphosilicate Optical Fibers", RADC-TR-81-69: Final Technical Report, Galileo Electro-Optical Corp, May 1981.
James, Graeme L. et al., "Diplexing Feed Assemblies for Application to Dual-Reflector Antennas", IEEE Transactions on Antennas and Propagation, vol. 51, No. 5, May 2003, 1024-1029.

(56) References Cited

OTHER PUBLICATIONS

James, J. R. et al., "Investigations and Comparisons of New Types of Millimetre-Wave Planar Arrays Using Microstrip and Dielectric Structures", Royal Military College of Science, Apr. 1985, 122 pages.
James, J.R. et al., "Investigations and Comparisons of New Types of Millimetre-Wave Planar Arrays Using Microstrip and Dielectric Structures", Royal Military Coll of Science Shrivenham (England)., 1985.
Jang, Hung-Chin "Applications of Geometric Algorithms to Reduce Interference in Wireless Mesh Network", Journal on Applications of Graph Theory in Wireless Ad hoc Networks and Sensor Networks (JGRAPH-HOC) vol. 2, No. 1, Abstract Only, Mar. 2010, 1 page.
Jawhar, Imad et al., "A hierarchical and topological classification of linear sensor networks", Wireless Telecommunications Symposium, WTS, IEEE, http://faculty.uaeu.ac.ae/Nader_M/papers/WTS2009.pdf, 2009, 8 pages.
Jee, George et al., "Demonstration of the Technical Viability of PLC Systems on Medium- and Low-Voltage Lines in the United States", Broadband is Power: Internet Access Via Power Line Networks, IEEE Communication Magazine, May 2003, 5 pages.
Jeong, et al., "Study of elliptical polarization requirement of KSTAR 84-GHz ECH system", Journal-Korean Physical Society 49, 2006.
Jiang, Peng "A New Method for Node Fault Detection in Wireless Sensor Networks", 2009.
Jin, "Quasi-optical mode converter for a coaxial cavity gyrotron", Forschungszentrum, 2007.
Jin, Yu et al., "Nevermind, the Problem Is Already Fixed: Proactively Detecting and Troubleshooting Customer DSL Problems", ACM CoNEXT, Philadelphia, USA, Nov.-Dec. 2010, 12 pages.
Jones, Jr., Howard S. "Conformal and Small Antenna Designs", U.S. Army Electronics Research and Development Command, Harry Diamond Laboratories, Apr. 1981, 32 pages.
Kamilaris, et al., "Exploring the Use of DNS as a Search Engine for the Web of Things", Internet of Things (WF-IoT), 2014 IEEE World Forum, 2014.
Kang, "Chapter 6: Array Antennas", IHS Engineering360, globalspec.com, http://www.globalspec.com/reference/75109/203279/chapter-6-array-antennas, Apr. 22, 2015.
Karbowiak, A. E. et al., "Characteristics of Waveguides for Long-Distance Transmission", Journal of Research of the National Bureau of Standards, vol. 65D, No. 1, Jan.-Feb. 1961, May 23, 1960, 75-88.
Katkovnik, Vladimir et al., "High-resolution signal processing for a switch antenna array FMCW radar with a single channel receiver", Sensor Array and Multichannel Signal Processing Workshop Proceedings, IEEE., 2002.
Katrasnik, Jaka "New Robot for Power Line Inspection", 2008 IEEE Conference on Robotics, Automation and Mechatronics, 2008, 1-6.
Khan, "Dual polarized dielectric resonator antennas", Chalmers University of Technology, 2010.
Kikuchi, H. et al., "Hybrid transmission mode of Goubau lines", J.Inst.Electr.Comm.Engrs., Japan,vol. 43, 1960, 39-45.
Kim, Myungsik et al., "Automated RFID-based identification system for steel coils", Progress in Electromagnetics Research 131, 2012, 1-17.
Kima, Yi-Gon et al., "Generating and detecting torsional guided waves using magnetostrictive sensors of crossed coils", Chonnam National University, Republic of Korea, Elsevier Ltd,, 2010.
Kirkham, H. et al., "Power system applications of fiber optics (Jet Propulsion Lab", JPL Publication 84-28, Electric Energy Systems Division, U.S. DoE, 1984, 180.
Kleinrock, Leonard et al., "On measured behavior of the ARPA network", Proceedings of the May 610, 1974.
Kliros, George "Dielectric-EBG covered conical antenna for UWB applications", https://www.researchgate.net/profile/George_Kliros/publication/235322849_Dielectric-EBG_covered_conical_antenna_for_UWB_applications/links/54329e410cf225bddcc7c037.pdf, Disclosing a quasi-planar wideband conical antenna coated with alternating high- and low-permittivity dielectric spherical shells (Section 2; Figure 1 on the 3rd Page)., 2010.
Koga, Hisao et al., "High-Speed Power Line Communication System Based on Wavelet OFDM", 7th International Symposium on Power-Line Communications and Its Applications, Mar. 26-28, 2003, 226-231.
Koshiba, Masanori et al., "Analytical expression of average power-coupling coefficients for estimating intercore crosstalk in multicore fibers", Photonics Journal, IEEE 4.5, 2012, 1987-1995.
Kroon, Barnard et al., "Steady state RF fingerprinting for identity verification: one class classifier versus customized ensemble", Artificial Intelligence and Cognitive Science. Springer Berlin Heidelberg, 198206, Abstract Only, 2010, 3 pages.
Kroyer, Thomas "A Waveguide High Order Mode Reflectometer for the Large Hadron Collider Beam-pipe", Diss. TU Wien., 2003.
Kuhn, Marc et al., "Power Line Enhanced Cooperative Wireless Communications", IEEE Journal on Selected Areas in Communications, vol. 24, No. 7, Jul. 2006, 10 pages.
Kumar, Sailesh "Survey of Current Network Intrusion Detection Techniques", Washington Univ. in St. Louis, Dec. 2007.
Kune, Denis F. et al., "Ghost Talk: Mitigating EMI Signal Injection Attacks against Analog Sensors", IEEE Symposium on Security and Privacy, 2013, 145-159.
Laforte, J.L. et al., "State-of-the-art on power line de-icing", Atmospheric Research 46, 143-158, 1998.
Lappgroupusa, "Selection of Number of Cable Cores With Emphasis on Sizing Parameters", Industrial Cable & Connector Technology News, lappconnect.blogspot.com, http://lappconnect.blogspot.com/2014_10_01_archive.html, Oct. 30, 2014.
Lazaropoulos, Athanasios G. "Wireless sensor network design for transmission line monitoring, metering, and controlling: introducing broadband over power lines-enhanced network model (BPLeNM)", ISRN Power Engineering, 2014.
Lee, Joseph C. "A Compact Q-/K-Band Dual Frequency Feed Horn", No. TR-645, Massachusetts Institute of Technology, Lincoln Laboratory, May 3, 1983, 40 pages.
Leech, Jamie et al., "Experimental investigation of a low-cost, high performance focal-plane horn array", Terahertz Science and Technology, IEEE Transactions on 2.1, 2012, 61-70.
Li, Mo et al., "Underground structure monitoring with wireless sensor networks", Proceedings of the 6th international conference on Information processing in sensor networks, ACM, 2007.
Li, Xi et al., "A FCM-Based peer grouping scheme for node failure recovery in wireless P2P file sharing", 2009 IEEE International Conference on Communications, 2009.
Li, Xiang-Yang et al., "Interference-Aware Topology Control for Wireless Sensor Networks", Secon. vol. 5, 2005.
Li, Xiaowei et al., "Integrated plasmonic semi-circular launcher for dielectric-loaded surface plasmonpolariton waveguide", Optics express 19.7: 65416548, 2011.
Li, Xu et al., "Smart community: an internet of things application", Communications Magazine, IEEE 49.11: 68-75, 2011.
Lier, E. et al., "Simple hybrid mode horn feed loaded with a dielectric cone", Electronics Letters 21.13: 563564, 1985.
Lier, Erik "A Dielectric Hybrid Mode Antenna Feed: A Simple Alternative to the Corrugated Horn", IEEE Transactions on Antennas and Propagation, vol. AP-34, No. 1, Jan. 1986, 21-30.
Lim, Christina et al., "Fiber-wireless networks and subsystem technologies", Lightwave Technology, Journal of 28.4, 390-405, 2010.
Liu, et al., "A 25 Gb/s (/km 2) urban wireless network beyond IMTadvanced", IEEE Communications Magazine 49.2, 2011, 122-129.
Lou, Tiancheng "Minimizing Average Interference through Topology Control", Algorithms for Sensor Systems, Springer Berlin Heidelberg, 2012, 115-129.
L-TEL: Quanzhou L-Tel Communicat, "Products: GSM Mircro Repeater", www.l-tel.com, Apr. 24, 2015, 3 pages.
Lucyszyn, S. et al., "Novel RF MEMS Switches", Microwave Conference, APMC, Asia-Pacific. IEEE, 2007.

(56) References Cited

OTHER PUBLICATIONS

Lucyszyn, Stepan et al., "RF MEMS for antenna applications", Antennas and Propagation (EuCAP), 7th European Conference on. IEEE,, 2013.
Luo, Qi et al., "Circularly polarized antennas", John Wiley & Sons, Book—description only, 2013, 1 page.
Mahato, Suvranshu Sekhar "Studies on an Infrared Sensor Based Wireless Mesh Network. Diss.", Abstract Only, 2010, 2 pages.
Maier, Martin et al., "The audacity of fiberwireless (FiWi) networks", AccessNets. Springer Berlin Heidelberg, 16-35., 2009.
Marcatili, E.A. et al., "Hollow Metallic and Dielectric Waveguides for Long Distance Optical Transmission and Lasers", Bell System Technical Journal 43(4), Abstract Only, 2 pages, 1964, 1783-1809.
Matsukawa, et al., "A dynamic channel assignment scheme for distributed antenna networks", Vehicular Technology Conference (VTC Spring), 2012 IEEE 75th. IEEE, 2012.
McAllister, M.W. et al., "Resonant hemispherical dielectric antenna", Electronics Letters 20.16: 657659, Abstract Only, 1984, 1 page.
Meessen, A. "Production of EM Surface Waves by Superconducting Spheres: A New Type of Harmonic Oscillators", Progress in Electromagnetics Research Symposium Proceedings, Moscow, Russia, Aug. 19-23, 2012, pp. 529-533.
Meng, H. et al., "A transmission line model for high-frequency power line communication channel", Power System Technology, PowerCon 2002. International Conference on. vol. 2. IEEE, 2002. http:/ /infocom. uniroma 1.it/ ""enzobac/MengChen02. pdf, 2002.
Menon, S.S. et al., "Propagation characteristics of guided modes in a solid dielectric pyramidal horn", Proceedings of the 2012 International Conference on Communication Systems and Network Technologies, IEEE Computer Society, Abstract Only, 2012, 2 pages.
Microwave Technologies, Ind, "Dielectric Antenna", www.microwavetechnologiesinc.co.in/microwavecommunicationlabproducts.html#dielectricantenna, May 21, 2015.
Miller, Ashley et al., "Pathway to Ubiquitous Broadband: Environments, Policies, and Technologies to Implementation Josh Winn Matthew Burch", Oct. 2016.
Miller, David A. "Establishing Optimal Wave Communication Channels Automatically", Journal of Lightwave Technology, vol. 31, No. 24, Dec. 15, 2013, 3987-3994.
Mishra, Sumita et al., "Load Balancing Optimization in LTE/LTEA Cellular Networks: A Review", arXiv preprint arXiv:1412.7273 (2014), 2014, 1-7.
Mitchell, John E. "Integrated Wireless Backhaul Over Optical Access Networks", Journal of Lightwave Technology 32.20, 2014, 3373-3382.
Miyagi, M. "Bending losses in hollow and dielectric tube leaky waveguides", Applied Optics 20(7), Abstract Only, 2 pages, 1981, 1221-1229.
Moaveni-Nejad, Kousha et al., "Low-Interference Topology Control for Wireless Ad Hoc Networks", Department of Computer Science, Illinois Institute of Technology, Ad Hoc & Sensor Wireless Networks 1.1-2, 2005, 41-64.
Moisan, M. et al., "Plasma sources based on the propagation of electromagnetic surface waves", Journal of Physics D: Applied Physics 24.7: 1025, 1991.
Mokhtarian, Kianoosh et al., "Caching in Video CDNs: Building Strong Lines of Defense", EuroSys, Amsterdam, Netherlands, 2014.
Mori, A. et al., "The Power Line Transmission Characteristics for an OFDM Signal", Progress in Electromagnetics Research, Pier 61, Musashi Institute of Technology, 2006, 279-290.
Morse, T.F. "Research Support for the Laboratory for Lightwave Technology", Brown Univ Providence Ri Div of Engineering, 1992.
Mruk, Joseph Rene "Wideband monolithically integrated frontend subsystems and components", Diss. University of Colorado, 2011.
Mushref, Muhammad "Matrix solution to electromagnetic scattering by a conducting cylinder with an eccentric metamaterial coating", http://www.sciencedirect.com/science/article/pii/S0022247X06011450/pdf?md5=4823be0348a3771b5cec9ffb7f326c2c&pid=1-s2.0-S0022247X06011450-main.pdf, Discloses controlling antenna radiation pattern with coatings, 2007.
Mwave, "Cband & L/Sband Telemetry Horn Antennas", mwavellc.com, www.mwavellc.com/custom-Band-LS-BandTelemetryHornAntennas.php, Jul. 6, 2012.
Nachiketh, P. et al., "Optimizing public-key encryption for wireless clients", Proceedings of the IEEE International Conference on Communications (ICC 2002). No. 1., 2002.
Nakano, Hisamatsu "http://repo.lib.hosei.ac.jp/bitstream/10114/3835/1/31_TAP(Low-Profile).pdf", Discloses affecting radiation patterns with alternating high-and low-permittivity dielectric shell coatings and formulae for dterimining the results (Figures 2-5 on p. 1865)., 2000.
Nandi, Somen et al., "Computing for rural empowerment: enabled by last-mile telecommunications", IEEE Communications Magazine 54.6, 2016, 102-109.
Narayanan, Arvind "Fingerprinting of RFID Tags and HighTech Stalking", 33 Bits of Entropy, 33bits.org, Oct. 4, 2011.
Nassa, Vinay Kumar "Wireless Communications: Past, Present and Future", Dronacharya Research Journal: 50. vol. III, Issue-II, Jul.-Dec. 2011, 2011.
NBNTM, "Network technology", nbnco.com.au, Jun. 27, 2014, 2 pages.
Netgear, "Powerline—Juice Up Your Network With Powerline", www.netgear.com/home/products/networking/powerline, Apr. 21, 2015, 3 pages.
Newmark System, Inc, "GM-12 Gimbal Mount", newmarksystems.com, 2015, 1 page.
Nibarger, John P. "An 84 pixel all-silicon corrugated feedhorn for CMB measurements", Journal of Low Temperature Physics 167.3-4, 2012, 522-527.
Nicholson, Basil J. "Microwave Rotary Joints for X-, C-, and S-band", Battelle Memorial Inst Columbus OH, 1965.
Nikitin, A. Y. et al., "Efficient Coupling of Light to Graphene Plasmons by Compressing Surface Polaritons with Tapered Bulk Materials", NanoLetters; pubs.acs.org/NanoLett,Apr. 28, 2014, 2896-2901.
Nikitin, Pavel V. et al., "Propagation Model for the HVAC Duct as a Communication Channel", IEEE Transactions on Antennas and Propagation 51.5, 2003.
Norse Appliance, "Block attacks before they target your network, and dramatically improve the ROI on your entire security infrastructure", norsecorp.com, 2015, 4 pages.
Nuvotronics, "PolyStrata—Phased Arrays & Antennas", Nuvotronics, nuvotronics.comhttp://www.nuvotronics.com/antennas. php, Apr. 26, 2015.
Olver, A. D. "Microwave horns and feeds", vol. 39. IET, Book—description only, 1994, 1 page.
Olver, A.D. et al., "Dielectric cone loaded horn antennas", Microwaves, Antennas and Propagation, IEEE Proceedings H. vol. 135. No. 3. IET, Abstract Only, 1988, 1 page.
Orfanidis, Sophocles J. "Electromagnetic waves and antennas", Rutgers University, 2002.
Pahlavan, Kaveh et al., "Wireless data communications", Proceedings of the IEEE 82.9: 1398-1430, 1994.
Patel, Shwetak N. et al., "The Design and Evaluation of an End-User-Deployable, Whole House, Contactless Power Consumption Sensor", CHI 2010: Domestic Life, Apr. 2010, 10 pages.
Pato, et al., "On building a distributed antenna system with joint signal processing for next generation wireless access networks: The Futon approach", 7th Conference on Telecommunications, Portugal, 2008.
Paul, Sanjoy et al., "The Cache-and-Forward Network Architecture for Efficient Mobile Content Delivery Services in the Future Internet", Innovations in NGN: Future Network and Services, 2008. K-INGN 2008. First ITU-T Kaleidoscope Academic Conference, 2008.
PCT, "International Search Report", dated Oct. 25, 2016, 1-12.
Perkons, Alfred R. et al., "TM surface-wave power combining by a planar active-lens amplifier", Microwave Theory and Techniques, IEEE Transactions on 46.6: 775783, 1998.

(56) References Cited

OTHER PUBLICATIONS

Péter, Zsolt et al., "Assessment of the current intensity for preventing ice accretion on overhead conductors", Power Delivery, IEEE Transactions on 22.1: 4, 2007, 565-57.
Petrovsky, Oleg "The Internet of Things: A Security Overview", w.druva.com, Mar. 31, 2015.
Pham, Tien-Thang et al., "A WDM-PON-compatible system for simultaneous distribution of gigabit baseband and wireless ultrawideband services with flexible bandwidth allocation", Photonics Journal, IEEE 3.1, 2011, 13-19.
Pike, Kevin J. et al., "A spectrometer designed for 6.7 and 14.1 T DNP-enhanced solid-state MAS NMR using quasi-optical microwave transmission", Journal of Magnetic Resonance, 2012, 9 pages.
Piksa, Petr et al., "Elliptic and hyperbolic dielectric lens antennas in mmwaves", Radioengineering 20.1, 2011, 271.
Pixel Technologies, "Pro 600 Sirius XM Radio Amplified Outdoor Antenna", Oct. 3, 2014, 1 page.
Plagemann, Thomas et al., "Infrastructures for community networks", Content Delivery Networks. Springer Berlin Heidelberg, 367-388, 2008.
Pohl, "A dielectric lens-based antenna concept for high-precision industrial radar measurements at 24GHz", Radar Conference (EuRAD), 2012 9th European, IEEE, 2012.
Ponchak, George E. et al., "A New Model for Broadband Waveguide to Microstrip Transition Design", NASA TM-88905, Dec. 1, 1986, 18 pgs.
Pranonsatit, S. et al., "Sectorised horn antenna array using an RF MEMS rotary switch", Asia-Pacific Microwave Conf., APMC., 2010.
Pranonsatit, Suneat et al., "Single-pole eight-throw RF MEMS rotary switch", Microelectromechanical Systems, Journal of 15.6: 1735-1744, 2006.
Prashant, R.R. et al., "Detecting and Identifying the Location of Multiple Spoofing Adversaries in Wireless Network", International Journal of Computer Science and Mobile Applications, vol. 2 Issue. 5, May 2014, 1-6.
Qi, Xue et al., "Ad hoc QoS ondemand routing (AQOR) in mobile ad hoc networks", Journal of parallel and distributed computing 63.2, 2003, 154-165.
Qiang, Ma "Sensor Fault Detection in Wireless Sensor Networks and Avoiding the Path Failure Nodes", 2015.
Qiu, Lili "Fault Detection, Isolation, and Diagnosis in Multihop Wireless Networks", 2003.
Quinstar Technology, Inc., "Prime Focus Antenna (QRP series)", quinstar.com, Aug. 19, 2016, 2 pages.
Rahim, S. K. A. et al., "Measurement of wet antenna losses on 26 GHz terrestrial microwave link in Malaysia", Wireless Personal Communications 64.2: 225231, 2012.
Rambabu, K. et al., "Compact single-channel rotary joint using ridged waveguide sections for phase adjustment", IEEE Transac-Compact single-channel rotary joint using ridged waveguide sections for phase adjustmenttions on Microwave Theory and Techniques, 51(8):1982-1986, Abstract Only, Aug. 2003, 2 pages.
Rangan, Sundeep et al., "Millimeter-Wave Cellular Wireless Networks: Potentials and Challenges", Proceedings of the IEEE, vol. 102, No. 3, Mar. 2014, 366-385.
Rangel, Rodrigo K. et al., "Sistema de Inspecao de Linhas de Transmissao de Energia Electrica Utilizando Veiculos Aereos Nao-Tripulados", Sep. 14-16, 2009, 1-9.
Rappaport, Theodore S. et al., "Mobile's Millimeter-Wave Makeover", Spectrum.IEEE.Org, Sep. 2014, 8 pages.
Raychaudhuri, Dipankar et al., "Emerging Wireless Technologies and the Future Mobile Internet", Cambridge University Press, Abstract Only, Mar. 2011, 1 page.
Raychem, "Wire and Cable", Dimensions 2:1., 1996.
Ren-Bin, Zhong et al., "Surface plasmon wave propagation along single metal wire", Chin. Phys. B, vol. 21, No. 11, May 2, 2012, 9 pages.
Reynet, Olivier et al., "Effect of the magnetic properties of the inclusions on the high-frequency dielectric response of diluted composites", Physical Review B66.9: 094412, 2002.
RF Check, "Examples of Cell Antennas", rfcheck.com, https://web.archive.org/web/20100201214318/http//www.rfcheck.com/Examplesof-Cell-Antennas.php, Feb. 1, 2010.
Rosenberg, Uwe et al., "A novel frequency-selective power combiner/divider in single-layer substrate integrated waveguide technology", IEEE Microwave and Wireless Components Letters, vol. 23, No. 8, Aug. 2013, 406-408.
Rouse, Margaret "Transport Layer Security (TLS)", TechTarget, searchsecurity.techtarget.com, Jul. 2006.
Roze, Mathieu et al., "Suspended core subwavelength fibers: towards practical designs for low-loss terahertz guidance", Optics express 19.10, 2011, 9127-9138.
Sagar, Nishant "Powerline Communications Systems: Overview and Analysis", Thesis, May 2011, 80 pages.
Sagues, Mikel et al., "Multi-tap complex-coefficient incoherent microwave photonic filters based on optical single-sideband modulation and narrow band optical filtering", Optics express 16.1, 2008, 295-303.
Sahoo, Srikanta "Faulty Node Detection in Wireless Sensor Networks Using Cluster", 2013.
Saied, Yosra Ben et al., "Trust management system design for the internet of things: a contextaware and multiservice approach", Computers & Security 39: 351365, Abstract Only, 2013, 2 pages.
Salema, Carlos et al., "Solid dielectric horn antennas", Artech House Publishers, 1998.
Salema, Carlos et al., "Solid dielectric horn antennas", Artech House Publishers, Amazon, Book—description only, 1998.
Sarafi, A. et al., "Hybrid wireless-broadband over power lines: A promising broadband solution in rural areas", Communications Magazine, IEEE 47.11, 2009, 140-147.
Sarafi, Angeliki M. et al., "Hybrid Wireless-Broadband over Power Lines: A Promising Broadband Solution in Rural Areas", IEEE Communications Magazine, Nov. 2009, 8 pages.
Sarnecki, Joseph et al., "Microcell design principles", Communications Magazine, IEEE 31.4: 76-82, 1993.
Saruhan, Ibrahim Halil "Detecting and Preventing Rogue Devices on the Network", SANS Institute InfoSec Reading Room, sans.org, Aug. 8, 2007, 1 page.
Scarfone, Karen et al., "Technical Guide to Information Security Testing and Assessment", National Institute of Standards and Technology, csrc.nist.gov, Special Publication, Sep. 2008, 800-115.
Scerri, Paul et al., "Geolocation of RF emitters by many UAVs", AIAA Infotech, Aerospace 2007 Conference and Exhibit, 2007.
Sciencedaily, "New Wi-Fi antenna enhances wireless coverage", www.sciencedaily.com, Apr. 29, 2015, 2 pages.
Security Matters, "Product Overview: Introducing SilentDefense", secmatters.com, Nov. 9, 2013, 1 page.
Sengled, "Boost: The world's first Wi-Fi extending led bulb", www.sengled.com/sites/default/files/field/product/downloads/manual/a01-a60_na_user_manual.pdf, Dec. 2014.
Shafai, Lotfollah "Dielectric Loaded Antennas", John Wiley & Sons, Inc, www.researchgate.net/publication/227998803_Dielectric_Loaded_Antennas, Apr. 15, 2005.
Shafi, Mansoor et al., "Advances in Propagation Modeling for Wireless Systems", EURASIP Journal on Wireless Communications and Networking. Hindawi Publishing Corp, 2009, p. 5.
Shankland, Steven "Lowly DSL poised for gigabit speed boost", C|Net, cnet.com, Oct. 21, 2014.
Sharma, Archana et al., "Dielectric Resonator Antenna for X band Microwave Application", Research & Reviews | International Journal of Advanced Research in Electrical, Electronics and Instrumentation Engineering, Oct. 2016.
Shila, Devu M. "Load-Aware Traffic Engineering for Mesh Networks", Computer Communications 31.7, 2008, 1460-1469.
Shimabukuko, F.I. et al., "Attenuation measurement of very low-loss dielectric waveguides by the cavity resonator method in the millimeter/submillimeter wavelength range", No. TR-0086A (2925-06)-1, Aerospace Corp El Segundo CA Electronics Research Lab, 1989.

(56) References Cited

OTHER PUBLICATIONS

Shindo, Shuichi et al., "Attenuation measurement of cylindrical dielectric-rod waveguide", Electronics Letters 12.5, 1976, 117-118.
Shumate, Paul W. et al., "Evolution of fiber in the residential loop plant", IEEE Communications Magazine 29.3, 1991, 68-74.
Sievenpiper, D.F. et al., "Two-dimensional beam steering using an electrically tunable impedance surface", IEEE Transactions on Antennas and Propagation, vol. 51, No. 10, Nov. 2003, pp. 2713-2722.
Silver, Ralph U. "Local Loop Overview", National Communications System (NCS), BellSouth Network Training, newnetworks.com, Aug. 2016.
Simons, Rainee N. "Coplanar Waveguide Feeds for Phased Array Antennas", Solid State Technology Branch of NASA Lewis Research Center Fourth Annual Digest, Conference on Advanced Space Exploration Initiative Technologies cosponsored by AIAA, NASA and OAI, 1992, 1-9.
Singh, Seema M. et al., "Broadband Over Power Lines a White Paper", State of New Jersey, Division of the Ratepayer Advocate, NJ, Oct. 2016.
Sommerfeld, A. "On the propagation of electrodynamic waves along a wire", Annals of Physics and Chemistry New Edition, vol. 67, No. 2, 1899, 72 pages.
Souryal, Michael R. et al., "Rapidly Deployable Mesh Network Testbed", https://pdfs.semanticscholar.org/f914/1ce6999c4095eab3bdea645745761ebe5141.pdf, 2009.
Spencer, D G. "Novel Millimeter ACC Antenna Feed", IEEE Colloquium on Antennas for Automotives, Mar. 10, 2000.
Stancil, Daniel D. et al., "High-speed internet access via HVAC ducts: a new approach", Global Telecommunications Conference, IEEE. vol. 6., 2001.
Steatite, "Custom Horn Antennas", Steatite QPar Antennas, steatiteqparantennas.co.uk, May 21, 2015, 1 page.
Strahler, Olivier "Network Based VPNs", SANS Institute InfoSec Reading Room, sans.org., Aug. 2002.
Strieby, M.E. et al., "Television transmission over wire lines", American Institute of Electrical Engineers, Transactions of the 60.12: 1090-1096, Abstract Only, 1941, 2 pages.
Sundqvist, Lassi "Cellular Controlled Drone Experiment: Evaluation of Network Requirements", 2015.
Sung-Woo, Lee "Mutual Coupling Considerations in the Development of Multi-feed Antenna Systems", http://ntrs.nasa.gov/archive/nasa/casi.ntrs.nasa.gov/19750003064.pdf, 2008.
Szabó, Csaba A. "European Broadband Initiatives with Public Participation", Broadband Services: 255, 2005.
Szczys, Mike "Cameras Perch on Power Lines, Steal Electricity", http://hackaday.com/2010/06/28/cameras-perch-on-power-lines-steal-electricity/, Discloses cameras that clamp on to power lines and use induction as a power source., 2010.
Taboada, John M. et al., "Thermo-optically tuned cascaded polymer waveguide taps", Applied physics letters 75.2, 1999, 163-165.
Talbot, David "Adapting Old-Style Phone Wires for Superfast Internet", Adapting Old-Style Phone Wires for Superfast Internet, Jul. 30, 2013.
Tantawi, Sami G. et al., "High-power multimode X-band rf pulse compression system for future linear colliders", Physical Review Special Topics-Accelerators and Beams, 1098-4402/05/8(4)/042002, 2005, 19 pages.
Templeton, Steven J. et al., "Detecting Spoofed Packets", DARPA Information Survivability Conference and Exposition, vol. 1, IEEE, 2003.
Teng, Ervin et al., "Aerial Sensing and Characterization of ThreeDimensional RF Fields", Univ. at Buffalo, cse.buffalo.edu, Sep. 2016.
Theoleyr, Fabrice "Internet of Things and M2M Communications", books.google.com, ISBN13: 9788792982483, Book—description only, Apr. 17, 2013, 1 page.
Thornton, John et al., "Modern lens antennas for communications engineering", vol. 39, 2013.
Thota, Saigopal et al., "Computing for Rural Empowerment: Enabled by Last-Mile Telecommunications (Extended Version)", Technical Report, 2013.
Valladares, Cindy "20 Critical Security Controls: Control 7—Wireless Device Control", Tripwire—The State of Security, tripwire.com, Mar. 21, 2013.
Vogelgesang, Ralf et al., "Plasmonic nanostructures in aperture-less scanning near-field optical microscopy (aSNOM)", physica status solidi (b) 245.10: 22552260, 2008.
Volat, C. et al., "De-icing/anti-icing techniques for power lines: current methods and future direction", Proceedings of the 11th International Workshop on Atmospheric Icing of Structures, Montreal, Canada., 2005.
Wade, Paul "Multiple Reflector Dish Antennas", http://www.w1ghz.org/antbook/conf/Multiple_reflector_antennas.pdf, 2004.
Wagter, Herman "Fiber-to-the-X: the economics of last-mile fiber", ARS Technica, arstechnica.com Mar. 31, 2010.
Wake, David et al., "Radio over fiber link design for next generation wireless systems", Lightwave Technology, Journal of28.16: 2456-2464., 2010.
Wang, Jing et al., "The influence of optical fiber bundle parameters on the transmission of laser speckle patterns", Optics express 22.8, 2014, 8908-8918.
Wang, Wei "Optimization Design of an Inductive Energy Harvesting Device for Wireless Power Supply System Overhead High-Voltage Power Lines", https://pdfs.semanticscholar.org/3941/601af7a21d55e8b57ab0c50d5f1d9 f9f6868.pdf, Discloses an induction based energy harvesting device that takes energy from overhead powerlines (Figure 4)., 2016.
Wang, Xingfu et al., "Zigzag coverage scheme algorithm & analysis for wireless sensor networks", Network Protocols and Algorithms 5.4, 2013, 19-38.
Wenger, N. "The launching of surface waves on an axial-cylindrical reactive surface", IEEE Transactions on Antennas and Propagation 13.1, 1965, 126-134.
Werner, Louis B. et al., "Operation Greenhouse", Scientific Director's Report of Atomic Weapon Tests at Eniwetok, Annex 6.7 Contimation-Decontamination Studies Naval Radiological Defense Lab, 1951.
Wilkins, George A. "Fiber Optic Telemetry in Ocean Cable Systems", Chapter in new edition of Handbook of Oceanographic Winch, Wire and Cable Technology, Alan H. Driscoll, Ed.,(to be published by University of Rhode Island)., 1986.
Wolfe, Victor et al., "Feasibility Study of Utilizing 4G LTE Signals in Combination With Unmanned Aerial Vehicles for the Purpose of Search and Rescue of Avalanche Victims (Increment 1)", University of Colorado at Boulder, Research Report, 2014, 26 pages.
Wolff, Christian "Phased Array Antenna", Radar Tutorial, web.archive.org, radartutorial.eu, Oct. 21, 2014, 2 pages.
Wu, Xidong et al., "Design and characterization of singleand multiplebeam mmwave circularly polarized substrate lens antennas for wireless communications", Microwave Theory and Techniques, IEEE Transactions on 49.3, 2001, 431-441.
Xi, Liu Xiao "Security services in SoftLayer", Sep. 21, 2015.
Xia, Cen et al., "Supermodes for optical transmission", Optics express 19.17, 2011, 16653-16664.
Yang, "Power Line Sensor Networks for Enhancing Power Line Reliability and Utilization", Georgia Institute of Technology, https://smartech.gatech.edu/bitstream/handle/1853/41087/Yang_Yi_201108_phd.pdf, Apr. 26, 2011, 264 pages.
Yang, et al., "Power line sensornet—a new concept for power grid monitoring", IEEE Power Engineering Society General Meeting, Abstract Only, 2006, pp. 8.
Yeh, C. et al., "Ceramic Waveguides", Interplanetary Network Progress Report 141.26: 1, May 15, 2000.
Yeh, C. et al., "Thin-Ribbon Tapered Coupler for Dielectric Waveguides", 5/151994, 42-48.
Yilmaz, et al., "Self-optimization of coverage and capacity in LTE using adaptive antenna systems", Aalto University, Feb. 2010.
Yousuf, Muhammad Salman "Power line communications: An Overview Part I", King Fand University of Petroleum and Minerals, Dhahran, KSA, 2008, 5 pages.

(56) References Cited

OTHER PUBLICATIONS

Yu, Shui et al., "Predicted packet padding for anonymous web browsing against traffic analysis attacks", Information Forensics and Security, IEEE Transactions on 7.4, http://nsp.org.au/syu/papers/tifs12.pdf, 2012, 1381-1393.
Zelby, Leon W. "Propagation Modes on a Dielectric Coated Wire", Journal of the Franklin Institute, vol. 274(2), Aug. 1962, pp. 85-97.
Zhang, Ming et al., "PlanetSeer: Internet Path Failure Monitoring and Characterization in WideArea Services", OSDI, vol. 4., 2004.
Zhao, et al., "Energy harvesting for a wireless-monitoring system of overhead high-voltage power lines", IET Generation, Transmission & Distribution 7, IEEE Xplore Abstract, 2013, 2 pages.
Zheng, Zhu et al., "Efficient coupling of propagating broadband terahertz radial beams to metal wires", Optics express 21.9: 1064210650, 2013.
Zucker, "Surface-wave antennas", Antenna engineering handbook 4, 2007, 32 pages.
Article 34 Amendment/Response to Written Opinion filed Apr. 3, 2017, PCT/US16/28197, pp. 1-10.
Article 34 Amendment/Response to Written Opinion PCT/US16/28412, filed Apr. 4, 2017, pp. 1-10.
PCT/US2015/047225 International Preliminary Report on Patentability, dated Mar. 30, 2017, pp. 1-5.
Article 34 Amendment filed for PCT/US16/32441 on, dated Mar. 14, 2017.
Article 34 Amendment for PCT/US16/27398 filed on, dated Mar. 14, 2017.
International Preliminary Report on Patentability for PCT/US2015/049927 dated Apr. 20, 2017.
Amendment Under Article 34 / Response to Written Opinion for PCT/US16/36290 filed on, May 15, 2017.
Amendment Under Article 34 / Response to Written Opinion for PCT/US16/36292 filed on, May 15, 2017.
Amendment Under Article 34 / Response to Written Opinion for PCT/US16/36293 filed on, May 15, 2017.
PCT/US16/36284 Article 34 Amendment filed, May 19, 2017.
PCT/US16/36285 Article 34 Amendment filed, May 19, 2017.
PCT/US16/36288 Article 34 Amendment filed, May 19, 2017.
International Report on Patentability for PCT/US15/056365 dated Jun. 1, 2017.
International Preliminary Report on Patentability for PCT/US2015/056626 dated Jun. 15, 2017.
International Preliminary Report on Patentability for PCT/US2015/056632 dated Jun. 15, 2017.
Article 34 Amendment, PCT/US16/36556, filed May 31, 2017, 1-13.
International Preliminary Report on Patentability, PCT/US2015/051194, dated May 4, 2017, 1-7.
International Preliminary Report on Patentability, PCT/US2015/056368, dated Jun. 1, 2017, 1-8.
International Preliminary Report on Patentability, PCT/US2015/056320, dated Jun. 1, 2017, 1-9.
International Preliminary Report on Patentability PCT/US16/28412, dated May 19, 2017, pp. 1-21.
International Preliminary Report on Patentability PCT/US16/26860, dated May 19, 2017, pp. 1-95.
"7785-1158-Wo Amendment Under Article 34-Response to Written Opinion Filed May 15, 2017", Application No. PCT/US16/36303 filed Jun. 8, 2016, 1-10.
"7785-1164-Wo Article 34 Amendment Filed May 19, 2017", PCT Application No. PCT/US16/36286 filed Jun. 8, 2016, 1-8.
"7785-1178-WO Article 34 Amendment Filed", PCT Application No. PCT/US16/36553 Filed Jun. 9, 2016, 1-11.
"7785-1184-02-WO Amendment Under Article 34 and Response to Written Opinion Filed May 15, 2017", Application No. PCT/US16/41561 filed Jul. 8, 2016, 1-14.
"7785-1184-WO PCT Amendment Under Article 34 Response to Written Opinion Filed May 15, 2017", PCT Application PCT/US16/36254 filed Jun. 8, 2016, 1-11.
"Amendment Under Article 34 / Response to Written Opinion", PCT/US16/28207, Filed Apr. 3, 2017, pp. 1-12.
"Amendment Under Article 34 / Response to Written Opinion", PCT/US16/36295, filed May 4, 2017.
"Amendment Under Article 34 / Response to Written Opinion", PCT/US16/36297, filed May 31, 2017, 12 pages.
"Amendment Under Article 34 / Response to Written Opinion", PCT Application No. PCT/US16/27403, dated Mar. 24, 2017, 11 pages.
"Amendment Under Article 34 / Response to Written Opinion", PCT Application No. PCT/US16/32430, dated Mar. 14, 2017, 19 pages.
"Amendment Under Article 34 / Response to Written Opinion", PCT Application No. PCT/US16/26193, dated Feb. 24, 2017, 6 pages.
"Amendment Under Article 34 / Response to Written Opinion", PCT Application No. PCT/US16/26860, dated Feb. 28, 2017, 6 pages.
"Amendment Under Article 34 / Response to Written Opinion", PCT Application No. PCT/US16/26318, dated Feb. 24, 2017, 7 pages.
"Amendment Under Article 34, Response to Written Opinion", PCT/US16/36289, Filed May 11, 2017, 8 pages.
"Amendment Under Article 34/Response to Written Opinion", PCT Application No. PCT/US2016/020001, dated Jan. 13, 2017, 6 pages.
"Article 34 Amendment", PCT/US16/36798, dated May 15, 2017.
"Article 34 Amendment", PCT/US16/33182, dated Apr. 4, 2017, 1-12.
"Article 34 Amendment", PCT Application No. PCT/US16/30964, dated Apr. 25, 2017, 13 pages.
"Article 34 Amendment", PCT/US16/36551, dated May 23, 2017, 14 pages.
"Article 34 Amendment", PCT/US16/35383, dated Apr. 14, 2017, 15 pages.
"Article 34 Amendment", PCT/US16/36388, dated May 31, 2017, 9 pages.
"Article 34 Amendment Filed Apr. 18, 2017 in PCT Application No. PCT/US16/57161".
"Article 34 Amendment filed Apr. 3, 2017", PCT Application No. PCT/US16/28206, dated Apr. 3, 2017, 9 pages.
"Article 34 Amendment for", PCT/US16/40992 filed on, May 5, 2017.
"International Preliminary Report on Patentability", PCT/US15/51583, dated May 4, 2017.
"International Preliminary Report on Patentability", PCT/US2015/049932, dated Apr. 27, 2017.
"International Preliminary Report on Patentability", PCT/US15/056598, dated Jun. 1, 2017.
"International Preliminary Report on Patentability", PCT/US15/48458, dated Apr. 13, 2017.
"International Preliminary Report on Patentability", PCT/US16/27398 dated May 1, 2017.
"International Preliminary Report on Patentability", PCT/US16/28207, dated May 16, 2017.
"International Preliminary Report on Patentability", PCT/US16/27403, dated May 19, 2017.
"International Preliminary Report on Patentability", PCT/US2015/051146, dated May 4, 2017.
"International Preliminary Report on Patentability", PCT/US2015/051163, dated, May 4, 2017.
"International Preliminary Report on Patentability", PCT/US16/36798, dated Jun. 9, 2017, 20 pages.
"International Preliminary Report on Patentability", PCT/US16/35383, dated Jun. 15, 2017, 32 pages.
"International Preliminary Report on Patentability", PCT/US15/56316, dated Jun. 1, 2017, 8 pages.
"International Preliminary Report on Patentability", PCT/US15/51213, dated May 4, 2017, 9.
"International Preliminary Report on Patentability", PCT/US2015/048454, dated Apr. 13, 2017, pp. 1-9.
"International Preliminary Report on Patentability & Written Opinion", PCT/US16/32430, dated May 25, 2017, 122 pages.

(56) References Cited

OTHER PUBLICATIONS

"International Preliminary Report on Patentability & Written Opinion", PCT/US16/28206, dated May 16, 2017, 23 pages.
"International Preliminary Report on Patentability & Written Opinion", PCT/US2015/051578, dated May 4, 2017, 6 pages.
"International Preliminary Report on Patentability & Written Opinion", PCT/US2015/047315, dated Mar. 30, 2017, 8 pages.
"International Preliminary Report on Patentability & Written Opinion", PCT/US2015/051193, dated May 4, 2017, 8 pages.
"International Preliminary Report on Patentability dated May 23, 2017", PCT Application No. PCT/US2015/056615 filed Oct. 21, 2015, dated May 23, 2017, 1-7.
"PCT Article 34 Amendment filed Apr. 12, 2017", PCT Application PCT/US16/32289 filed May 13, 2016, 1-11.
"Response to Written Opinion and Article 34 Amendment", PCT/US2016/035384, filed Apr. 12, 2017, 10 pages.
Patent Cooperation Treaty, "International Preliminary Report on Patentability dated Jun. 16, 2017", PCT Application No. PCT/US16/36553 filed Jun. 16, 2016, 25 pages.
Patent Cooperation Treaty, "International Preliminary Report on Patentability dated Apr. 25, 2017", Application No. PCT/US2015/051183, dated Apr. 25, 2017, 1-8.
Patent Cooperation Treaty, "International Preliminary Report on Patentability dated Jun. 15, 2017", PCT Application No. PCT/US16/33182 filed May 19, 2016, dated Jun. 15, 2017, 52 pages.
Patent Cooperation Treaty (PCT), "International Preliminary Report on Patentability", Application No. PCT/US2015/049928, dated Apr. 27, 2017, 1-9.
Yeh, W.H. C., "Electromagnetic Surface-Wave Propagation Along a Dielectric Cylinder of Elliptical Cross Section", Thesis, California Institute of Technology, Pasadena, CA, 1962, 182 pgs.
Int'l Preliminary Report on Patentability for PCT/US15/034827 dated Mar. 9, 2017.
"AirCheck G2 Wireless Tester", NetScout®, enterprise.netscout.com, Dec. 6, 2016, 10 pages.
"Brackets, Conduit Standoff", Hubbell Power Systems, Inc., hubbellpowersystems.com, Dec. 2, 2010, 2 pages.
"Dual Band Switched-Parasitic Wire Antennas for Communications and Direction Finding", www.researchgate.net/profile/David_Thiel2/publication/3898574_Dual_band_switched-parasitic_wire_antennas_for_communications_and_direction_finding/links/0fcfd5091b4273ce54000000.pdf, 2000, 5 pages.
"Electronic Countermeasure (ECM) Antennas", vol. 8, No. 2, Apr. 2000, 2 pages.
"International Preliminary Report on Patentability", PCT/US16/20001, dated Feb. 17, 2017, 1-14.
"International Search Report & Written Opinion", PCT/US16/050488, dated Nov. 11, 2016.
"International Search Report & Written Opinion", PCT/US16/50345, dated Nov. 15, 2016.
"International Search Report & Written Opinion", PCT/US2016/050346, dated Nov. 17, 2016.
"International Search Report & Written Opinion", PCT/US2016/050860, dated Nov. 17, 2016, 11 pages.
"International Search Report & Written Opinion", PCT/US2016/050344, dated Nov. 25, 2016, 16 pages.
"International Search Report and Written Opinion", PCT/US2016/046315, dated Nov. 3, 2016.
"International Search Report and Written Opinion", PCT/US2016/050039, dated Nov. 14, 2016.
"International Search Report and Written Opinion", PCT/US2016/050347, dated Nov. 15, 2016.
"International Search Report and Written Opinion", PCT/US2016/051217, dated Nov. 29, 2016.
"Newsletter 4.4—Antenna Magus version 4.4 released!", antennamagus.com, Aug. 10, 2013, 8 pages.
"PCT International Search Report", PCT/US2016/057161, PCT International Search Report and Written Opinion, dated Jan. 12, 2017, 1-13, Jan. 12, 2017, 1-13.
"Technology Brief 13: Touchscreens and Active Digitizers", https://web.archive.org/web/20100701004625/http://web.engr.oregonstate.edu/~moon/engr203/read/read4.pdf, 2010, 289-311.
Al-Ali, A.R. et al., "Mobile RFID Tracking System", Information and Communication Technologies: From Theory to Applications, ICTTA 2008, 3rd International Conference on IEEE, 2008, 4 pages.
Alaridhee, T. et al., "Transmission properties of slanted annular aperture arrays. Giant energy deviation over sub-wavelength distance", Optics express 23.9, 2015, 11687-11701.
Allen, Jeffrey et al., "New Concepts in Electromagnetic Materials and Antennas", Air Force Research Laboratory, Jan. 2015, 80 pages.
Amirshahi, P. et al., "Transmission channel model and capacity of overhead multiconductor mediumvoltage powerlines for broadband communications", Consumer Communications and Networking Conference, 2005, 5 pages.
Amt, John H. et al., "Flight Testing of a Pseudolite Navigation System on a UAV", Air Force Institute of Technology: ION Conference, Jan. 2007, 9 pages.
Ascom, "TEMS Pocket—a Complete Measurement Smartphone System in your Hand", http://www.ascom.us/us-en/tems_pocket_14._0_feature_specific_datasheet.pdf, 2014, 2 pages.
Baanto, "Surface Acoustive Wave (SAW) Touch Screen", http://baanto.com/surface-acoustic-wave-saw-touch-screen, 2016, 4 pages.
Barnes, Heidi et al., "DeMystifying the 28 Gb/s PCB Channel: Design to Measurement", Design Con. 2014, Feb. 28, 2014, 54 pages.
Benkhelifa, Elhadj, "User Profiling for Energy Optimisation in Mobile Cloud Computing", 2015, 1159-1165.
Briso-Rodriguez, "Measurements and Modeling of Distributed Antenna Systems in Railway Tunnels", IEEE Transactions on Vehicular Technology, vol. 56, No. 5, Sep. 2007, 2870-2879.
Budde, Matthias, "Using a 2DST Waveguide for Usable, Physically Constrained Out-of-Band Wi-Fi Authentication", https://pdfs.semanticscholar.org/282e/826938ab7170c198057f9236799e92e21219.pdf, 2013, 8 pages.
Chaimae, Elmakfalji et al., "New Way of Passive RFID Deployment for Smart Grid", Journal of Theoretical and Applied Information Technology 82.1, Dec. 10, 2015, 81-84.
Chen, Ke et al., "Geometric phase coded metasurface: from polarization dependent directive electromagnetic wave scattering to diffusionlike scattering", Scientific Reports 6, 2016, 1-10.
Collins, D.D. et al., "Final Report on Advanced Antenna Design Techniques", GER 11246, Report No. 4, Sep. 6, 1963, 1-70.
Crisp, "Uplink and Downlink Coverage Improvements of 802.11g Signals Using a Distributed Antenna Network", Journal of Lightwave Technology ( vol. 25, Issue: 11), Dec. 6, 2007, 1-4.
Curry, James M., "A Web of Drones: A 2040 Strategy to Reduce the United States Dependance on Space Based Capabilities", Air War College, Feb. 17, 2015, 34 pages.
Dyson, John D., "The Equiangular Spiral Antenna", IRE Transactions on Antennas and Propagation, 1959, 181-187.
Earth Data, "Remote Sensors", NASA, earthdata.nasa.gov, Oct. 17, 2016, 36 pages.
Eizo, "How can a screen sense touch? A basic understanding of touch panels", www.eizo.com/library/basics/basic_understanding_of_touch_panel, Sep. 27, 2010, 8 pages.
Ekstrom, "Slot-line end-fire antennas for THz frequencies", Third International Symposium on Space Terahertz Technology, 280-290.
Emerson, "About Rosemount 5300 Level Transmitter", www.emerson.com, Nov. 2016, 6 pages.
Faggiani, Adriano, "Smartphone-based crowdsourcing for network monitoring: opportunities, challenges, and a case study", http://vecchio.iet.unipi.it/vecchio/files/2010/02/article.pdf, 2014, 8 pages.
Fattah, E. Abdel et al., "Numerical 3D simulation of surface wave excitation in planar-type plasma processing device with a corrugated dielectric plate", Elsevier, Vacuum 86, 2011, 330-334.
Galli, "For the Grid and Through the Grid: The Role of Power Line Communications in the Smart Grid", Proceedings of the IEEE 99.6, Jun. 2011, 1-26.

(56) References Cited

OTHER PUBLICATIONS

Gerini, Giampiero, "Multilayer array antennas with integrated frequency selective surfaces conformal to a circular cylindrical surface", http://alexandria.tue.nl/openaccess/Metis248614.pdf, 2005, 2020-2030.
Gilbert, Barrie et al., "The Gears of Genius", IEEE SolidState Circuits Newsletter 4.12, 2007, 10-28.
Godara, "Applications of Antenna Arrays to Mobile Communications, Part I: Performance Improvement, Feasibility, and System Considerations", Proceedings of the IEEE, vol. 85, No. 7, Jul. 1997, 1031-1060.
Goubau, Georg et al., "Investigation of a Surface-Wave Line for Long Distance Transmission", 1952, 263-267.
Goubau, Georg et al., "Investigations with a Model Surface Wave Transmission Line", IRE Transactions on Antennas and Propagation, 1957, 222-227.
Goubau, Georg, "Open Wire Lines", IRE Transactions on Microwave Theory and Techniques, 1956, 197-200.
Goubau, Georg, "Single-Conductor Surface-Wave Transmission Lines", Proceedings of the I.R.E., 1951, 619-624.
Goubau, Georg, "Surface Waves and Their Application to Transmission Lines", Radio Communication Branch, Coles Signal Laboratory, Mar. 10, 1950, 1119-1128.
Goubau, Georg, "Waves on Interfaces", IRE Transactions on Antennas and Propagation, Dec. 1959, 140-146.
Greco, R., "Soil water content inverse profiling from single TDR waveforms", Journal of hydrology 317.3, 2006, 325-339.
Gunduz, Deniz et al., "The multiway relay channel", IEEE Transactions on Information Theory 59.1, 2013, 5163.
Hafeez, "Smart Home Area Networks Protocols within the Smart Grid Context", Journal of Communications vol. 9, No. 9, Sep. 2014, 665-671.
Halder, Achintya et al., "Low-cost alternate EVM test for wireless receiver systems", 23rd IEEE VLSI Test Symposium (VTS'05), 2005, 6 pages.
Hale, Paul et al., "A statistical study of deembedding applied to eye diagram analysis", IEEE Transactions on Instrumentation and Measurement 61.2, 2012, 475-488.
Hussain, Mohamed T. et al., "Closely Packed Millimeter-Wave MIMO Antenna Arrays with Dielectric Resonator Elements", Antennas and Propagation (EuCAP) 2016 10th European Conference, Apr. 2016, 1-5.
Ikrath, K. et al., "Antenna Innovation Glass-Fiber Tube Focuses Microwave Beam", Electronics, vol. 35, No. 38, Sep. 21, 1962, 44-47.
Illinois Historic Archive, "Antennas on the Web", Photo Archive of Antennas, ece.illinois.ed, 1-18, Dec. 2016.
Japan Patent Office, "JP Office Action dated Feb. 14, 2017", Feb. 14, 2017, 1-12.
Jensen, Michael, "Data-Dependent Fingerprints for Wireless Device Authentication", www.dtic.mil/cgi-bin/GetTRDoc?AD=ADA626320, 2014, 15 pages.
Jiang, Y.S. et al., "Electromagnetic orbital angular momentum in remote sensing", PIERS Proceedings, Moscow, Russia, Aug. 18-21, 2009, 1330-1337.
Kado, Yuichi et al., "Exploring SubTHz Waves for Communications, Imaging, and Gas Sensing", Fog 2: O2, PIERS Proceedings, Beijing, China, Mar. 23-27, 2009, 42-47.
Kedar, "Wide Beam Tapered Slot Antenna for Wide Angle Scanning Phased Array Antenna", Progress in Electromagnetics Research B, vol. 27, 2011, 235-251.
Khan, Kaleemullah, "Authentication in Multi-Hop Wireless Mesh Networks", World Academy of Science, Engineering and Technology, International Journal of Electrical, Computer, Energetic, Electronic and Communication Engineering vol. 2, No. 10, 2008, 2406-2411.
Khan, Mohammed R., "A beam steering technique using dielectric wedges", Diss. University of London, Dec. 1985, 3 pages.
Kim, Jong-Hyuk et al., "Real-time Navigation, Guidance, and Control of a UAV using Low-cost Sensors", Australian Centre for Field Robotics, Mar. 5, 2011, 6 pages.
Kolpakov, Stanislav A. et al., "Toward a new generation of photonic humidity sensors", Sensors 14.3, 2014, 3986-4013.
Kuehn, E, "Self-configuration and self-optimization of 4G Radio Access Networks", http://wirelessman.org/tgm/contrib/S80216m-07_169.pdf, 2007, 13 pages.
Kumar, Sumeet et al., "Urban street lighting infrastructure monitoring using a mobile sensor platform", IEEE Sensors Journal, 16.12, 2016, 4981-4994.
Lairdtech, "Allpurpose Mount Kit", www.lairdtech.com, Mar. 29, 2015, 2 pages.
Lazaropoulos, Athanasios, "TowardsModal Integration of Overhead and Underground Low-Voltage and Medium-Voltage Power Line Communication Channels in the Smart Grid Landscape:Model Expansion, Broadband Signal Transmission Characteristics, and Statistical Performance Metrics", International Scholarly Research Network, ISRN Signal Processing, vol. 2012, Article ID 121628, 17 pages, Mar. 26, 2012, 18 pages.
Liang, Bin, "Cylindrical Slot FSS Configuration for Beam-Switching Applications", IEEE Transactions on Antennas and Propagation, vol. 63, No. 1, Jan. 2015, 166-173.
Luo, Hailu et al., "Reversed propagation dynamics of Laguerre-Gaussian beams in left-handed materials", Physical Review A 77.2, 023812., Feb. 20, 2008, 1-7.
Makwana, G. D. et al., "Wideband Stacked Rectangular Dielectric Resonator Antenna at 5.2 GHz", International Journal of Electromagnetics and Applications 2012, 2(3), 2012, 41-45.
Marin, Leandro, "Optimized ECC Implementation for Secure Communication between Heterogeneous IoT Devices", www.mdpi.com/1424-8220/15/9/21478/pdf, 2015, 21478-21499.
Marrucci, Lorenzo, "Rotating light with light: Generation of helical modes of light by spin-to-orbital angular momentum conversion in inhomogeneous liquid crystals", International Congress on Optics and Optoelectronics. International Society for Optics and Photonics, 2007, 12 pages.
Marzetta, "Noncooperative Cellular Wireless with Unlimited Numbers of Base Station Antennas", IEEE Transactions on Wireless Communications, vol. 9, No. 11, Nov. 2010, 3590-3600.
Matikainen, Leena et al., "Remote sensing methods for power line corridor surveys", ISPRS Journal of Photogrammetry and Remote Sensing, 119, 2016, 10-31.
McKeown, David M. et al., "Rulebased interpretation of aerial imagery", IEEE Transactions on Pattern Analysis and Machine Intelligence 5, 1985, 570-585.
Mehta, "Advance Featuring Smart Energy Meter With Bi-directional Communication", Electronics & Communication MEFGI, Feb. 9, 2014, 169-174.
Mena, F.P. et al., "Design and Performance of a 600720GHz SidebandSeparating Receiver Using and AlN SIS Junctions", IEEE Transactions on Microwave Theory and Techniques 59.1, 2011, 166-177.
Mueller, G.E. et al., "Polyrod Antennas", Bell System Technical Journal, vol. 26., No. 4, Oct. 29, 1947, 837-851.
Nakano, Hisamatsu et al., "A Spiral Antenna Backed by a Conducting Plane Reflector", IEEE Transactions on Antennas and Propagation, vol. AP-34 No. 6, Jun. 1986, 791-796.
Nassar, "Local Utility Powerline Communications in the 3-500 kHz Band: Channel Impairments, Noise, and Standards", IEEE Signal Processing Magazine, 2012, 1-22.
Niedermayer, Uwe et al., "Analytic modeling, simulation and interpretation of broadband beam coupling impedance bench measurements", Nuclear Instruments and Methods in Physics Research Section A: Accelerators, Spectrometers, Detectors and Associated Equipment 776, 2015, 129-143.
Nwclimate, "Weather Instruments and Equipment Explained", nwclimate.org, May 7, 2015, 22 pages.
Ohliger, Michael, "An introduction to coil array design for parallel MRI", http://mriquestions.com/uploads/3/4/5/7/34572113/intro__to_coil__design__parallel__.pdf, 2006, 16 pages.
Paruchuri, et al., "Securing Powerline Communication", IEEE, 2008, 64-69.

(56) References Cited

OTHER PUBLICATIONS

Quan, Xulin, "Analysis and Design of a Compact Dual-Band Directional Antenna", IEEE Antennas and Wireless Propagation Letters, vol. 11, 2012, 547-550.
Ranga, Yogesh et al., "An ultra-wideband quasi-planar antenna with enhanced gain", Progress in Electromagnetics Research C 49, 2014, 59-65.
Rekimoto, Jun, "SmartSkin: An Infrastructure for Freehand Manipulation on Interactive Surfaces", https://vs.inf.ethz.ch/edu/SS2005/DS/papers/surfaces/rekimoto-smartskin.pdf, 2002, 8 pages.
Ricardi, L. J., "Some Characteristics of a Communication Satellite Multiple-Beam Antenna", Massachusetts Institute of Technology, Lincoln Laboratory, Technical Note 1975-3, Jan. 28, 1975, 62 pages.
Rieke, M. et al., "High-Precision Positioning and Real-Time Data Processing of UAV Systems", International Archives of the Photogrammetry, Remote Sensing and Spatial Information Sciences, vol. XXXVIII-1/C22, 2011, 119-124.
Robinson, D.A. et al., "Advancing processbased watershed hydrological research using nearsurface geophysics: A vision for, and review of, electrical and magnetic geophysical methods", Hydrological Processes 22.18, Mar. 11, 2008, 3604-3635.
Robles, Rosslin John et al., "A Review on Security in Smart Home Development", International Journal of Advanced Science and Technology 15, Feb. 2010, 13-22.
Rousstia, M. W., "Switched-beam antenna array design for millimeter-wave applications", https://pure.tue.nl/ws/files/4418145/599448877400424.pdf, Jan. 1, 2011, 148 pages.
Schoning, Johannes et al., "Multi-Touch Surfaces: A Technical Guide", Johannes Schoning, Institute for Geoinformatics University of Münster, Technical Report TUM-10833, 2008, 19 pages.
Sembiring, Krisantus, "Dynamic Resource Allocation for Cloud-based Media Processing", http://www.chinacloud.cn/upload/2013-04/13042109511919.pdf, 2013, 49-54.
Shin, Donghoon et al., "10 Gbps Millimeter-Wave OFDM Experimental System with Iterative Phase Noise Compensation", Tokyo Institute of Technology, IEEE, 2013, 184-186.
Silvonen, Kimmo, "Calibration and DeEmbedding of Microwave Measurements Using Any Combination of Oneor TwoPort Standards", Publication of the Circuit Theory Laboratory, CT4, 1987, 1-28.
Simionovici, Ana-Maria et al., "Predictive Modeling in a VoIP System", 2013, 32-40.
Singh, Sapana et al., "Key Concepts and Network Architecture for 5G Mobile Technology", International Journal of Scientific Research Engineering & Technology (IJSERT), IIMT Engineering College, Meerut, India, vol. 1, Issue 5, Aug. 2012, 165- 170.
Song, Kaijun et al., "Broadband radial waveguide power amplifier using a spatial power combining technique", www.mtech.edu/academics/mines/geophysical/xzhou/publications/songfanzhou_2009b_impa.pdf, 2009, 7 pages.
Sospedra, Joaquim et al., "Badalona Oil PierBased Met-Ocean Monitoring Station", Campbell Scientific, www.campbellsci.com, Nov. 2016, 2 pages.
Sowmya, Arcot et al., "Modelling and representation issues in automated feature extraction from aerial and satellite images", ISPRS journal of photogrammetry and remote sensing, 55.1, 2000, 34-47.
Sun, Zhi et al., "Magnetic Induction Communications for Wireless Underground Sensor Networks", IEEE Transactions on Antennas and Propagation, vol. 58, No. 7, Jul. 2010, 2426-2435.
Tesoriero, Ricardo et al., "Tracking autonomous entities using RFID technology", IEEE Transactions on Consumer Electronics 55.2, 2009, 650-655.
Thottapan, M., "Design and simulation of metal PBG waveguide mode launcher", www.researchgate.net/profile/Dr_M_Thottappan/publication/262415753_Design_and_Simulation_of_Metal_PBG_Waveguide_Mode_Launcher/links/0f317537ad93a5e2a4000000.pdf, 2014, 383-387.
Tillack, M. S. et al., "Configuration and engineering design of the Aries-RS tokamak power plant", https://www.researchgate.net/publication/222496003_Configuration_and_engineering_design_of_the_ARIES-RS_tokamak_power_plant, 1997, 87-113.
Van Atta, L.C., "Contributions to the antenna field during World War II", www.nonstopsystems.com/radio/pdf-hell/article-IRE-5-1962.pdf, 1962, 692-697.
Wang, Hao et al., "Dielectric Loaded Substrate Integrated Waveguide (SIW)—Plan Horn Antennas", IEEE Transactions on Antennas and Propagation, IEEE Service Center, Piscataway, NJ, US, vol. 56, No. 3, Mar. 1, 2010, 640-647.
Washiro, Takanori, "Applications of RFID over power line for Smart Grid", Power Line Communications and Its Applications (ISPLC), 2012 16th IEEE International Symposium on. IEEE, 2012, 83-87.
Wikipedia, "Angular Momentum of Light", https://en.wikipedia.org/wiki/Angular_momentum_of_light, Nov. 10, 2016, 1-7.
Wilkes, Gilbert, "Wave Length Lenses", Dec. 5, 1946, 49 pages.
Won Jung, Chang et al., Reconfigurable Scan-Beam Single-Arm Spiral Antenna Integrated With RF-MEMS.
Switches, IEEE Transactions on Antennas and Propagation, vol. 54, No. 2, Feb. 2006, 455-463.
Woodford, Chris, "How do touchscreens work?", www.explainthatstuff.com/touchscreens.html, Aug. 23, 2016, 8 pages.
Xiao, Shiyi et al., "Spin-dependent optics with metasurfaces", Nanophotonics 6.1, 215-234., 2016, 215-234.
Zhang, "Modified Tapered Slot-line Antennas for Special Applications", REV Journal on Electronics and Communications, vol. 2, Jul.-Dec. 2012, 106-112.

* cited by examiner

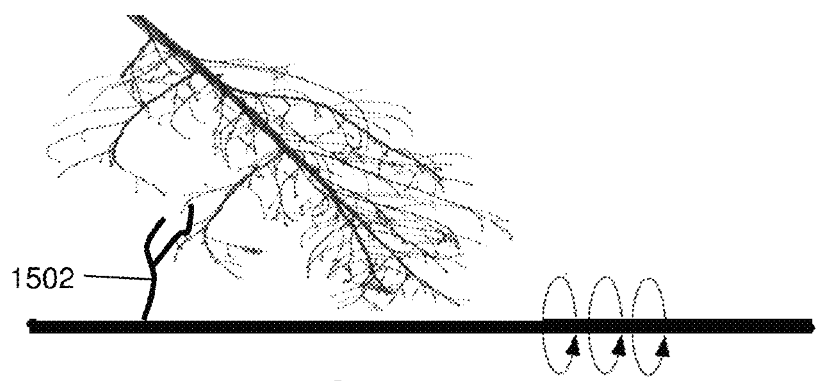
FIG. 15(A)
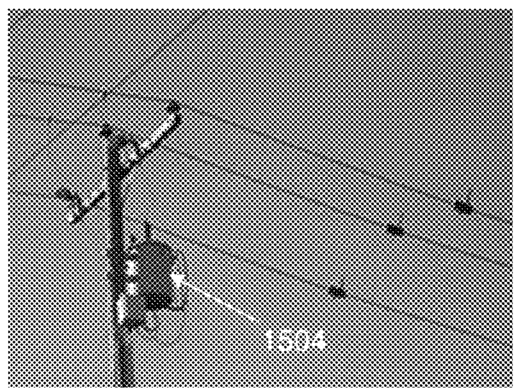
FIG. 15(B)
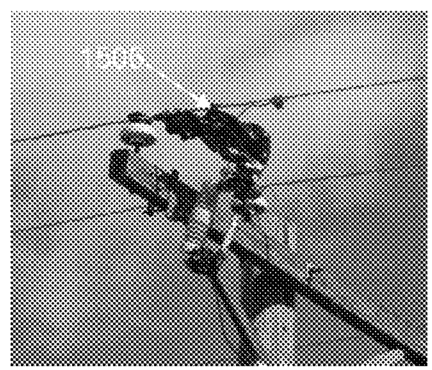
FIG. 15(C)
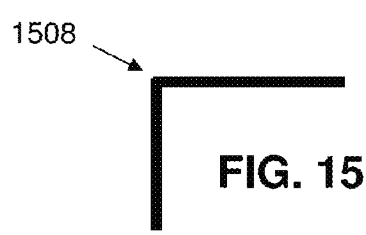
FIG. 15(D)
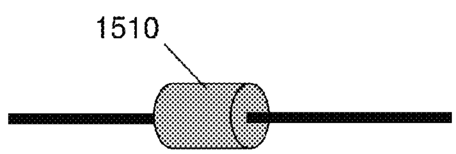
FIG. 15(E)
1512
FIG. 15(F)
1514
FIG. 15(G)

1700

2100

2500

METHOD AND APPARATUS FOR ADJUSTING A MODE OF COMMUNICATION IN A COMMUNICATION NETWORK

CROSS-REFERENCE TO RELATED APPLICATION(S)

This application is a continuation of U.S. patent application Ser. No. 14/513,246 filed Oct. 14, 2014 by Paul Shala Henry et al., entitled "Method and Apparatus for Adjusting a Mode of Communication in a Communication Network." All sections of the aforementioned application(s) are incorporated herein by reference in its entirety.

FIELD OF THE DISCLOSURE

The subject disclosure relates to a method and apparatus for adjusting a mode of communication in a communication network.

BACKGROUND

As smart phones and other portable devices increasingly become ubiquitous, and data usage increases, macrocell base station devices and existing wireless infrastructure in turn require higher bandwidth capability in order to address the increased demand. To provide additional mobile bandwidth, small cell deployment is being pursued, with microcells and picocells providing coverage for much smaller areas than traditional macrocells.

BRIEF DESCRIPTION OF THE DRAWINGS

Reference will now be made to the accompanying drawings, which are not necessarily drawn to scale, and wherein:

FIGS. 15A, 15B, 15C, 15D, 15E, 15F, and 15G illustrate example, non-limiting embodiments of sources for disturbances detectable by the waveguide system of FIG. 14 as described herein.

DETAILED DESCRIPTION

Figure 1:
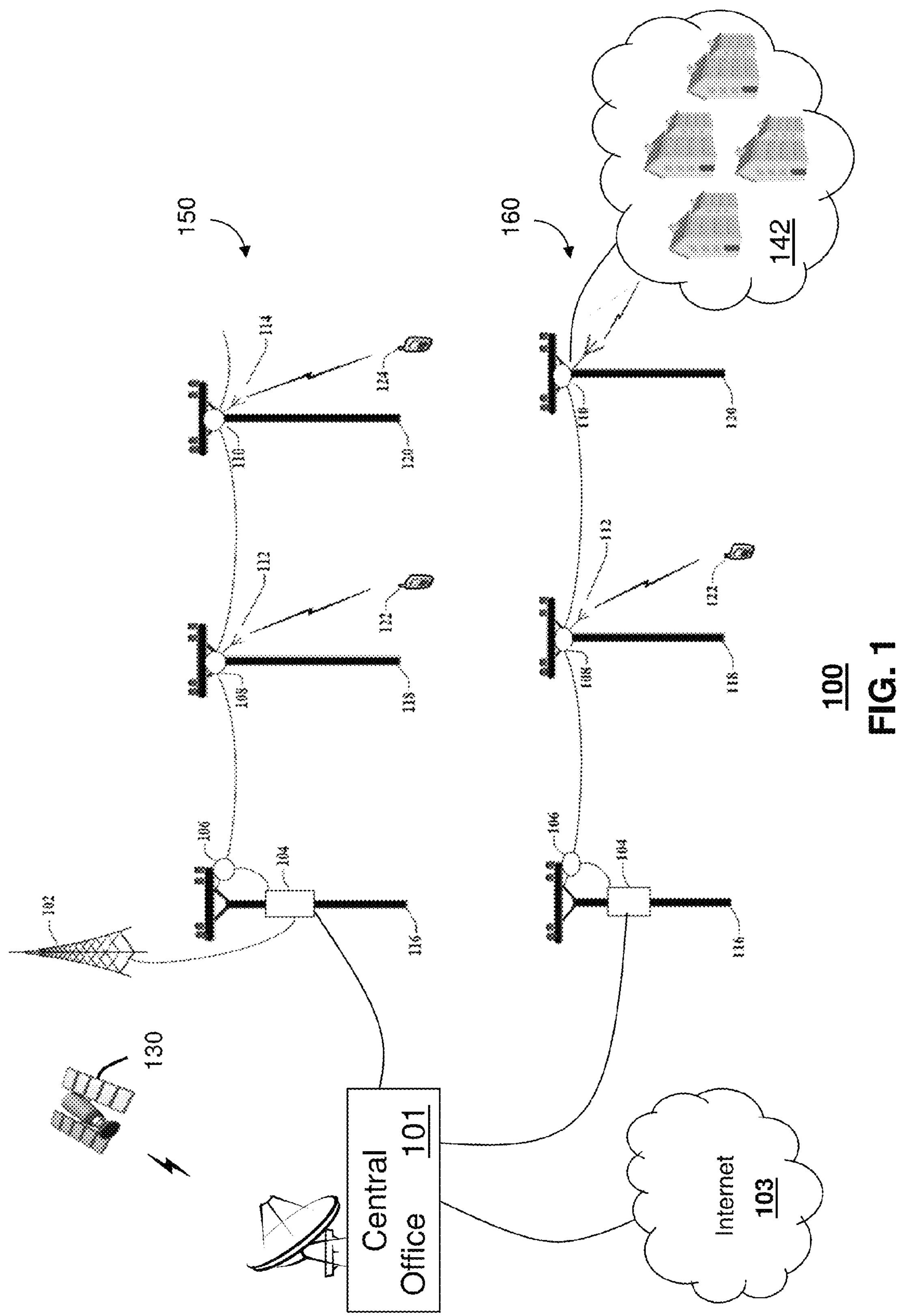
FIG. 1 is a block diagram illustrating an example, non-limiting embodiment of a guided wave communications system in accordance with various aspects described herein.

One or more embodiments are now described with reference to the drawings, wherein like reference numerals are used to refer to like elements throughout. In the following description, for purposes of explanation, numerous details are set forth in order to provide a thorough understanding of the various embodiments. It is evident, however, that the various embodiments can be practiced without these details (and without applying to any particular networked environment or standard).

To provide network connectivity to additional base station devices, the backhaul network that links the communication cells (e.g., microcells and macrocells) to network devices of the core network correspondingly expands. Similarly, to provide network connectivity to a distributed antenna system, an extended communication system that links base station devices and their distributed antennas is desirable. A guided wave communication system can be provided to enable alternative, increased or additional network connectivity and a waveguide coupling system can be provided to transmit and/or receive guided wave (e.g., surface wave) communications on a wire, such as a wire that operates as a single-wire transmission line (e.g., a utility line), that operates as a waveguide and/or that otherwise operates to guide the transmission of an electromagnetic wave.

In an embodiment, a waveguide coupler that is utilized in a waveguide coupling system can be made of a dielectric material, or other low-loss insulator (e.g., Teflon, polyethylene and etc.), or even be made of a conducting (e.g., metallic, non-metallic, etc.) material, or any combination of the foregoing materials. Reference throughout the detailed description to "dielectric waveguide" is for illustration purposes and does not limit embodiments to being constructed solely of dielectric materials. In other embodiments, other dielectric or insulating materials are possible. It will be appreciated that a variety of transmission media can be utilized with guided wave communications without departing from example embodiments. Examples of such transmission media can include one or more of the following, either alone or in one or more combinations: wires, whether insulated or not, and whether single-stranded or multi-stranded; conductors of other shapes or configurations including wire bundles, cables, rods, rails, pipes; non-conductors such as dielectric pipes, rods, rails, or other dielectric members; combinations of conductors and dielectric materials; or other guided wave transmission media.

For these and/or other considerations, in one or more embodiments, an apparatus comprises a waveguide that facilitates propagation of a first electromagnetic wave at least in part on a waveguide surface, wherein the waveguide surface does not surround in whole or in substantial part a wire surface of a wire, and, in response to the waveguide being positioned with respect to the wire, the first electromagnetic wave couples at least in part to the wire surface and travels at least partially around the wire surface as a second electromagnetic wave, and wherein the second electromagnetic wave has at least one wave propagation mode for propagating longitudinally along the wire.

In another embodiment, an apparatus comprises a waveguide that has a waveguide surface that defines a cross sectional area of the waveguide wherein a wire is positioned outside of the cross-sectional area of the waveguide such that a first electromagnetic wave, traveling along the wire at least in part on the wire surface, couples at least in part to the waveguide surface and travels at least partially around the waveguide surface as a second electromagnetic wave.

In an embodiment, a method comprises emitting, by a transmission device, a first electromagnetic wave that propagates at least in part on a waveguide surface of a waveguide, wherein the waveguide is not coaxially aligned with a wire. The method can also include configuring the waveguide in proximity of the wire to facilitate coupling of at least a part of the first electromagnetic wave to a wire surface, forming a second electromagnetic wave that propagates longitudinally along the wire and at least partially around the wire surface.

In another embodiment, an apparatus comprises, in one or more embodiments, a waveguide having a slot formed by opposing slot surfaces that are non-parallel, wherein the opposing slot surfaces are separated by a distance that enables insertion of a wire in the slot, wherein the waveguide facilitates propagation of a first electromagnetic wave at least in part on a waveguide surface, and, in response to the waveguide being positioned with respect to the wire, the first electromagnetic wave couples at least in part to a wire surface of the wire and travels at least partially around the wire surface as a second electromagnetic wave for propagating longitudinally along the wire, and wherein the second electromagnetic wave has at least one wave propagation mode.

In another embodiment, an apparatus comprises, in one or more embodiments, a waveguide, wherein the waveguide comprises a material that is not electrically conductive and is suitable for propagating electromagnetic waves on a waveguide surface of the waveguide, wherein the waveguide facilitates propagation of a first electromagnetic wave at least in part on the waveguide surface, and, in response to the waveguide being positioned with respect to a wire, the first electromagnetic wave couples at least in part to a wire surface of the wire and travels at least partially around the wire surface as a second electromagnetic wave, and wherein the second electromagnetic wave has at least one wave propagation mode for propagating longitudinally along the wire.

One embodiment of the subject disclosure includes an apparatus having a waveguide that facilitates transmission or reception of electromagnetic waves along a surface of a wire of a power grid that also facilitates delivery of electric energy to devices. The apparatus can further include one or more sensors that facilitate sensing of a disturbance that is adverse to the waveguide, the wire, the transmission or reception of electromagnetic waves that propagate along the surface or waveguide surface, or any combination thereof.

One embodiment of the subject disclosure includes a method for transmitting, by an apparatus having a waveguide and a sensor, electromagnetic waves that propagate along a surface of a wire that facilitates delivery of electric energy to devices, and sensing, by the sensor, a disturbance that is adverse to the electromagnetic waves that propagate along the surface.

One embodiment of the subject disclosure includes a machine-readable (e.g., computer-readable, processor-readable, etc.) storage medium having executable instructions that, when executed by a processor, facilitate performance of operations, including inducing with or via a waveguide, electromagnetic waves guided along a surface of a transmission medium, and collecting sensing data from a sensor, the sensing data associated with a disturbance that is adverse to the electromagnetic waves guided along the surface of the transmission medium.

One embodiment of the subject disclosure includes an apparatus having a processor and a memory. The processor can perform an operation of receiving telemetry information from a waveguide system coupled to a sensor, detecting from the telemetry information a disturbance that is adverse to one of operations of the waveguide system, the transmission or reception of the electromagnetic waves along the wire surface or the waveguide surface, or a combination thereof, and reporting the disturbance. The waveguide system can comprise a waveguide that can be positioned with respect to a wire of a power grid that facilitates delivery of electric energy to devices. The waveguide can also facilitate transmission or reception of electromagnetic waves along a wire surface of the wire, while the sensor can facilitate sensing disturbances adverse to electromagnetic waves.

One embodiment of the subject disclosure includes a method for receiving, by a network element comprising a processor, telemetry information from a waveguide system, determining, by the network element, a disturbance from sensing data included in the telemetry information, and transmitting, by the network element, instructions to the waveguide system to adjust a route of the electromagnetic waves to avoid or compensate for the disturbance determined. The waveguide system can facilitate transmission of electromagnetic waves along a surface of a wire of a power grid and sensing of disturbances adverse to the transmission or reception of the electromagnetic waves.

One embodiment of the subject disclosure includes a machine-readable (e.g., computer-readable, processor-readable, etc.) storage medium having executable instructions that, when executed by a processor, facilitate performance of operations, including receiving telemetry information from an apparatus that induces electromagnetic waves on a surface of a wire of a power grid for delivery of communication signals to a recipient communication device coupled to the power grid, and detecting a disturbance from the telemetry information that is adverse to a delivery of the communication signals to the recipient communication device.

One embodiment of the subject disclosure includes a waveguide system comprising a first waveguide, a second waveguide, and a memory including instructions executable by a processor. The first waveguide can be positioned with respect to a first wire of a power grid that facilitates delivery of electric power to devices. The first waveguide facilitates transmission or reception of electromagnetic waves that propagate along a first surface of the first wire for transporting communications data. The second waveguide can be positioned with respect to a second wire of the power grid for facilitating transmission or reception of electromagnetic waves that propagate along a second surface of the second wire. In an example embodiment, the first wire corresponds to a primary communication link of the power grid, while the second wire corresponds to a secondary communication link of the power grid. The processor can perform operations including detecting a communication fault in the primary communication link that is adverse to the transmission or reception of electromagnetic waves that transport the communications data, and redirecting via the second waveguide the transmission or reception of electromagnetic waves transporting the communications data to the secondary communication link responsive to detecting the communication fault.

One embodiment of the subject disclosure includes a communication system comprising a plurality of waveguide systems and a memory including instructions executable by a processor. Each of the plurality of waveguide systems can facilitate transmission or reception of electromagnetic waves that transport communications data directed to a recipient device and that propagate along surfaces of a first wire or a second wire of a power grid. In an example embodiment, the first wire of the power grid is used as a primary communication link, while the second wire of the power grid is used as a backup communication link. The processor can perform operations including instructing a first waveguide system of the plurality of waveguide systems to redirect transmission or reception of electromagnetic waves transporting the communications data to the backup communication link responsive to detecting a communication fault in the primary communication link.

One embodiment of the subject disclosure includes a method for detecting a communication fault in a first wire of a power grid that affects a transmission or reception of electromagnetic waves that transport data and that propagate along surfaces of the first wire, selecting a backup communication medium from a plurality of backup communication mediums according to selection criteria, and redirecting the transmission or reception of electromagnetic waves that transport the data to the backup communication medium to circumvent the communication fault.

One embodiment of the subject disclosure includes a method for detecting an impairment, the impairment adversely affecting a propagation of electromagnetic waves on a surface of a wire, and adjusting a mode of communication for transmitting or receiving electromagnetic waves on the surface of the wire to mitigate the impairment.

One embodiment of the subject disclosure includes a waveguide system including a waveguide that facilitates transmission or reception of electromagnetic waves that propagate along a surface of a wire, a memory that stores instructions, and a processor coupled thereto. The processor can perform operations including detecting a condition that adversely affects a propagation of electromagnetic waves on a surface of a wire, and adjusting a wave propagation mode of the electromagnetic waves transmitted or received by the waveguide to reduce adverse effects caused by the condition.

One embodiment of the subject disclosure includes a machine-readable device, including instructions. Responsive to executing the instructions, a processor can perform operations including detecting a source of signal degradation wire that adversely affects a propagation of electromagnetic waves generated by a waveguide system on a surface of a wire, and adjusting characteristics of the electromagnetic waves generated by the waveguide system to reduce adverse effects caused by the source of signal interference.

Various embodiments described herein relate to a waveguide coupling system for launching and extracting guided wave (e.g., surface wave communications that are electromagnetic waves) transmissions from a wire. At millimeter-wave frequencies (e.g., 30 to 300 GHz), wherein the wavelength can be small compared to the size of the equipment, transmissions can propagate as waves guided by a waveguide, such as a strip or length of dielectric material or other coupler. The electromagnetic field structure of the guided wave can be inside and/or outside of the waveguide. When this waveguide is brought into close proximity to a wire (e.g., a utility line or other transmission line), at least a portion of the guided waves decouples from the waveguide and couples to the wire, and continue to propagate as guided waves, such as surface waves about the surface of the wire.

According to an example embodiment, a surface wave is a type of guided wave that is guided by a surface of the wire, which can include an exterior or outer surface of the wire, or another surface of the wire that is adjacent to or exposed to another type of medium having different properties (e.g., dielectric properties). Indeed, in an example embodiment, a surface of the wire that guides a surface wave can represent a transitional surface between two different types of media. For example, in the case of a bare or uninsulated wire, the surface of the wire can be the outer or exterior conductive surface of the bare or uninsulated wire that is exposed to air or free space. As another example, in the case of insulated wire, the surface of the wire can be the conductive portion of the wire that meets the insulator portion of the wire, or can otherwise be the insulator surface of the wire that is exposed to air or free space, or can otherwise be any material region between the insulator surface of the wire and the conductive portion of the wire that meets the insulator portion of the wire, depending upon the relative differences in the properties (e.g., dielectric properties) of the insulator, air, and/or the conductor and further dependent on the frequency and propagation mode or modes of the guided wave.

According to an example embodiment, guided waves such as surface waves can be contrasted with radio transmissions over free space/air or conventional propagation of electrical power or signals through the conductor of the wire. Indeed, with surface wave or guided wave systems described herein, conventional electrical power or signals can still propagate or be transmitted through the conductor of the wire, while guided waves (including surface waves and other electromagnetic waves) can propagate or be transmitted about the surface of the wire, according to an example embodiment. In an embodiment, a surface wave can have a field structure (e.g., an electromagnetic field structure) that lies primarily or substantially outside of the line, wire, or transmission medium that serves to guide the surface wave.

According to an example embodiment, the electromagnetic waves traveling along the wire and around the outer surface of the wire are induced by other electromagnetic waves traveling along a waveguide in proximity to the wire. The inducement of the electromagnetic waves can be independent of any electrical potential, charge or current that is injected or otherwise transmitted through the wires as part of an electrical circuit. It is to be appreciated that while a small current in the wire may be formed in response to the propagation of the electromagnetic wave along the wire, this can be due to the propagation of the electromagnetic wave along the wire surface, and is not formed in response to electrical potential, charge or current that is injected into the wire as part of an electrical circuit. The electromagnetic waves traveling on the wire therefore do not require a circuit to propagate along the wire surface. The wire therefore is a single wire transmission line that is not part of a circuit. Also, in some embodiments, a wire is not necessary, and the electromagnetic waves can propagate along a single line transmission medium that is not a wire.

According to an example embodiment, the term "about" a wire used in conjunction with a guided wave (e.g., surface wave) can include fundamental wave propagation modes and other guided waves having a circular or substantially circular field distribution (e.g., electric field, magnetic field, electromagnetic field, etc.) at least partially around a wire or other transmission medium. In addition, when a guided wave propagates "about" a wire or other transmission medium, it can do so according to a wave propagation mode that includes not only the fundamental wave propagation modes (e.g., zero order modes), but additionally or alternatively other non-fundamental wave propagation modes such as higher-order guided wave modes (e.g., $1^{st}$ order modes, $2^{nd}$ order modes, etc.), asymmetrical modes and/or other guided (e.g., surface) waves that have non-circular field distributions around a wire or other transmission medium.

For example, such non-circular field distributions can be unilateral or multi-lateral with one or more axial lobes characterized by relatively higher field strength and/or one or more nulls or null regions characterized by relatively low-field strength, zero-field strength or substantially zero field strength. Further, the field distribution can otherwise vary as a function of a longitudinal axial orientation around the wire such that one or more regions of axial orientation around the wire have an electric or magnetic field strength (or combination thereof) that is higher than one or more other regions of axial orientation, according to an example embodiment. It will be appreciated that the relative positions of the wave higher order modes or asymmetrical modes can vary as the guided wave travels along the wire.

Referring now to FIG. 1, a block diagram illustrating an example, non-limiting embodiment of a guided wave communication system 100 is shown. Guided wave communication system 100 depicts an exemplary environment in which a dielectric waveguide coupling system can be used.

Guided wave communication system 100 can comprise a first instance of a distributed system 150 that includes one or more base station devices (e.g., base station device 104) that are communicably coupled to a central office 101 and/or a macrocell site 102. Base station device 104 can be connected by a wired (e.g., fiber and/or cable), or by a wireless (e.g., microwave wireless) connection to the macrocell site 102 and the central office 101. A second instance of the distributed system 160 can be used to provide wireless voice and data services to mobile device 122 and to residential and/or commercial establishments 142 (herein referred to as establishments 142). System 100 can have additional instances of the distribution systems 150 and 160 for providing voice and/or data services to mobile devices 122-124 and establishments 142 as shown in FIG. 1.

Macrocells such as macrocell site 102 can have dedicated connections to the mobile network and base station device 104 can share and/or otherwise use macrocell site 102's connection. Central office 101 can be used to distribute media content and/or provide internet service provider (ISP) services to mobile devices 122-124 and establishments 142. The central office 101 can receive media content from a constellation of satellites 130 (one of which is shown in FIG. 1) or other sources of content, and distribute such content to mobile devices 122-124 and establishments 142 via the first and second instances of the distribution system 15 and 160. The central office 101 can also be communicatively coupled to the Internet 103 for providing internet data services to mobile devices 122-124 and establishments 142.

Base station device 104 can be mounted on, or attached to, utility pole 116. In other embodiments, base station device 104 can be near transformers and/or other locations situated nearby a power line. Base station device 104 can facilitate connectivity to a mobile network for mobile devices 122 and 124. Antennas 112 and 114, mounted on or near utility poles 118 and 120, respectively, can receive signals from base station device 104 and transmit those signals to mobile devices 122 and 124 over a much wider area than if the antennas 112 and 114 were located at or near base station device 104.

It is noted that FIG. 1 displays three utility poles, in each instance of the distribution systems 150 and 160, with one base station device, for purposes of simplicity. In other embodiments, utility pole 116 can have more base station devices, and more utility poles with distributed antennas and/or tethered connections to establishments 142.

A dielectric waveguide coupling device 106 can transmit the signal from base station device 104 to antennas 112 and 114 via utility or power line(s) that connect the utility poles 116, 118, and 120. To transmit the signal, radio source and/or coupler 106 upconverts the signal (e.g., via frequency mixing) from base station device 104 or otherwise converts the signal from the base station device 104 to a millimeter-wave band signal and the dielectric waveguide coupling device 106 launches a millimeter-wave band wave that propagates as a guided wave (e.g., surface wave or other electromagnetic wave) traveling along the utility line or other wire. At utility pole 118, another dielectric waveguide coupling device 108 receives the guided wave (and optionally can amplify it as needed or desired or operate as a digital repeater to receive it and regenerate it) and sends it forward as a guided wave (e.g., surface wave or other electromagnetic wave) on the utility line or other wire. The dielectric waveguide coupling device 108 can also extract a signal from the millimeter-wave band guided wave and shift it down in frequency or otherwise convert it to its original cellular band frequency (e.g., 1.9 GHz or other defined cellular frequency) or another cellular (or non-cellular) band frequency. An antenna 112 can transmit (e.g., wirelessly transmit) the downshifted signal to mobile device 122. The process can be repeated by dielectric waveguide coupling device 110, antenna 114 and mobile device 124, as necessary or desirable.

Transmissions from mobile devices 122 and 124 can also be received by antennas 112 and 114 respectively. Repeaters on dielectric waveguide coupling devices 108 and 110 can upshift or otherwise convert the cellular band signals to millimeter-wave band and transmit the signals as guided wave (e.g., surface wave or other electromagnetic wave) transmissions over the power line(s) to base station device 104.

Media content received by the central office 101 can be supplied to the second instance of the distribution system 160 via the base station device 104 for distribution to mobile devices 122 and establishments 142. The dielectric waveguide coupling device 110 can be tethered to the establishments 142 by one or more wired connections or a wireless interface. The one or more wired connections, may include without limitation, a power line, a coaxial cable, a fiber cable, a twisted pair cable, or other suitable wired mediums for distribution of media content and/or for providing internet services. In an example embodiment, the wired connections from the waveguide coupling device 110 can be communicatively coupled to one or more very high bit rate digital subscriber line (VDSL) modems located at one or more corresponding service area interfaces (SAIs—not shown), each SAI providing services to a portion of the establishments 142. The VDSL modems can be used to selectively distribute media content and/or provide internet services to gateways (not shown) located in the establishments 142. The SAIs can also be communicatively coupled to the establishments 142 over a wired medium such as a power line, a coaxial cable, a fiber cable, a twisted pair cable, or other suitable wired mediums. In other example embodiments, the waveguide coupling device 110 can be communicatively coupled directly to establishments 142 without intermediate interfaces such as the SAIs.

In another example embodiment, system 100 can employ diversity paths, where two or more utility lines or other wires are strung between the utility poles 116, 118, and 120 (e.g., for example, two or more wires between poles 116 and 120) and redundant transmissions from base station 104 are transmitted as guided waves down the surface of the utility lines or other wires. The utility lines or other wires can be either insulated or uninsulated, and depending on the environmental conditions that cause transmission losses, the coupling devices can selectively receive signals from the insulated or uninsulated utility lines or other wires. The selection can be based on measurements of the signal-to-noise ratio of the wires, or based on determined weather/environmental conditions (e.g., moisture detectors, weather forecasts, etc.). The use of diversity paths with system 100 can enable alternate routing capabilities, load balancing, increased load handling, concurrent bi-directional or synchronous communications, spread spectrum communications, etc. (See FIG. 8 for more illustrative details).

It is noted that the use of the dielectric waveguide coupling devices 106, 108, and 110 in FIG. 1 are by way of example only, and that in other embodiments, other uses are possible. For instance, dielectric waveguide coupling devices can be used in a backhaul communication system, providing network connectivity to base station devices. Dielectric waveguide coupling devices can be used in many circumstances where it is desirable to transmit guided wave communications over a wire, whether insulated or not insulated. Dielectric waveguide coupling devices are improvements over other coupling devices due to no contact or limited physical and/or electrical contact with the wires that may carry high voltages. With dielectric waveguide coupling devices, the apparatus can be located away from the wire (e.g., spaced apart from the wire) and/or located on the wire so long as it is not electrically in contact with the wire, as the dielectric acts as an insulator, allowing for cheap, easy, and/or less complex installation. However, as previously noted conducting or non-dielectric couplers can be employed, for example in configurations where the wires correspond to a telephone network, cable television network, broadband data service, fiber optic communications system or other network employing low voltages or having insulated transmission lines.

It is further noted, that while base station device 104 and macrocell site 102 are illustrated in an embodiment, other network configurations are likewise possible. For example, devices such as access points or other wireless gateways can be employed in a similar fashion to extend the reach of other networks such as a wireless local area network, a wireless personal area network or other wireless network that operates in accordance with a communication protocol such as a 802.11 protocol, WIMAX protocol, UltraWideband protocol, Bluetooth protocol, Zigbee protocol or other wireless protocol.

Figure 2:
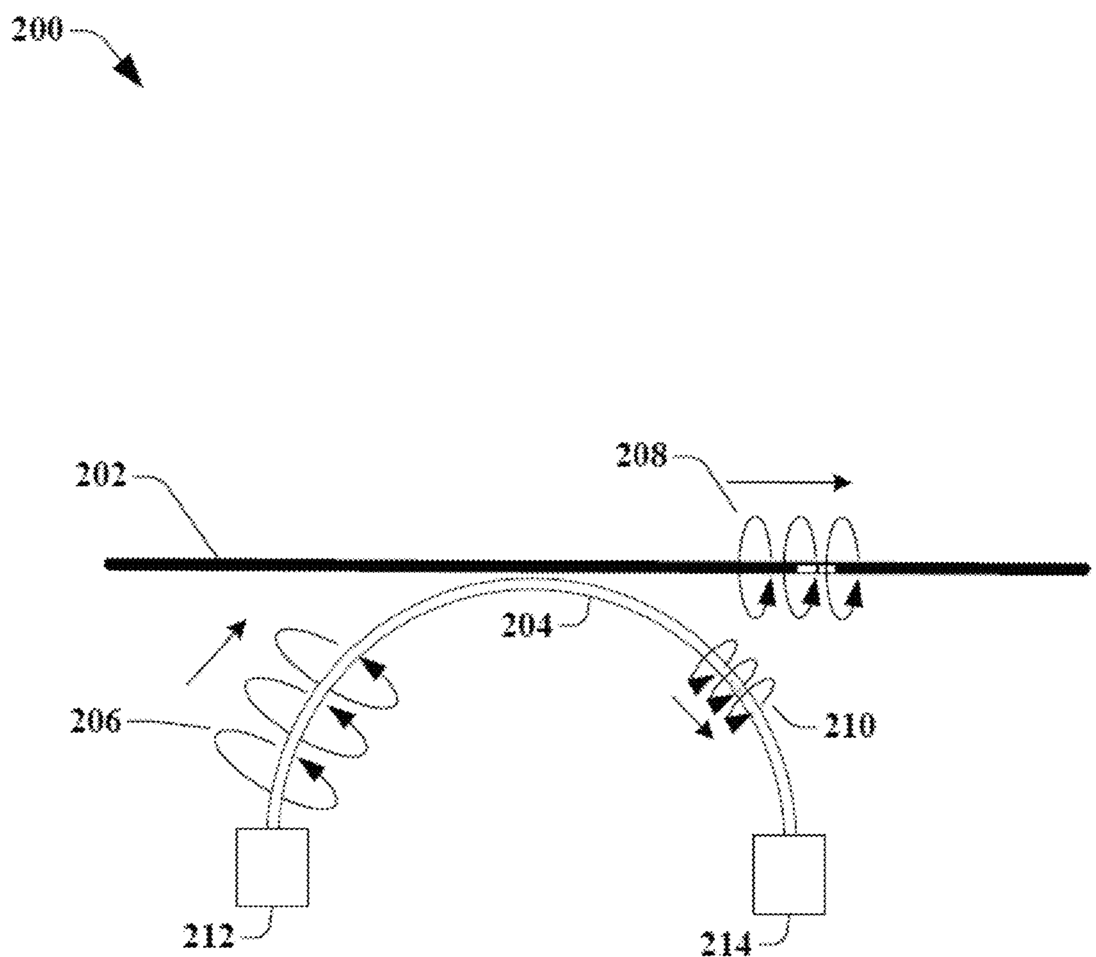
FIG. 2 is a block diagram illustrating an example, non-limiting embodiment of a dielectric waveguide coupler in accordance with various aspects described herein.

Turning now to FIG. 2, illustrated is a block diagram of an example, non-limiting embodiment of a dielectric waveguide coupling system 200 in accordance with various aspects described herein. System 200 comprises a dielectric waveguide 204 that has a wave 206 propagating as a guided wave about a waveguide surface of the dielectric waveguide 204. In an embodiment, the dielectric waveguide 204 is curved, and at least a portion of the waveguide 204 can be placed near a wire 202 in order to facilitate coupling between the waveguide 204 and the wire 202, as described herein. The dielectric waveguide 204 can be placed such that a portion of the curved dielectric waveguide 204 is parallel or substantially parallel to the wire 202. The portion of the dielectric waveguide 204 that is parallel to the wire can be an apex of the curve, or any point where a tangent of the curve is parallel to the wire 202. When the dielectric waveguide 204 is positioned or placed thusly, the wave 206 travelling along the dielectric waveguide 204 couples, at least in part, to the wire 202, and propagates as guided wave 208 around or about the wire surface of the wire 202 and longitudinally along the wire 202. The guided wave 208 can be characterized as a surface wave or other electromagnetic wave, although other types of guided waves 208 can supported as well without departing from example embodiments. A portion of the wave 206 that does not couple to the wire 202 propagates as wave 210 along the dielectric waveguide 204. It will be appreciated that the dielectric waveguide 204 can be configured and arranged in a variety of positions in relation to the wire 202 to achieve a desired level of coupling or non-coupling of the wave 206 to the wire 202. For example, the curvature and/or length of the dielectric waveguide 2014 that is parallel or substantially parallel, as well as its separation distance (which can include zero separation distance in an embodiment), to the wire 202 can be varied without departing for example embodiments. Likewise, the arrangement of dielectric waveguide 204 in relation to the wire 202 may be varied based upon considerations of the respective intrinsic characteristics (e.g., thickness, composition, electromagnetic properties, etc.) of the wire 202 and the dielectric waveguide 204, as well as the characteristics (e.g., frequency, energy level, etc.) of the waves 206 and 208.

The guided wave 208 stays parallel or substantially parallel to the wire 202, even as the wire 202 bends and flexes. Bends in the wire 202 can increase transmission losses, which are also dependent on wire diameters, frequency, and materials. If the dimensions of the dielectric waveguide 204 are chosen for efficient power transfer, most of the power in the wave 206 is transferred to the wire 202, with little power remaining in wave 210. It will be appreciated that the guided wave 208 can still be multi-modal in nature (discussed herein), including having modes that are non-fundamental or asymmetric, while traveling along a path that is parallel or substantially parallel to the wire 202, with or without a fundamental transmission mode. In an embodiment, non-fundamental or asymmetric modes can be utilized to minimize transmission losses and/or obtain increased propagation distances.

It is noted that the term parallel is generally a geometric construct which often is not exactly achievable in real systems. Accordingly, the term parallel as utilized in the subject disclosure represents an approximation rather than an exact configuration when used to describe embodiments disclosed in the subject disclosure. In an embodiment, substantially parallel can include approximations that are within 30 degrees of true parallel in all dimensions.

In an embodiment, the wave 206 can exhibit one or more wave propagation modes. The dielectric waveguide modes can be dependent on the shape and/or design of the waveguide 204. The one or more dielectric waveguide modes of wave 206 can generate, influence, or impact one or more wave propagation modes of the guided wave 208 propagating along wire 202. In an embodiment, the wave propagation modes on the wire 202 can be similar to the dielectric waveguide modes since both waves 206 and 208 propagate about the outside of the dielectric waveguide 204 and wire 202 respectively. In some embodiments, as the wave 206 couples to the wire 202, the modes can change form, or new modes can be created or generated, due to the coupling between the dielectric waveguide 204 and the wire 202. For example, differences in size, material, and/or impedances of the dielectric waveguide 204 and wire 202 may create additional modes not present in the dielectric waveguide modes and/or suppress some of the dielectric waveguide modes. The wave propagation modes can comprise the fundamental transverse electromagnetic mode (Quasi-$TEM_{00}$), where only small electric and/or magnetic fields extend in the direction of propagation, and the electric and magnetic fields extend radially outwards while the guided wave propagates along the wire. This guided wave mode can be donut shaped, where few of the electromagnetic fields exist within the dielectric waveguide 204 or wire 202.

Waves 206 and 208 can comprise a fundamental TEM mode where the fields extend radially outwards, and also comprise other, non-fundamental (e.g., asymmetric, higher-level, etc.) modes. While particular wave propagation modes are discussed above, other wave propagation modes are likewise possible such as transverse electric (TE) and transverse magnetic (TM) modes, based on the frequencies employed, the design of the dielectric waveguide 204, the dimensions and composition of the wire 202, as well as its surface characteristics, its optional insulation, the electromagnetic properties of the surrounding environment, etc. It should be noted that, depending on the frequency, the electrical and physical characteristics of the wire 202 and the particular wave propagation modes that are generated, guided wave 208 can travel along the conductive surface of an oxidized uninsulated wire, an unoxidized uninsulated wire, an insulated wire and/or along the insulating surface of an insulated wire.

In an embodiment, a diameter of the dielectric waveguide 204 is smaller than the diameter of the wire 202. For the millimeter-band wavelength being used, the dielectric waveguide 204 supports a single waveguide mode that makes up wave 206. This single waveguide mode can change as it couples to the wire 202 as surface 208. If the dielectric waveguide 204 were larger, more than one waveguide mode can be supported, but these additional waveguide modes may not couple to the wire 202 as efficiently, and higher coupling losses can result. However, in some alternative embodiments, the diameter of the dielectric waveguide 204 can be equal to or larger than the diameter of the wire 202, for example, where higher coupling losses are desirable or when used in conjunction with other techniques to otherwise reduce coupling losses (e.g., impedance matching with tapering, etc.).

In an embodiment, the wavelength of the waves 206 and 208 are comparable in size, or smaller than a circumference of the dielectric waveguide 204 and the wire 202. In an example, if the wire 202 has a diameter of 0.5 cm, and a corresponding circumference of around 1.5 cm, the wavelength of the transmission is around 1.5 cm or less, corresponding to a frequency of 20 GHz or greater. In another embodiment, a suitable frequency of the transmission and the carrier-wave signal is in the range of 30-100 GHz, perhaps around 30-60 GHz, and around 38 GHz in one example. In an embodiment, when the circumference of the dielectric waveguide 204 and wire 202 is comparable in size to, or greater, than a wavelength of the transmission, the waves 206 and 208 can exhibit multiple wave propagation modes including fundamental and/or non-fundamental (symmetric and/or asymmetric) modes that propagate over sufficient distances to support various communication systems described herein. The waves 206 and 208 can therefore comprise more than one type of electric and magnetic field configuration. In an embodiment, as the guided wave 208 propagates down the wire 202, the electrical and magnetic field configurations will remain the same from end to end of the wire 202. In other embodiments, as the guided wave 208 encounters interference or loses energy due to transmission losses, the electric and magnetic field configurations can change as the guided wave 208 propagates down wire 202.

In an embodiment, the dielectric waveguide 204 can be composed of nylon, Teflon, polyethylene, a polyamide, or other plastics. In other embodiments, other dielectric materials are possible. The wire surface of wire 202 can be metallic with either a bare metallic surface, or can be insulated using plastic, dielectric, insulator or other sheathing. In an embodiment, a dielectric or otherwise non-conducting/insulated waveguide can be paired with either a bare/metallic wire or insulated wire. In other embodiments, a metallic and/or conductive waveguide can be paired with a bare/metallic wire or insulated wire. In an embodiment, an oxidation layer on the bare metallic surface of the wire 202

(e.g., resulting from exposure of the bare metallic surface to oxygen/air) can also provide insulating or dielectric properties similar to those provided by some insulators or sheathings.

It is noted that the graphical representations of waves 206, 208 and 210 are presented merely to illustrate the principles that wave 206 induces or otherwise launches a guided wave 208 on a wire 202 that operates, for example, as a single wire transmission line. Wave 210 represents the portion of wave 206 that remains on the dielectric waveguide 204 after the generation of guided wave 208. The actual electric and magnetic fields generated as a result of such wave propagation may vary depending on the frequencies employed, the particular wave propagation mode or modes, the design of the dielectric waveguide 204, the dimensions and composition of the wire 202, as well as its surface characteristics, its optional insulation, the electromagnetic properties of the surrounding environment, etc.

It is noted that dielectric waveguide 204 can include a termination circuit or damper 214 at the end of the dielectric waveguide 204 that can absorb leftover radiation or energy from wave 210. The termination circuit or damper 214 can prevent and/or minimize the leftover radiation or energy from wave 210 reflecting back toward transmitter circuit 212. In an embodiment, the termination circuit or damper 214 can include termination resistors, and/or other components that perform impedance matching to attenuate reflection. In some embodiments, if the coupling efficiencies are high enough, and/or wave 210 is sufficiently small, it may not be necessary to use a termination circuit or damper 214. For the sake of simplicity, these transmitter and termination circuits or dampers 212 and 214 are not depicted in the other figures, but in those embodiments, transmitter and termination circuits or dampers may possibly be used.

Further, while a single dielectric waveguide 204 is presented that generates a single guided wave 208, multiple dielectric waveguides 204 placed at different points along the wire 202 and/or at different axial orientations about the wire can be employed to generate and receive multiple guided waves 208 at the same or different frequencies, at the same or different phases, at the same or different wave propagation modes. The guided wave or waves 208 can be modulated to convey data via a modulation technique such as phase shift keying, frequency shift keying, quadrature amplitude modulation, amplitude modulation, multi-carrier modulation and via multiple access techniques such as frequency division multiplexing, time division multiplexing, code division multiplexing, multiplexing via differing wave propagation modes and via other modulation and access strategies.

Figure 3:
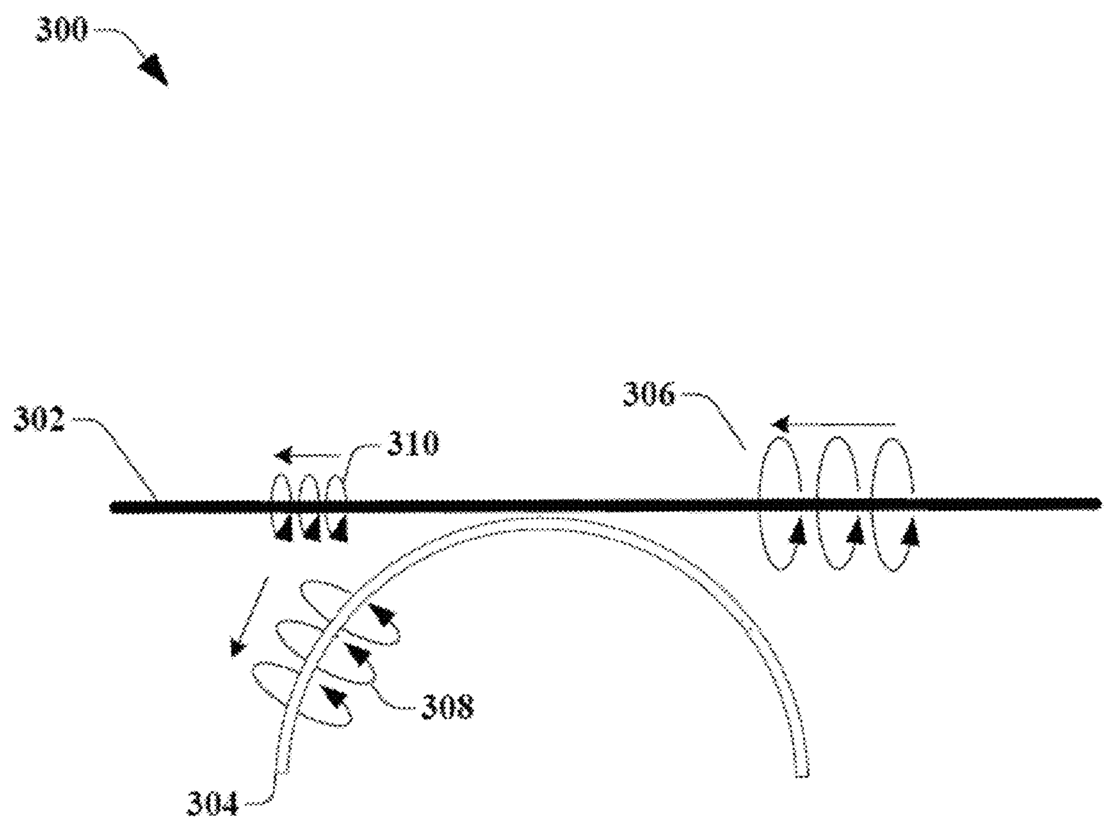
FIG. 3 is a block diagram illustrating an example, non-limiting embodiment of a dielectric waveguide coupler in accordance with various aspects described herein.

Turning now to FIG. 3, illustrated is a block diagram of an example, non-limiting embodiment of a dielectric waveguide coupling system 300 in accordance with various aspects described herein. System 300 comprises a dielectric waveguide 304 and a wire 302 that has a wave 306 propagating as a guided wave about a wire surface of the wire 302. In an example embodiment, the wave 306 can be characterized as a surface wave or other electromagnetic wave.

In an example embodiment, the dielectric waveguide 304 is curved or otherwise has a curvature, and can be placed near a wire 302 such that a portion of the curved dielectric waveguide 304 is parallel or substantially parallel to the wire 302. The portion of the dielectric waveguide 304 that is parallel to the wire can be an apex of the curve, or any point where a tangent of the curve is parallel to the wire 302. When the dielectric waveguide 304 is near the wire, the guided wave 306 travelling along the wire 302 can couple to the dielectric waveguide 304 and propagate as guided wave 308 about the dielectric waveguide 304. A portion of the guided wave 306 that does not couple to the dielectric waveguide 304 propagates as guided wave 310 (e.g., surface wave or other electromagnetic wave) along the wire 302.

The guided waves 306 and 308 stay parallel to the wire 302 and dielectric waveguide 304, respectively, even as the wire 302 and dielectric waveguide 304 bend and flex. Bends can increase transmission losses, which are also dependent on wire diameters, frequency, and materials. If the dimensions of the dielectric waveguide 304 are chosen for efficient power transfer, most of the energy in the guided wave 306 is coupled to the dielectric waveguide 304 and little remains in guided wave 310.

In an embodiment, a receiver circuit can be placed on the end of waveguide 304 in order to receive wave 308. A termination circuit can be placed on the opposite end of the waveguide 304 in order to receive guided waves traveling in the opposite direction to guided wave 306 that couple to the waveguide 304. The termination circuit would thus prevent and/or minimize reflections being received by the receiver circuit. If the reflections are small, the termination circuit may not be necessary.

It is noted that the dielectric waveguide 304 can be configured such that selected polarizations of the surface wave 306 are coupled to the dielectric waveguide 304 as guided wave 308. For instance, if guided wave 306 is made up of guided waves or wave propagation modes with respective polarizations, dielectric waveguide 304 can be configured to receive one or more guided waves of selected polarization(s). Guided wave 308 that couples to the dielectric waveguide 304 is thus the set of guided waves that correspond to one or more of the selected polarization(s), and further guided wave 310 can comprise the guided waves that do not match the selected polarization(s).

The dielectric waveguide 304 can be configured to receive guided waves of a particular polarization based on an angle/rotation around the wire 302 that the dielectric waveguide 304 is placed. For instance, if the guided wave 306 is polarized horizontally, most of the guided wave 306 transfers to the dielectric waveguide as wave 308. As the dielectric waveguide 304 is rotated 90 degrees around the wire 302, though, most of the energy from guided wave 306 would remain coupled to the wire as guided wave 310, and only a small portion would couple to the wire 302 as wave 308.

It is noted that waves 306, 308, and 310 are shown using three circular symbols in FIG. 3 and in other figures in the specification. These symbols are used to represent a general guided wave, but do not imply that the waves 306, 308, and 310 are necessarily circularly polarized or otherwise circularly oriented. In fact, waves 306, 308, and 310 can comprise a fundamental TEM mode where the fields extend radially outwards, and also comprise other, non-fundamental (e.g. higher-level, etc.) modes. These modes can be asymmetric (e.g., radial, bilateral, trilateral, quadrilateral, etc.) in nature as well.

It is noted also that guided wave communications over wires can be full duplex, allowing simultaneous communications in both directions. Waves traveling one direction can pass through waves traveling in an opposite direction. Electromagnetic fields may cancel out at certain points and for short times due to the superposition principle as applied to waves. The waves traveling in opposite directions propagate as if the other waves weren't there, but the composite effect to an observer may be a stationary standing wave pattern. As the guided waves pass through each other and are no longer in a state of superposition, the interference subsides. As a guided wave (e.g., surface wave or other electromagnetic wave) couples to a waveguide and move away from the wire, any interference due to other guided waves (e.g., surface waves or other electromagnetic wave) decreases. In an embodiment, as guided wave 306 (e.g., surface wave or other electromagnetic wave) approaches dielectric waveguide 304, another guided wave (e.g., surface wave or other electromagnetic wave) (not shown) traveling from left to right on the wire 302 passes by causing local interference. As guided wave 306 couples to dielectric waveguide 304 as wave 308, and moves away from the wire 302, any interference due to the passing guided wave subsides.

It is noted that the graphical representations of waves 306, 308 and 310 are presented merely to illustrate the principles that guided wave 306 induces or otherwise launches a wave 308 on a dielectric waveguide 304. Guided wave 310 represents the portion of guided wave 306 that remains on the wire 302 after the generation of wave 308. The actual electric and magnetic fields generated as a result of such guided wave propagation may vary depending on one or more of the shape and/or design of the dielectric waveguide, the relative position of the dielectric waveguide to the wire, the frequencies employed, the design of the dielectric waveguide 304, the dimensions and composition of the wire 302, as well as its surface characteristics, its optional insulation, the electromagnetic properties of the surrounding environment, etc.

Figure 4:
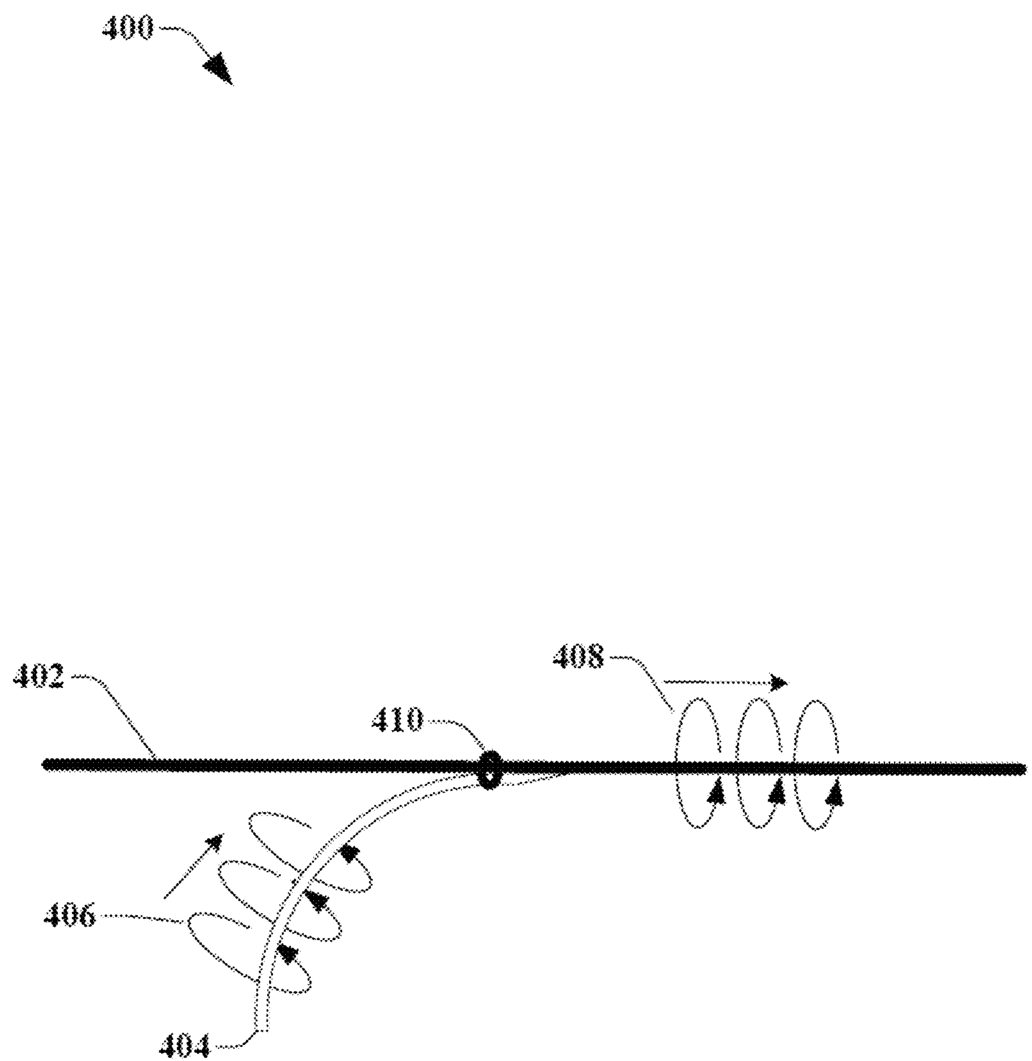
FIG. 4 is a block diagram illustrating an example, non-limiting embodiment of a dielectric waveguide coupler in accordance with various aspects described herein.

Turning now to FIG. 4, illustrated is a block diagram of an example, non-limiting embodiment of a dielectric waveguide coupling system 400 in accordance with various aspects described herein. System 400 comprises a dielectric waveguide 404 that has a wave 406 propagating as a guided wave about a waveguide surface of the dielectric waveguide 404. In an embodiment, the dielectric waveguide 404 is curved, and an end of the dielectric waveguide 404 can be tied, fastened, or otherwise mechanically coupled to a wire 402. When the end of the dielectric waveguide 404 is fastened to the wire 402, the end of the dielectric waveguide 404 is parallel or substantially parallel to the wire 402. Alternatively, another portion of the dielectric waveguide beyond an end can be fastened or coupled to wire 402 such that the fastened or coupled portion is parallel or substantially parallel to the wire 402. The coupling device 410 can be a nylon cable tie or other type of non-conducting/dielectric material that is either separate from the dielectric waveguide 404 or constructed as an integrated component of the dielectric waveguide 404. The dielectric waveguide 404 can be adjacent to the wire 402 without surrounding the wire 402.

When the dielectric waveguide 404 is placed with the end parallel to the wire 402, the guided wave 406 travelling along the dielectric waveguide 404 couples to the wire 402, and propagates as guided wave 408 about the wire surface of the wire 402. In an example embodiment, the guided wave 408 can be characterized as a surface wave or other electromagnetic wave.

It is noted that the graphical representations of waves 406 and 408 are presented merely to illustrate the principles that wave 406 induces or otherwise launches a guided wave 408 on a wire 402 that operates, for example, as a single wire transmission line. The actual electric and magnetic fields generated as a result of such wave propagation may vary depending on one or more of the shape and/or design of the dielectric waveguide, the relative position of the dielectric waveguide to the wire, the frequencies employed, the design of the dielectric waveguide 404, the dimensions and composition of the wire 402, as well as its surface characteristics, its optional insulation, the electromagnetic properties of the surrounding environment, etc.

In an embodiment, an end of dielectric waveguide 404 can taper towards the wire 402 in order to increase coupling efficiencies. Indeed, the tapering of the end of the dielectric waveguide 404 can provide impedance matching to the wire 402, according to an example embodiment of the subject disclosure. For example, an end of the dielectric waveguide 404 can be gradually tapered in order to obtain a desired level of coupling between waves 406 and 408 as illustrated in FIG. 4.

In an embodiment, the coupling device 410 can be placed such that there is a short length of the dielectric waveguide 404 between the coupling device 410 and an end of the dielectric waveguide 404. Maximum coupling efficiencies are realized when the length of the end of the dielectric waveguide 404 that is beyond the coupling device 410 is at least several wavelengths long for whatever frequency is being transmitted.

Figure 5:
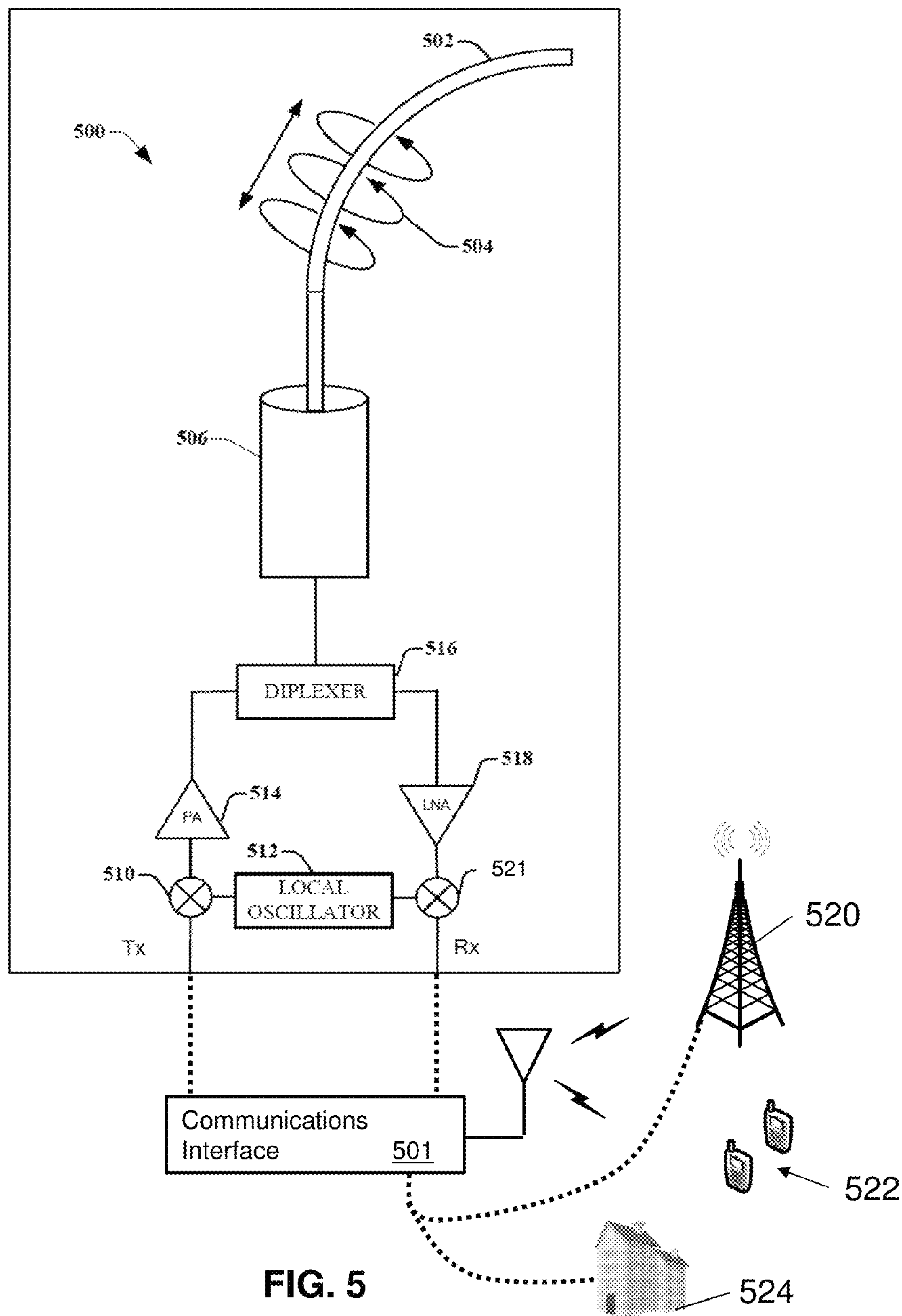
FIG. 5 is a block diagram illustrating an example, non-limiting embodiment of a dielectric waveguide coupler and transceiver in accordance with various aspects described herein.

Turning now to FIG. 5, illustrated is a block diagram of an example, non-limiting embodiment of a dielectric waveguide coupler and transceiver system 500 (referred to herein collectively as system 500) in accordance with various aspects described herein. System 500 comprises a transmitter/receiver device 506 that launches and receives waves (e.g., guided wave 504 onto dielectric waveguide 502). The guided waves 504 can be used to transport signals received from and sent to a base station 520, mobile devices 522, or a building 524 by way of a communications interface 501. The communications interface 501 can be an integral part of system 500. Alternatively, the communications interface 501 can be tethered to system 500. The communications interface 501 can comprise a wireless interface for interfacing to the base station 520, the mobile devices 522, or building 524 utilizing any of various wireless signaling protocols (e.g., LTE, WiFi, WiMAX, IEEE 802.xx, etc.). The communications interface 501 can also comprise a wired interface such as a fiber optic line, coaxial cable, twisted pair, or other suitable wired mediums for transmitting signals to the base station 520 or building 524. For embodiments where system 500 functions as a repeater, the communications interface 501 may not be necessary.

The output signals (e.g., Tx) of the communications interface 501 can be combined with a millimeter-wave carrier wave generated by a local oscillator 512 at frequency mixer 510. Frequency mixer 510 can use heterodyning techniques or other frequency shifting techniques to frequency shift the output signals from communications interface 501. For example, signals sent to and from the communications interface 501 can be modulated signals such as orthogonal frequency division multiplexed (OFDM) signals formatted in accordance with a Long-Term Evolution (LTE) wireless protocol or other wireless 3G, 4G, 5G or higher voice and data protocol, a Zigbee, WIMAX, UltraWideband or IEEE 802.11 wireless protocol or other wireless protocol. In an example embodiment, this frequency conversion can be done in the analog domain, and as a result, the frequency shifting can be done without regard to the type of communications protocol that the base station 520, mobile devices 522, or in-building devices 524 use. As new communications technologies are developed, the communications interface 501 can be upgraded or replaced and the frequency shifting and transmission apparatus can remain, simplifying upgrades. The carrier wave can then be sent to a power amplifier ("PA") 514 and can be transmitted via the transmitter receiver device 506 via the diplexer 516.

Signals received from the transmitter/receiver device 506 that are directed towards the communications interface 501 can be separated from other signals via diplexer 516. The transmission can then be sent to low noise amplifier ("LNA") 518 for amplification. A frequency mixer 521, with help from local oscillator 512 can downshift the transmission (which is in the millimeter-wave band or around 38 GHz in some embodiments) to the native frequency. The communications interface 501 can then receive the transmission at an input port (Rx).

In an embodiment, transmitter/receiver device 506 can include a cylindrical or non-cylindrical metal (which, for example, can be hollow in an embodiment, but not necessarily drawn to scale) or other conducting or non-conducting waveguide and an end of the dielectric waveguide 502 can be placed in or in proximity to the waveguide or the transmitter/receiver device 506 such that when the transmitter/receiver device 506 generates a transmission, the guided wave couples to dielectric waveguide 502 and propagates as a guided wave 504 about the waveguide surface of the dielectric waveguide 502. Similarly, if guided wave 504 is incoming (coupled to the dielectric waveguide 502 from a wire), guided wave 504 then enters the transmitter/receiver device 506 and couples to the cylindrical waveguide or conducting waveguide. While transmitter/receiver device 506 is shown to include a separate waveguide—an antenna, cavity resonator, klystron, magnetron, travelling wave tube, or other radiating element can be employed to induce a guided wave on the waveguide 502, without the separate waveguide.

In an embodiment, dielectric waveguide 502 can be wholly constructed of a dielectric material (or another suitable insulating material), without any metallic or otherwise conducting materials therein. Dielectric waveguide 502 can be composed of nylon, Teflon, polyethylene, a polyamide, other plastics, or other materials that are non-conducting and suitable for facilitating transmission of electromagnetic waves on an outer surface of such materials. In another embodiment, dielectric waveguide 502 can include a core that is conducting/metallic, and have an exterior dielectric surface. Similarly, a transmission medium that couples to the dielectric waveguide 502 for propagating electromagnetic waves induced by the dielectric waveguide 502 or for supplying electromagnetic waves to the dielectric waveguide 502 can be wholly constructed of a dielectric material (or another suitable insulating material), without any metallic or otherwise conducting materials therein.

It is noted that although FIG. 5 shows that the opening of transmitter receiver device 506 is much wider than the dielectric waveguide 502, this is not to scale, and that in other embodiments the width of the dielectric waveguide 502 is comparable or slightly smaller than the opening of the hollow waveguide. It is also not shown, but in an embodiment, an end of the waveguide 502 that is inserted into the transmitter/receiver device 506 tapers down in order to reduce reflection and increase coupling efficiencies.

The transmitter/receiver device 506 can be communicably coupled to a communications interface 501, and alternatively, transmitter/receiver device 506 can also be communicably coupled to the one or more distributed antennas 112 and 114 shown in FIG. 1. In other embodiments, transmitter receiver device 506 can comprise part of a repeater system for a backhaul network.

Before coupling to the dielectric waveguide 502, the one or more waveguide modes of the guided wave generated by the transmitter/receiver device 506 can couple to one or more wave propagation modes of the guided wave 504. The wave propagation modes can be different than the hollow metal waveguide modes due to the different characteristics of the hollow metal waveguide and the dielectric waveguide. For instance, wave propagation modes can comprise the fundamental transverse electromagnetic mode (Quasi-$TEM_{00}$), where only small electrical and/or magnetic fields extend in the direction of propagation, and the electric and magnetic fields extend radially outwards from the dielectric waveguide 502 while the guided waves propagate along the dielectric waveguide 502. The fundamental transverse electromagnetic mode wave propagation mode does not exist inside a waveguide that is hollow. Therefore, the hollow metal waveguide modes that are used by transmitter/receiver device 506 are waveguide modes that can couple effectively and efficiently to wave propagation modes of dielectric waveguide 502.

Figure 6:
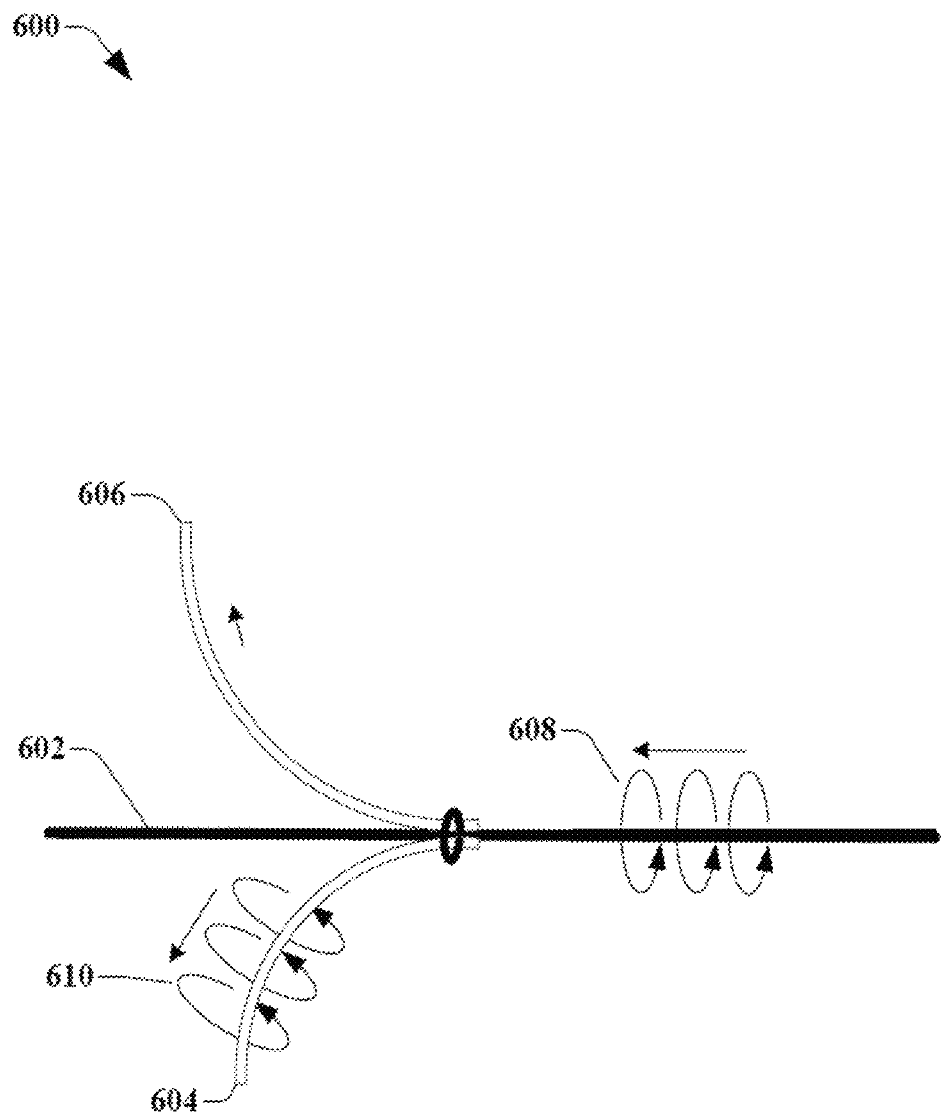
FIG. 6 is a block diagram illustrating an example, non-limiting embodiment of a dual dielectric waveguide coupler in accordance with various aspects described herein.

Turning now to FIG. 6, illustrated is a block diagram illustrating an example, non-limiting embodiment of a dual dielectric waveguide coupling system 600 in accordance with various aspects described herein. In an embodiment, two or more dielectric waveguides (e.g., 604 and 606) can be positioned around a wire 602 in order to receive guided wave 608. In an embodiment, the guided wave 608 can be characterized as a surface wave or other electromagnetic wave. In an embodiment, one dielectric waveguide is enough to receive the guided wave 608. In that case, guided wave 608 couples to dielectric waveguide 604 and propagates as guided wave 610. If the field structure of the guided wave 608 oscillates or undulates around the wire 602 due to various outside factors, then dielectric waveguide 606 can be placed such that guided wave 608 couples to dielectric waveguide 606. In some embodiments, four or more dielectric waveguides can be placed around a portion of the wire 602, e.g., at 90 degrees or another spacing with respect to each other, in order to receive guided waves that may oscillate or rotate around the wire 602, that have been induced at different axial orientations or that have non-fundamental or higher order modes that, for example, have lobes and/or nulls or other asymmetries that are orientation dependent. However, it will be appreciated that there may be less than or more than four dielectric waveguides placed around a portion of the wire 602 without departing from example embodiments. It will also be appreciated that while some example embodiments have presented a plurality of dielectric waveguides around at least a portion of a wire 602, this plurality of dielectric waveguides can also be considered as part of a single dielectric waveguide system having multiple dielectric waveguide subcomponents. For example, two or more dielectric waveguides can be manufactured as single system that can be installed around a wire in a single installation such that the dielectric waveguides are either pre-positioned or adjustable relative to each other (either manually or automatically) in accordance with the single system. Receivers coupled to dielectric waveguides 606 and 604 can use diversity combining to combine signals received from both dielectric waveguides 606 and 604 in order to maximize the signal quality. In other embodiments, if one or the other of a dielectric waveguides 604 and 606 receive a transmission that is above a predetermined threshold, receivers can use selection diversity when deciding which signal to use.

It is noted that the graphical representations of waves 608 and 610 are presented merely to illustrate the principles that guided wave 608 induces or otherwise launches a wave 610 on a dielectric waveguide 604. The actual electric and magnetic fields generated as a result of such wave propagation may vary depending on the frequencies employed, the design of the dielectric waveguide 604, the dimensions and composition of the wire 602, as well as its surface characteristics, its optional insulation, the electromagnetic properties of the surrounding environment, etc.

Figure 7:
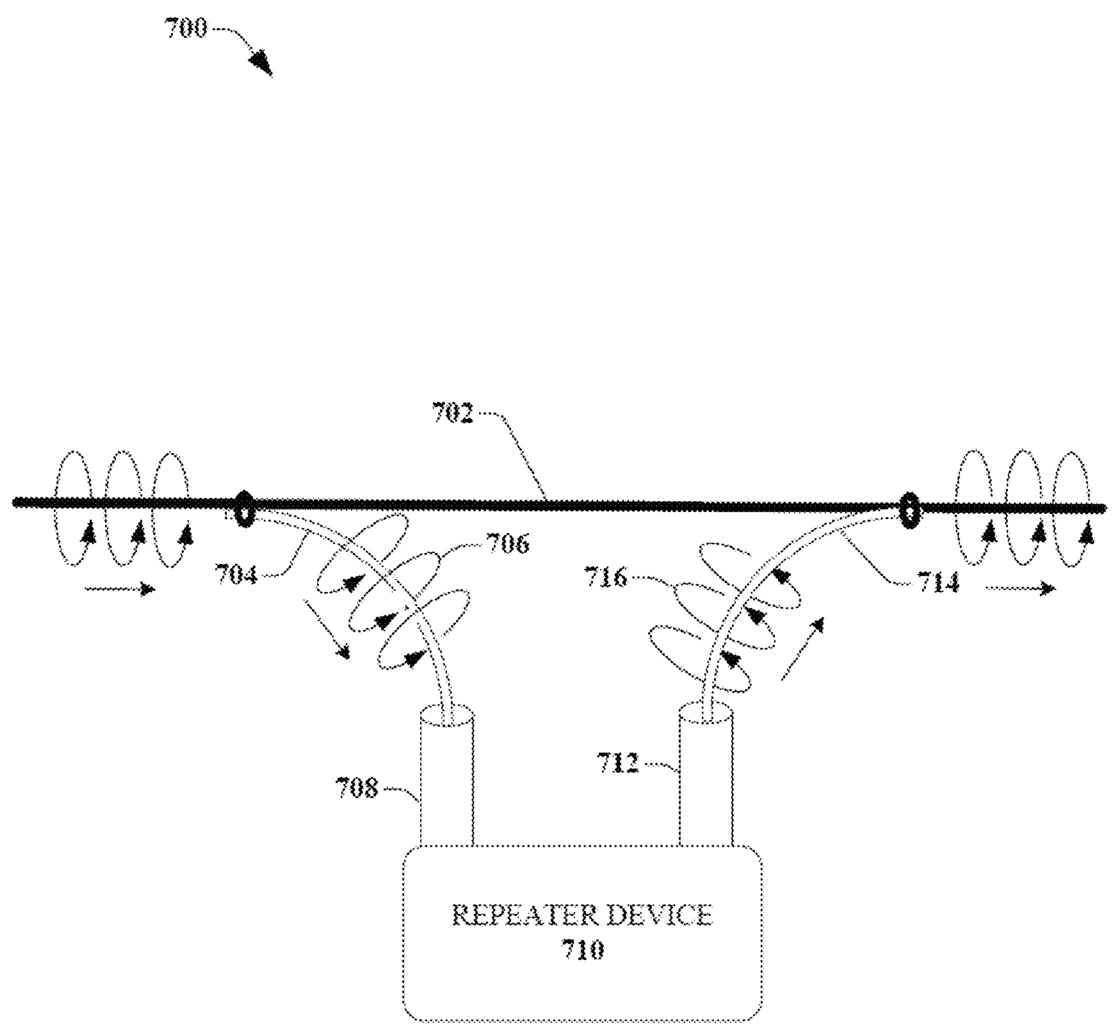
FIG. 7 is a block diagram illustrating an example, non-limiting embodiment of a bidirectional dielectric waveguide coupler in accordance with various aspects described herein.

Turning now to FIG. 7, illustrated is a block diagram of an example, non-limiting embodiment of a bidirectional dielectric waveguide coupling system 700 in accordance with various aspects described herein. In system 700, two dielectric waveguides 704 and 714 can be placed near a wire 702 such that guided waves (e.g., surface waves or other electromagnetic waves) propagating along the wire 702 are coupled to dielectric waveguide 704 as wave 706, and then are boosted or repeated by repeater device 710 and launched as a guided wave 716 onto dielectric waveguide 714. The guided wave 716 can then couple to wire 702 and continue to propagate along the wire 702. In an embodiment, the repeater device 710 can receive at least a portion of the power utilized for boosting or repeating through magnetic coupling with the wire 702, which can be a power line.

In some embodiments, repeater device 710 can repeat the transmission associated with wave 706, and in other embodiments, repeater device 710 can be associated with a distributed antenna system and/or base station device located near the repeater device 710. Receiver waveguide 708 can receive the wave 706 from the dielectric waveguide 704 and transmitter waveguide 712 can launch guided wave 716 onto dielectric waveguide 714. Between receiver waveguide 708 and transmitter waveguide 712, the signal can be amplified to correct for signal loss and other inefficiencies associated with guided wave communications or the signal can be received and processed to extract the data contained therein and regenerated for transmission. In an embodiment, a signal can be extracted from the transmission and processed and otherwise emitted to mobile devices nearby via distributed antennas communicably coupled to the repeater device 710. Similarly, signals and/or communications received by the distributed antennas can be inserted into the transmission that is generated and launched onto dielectric waveguide 714 by transmitter waveguide 712. Accordingly, the repeater system 700 depicted in FIG. 7 can be comparable in function to the dielectric waveguide coupling device 108 and 110 in FIG. 1.

It is noted that although FIG. 7 shows guided wave transmissions 706 and 716 entering from the left and exiting to the right respectively, this is merely a simplification and is not intended to be limiting. In other embodiments, receiver waveguide 708 and transmitter waveguide 712 can also function as transmitters and receivers respectively, allowing the repeater device 710 to be bi-directional.

In an embodiment, repeater device 710 can be placed at locations where there are discontinuities or obstacles on the wire 702. These obstacles can include transformers, connections, utility poles, and other such power line devices. The repeater device 710 can help the guided (e.g., surface) waves jump over these obstacles on the line and boost the transmission power at the same time. In other embodiments, a dielectric waveguide can be used to jump over the obstacle without the use of a repeater device. In that embodiment, both ends of the dielectric waveguide can be tied or fastened to the wire, thus providing a path for the guided wave to travel without being blocked by the obstacle.

Figure 8:
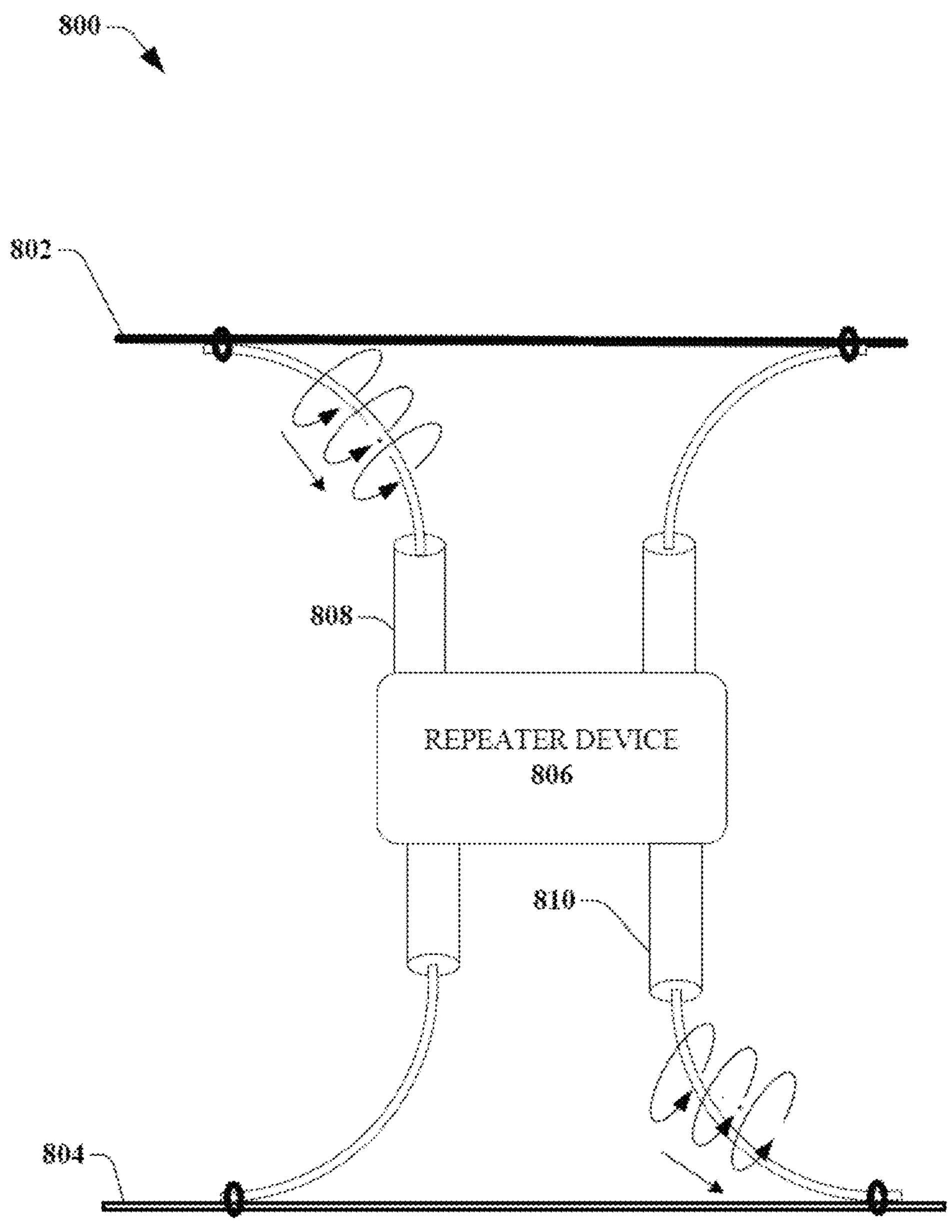
FIG. 8 illustrates a block diagram illustrating an example, non-limiting embodiment of a bidirectional dielectric waveguide coupler in accordance with various aspects described herein.

Turning now to FIG. 8, illustrated is a block diagram of an example, non-limiting embodiment of a bidirectional dielectric waveguide coupler 800 in accordance with various aspects described herein. The bidirectional dielectric waveguide coupler 800 can employ diversity paths in the case of when two or more wires are strung between utility poles. Since guided wave transmissions have different transmission efficiencies and coupling efficiencies for insulated wires and un-insulated wires based on weather, precipitation and atmospheric conditions, it can be advantageous to selectively transmit on either an insulated wire or un-insulated wire at certain times.

In the embodiment shown in FIG. 8, repeater device uses a receiver waveguide 808 to receive a guided wave traveling along uninsulated wire 802 and repeats the transmission using transmitter waveguide 810 as a guided wave along insulated wire 804. In other embodiments, repeater device can switch from the insulated wire 804 to the un-insulated wire 802, or can repeat the transmissions along the same paths. Repeater device 806 can include sensors, or be in communication with sensors that indicate conditions that can affect the transmission. Based on the feedback received from the sensors, the repeater device 806 can make the determination about whether to keep the transmission along the same wire, or transfer the transmission to the other wire.

Figure 9:
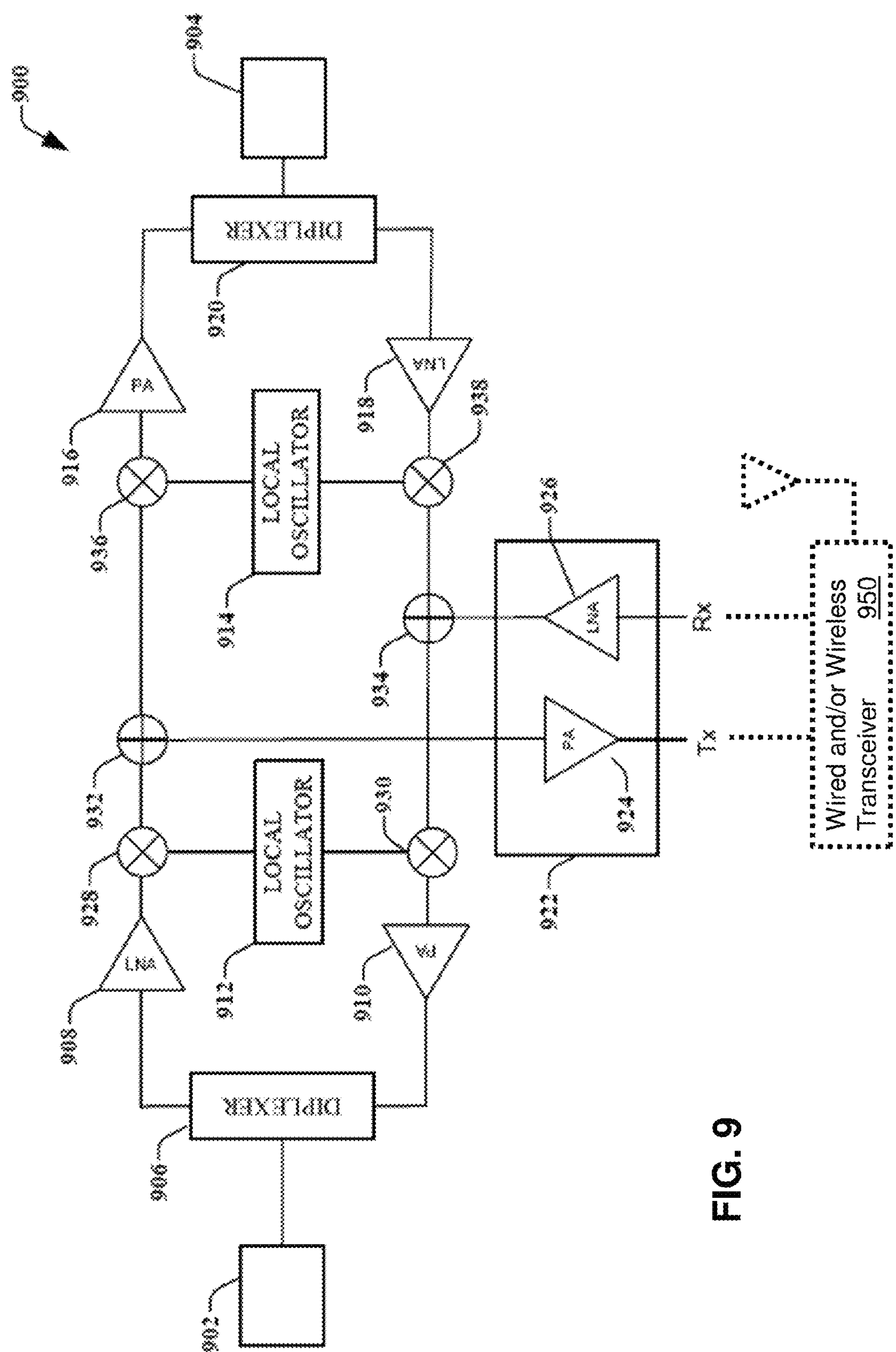
FIG. 9 illustrates a block diagram illustrating an example, non-limiting embodiment of a bidirectional repeater system in accordance with various aspects described herein.

Turning now to FIG. 9, illustrated is a block diagram illustrating an example, non-limiting embodiment of a bidirectional repeater system 900. Bidirectional repeater system 900 includes waveguide coupling devices 902 and 904 that receive and transmit transmissions from other coupling devices located in a distributed antenna system or backhaul system.

In various embodiments, waveguide coupling device 902 can receive a transmission from another waveguide coupling device, wherein the transmission has a plurality of subcarriers. Diplexer 906 can separate the transmission from other transmissions, and direct the transmission to low-noise amplifier ("LNA") 908. A frequency mixer 928, with help from a local oscillator 912, can downshift the transmission (which is in the millimeter-wave band or around 38 GHz in some embodiments) to a lower frequency, whether it is a cellular band (~1.9 GHz) for a distributed antenna system, a native frequency, or other frequency for a backhaul system. An extractor 932 can extract the signal on the subcarrier that corresponds to antenna or other output component 922 and direct the signal to the output component 922. For the signals that are not being extracted at this antenna location, extractor 932 can redirect them to another frequency mixer 936, where the signals are used to modulate a carrier wave generated by local oscillator 914. The carrier wave, with its subcarriers, is directed to a power amplifier ("PA") 916 and is retransmitted by waveguide coupling device 904 to another repeater system, via diplexer 920.

At the output device 922 (antenna in a distributed antenna system), a PA 924 can boost the signal for transmission to the mobile device. An LNA 926 can be used to amplify weak signals that are received from the mobile device and then send the signal to a multiplexer 934 which merges the signal with signals that have been received from waveguide coupling device 904. The signals received from coupling device 904 have been split by diplexer 920, and then passed through LNA 918, and downshifted in frequency by frequency mixer 938. When the signals are combined by multiplexer 934, they are upshifted in frequency by frequency mixer 930, and then boosted by PA 910, and transmitted back to the launcher or on to another repeater by waveguide coupling device 902. In an embodiment bidirectional repeater system 900 can be just a repeater without the antenna/output device 922. It will be appreciated that in some embodiments, a bidirectional repeater system 900 could also be implemented using two distinct and separate uni-directional repeaters. In an alternative embodiment, a bidirectional repeater system 900 could also be a booster or otherwise perform retransmissions without downshifting and upshifting. Indeed in example embodiment, the retransmissions can be based upon receiving a signal or guided wave and performing some signal or guided wave processing or reshaping, filtering, and/or amplification, prior to retransmission of the signal or guided wave.

Figure 10A:
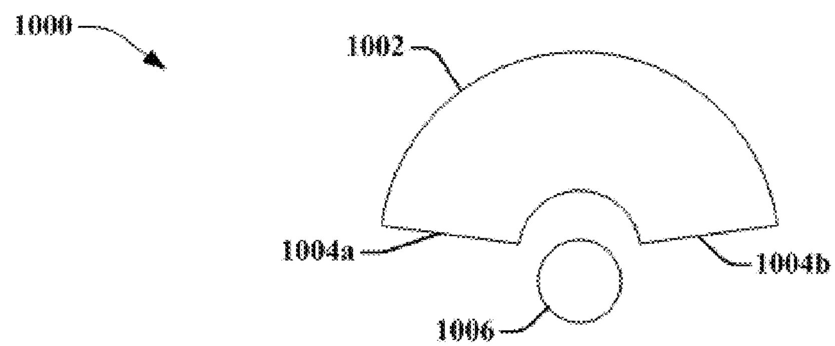
FIGS. 10A, 10B, and 10C are block diagrams illustrating example, non-limiting embodiments of a slotted waveguide coupler in accordance with various aspects described herein.
Figure 10B:
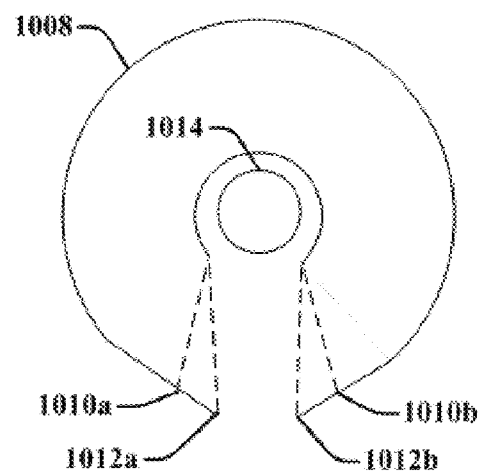
Figure 10C:
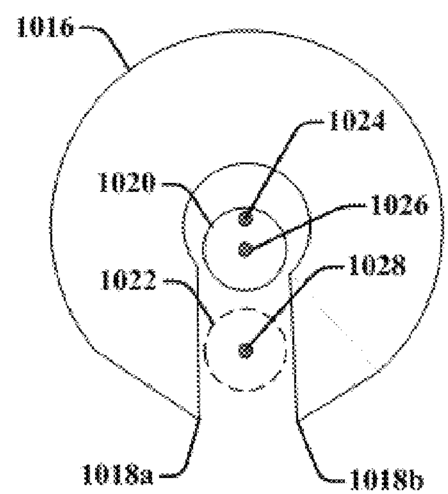

Turning now to FIGS. 10A, 10B, and 10C, illustrated are block diagrams of example, non-limiting embodiments of a slotted waveguide coupler system 1000 in accordance with various aspects described herein. In FIG. 10A, the waveguide coupler system comprises a wire 1006 that is positioned with respect to a waveguide 1002, such that the wire 1006 fits within or near a slot formed in the waveguide 1002 that runs longitudinally with respect to the wire 1004. The opposing ends 1004*a* and 1004*b* of the waveguide 1002, and the waveguide 1002 itself, surrounds less than 180 degrees of the wire surface of the wire 1006.

In FIG. 10B the waveguide coupler system comprises a wire 1014 that is positioned with respect to a waveguide 1008, such that the wire 1014 fits within or near a slot formed in the waveguide 1008 that runs longitudinally with respect to the wire 1004. The slot surfaces of the waveguide 1008 can be non parallel, and two different exemplary embodiments are shown in FIG. 10B. In the first, slot surfaces 1010*a* and 1010*b* can be non parallel and aim outwards, slightly wider than the width of the wire 1014. In the other embodiment, the slots surfaces 1012*a* and 1012*b* can still be non-parallel, but narrow to form a slot opening smaller than a width of the wire 1014. Any range of angles of the non parallel slot surfaces are possible, of which these are two exemplary embodiments.

In FIG. 10C, the waveguide coupler system shows a wire 1020 that fits within a slot formed in waveguide 1016. The slot surfaces 1018*a* and 1018*b* in this exemplary embodiment can be parallel, but the axis 1026 of the wire 1020 is not aligned with the axis 1024 of the waveguide 1016. The waveguide 1016 and the wire 1020 are therefore not coaxially aligned. In another embodiment, shown, a possible position of the wire at 1022 also has an axis 1028 that is not aligned with the axis 1024 of the waveguide 1016.

It is to be appreciated that while three different embodiments showing a) waveguide surfaces that surround less than 180 degrees of the wire, b) non parallel slot surfaces, and c) coaxially unaligned wires and waveguide were shown separately in FIGS. 10A, 10B, and 10C, in various embodiments, diverse combinations of the listed features are possible.

Figure 11:
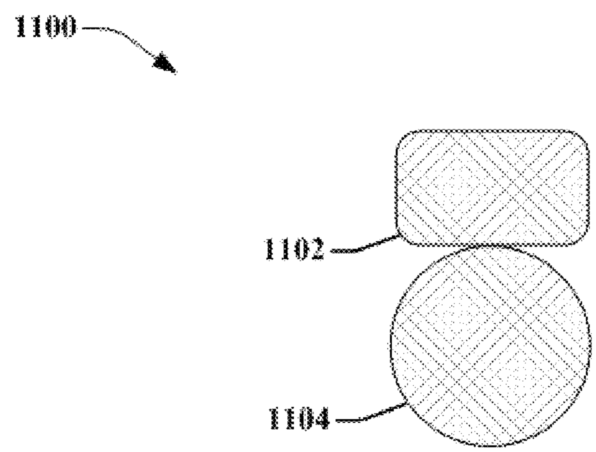
FIG. 11 is a block diagram illustrating an example, non-limiting embodiment of a waveguide coupling system in accordance with various aspects described herein

Turning now to FIG. 11, illustrated is an example, non-limiting embodiment of a waveguide coupling system 1100 in accordance with various aspects described herein. FIG. 11 depicts a cross sectional representation of the waveguide and wire embodiments shown in FIGS. 2, 3, 4, and etc. As can be seen in 1100, the wire 1104 can be positioned directly next to and touching waveguide 1102. In other embodiments, as shown in waveguide coupling system 1200 in FIG. 12, the wire 1204 can still be placed near, but not actually touching waveguide strip 1202. In both cases, electromagnetic waves traveling along the waveguides can induce other electromagnetic waves on to the wires and vice versa. Also, in both embodiments, the wires 1104 and 1204 are placed outside the cross-sectional area defined by the outer surfaces of waveguides 1102 and 1202.

For the purposes of this disclosure, a waveguide does not surround, in substantial part, a wire surface of a wire when the waveguide does not surround an axial region of the surface, when viewed in cross-section, of more than 180 degrees. For avoidance of doubt, a waveguide does not surround, in substantial part a surface of a wire when the waveguide surrounds an axial region of the surface, when viewed in cross-section, of 180 degrees or less.

Figure 12:
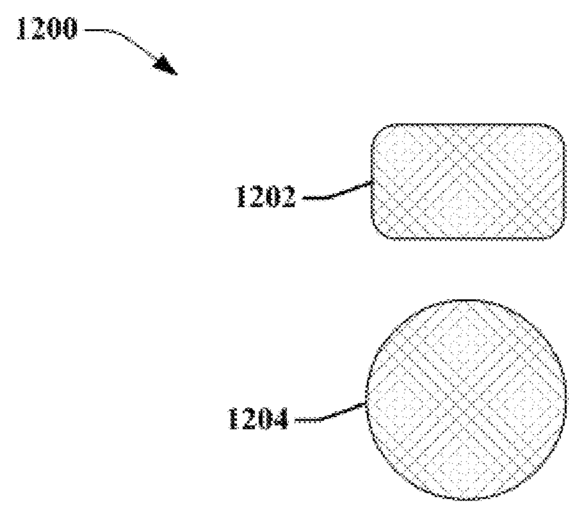
FIG. 12 is a block diagram illustrating an example, non-limiting embodiment of a waveguide coupling system in accordance with various aspects described herein.

It is to be appreciated that while FIGS. 11 and 12 show wires 1104 and 1204 having a circular shape and waveguides 1102 and 1202 having rectangular shapes, this is not meant to be limiting. In other embodiments, wires and waveguides can have a variety of shapes, sizes, and configurations. The shapes can include, but not be limited to: ovals or other elliptoid shapes, octagons, quadrilaterals or other polygons with either sharp or rounded edges, or other shapes. Additionally, in some embodiments, the wires 1104 and 1204 can be stranded wires comprising smaller gauge wires, such as a helical strand, braid or other coupling of individual strands into a single wire. Any of wires and waveguides shown in the figures and described throughout this disclosure can include one or more of these embodiments.

Figure 13:
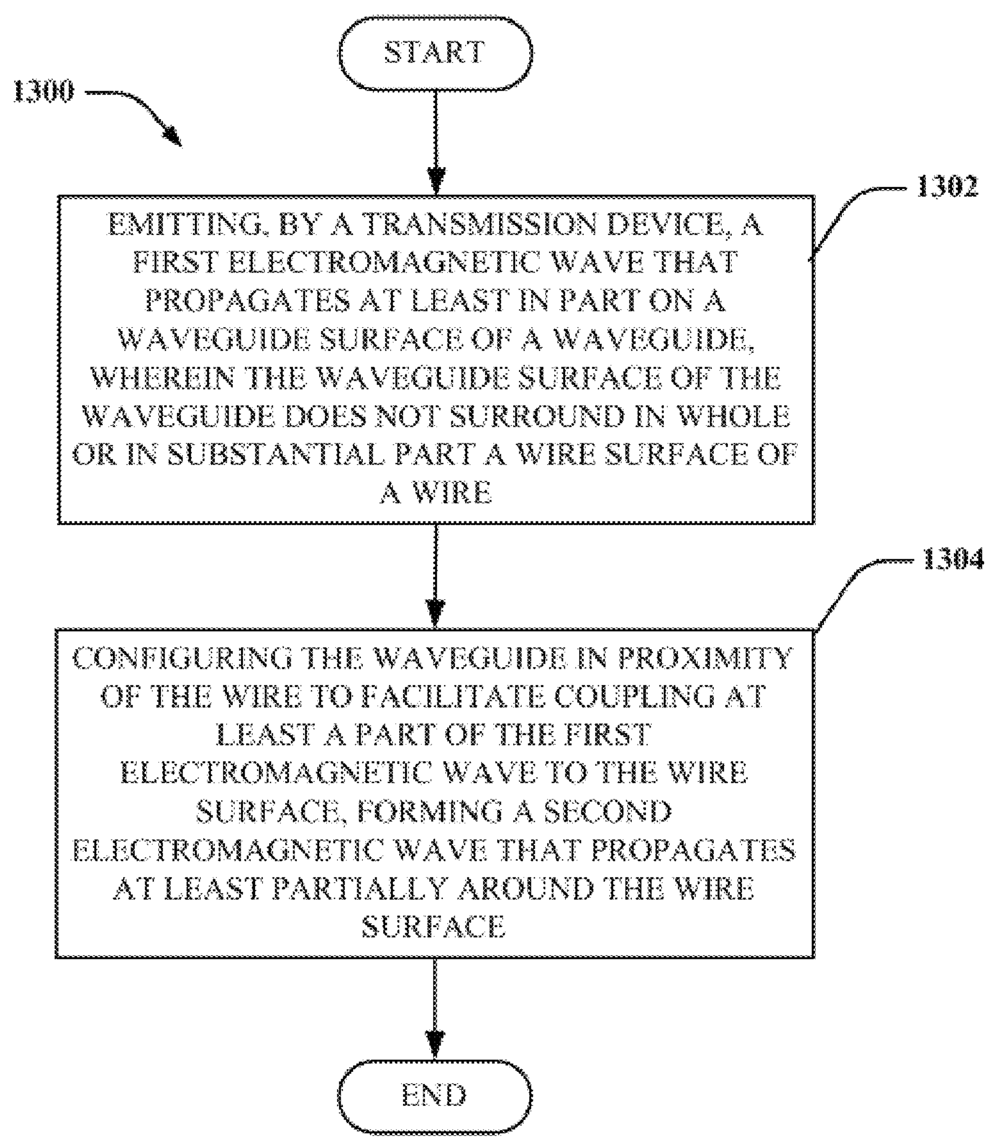
FIG. 13 illustrates a flow diagram of an example, non-limiting embodiment of a method for transmitting a transmission with a dielectric waveguide coupler as described herein.

FIG. 13 illustrates a process in connection with the aforementioned systems. The process in FIG. 13 can be implemented for example by systems 100, 200, 300, 400, 500, 600, 700, 800, and 900 illustrated in FIGS. 1-9 respectively. While for purposes of simplicity of explanation, the process is shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described hereinafter.

FIG. 13 illustrates a flow diagram of an example, non-limiting embodiment of a method for transmitting a transmission with a dielectric waveguide coupler as described herein. Method 1300 can begin at 1302 where a first electromagnetic wave is emitted by a transmission device as a guided wave that propagates at least in part on a waveguide surface of a waveguide, wherein the waveguide surface of the waveguide does not surround in whole or in substantial part a wire surface of a wire. The transmission that is generated by a transmitter can be based on a signal received from a base station device, access point, network, a mobile device, or other signal source.

At 1304, based upon configuring or positioning the waveguide in proximity of the wire, the guided wave then couples at least a part of the first electromagnetic wave to a wire surface, forming a second electromagnetic wave (e.g., a surface wave) that propagates at least partially around the wire surface, wherein the wire is in proximity to the waveguide. This can be done in response to positioning a portion of the dielectric waveguide (e.g., a tangent of a curve of the dielectric waveguide) near and parallel to the wire, wherein a wavelength of the electromagnetic wave is smaller than a circumference of the wire and the dielectric waveguide. The guided wave, or surface wave, stays parallel to the wire even as the wire bends and flexes. Bends can increase transmission losses, which are also dependent on wire diameters, frequency, and materials. The coupling interface between the wire and the waveguide can also be configured to achieve the desired level of coupling, as described herein, which can include tapering an end of the waveguide to improve impedance matching between the waveguide and the wire.

The transmission that is emitted by the transmitter can exhibit one or more waveguide modes. The waveguide modes can be dependent on the shape and/or design of the waveguide. The propagation modes on the wire can be different than the waveguide modes due to the different characteristics of the waveguide and the wire. When the circumference of the wire is comparable in size to, or greater, than a wavelength of the transmission, the guided wave exhibits multiple wave propagation modes. The guided wave can therefore comprise more than one type of electric and magnetic field configuration. As the guided wave (e.g., surface wave) propagates down the wire, the electrical and magnetic field configurations may remain substantially the same from end to end of the wire or vary as the transmission traverses the wave by rotation, dispersion, attenuation or other effects.

Figure 14:
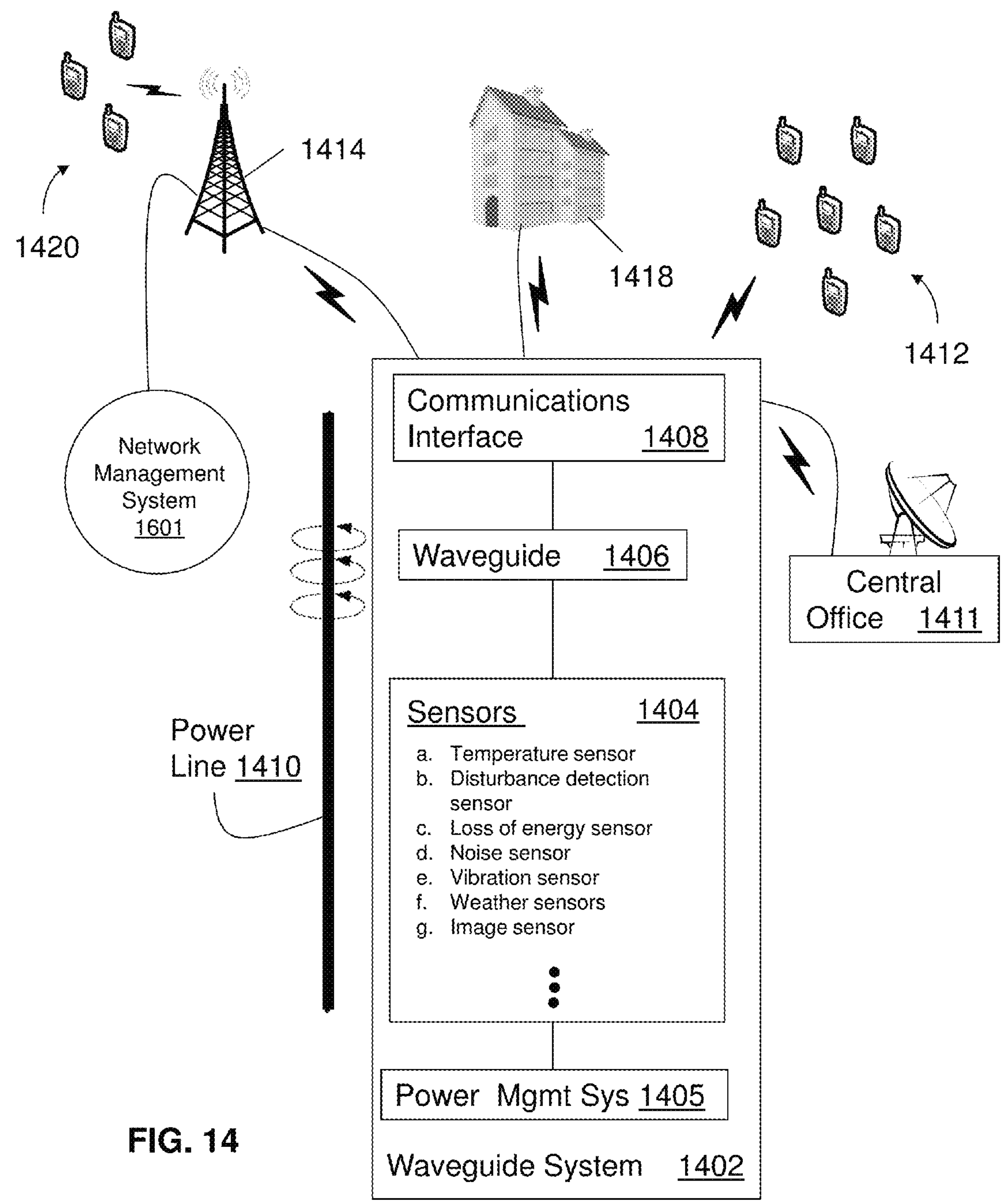
FIG. 14 is a block diagram illustrating an example, non-limiting embodiment of a waveguide system in accordance with various aspects described herein.

FIG. 14 is a block diagram illustrating an example, non-limiting embodiment of a waveguide system 1402 in accordance with various aspects described herein. The waveguide system 1402 can comprise sensors 1404, a power management system 1405, a waveguide 1406, and a communications interface 1408.

The waveguide system 1402 can be coupled to a power line 1410 for facilitating data communications in accordance with embodiments described in the subject disclosure. In an example embodiment, the waveguide 1406 can comprise all or part of the system 500, such as shown in FIG. 5, for inducing electromagnetic waves on a surface of the power line 1410 that longitudinally propagate along the surface of the power line 1410 as described in the subject disclosure. Non-limiting techniques for coupling the waveguide 1406 to the power line 1410 are shown in FIGS. 2-4 and 6. The waveguide 1406 can also serve as a repeater for retransmitting electromagnetic waves on the same power line 1410 or for routing electromagnetic waves between power lines 1410 as shown in FIGS. 7-8.

The communications interface 1408 can comprise the communications interface 501 shown in FIG. 5, in an example embodiment. The communications interface 1408 couples to the waveguide 1406 for up-converting signals operating at an original frequency to electromagnetic waves operating at a carrier frequency that propagate on a surface of a coupling device of the waveguide 1406, such as the dielectric 502 of FIG. 5, and that induce corresponding electromagnetic waves that propagate on a surface of the power line 1410. The power line 1410 can be a wire (e.g., single stranded or multi-stranded) having a conducting surface or insulated surface. The communications interface 1408 can also receive signals from the waveguide 1406 that have been down-converted from electromagnetic waves operating at a carrier frequency to signals at their original frequency.

Signals received by the communications interface 1408 for up-conversion can include without limitation signals supplied by a central office 1411 over a wired or wireless interface of the communications interface 1408, a base station 1414 over a wired or wireless interface of the communications interface 1408, wireless signals transmitted by mobile devices 1420 to the base station 1414 for delivery over the wired or wireless interface of the communications interface 1408, signals supplied by in-building communication devices 1418 over the wired or wireless interface of the communications interface 1408, and/or wireless signals supplied to the communications interface 1408 by mobile devices 1412 roaming in a wireless communication range of the communications interface 1408. In embodiments where the waveguide system 1402 functions as a repeater, such as shown in FIGS. 7-8, the communications interface 1408 may not be included in the waveguide system 1402.

The electromagnetic waves propagating along the surface of the power 1410 can be modulated and formatted to include packets or frames of data that include a data payload and further include networking information (such as header information for identifying one or more destination waveguide systems 1402). The networking information may be provided by the waveguide system 1402 or an originating device such as the central office 1411, the base station 1414, mobile devices 1420, or in-building devices 1418, or a combination thereof. Additionally, the modulated electromagnetic waves can include error correction data for mitigating signal disturbances. The networking information and error correction data can be used by a destination waveguide system 1402 for detecting transmissions directed to it, and for down-converting and processing with error correction data transmissions that include voice and/or data signals directed to recipient communication devices communicatively coupled to the destination waveguide system 1402.

Referring now to the sensors 1404 of the waveguide system 1402, the sensors 1404 can comprise one or more of a temperature sensor 1404*a*, a disturbance detection sensor 1404*b*, a loss of energy sensor 1404*c*, a noise sensor 1404*d*, a vibration sensor 1404*e*, an environmental (e.g., weather) sensor 1404*f*, and/or an image sensor 1404*g*. The temperature sensor 1404*a* can be used to measure ambient temperature, a temperature of the waveguide 1406, a temperature of the power line 1410, temperature differentials (e.g., compared to a setpoint or baseline, between 1046 and 1410, etc.), or any combination thereof. In one embodiment, temperature metrics can be collected and reported periodically to a network management system 1601 by way of the base station 1414.

The disturbance detection sensor 1404*b* can perform measurements on the power line 1410 to detect disturbances such as signal reflections, which may indicate a presence of a downstream disturbance that may impede the propagation of electromagnetic waves on the power line 1410. A signal reflection can represent a distortion resulting from, for example, an electromagnetic wave transmitted on the power line 1410 by the waveguide 1406 that reflects in whole or in part back to the waveguide 1406 from a disturbance in the power line 1410 located downstream from the waveguide 1406.

Signal reflections can be caused by obstructions on the power line 1410. For example, a tree limb shown in FIG. 15(A) may cause electromagnetic wave reflections when the tree limb is lying on the power line 1410, or is in close proximity to the power line 1410 which may cause a corona discharge 1502. Other illustrations of obstructions that can cause electromagnetic wave reflections can include without limitation an object 1506 that has been entangled on the power line 1410 as shown in FIG. 15(C) (e.g., clothing, a shoe wrapped around a power line 1410 with a shoe string, etc.), a corroded build-up 1512 on the power line 1410 as shown in FIG. 15(F), or an ice build-up 1514 as shown in FIG. 15 (G). Power grid components may also interfere with the transmission of electromagnetic waves on the surface of power lines 1410. Illustrations of power grid components that may cause signal reflections include without limitation a transformer 1504 illustrated in FIG. 15(B) and a joint 1510 for connecting spliced power lines such as illustrated in FIG. 15(E). A sharp angle 1508 on a power line 1410, as shown in FIG. 15(D), may also cause electromagnetic wave reflections.

The disturbance detection sensor 1404*b* can comprise a circuit to compare magnitudes of electromagnetic wave reflections to magnitudes of original electromagnetic waves transmitted by the waveguide 1406 to determine how much a downstream disturbance in the power line 1410 attenuates transmissions. The disturbance detection sensor 1404*b* can further comprise a spectral analyzer circuit for performing spectral analysis on the reflected waves. The spectral data generated by the spectral analyzer circuit can be compared with spectral profiles via pattern recognition, an expert system, curve fitting, matched filtering or other artificial intelligence, classification or comparison technique to identify a type of disturbance based on, for example, the spectral profile that most closely matches the spectral data. The spectral profiles can be stored in a memory of the disturbance detection sensor 1404*b* or may be remotely accessible by the disturbance detection sensor 1404*b*. The profiles can comprise spectral data that models different disturbances that may be encountered on power lines 1410 to enable the disturbance detection sensor 1404*b* to identify disturbances locally. An identification of the disturbance if known can be reported to the network management system 1601 by way of the base station 1414. The disturbance detection sensor 1404*b* can also utilize the waveguide 1406 to transmit electromagnetic waves as test signals to determine a round-trip time for an electromagnetic wave reflection. The round trip time measured by the disturbance detection sensor 1404*b* can be used to calculate a distance traveled by the electromagnetic wave up to a point where the reflection takes place, which enables the disturbance detection sensor 1404*b* to calculate a distance from the waveguide 1406 to the downstream disturbance on the power line 1410.

The distance calculated can be reported to the network management system 1601 by way of the base station 1414. In one embodiment, the location of the waveguide system 1402 on the power line 1410 may be known to the network management system 1601, which the network management system 1601 can use to determine a location of the disturbance on the power line 1410 based on a known topology of the power grid. In another embodiment, the waveguide system 1402 can provide its location to the network management system 1601 to assist in the determination of the location of the disturbance on the power line 1410. The location of the waveguide system 1402 can be obtained by the waveguide system 1402 from a pre-programmed location of the waveguide system 1402 stored in a memory of the waveguide system 1402, or the waveguide system 1402 can determine its location using a GPS receiver (not shown) included in the waveguide system 1402.

The power management system 1405 provides energy to the aforementioned components of the waveguide system 1402. The power management system 1405 can receive energy from solar cells, or from a transformer (not shown) coupled to the power line 1410, or by inductive coupling to the power line 1410 or another nearby power line. The power management system 1405 can also include a backup battery and/or a super capacitor or other capacitor circuit for providing the waveguide system 1402 with temporary power. The loss of energy sensor 1404*c* can be used to detect when the waveguide system 1402 has a loss of power condition and/or the occurrence of some other malfunction. For example, the loss of energy sensor 1404*c* can detect when there is a loss of power due to defective solar cells, an obstruction on the solar cells that causes them to malfunction, loss of power on the power line 1410, and/or when the backup power system malfunctions due to expiration of a backup battery, or a detectable defect in a super capacitor. When a malfunction and/or loss of power occurs, the loss of energy sensor 1404*c* can notify the network management system 1601 by way of the base station 1414.

The noise sensor 1404*d* can be used to measure noise on the power line 1410 that may adversely affect transmission of electromagnetic waves on the power line 1410. The noise sensor 1404*d* can sense unexpected electromagnetic interference, noise bursts, or other sources of disturbances that may interrupt transmission of modulated electromagnetic waves on a surface of a power line 1410. A noise burst can be caused by, for example, a corona discharge, or other source of noise. The noise sensor 1404*d* can compare the measured noise to a noise profile obtained by the waveguide system 1402 from an internal database of noise profiles or from a remotely located database that stores noise profiles via pattern recognition, an expert system, curve fitting, matched filtering or other artificial intelligence, classification or comparison technique. From the comparison, the noise sensor 1404*d* may identify a noise source (e.g., corona discharge or otherwise) based on, for example, the noise profile that provides the closest match to the measured noise. The noise sensor 1404*d* can also detect how noise affects transmissions by measuring transmission metrics such as bit error rate, packet loss rate, jitter, packet retransmission requests, etc. The noise sensor 1404*d* can report to the network management system 1601 by way of the base station 1414 the identity of noise sources, their time of occurrence, and transmission metrics, among other things.

The vibration sensor 1404*e* can include accelerometers and/or gyroscopes to detect 2D or 3D vibrations on the power line 1410. The vibrations can be compared to vibration profiles that can be stored locally in the waveguide system 1402, or obtained by the waveguide system 1402 from a remote database via pattern recognition, an expert system, curve fitting, matched filtering or other artificial intelligence, classification or comparison technique. Vibration profiles can be used, for example, to distinguish fallen trees from wind gusts based on, for example, the vibration profile that provides the closest match to the measured vibrations. The results of this analysis can be reported by the vibration sensor 1404*e* to the network management system 1601 by way of the base station 1414.

The environmental sensor 1404*f* can include a barometer for measuring atmospheric pressure, ambient temperature (which can be provided by the temperature sensor 1404*a*), wind speed, humidity, wind direction, and rainfall, among other things. The environmental sensor 1404*f* can collect raw information and process this information by comparing it to environmental profiles that can be obtained from a memory of the waveguide system 1402 or a remote database to predict weather conditions before they arise via pattern recognition, an expert system, knowledge-based system or other artificial intelligence, classification or other weather modeling and prediction technique. The environmental sensor 1404*f* can report raw data as well as its analysis to the network management system 1601.

The image sensor 1404*g* can be a digital camera (e.g., a charged coupled device or CCD imager, infrared camera, etc.) for capturing images in a vicinity of the waveguide system 1402. The image sensor 1404*g* can include an electromechanical mechanism to control movement (e.g., actual position or focal points/zooms) of the camera for inspecting the power line 1410 from multiple perspectives (e.g., top surface, bottom surface, left surface, right surface and so on). Alternatively, the image sensor 1404*g* can be designed such that no electromechanical mechanism is needed in order to obtain the multiple perspectives. The collection and retrieval of imaging data generated by the image sensor 1404*g* can be controlled by the network management system 1601, or can be autonomously collected and reported by the image sensor 1404*g* to the network management system 1601.

Other sensors that may be suitable for collecting telemetry information associated with the waveguide system 1402 and/or the power lines 1410 for purposes of detecting, predicting and/or mitigating disturbances that can impede electromagnetic wave transmissions on power lines 1410 (or any other form of a transmission medium of electromagnetic waves) may be utilized by the waveguide system 1402.

Figure 16:
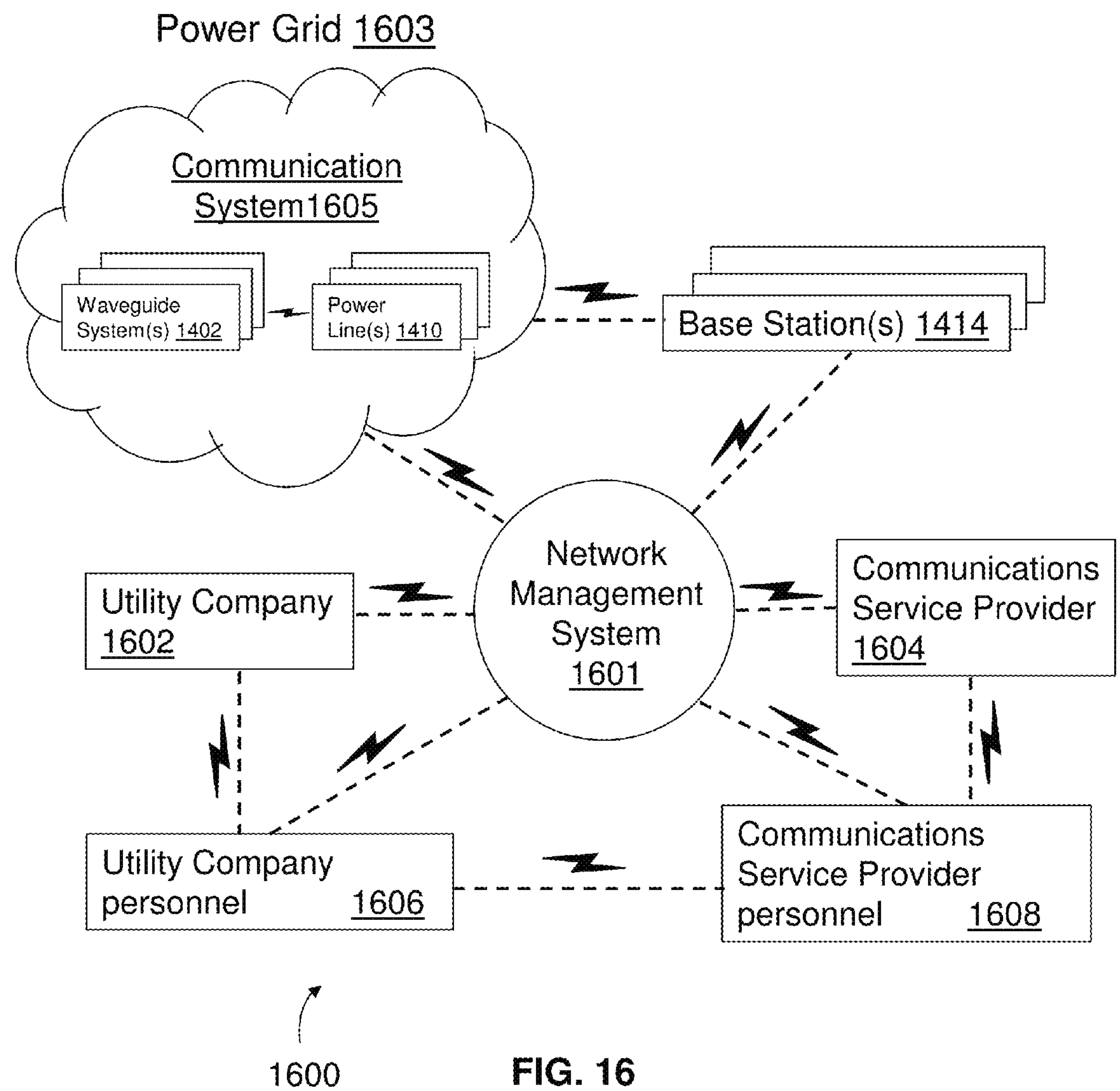
FIG. 16 is a block diagram illustrating an example, non-limiting embodiment of a system for managing a power grid communication system in accordance with various aspects described herein.

FIG. 16 is a block diagram illustrating an example, non-limiting embodiment of a system 1600 for managing a power grid 1603 and a communication system 1605 embedded therein in accordance with various aspects described herein. The communication system 1605 comprises a plurality of waveguide systems 1402 coupled to power lines 1410 of the power grid 1603. At least a portion of the waveguide systems 1402 used in the communication system 1605 can be in direct communication with a base station 1414 and/or the network management system 1601. Waveguide systems 1402 not directly connected to a base station 1414 or the network management system 1601 can engage in communication sessions with either a base station 1414 or the network management system 1601 by way of other downstream waveguide systems 1402 connected to a base station 1414 or the network management system 1601.

The network management system 1601 can be communicatively coupled to equipment of a utility company 1602 and equipment of a communications service provider 1604 for providing each entity, status information associated with the power grid 1603 and the communication system 1605, respectively. The network management system 1601, the equipment of the utility company 1602, and the communications service provider 1604 can access communication devices utilized by utility company personnel 1606 and/or communication devices utilized by communications service provider personnel 1608 for purposes of providing status information and/or for directing such personnel in the management of the power grid 1603 and/or communication system 1605.

Figure 17A:
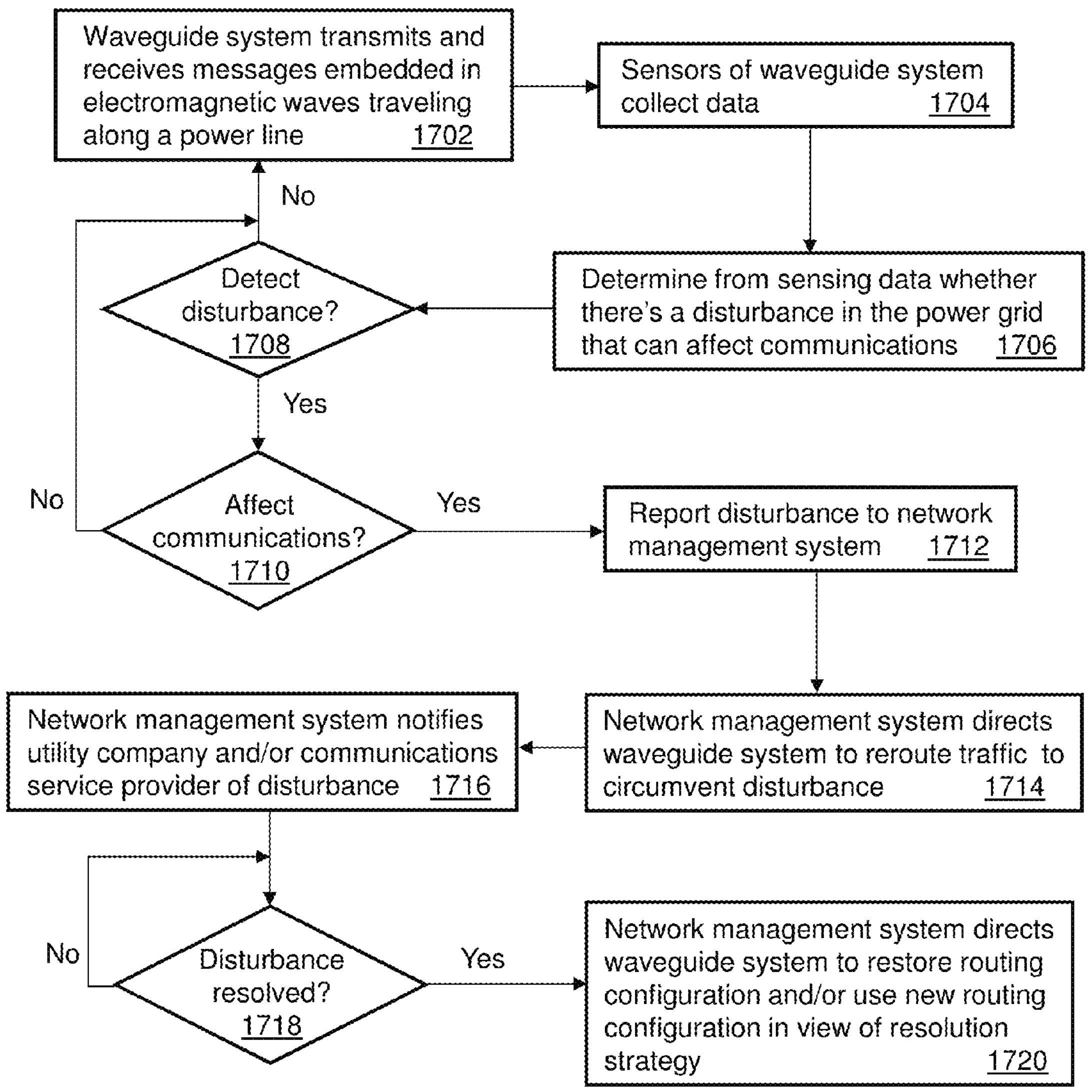
FIG. 17A illustrates a flow diagram of an example, non-limiting embodiment of a method for detecting and mitigating disturbances occurring in a communication network of the system of FIG. 16.

FIG. 17A illustrates a flow diagram of an example, non-limiting embodiment of a method 1700 for detecting and mitigating disturbances occurring in a communication network of the system 1600 of FIG. 16. Method 1700 can begin with step 1702 where a waveguide system 1402 transmits and receives messages embedded in, or forming part of, modulated electromagnetic waves or another type of electromagnetic waves traveling along a surface of a power line 1410. The messages can be voice messages, streaming video, and/or other data/information exchanged between communication devices communicatively coupled to the communication system 1605. At step 1704 the sensors 1404 of the waveguide system 1402 can collect sensing data. In an embodiment, the sensing data can be collected in step 1704 prior to, during, or after the transmission and/or receipt of messages in step 1702. At step 1706 the waveguide system 1402 (or the sensors 1404 themselves) can determine from the sensing data an actual or predicted occurrence of a disturbance in the communication system 1605 that can affect communications originating from (e.g., transmitted by) or received by the waveguide system 1402. The waveguide system 1402 (or the sensors 1404) can process temperature data, signal reflection data, loss of energy data, noise data, vibration data, environmental data, or any combination thereof to make this determination. The waveguide system 1402 (or the sensors 1404) may also detect, identify, estimate, or predict the source of the disturbance and/or its location in the communication system 1605. If a disturbance is neither detected/identified nor predicted/estimated at step 1708, the waveguide system 1402 can proceed to step 1702 where it continues to transmit and receive messages embedded in, or forming part of, modulated electromagnetic waves traveling along a surface of the power line 1410.

If at step 1708 a disturbance is detected/identified or predicted/estimated to occur, the waveguide system 1402 proceeds to step 1710 to determine if the disturbance adversely affects (or alternatively, is likely to adversely affect or the extent to which it may adversely affect) transmission or reception of messages in the communication system 1605. In one embodiment, a duration threshold and a frequency of occurrence threshold can be used at step 1710 to determine when a disturbance adversely affects communications in the communication system 1605. For illustration purposes only, assume a duration threshold is set to 500 ms, while a frequency of occurrence threshold is set to 5 disturbances occurring in an observation period of 10 sec. Thus, a disturbance having a duration greater than 500 ms will trigger the duration threshold. Additionally, any disturbance occurring more than 5 times in a 10 sec time interval will trigger the frequency of occurrence threshold.

In one embodiment, a disturbance may be considered to adversely affect signal integrity in the communication systems 1605 when the duration threshold alone is exceeded. In another embodiment, a disturbance may be considered as adversely affecting signal integrity in the communication systems 1605 when both the duration threshold and the frequency of occurrence threshold are exceeded. The latter embodiment is thus more conservative than the former embodiment for classifying disturbances that adversely affect signal integrity in the communication system 1605. It will be appreciated that many other algorithms and associated parameters and thresholds can be utilized for step 1710 in accordance with example embodiments.

Referring back to method 1700, if at step 1710 the disturbance detected at step 1708 does not meet the condition for adversely affected communications (e.g., neither exceeds the duration threshold nor the frequency of occurrence threshold), the waveguide system 1402 may proceed to step 1702 and continue processing messages. For instance, if the disturbance detected in step 1708 has a duration of 1 ms with a single occurrence in a 10 sec time period, then neither threshold will be exceeded. Consequently, such a disturbance may be considered as having a nominal effect on signal integrity in the communication system 1605 and thus would not be flagged as a disturbance requiring mitigation. Although not flagged, the occurrence of the disturbance, its time of occurrence, its frequency of occurrence, spectral data, and/or other useful information, may be reported to the network management system 1601 as telemetry data for monitoring purposes.

Referring back to step 1710, if on the other hand the disturbance satisfies the condition for adversely affected communications (e.g., exceeds either or both thresholds), the waveguide system 1402 can proceed to step 1712 and report the incident to the network management system 1601. The report can include raw sensing data collected by the sensors 1404, a description of the disturbance if known by the waveguide system 1402, a time of occurrence of the disturbance, a frequency of occurrence of the disturbance, a location associated with the disturbance, parameters readings such as bit error rate, packet loss rate, retransmission requests, jitter, latency and so on. If the disturbance is based on a prediction by one or more sensors of the waveguide system 1402, the report can include a type of disturbance expected, and if predictable, an expected time occurrence of the disturbance, and an expected frequency of occurrence of the predicted disturbance when the prediction is based on historical sensing data collected by the sensors 1404 of the waveguide system 1402.

At step 1714, the network management system 1601 can determine a mitigation, circumvention, or correction technique, which may include directing the waveguide system 1402 to reroute traffic to circumvent the disturbance if the location of the disturbance can be determined. In one embodiment, the waveguide system 1402 detecting the disturbance may direct a repeater 1802 such as the one shown in FIG. 18A to connect the waveguide system 1402 from a primary power line 1804 affected by the disturbance to a secondary power line 1806 to enable the waveguide system 1402 to reroute traffic to a different transmission medium and avoid the disturbance 1801. In an embodiment where the waveguide system 1402 is configured as a repeater, such as repeater 1802, the waveguide system 1402 can itself perform the rerouting of traffic from the primary power line 1804 to the secondary power line 1806. It is further noted that for bidirectional communications (e.g., full or half-duplex communications), the repeater 1802 can be configured to reroute traffic from the secondary power line 1806 back to the primary power line 1804 for processing by the waveguide system 1402.

Figure 18A:
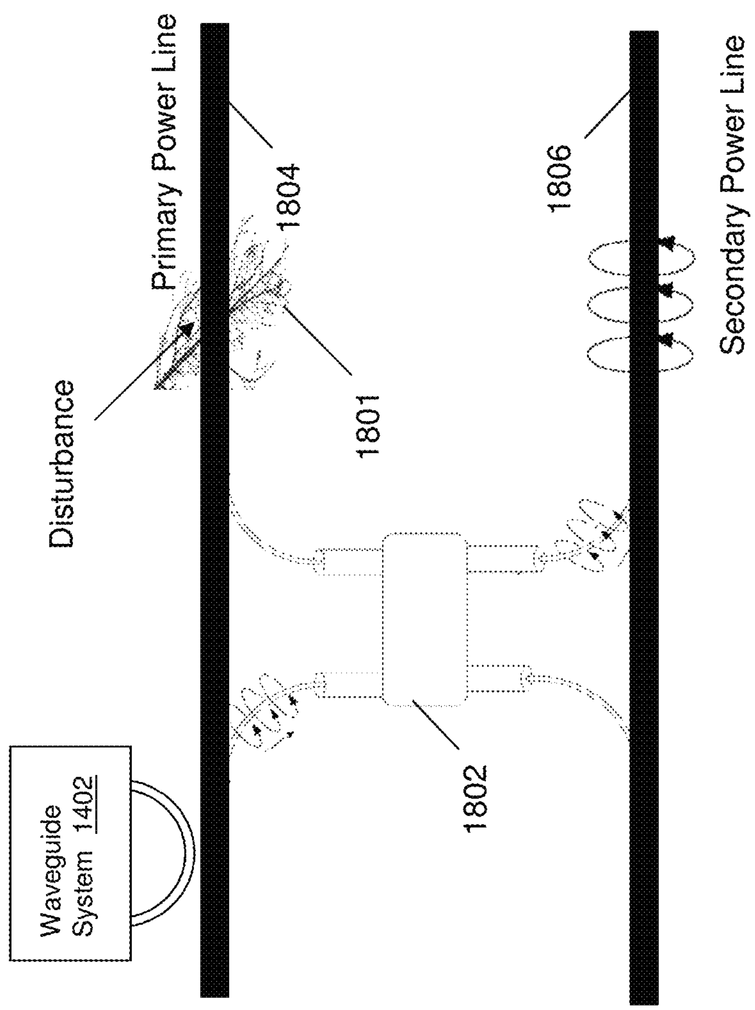
FIG. 18A illustrates an example, non-limiting embodiment for mitigating a disturbance detected by the waveguide system of FIG. 14 as described herein.
Figure 18B:
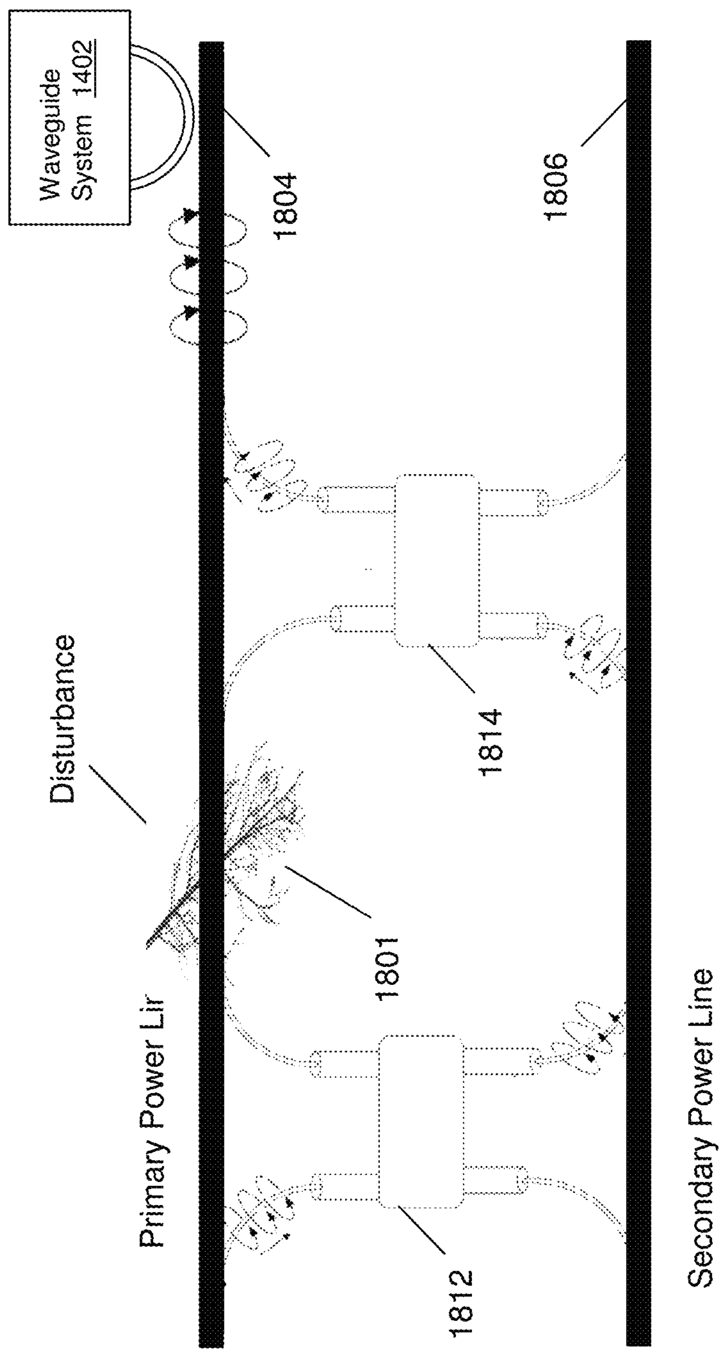
FIG. 18B illustrates another example, non-limiting embodiment for mitigating a disturbance detected by the waveguide system of FIG. 14 as described herein.

In another embodiment, the waveguide system 1402 can redirect traffic by instructing a first repeater 1812 situated upstream of the disturbance and a second repeater 1814 situated downstream of the disturbance to redirect traffic from a primary power line 1804 temporarily to a secondary power line 1806 and back to the primary power line 1804 in a manner that avoids the disturbance 1801 as shown in FIG. 18B. It is further noted that for bidirectional communications (e.g., full or half-duplex communications), the repeaters 1812 and 1814 can be configured to reroute traffic from the secondary power line 1806 back to the primary power line 1804.

To avoid interrupting existing communication sessions occurring on a secondary power line 1806, the network management system 1601 may direct the waveguide system 1402 (in the embodiments of FIGS. 18A-18B) to instruct repeater(s) to utilize unused time slot(s) and/or frequency band(s) of the secondary power line 1806 for redirecting data and/or voice traffic away from the primary power line 1804 to circumvent the disturbance 1801.

At step 1716, while traffic is being rerouted to avoid the disturbance, the network management system 1601 can notify equipment of the utility company 1602 and/or equipment of the communications service provider 1604, which in turn may notify personnel of the utility company 1606 and/or personnel of the communications service provider 1608 of the detected disturbance and its location if known. Field personnel from either party can attend to resolving the disturbance at a determined location of the disturbance. Once the disturbance is removed or otherwise mitigated by personnel of the utility company and/or personnel of the communications service provider, such personnel can notify their respective companies and/or the network management system 1601 utilizing field equipment (e.g., a laptop computer, smartphone, etc.) communicatively coupled to network management system 1601, and/or equipment of the utility company and/or the communications service provider. The notification can include a description of how the disturbance was mitigated and any changes to the power lines 1410 that may change a topology of the communication system 1605.

Once the disturbance has been resolved, the network management system 1601 can direct the waveguide system 1402 at step 1720 to restore the previous routing configuration used by the waveguide system 1402 or route traffic according to a new routing configuration if the restoration strategy used to mitigate the disturbance resulted in a new network topology of the communication system 1605. In another embodiment, the waveguide system 1402 can be configured to monitor mitigation of the disturbance by transmitting test signals on the power line 1410 to determine when the disturbance has been removed. Once the waveguide 1402 detects an absence of the disturbance it can autonomously restore its routing configuration without assistance by the network management system 1601 if it determines the network topology of the communication system 1605 has not changed, or it can utilize a new routing configuration that adapts to a detected new network topology.

Figure 17B:
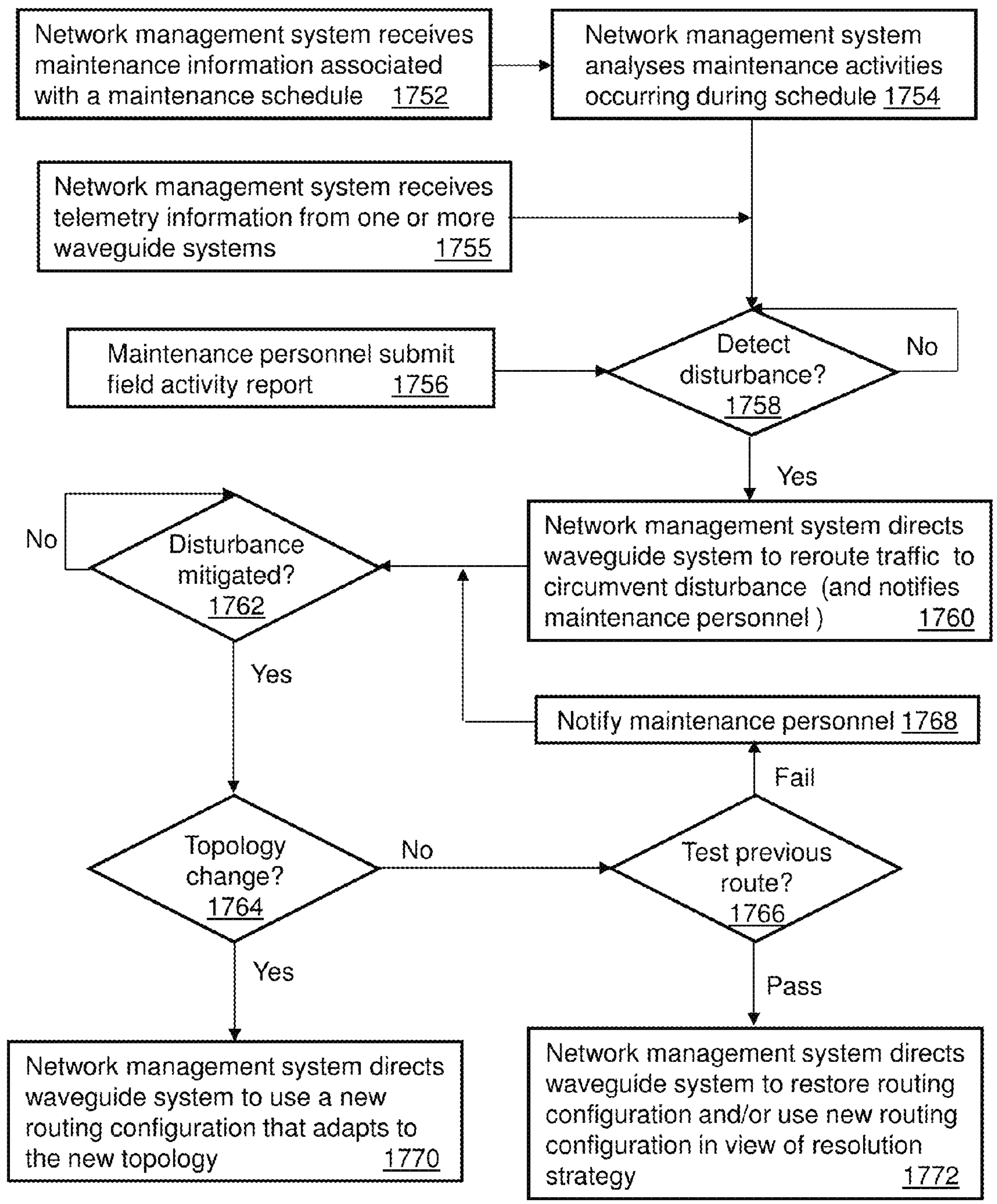
FIG. 17B illustrates a flow diagram of an example, non-limiting embodiment of a method for detecting and mitigating disturbances occurring in a communication network of the system of FIG. 16.

FIG. 17B illustrates a flow diagram of an example, non-limiting embodiment of a method 1750 for detecting and mitigating disturbances occurring in a communication network of the system 1600 of FIG. 16. In one embodiment, method 1750 can begin with step 1752 where a network management system 1601 receives from equipment of the utility company 1602 or equipment of the communications service provider 1604 maintenance information associated with a maintenance schedule. The network management system 1601 can at step 1754 identify from the maintenance information, maintenance activities to be performed during the maintenance schedule. From these activities, the network management system 1601 can detect a disturbance resulting from the maintenance (e.g., scheduled replacement of a power line 1410, scheduled replacement of a waveguide system 1402 on the power line 1410, scheduled reconfiguration of power lines 1410 in the power grid 1603, etc.).

In another embodiment, the network management system 1601 can receive at step 1755 telemetry information from one or more waveguide systems 1402. The telemetry information can include among other things an identity of each waveguide system 1402 submitting the telemetry information, measurements taken by sensors 1404 of each waveguide system 1402, information relating to predicted, estimated, or actual disturbances detected by the sensors 1404 of each waveguide system 1402, location information associated with each waveguide system 1402, an estimated location of a detected disturbance, an identification of the disturbance, and so on. The network management system 1601 can determine from the telemetry information a type of disturbance that may be adverse to operations of the waveguide, transmission of the electromagnetic waves along the wire surface, or both. The network management system 1601 can also use telemetry information from multiple waveguide systems 1402 to isolate and identify the disturbance. Additionally, the network management system 1601 can request telemetry information from waveguide systems 1402 in a vicinity of an affected waveguide system 1402 to triangulate a location of the disturbance and/or validate an identification of the disturbance by receiving similar telemetry information from other waveguide systems 1402.

In yet another embodiment, the network management system 1601 can receive at step 1756 an unscheduled activity report from maintenance field personnel. Unscheduled maintenance may occur as result of field calls that are unplanned or as a result of unexpected field issues discovered during field calls or scheduled maintenance activities. The activity report can identify changes to a topology configuration of the power grid 1603 resulting from field personnel addressing discovered issues in the communication system 1605 and/or power grid 1603, changes to one or more waveguide systems 1402 (such as replacement or repair thereof), mitigation of disturbances performed if any, and so on.

At step 1758, the network management system 1601 can determine from reports received according to steps 1752 through 1756 if a disturbance will occur based on a maintenance schedule, or if a disturbance has occurred or is predicted to occur based on telemetry data, or if a disturbance has occurred due to an unplanned maintenance identified in a field activity report. From any of these reports, the network management system 1601 can determine whether a detected or predicted disturbance requires rerouting of traffic by the affected waveguide systems 1402 or other waveguide systems 1402 of the communication system 1605.

When a disturbance is detected or predicted at step 1758, the network management system 1601 can proceed to step 1760 where it can direct one or more waveguide systems 1402 to reroute traffic to circumvent the disturbance similar to the illustrations of FIG. 18A or 18B. When the disturbance is permanent due to a permanent topology change of the power grid 1603, the network management system 1601 can proceed to step 1770 and skip steps 1762, 1764, 1766, and 1772. At step 1770, the network management system 1601 can direct one or more waveguide systems 1402 to use a new routing configuration that adapts to the new topology. However, when the disturbance has been detected from telemetry information supplied by one or more waveguide systems 1402, the network management system 1601 can notify maintenance personnel of the utility company 1606 or the communications service provider 1608 of a location of the disturbance, a type of disturbance if known, and related information that may be helpful to such personnel to mitigate the disturbance. When a disturbance is expected due to maintenance activities, the network management system 1601 can direct one or more waveguide systems 1402 to reconfigure traffic routes at a given schedule (consistent with the maintenance schedule) to avoid disturbances caused by the maintenance activities during the maintenance schedule.

Returning back step 1760 and upon its completion, the process can continue with step 1762. At step 1762, the network management system 1601 can monitor when the disturbance(s) have been mitigated by field personnel. Mitigation of a disturbance can be detected at step 1762 by analyzing field reports submitted to the network management system 1601 by field personnel over a communications network (e.g., cellular communication system) utilizing field equipment (e.g., a laptop computer or handheld computer/device). If field personnel have reported that a disturbance has been mitigated, the network management system 1601 can proceed to step 1764 to determine from the field report whether a topology change was required to mitigate the disturbance. A topology change can include rerouting a power line 1410, reconfiguring a waveguide system 1402 to utilize a different power line 1410, otherwise utilizing an alternative link to bypass the disturbance and so on. If a topology change has taken place, the network management system 1601 can direct at step 1770 one or more waveguide systems 1402 to use a new routing configuration that adapts to the new topology.

If, however, a topology change has not been reported by field personnel, the network management system 1601 can proceed to step 1766 where it can direct one or more waveguide systems 1402 to send test signals to test a routing configuration that had been used prior to the detected disturbance(s). Test signals can be sent to affected waveguide systems 1402 in a vicinity of the disturbance. The test signals can be used to determine if signal disturbances (e.g., electromagnetic wave reflections) are detected by any of the waveguide systems 1402. If the test signals confirm that a prior routing configuration is no longer subject to previously detected disturbance(s), then the network management system 1601 can at step 1772 direct the affected waveguide systems 1402 to restore a previous routing configuration. If, however, test signals analyzed by one or more waveguide systems 1402 and reported to the network management system 1601 indicate that the disturbance(s) or new disturbance(s) are present, then the network management system 1601 will proceed to step 1768 and report this information to field personnel to further address field issues. The network management system 1601 can in this situation continue to monitor mitigation of the disturbance(s) at step 1762.

In the aforementioned embodiments, the waveguide systems 1402 can be configured to be self-adapting to changes in the power grid 1603 and/or to mitigation of disturbances. That is, one or more affected waveguide systems 1402 can be configured to self monitor mitigation of disturbances and reconfigure traffic routes without requiring instructions to be sent to them by the network management system 1601. In this embodiment, the one or more waveguide systems 1402 that are self-configurable can inform the network management system 1601 of its routing choices so that the network management system 1601 can maintain a macro-level view of the communication topology of the communication system 1605.

While for purposes of simplicity of explanation, the respective processes are shown and described as a series of blocks in FIGS. 17A and 17B, respectively, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein.

Figure 19:
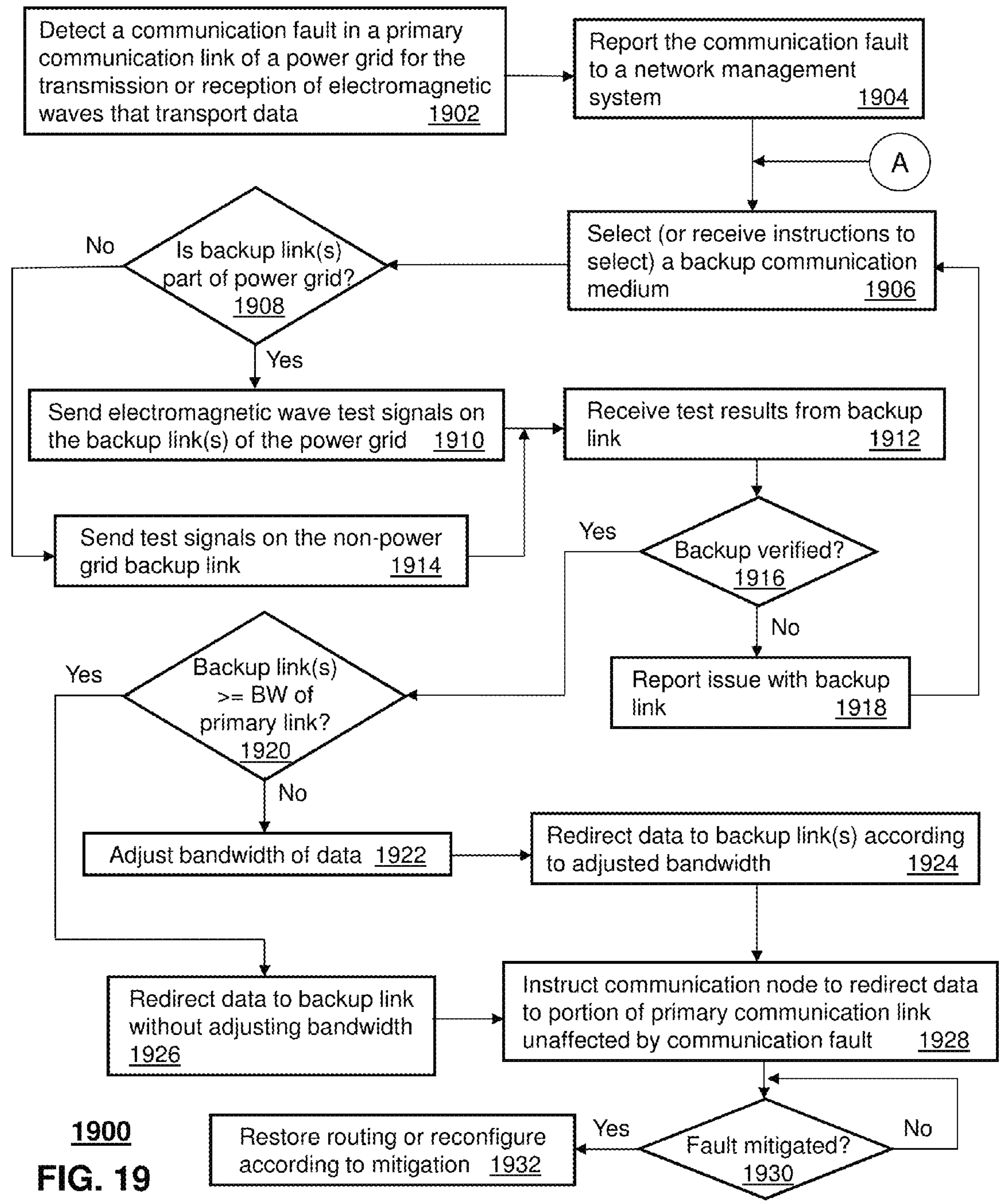
FIG. 19 illustrates a flow diagram of an example, non-limiting embodiment of a method for mitigating communication faults in a communication system of FIG. 20.
Figure 20:
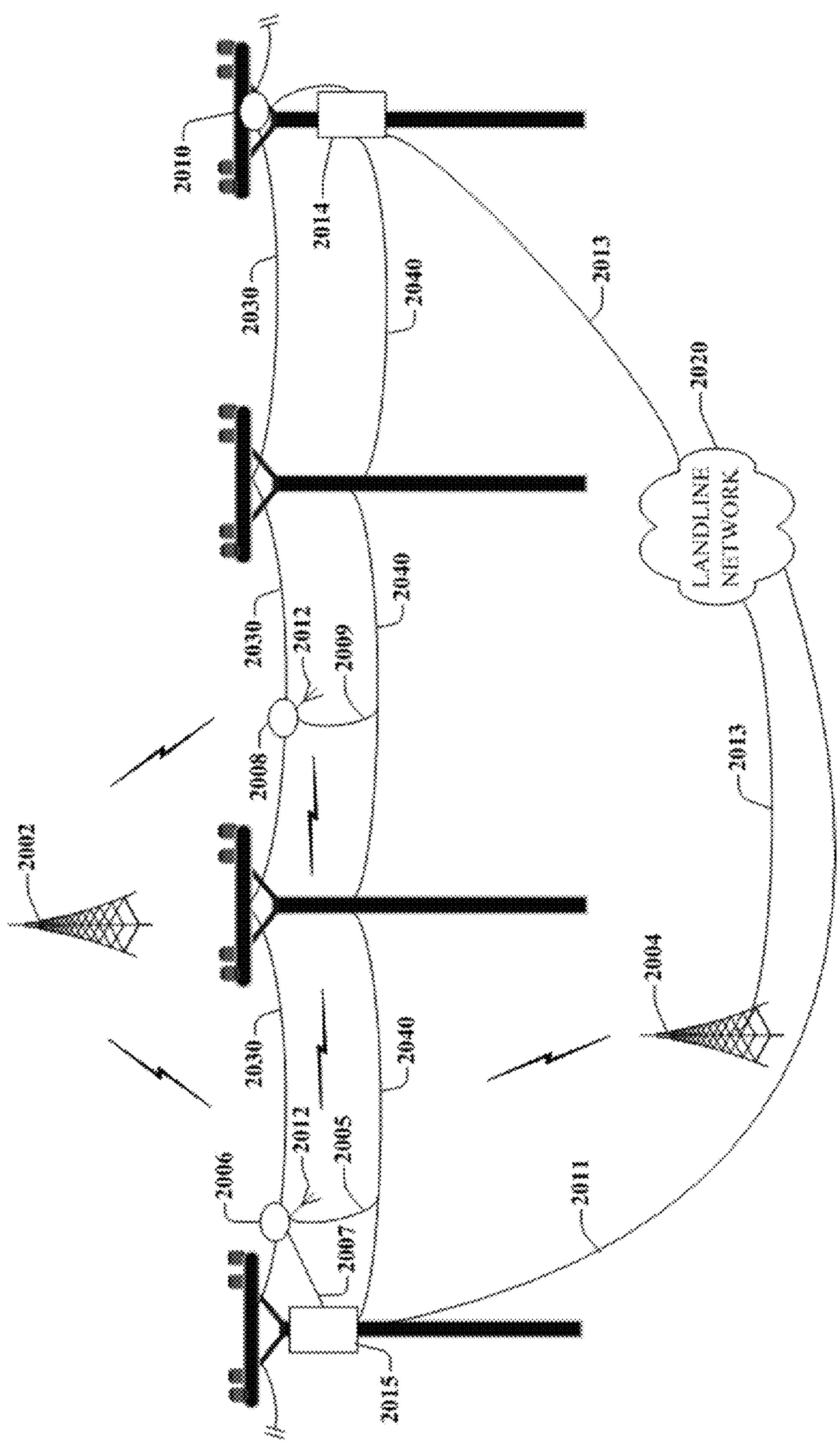
FIG. 20 is a block diagram of an example, non-limiting embodiment of a communication system in accordance with various aspects described herein.

FIG. 19 illustrates a flow diagram of an example, non-limiting embodiment of a method 1900 for mitigating faults in a communication system of FIG. 20. Method 1900 can begin at step 1902 where a waveguide system such as shown in FIG. 14 detects a fault in a primary communication link depicted by reference 2030 of FIG. 20 (herein referred to as primary communication link 2030). For long-haul communications, the primary communication link 2030 can represent a high voltage power line (e.g., 100 kV-138 kV), an extra high voltage power line (e.g., 230 kV-800 kV), or an ultra high voltage power line (e.g., >800 kV) of the power grid. Generally, such power lines are placed at a high altitude on utility poles in one embodiment for safety reasons and to reduce a likelihood of obstructions from tree limbs. For short-haul communications (e.g., urban, suburban, or rural areas), the primary communication link 2030 can represent a medium voltage power line (e.g., 4 kV to 69 kV), which are generally positioned above lower voltage power lines, telephone lines, and/or coaxial cable lines. Thus it will be appreciated that the primary communication link 2030 can include non-high-voltage (e.g., medium or low voltage) power lines as well at various positions on utility poles without departing from example embodiments.

However, obstructions from tree limbs can happen with such power lines, which as was described previously can be sensed by sensors of the waveguide system described in FIG. 14. Generally, a fault can represent any disturbance sensed or detected by the sensors of the waveguide system that can adversely affect the transmission or reception of electromagnetic waves that transport data and that propagate on a surface of the primary communication link 2030. A non-limiting illustration of data can include voice communication services, internet services, broadcast video services, control data for controlling the distribution of content and/or for establishing voice and/or data communication sessions, voice or data communications from other networks, or other types of data services in any combination thereof.

At step 1904, the waveguide system 1402 can report the fault, or information associated therewith, to a network management system 1601 such as shown in FIGS. 14 and 16. For example, the waveguide system 1402 can identify a type of fault, a location of the fault, quality metrics (described herein) and/or other communication parameter information associated with a fault including signal strength, signal loss, latency, packet loss, etc. In one embodiment, the network management system 1601 can take evasive action by instructing the waveguide system 1402 to select at step 1906 one or more backup communication mediums or links that provide backup communication services in the event of a fault at the primary communication link 2030. In another embodiment, the waveguide system 1402 can autonomously take evasive action to maintain communication services active by selecting at step 1906 one or more backup communication mediums or link. The waveguide system 1402 can be configured to select a backup communication medium or link based on selection criteria. The selection criteria can include quality metrics that can be used to verify that the backup communication medium is suitable for backup communication services. Quality metrics can include without limitation a desired communications bandwidth, a desired Quality of Service (QoS), a desired signal to noise ratio, a desired bit error rate performance, a desired packet loss performance, a desired data throughput, a desired jitter performance, a desired latency performance, and so on.

The waveguide system, which can be represented by any of references 2006, 2008, or 2010 of FIG. 20 (herein referred to as waveguide systems 2006, 2008, or 2010) can have multiple options for initiating backup communication services. For example, waveguide system 2006 can have an antenna 2012 that can be coupled to a communications interface such as reference 1408 of FIG. 14 to enable the waveguide system 2006 to engage in wireless communications (e.g., LTE, WiFi, 4/5G, or otherwise) with base station 2002, base station 2004, or other waveguide systems such as waveguide system 2008 deploying a wireless communications interface with an antenna 2012. Waveguide system 2006 can thus redirect data to base station 2002 over a first wireless link. Base station 2002 can in turn redirect the data to waveguide system 2008 over a second wireless link. Waveguide system 2008 can then retransmit the data using electromagnetic waves that propagate on the primary link 2030.

Similarly, waveguide system 2006 can redirect data to base station 2004 over a first wireless link. Base station 2004 in turn can redirect the data to a landline network 2020 over a high speed wired link 2013 (e.g., fiber). The landline network 2020 can also redirect the data to a local base station 2014 (e.g., a microcell) over another high speed link 2013. The local base station 2014 can then supply the data to waveguide system 2010 which retransmits the data using electromagnetic waves that propagate on the primary communication link 2030. Additionally, waveguide system 2006 can redirect data to waveguide system 2008 over a wireless link. Waveguide system 2008 can then retransmit the data using electromagnetic waves that propagate on the primary communication link 2030.

In each of the above example embodiments, the data is sent by the waveguide system 2006 to the backup communication medium or link, which redirects it back to a portion of the primary communication link 2030 unaffected by the fault. Unaffected portions of the primary communication link 2030 can be identified by the network management system 1601. The network management system 1601 can in turn coordinate the flow of traffic with communication nodes of the backup communication medium selected by waveguide system 2006 to redirect data back to unaffected portions of the primary communication link 2030.

Using a wireless link to connect to any of the backup communication mediums or link may, however, in some embodiments result in less bandwidth than the original bandwidth capacity of the affected primary communication link 2030. In such embodiments, waveguide system 2006 may need to adjust the bandwidth of the data to accommodate retransmission over a selected backup communication medium as will be addressed by method 1900 at steps 1920, 1922 and 1924. To reduce or eliminate the need for bandwidth adjustments, the waveguide system 2006 can select multiple wireless backup communication mediums to mitigate the need for adjusting the bandwidth of the data by distributing portions of the data between the selected backup communication mediums.

In addition to wireless backup links, the waveguide system 2006 can use a waveguide 2005 (incorporated in waveguide system 2006) that can couple to an unaffected line in its vicinity such as line 2040, which can serve as secondary communication link (herein referred to as secondary communication link 2040) for providing backup communication services. For long-haul communications, the secondary communication link 2040 can represent another high power line if more than one high power line is available, or a medium voltage power line if available. For short-haul communications (e.g., urban, suburban, or rural areas), the secondary communication link 2040 can represent a low voltage power line (e.g., less than 1000 volts such as 240V) for distributing electrical power to commercial and/or residential establishments, telephone lines, or coaxial cable lines. For illustration purposes, line 2040 will be assumed to be a power line, and thus referred to herein as power line 2040. However, it is noted that line 2040 can be a non-power line such as a telephone line, or a coaxial cable accessible to the waveguide system 2006. It is further noted that the low voltage power line, telephone lines, or coaxial cable lines are generally positioned below the medium voltage power line and thus may be more susceptible to obstructions such as tree limbs that may cause a disturbance that adversely affects the transmission or reception of electromagnetic waves on a surface of secondary communication link 2040.

Secondary communication link 2040 enables waveguide system 2006 to communicate with waveguide system 2008, which also has a waveguide 2009 incorporated therein and coupled to the secondary communication link 2040. In this configuration, the secondary communication link 2040 can be used to bypass a fault in the primary communication link 2030 that may be occurring between waveguide system 2006 and waveguide system 2008. In this illustration, waveguide system 2008 can reestablish communication services back to a portion of the primary communication link 2030 that is unaffected by the fault detected by waveguide system 2006. If, however, the fault on the primary communication link 2030 affects both waveguide system 2006 and waveguide system 2008, waveguide system 2006 can use the secondary communication link 2040 to communicate with the local base station 2014, which can be configured with a waveguide system of its own such as shown in FIG. 14 to receive and transmit electromagnetic waves that transport the data and that propagate on a surface of the secondary communication link 2040. The local base station 2014 can in turn supply the data to waveguide system 2010 which can redirect its transmission to the primary communication link 2030 to downstream waveguide systems (not shown).

It is further noted that data can be redirected to the secondary communication link 2040 in several ways. In one embodiment, electromagnetic waves propagating on the primary communication link 2030 can be redirected to the secondary communication link 2040. This can be accomplished by connecting one end of waveguide 2005 to the secondary communication link 2040 and the other end of waveguide 2005 to an unaffected portion of the primary communication link 2030. In this configuration, electromagnetic waves flowing on the primary communication link 2030 can be redirected by the waveguide 2005 to the secondary communication link 2040, and electromagnetic waves flowing on the secondary communication link 2030 can be redirected by the waveguide 2005 to the primary communication link 2040.

In one embodiment, the electromagnetic waves propagating through the waveguide 2005 in a direction of the primary communication link 2030 or in a direction of the secondary communication link 2040 can be unamplified. For instance, the waveguide 2005 can be a passive dielectric waveguide device coupled to both ends of the primary and secondary communication links 2030 and 2040, respectively, having no active circuitry for modifying the electromagnetic waves flowing through the waveguide 2005 in either direction. Alternatively, one or more amplifiers can be added to the waveguide 2005 to amplify the electromagnetic waves propagating through the waveguide 2005 in a direction of the primary communication link 2030 and/or in a direction of the secondary communication link 2040. For example, the waveguide 2005 can include active circuits that amplify the electromagnetic waves propagating in a direction of the primary communication link 2030 and/or active circuits that amplify electromagnetic waves propagating in a direction of the secondary communication link 2040.

In yet another embodiment, the waveguide device 2005 can be represented by a repeater such as shown in FIG. 8 which can utilize active circuitry such as shown in FIG. 9 to extract the data included in the electromagnetic waves propagating in the primary communication link 2030, and retransmitting the same data with new electromagnetic waves that are sent to the secondary communication link 2040. Similarly, the circuitry of FIG. 9 can be used to extract data included in the electromagnetic waves propagating in the secondary communication link 2040, and retransmitting the same data with new electromagnetic waves that are sent to the primary communication link 2030.

In yet another embodiment, the waveguide system 2006 can also include a link 2007 that couples the waveguide system 2006 to a local base station 2015 (e.g., a microcell). Link 2007 can represent a high speed communication link such as a fiber link enabling the waveguide system 2006 to redirect data to the local base station 2015, which in turn can direct data to a landline network 2020 that in turn supplies the data to another local base station 2014 that can present such signals to waveguide system 2010 for redirecting the data back to the primary communication link 2030.

Based on the above illustrations, the waveguide system 2006 has several options for selecting at step 1906 one or more backup communication mediums or links depending on its bandwidth needs, which include: (1) a wired connection to local base station 2015 via high speed link 2007 which enables waveguide system 2006 to redirect data back to the primary communication link 2030 via waveguide system 2010, (2) a connection to secondary communication link 2040 via waveguide 2005 of the waveguide system 2006 which enables waveguide system 2006 to redirect data back to the primary communication link 2030 via waveguide system 2008, (3) a connection to secondary communication link 2040 via waveguide 2005 of the waveguide system 2006 which also enables waveguide system 2006 to redirect data back to the primary communication link 2030 via waveguide system 2010 using the local base station 2014, (4) a wireless link to base station 2002 which enables waveguide system 2006 to redirect data back to the primary communication link 2030 via waveguide system 2008, (5) a wireless link to base station 2004 which enables waveguide system 2006 to redirect data back to the primary communication link 2030 via waveguide system 2010 using the local base station 2014, and (6) a wireless link to waveguide system 2008 which can redirect data back to the primary communication link 2030.

Once waveguide system 2006 has selected one or more backup communication links, it can proceed to step 1908 where it can determine whether a particular backup communication link is part of the power grid or otherwise (e.g., wireless link or wired link to a local base station). Since it is possible that more than one backup communication link can be selected by waveguide system 2006, steps 1910 and 1914 may be invoked simultaneously or in sequence for each instance of a backup link of the power grid, a backup wireless link, and/or a backup wired link to a local base station.

For backup links of the power grid, the waveguide system 2006 can be configured to transmit electromagnetic wave test signals on the secondary communication link 2040. The electromagnetic wave test signals can be received by waveguide system 2008 and/or local base station 2014 (assuming it has an integrated waveguide system). The test signals can be analyzed by the waveguide system 2008 and/or the local base station 2014. The test signals can be measured, for example, for signal to noise ratio, data throughput, bit error rate, packet loss rate, jitter, latency, and other metrics that can be compared to the selection criteria by waveguide system 2006. The test results can be transmitted back at step 1912 to waveguide system 2006 by waveguide system 2008 and/or by the local base station 2014 over the secondary communication link 2040, or in the case of waveguide system 2008 over a wireless link, and in the case of local base station 2014 over wired links 2013 and 2011. In addition to analyzing test results sent back from waveguide system 2008 and/or local base station 2014 according to the selection criteria, waveguide system 2006 can also perform autonomous tests on the secondary communication link 2040 such as signal reflection measurements and other measurements described in the subject disclosure.

For non-power grid backup links, the waveguide system 2006 can send test signals appropriate for the type of transmission medium being used. In the case of wireless links, the waveguide system 2006 can send wireless test signals to base station 2002, base station 2004, and/or waveguide system 2008. The waveguide system 2006 can determine a received signal strength indication (RSSI) for each wireless link, signal to noise ratios for each wireless link, data throughputs, bit error rates, packet loss rates, and other measurements applicable to the selection criteria for determining the suitability of each wireless link. Test results can also be received at step 1912 by waveguide system 2006 from base station 2002, 2004, and/or waveguide system 2008 over the wireless link. In the case of a wired (non-power grid) link such as link 2007, the waveguide 2006 can send test signals for testing communications with waveguide system 2010. Similarly, test results can be received back from waveguide system 2010 and/or intermediate nodes (e.g., landline network 2020 and/or local base station 2015) for comparison to the selection criteria.

At step 1916, the waveguide system 2006 can assess whether a backup link is suitable for backup communication services in accordance with the selection criteria used by the waveguide system 2006. If a backup link is not available or suitable for backup communication services, the waveguide system 2006 can proceed to step 1918 and report this issue to the network management system 1601 via an available backup link, and proceed to select another backup link (if available) at step 1906. If another backup link is selected, the waveguide system 2006 can perform steps 1908-1912 as previously described. If one or more backup links have been verified at step 1916 to be suitable for backup communication services, then the waveguide system 2006 can proceed to step 1920 to determine if the backup link(s) provide sufficient bandwidth to support the bandwidth being used in the primary communication link 2030 to transport the data.

If the backup link(s) cannot support the bandwidth originally used for transmission of the data on the primary communication link 2030, the waveguide system 2006 can proceed to step 1922 to adjust the bandwidth of the data so that it is suitable for the backup link(s). If real-time transmissions are present, for example, real-time audio or video signals, a transcoder can transcode these real-time signals to reduce the bit rate to conform to the adjusted bandwidth. In another embodiment, the transmission rate of non-real-time signals can be reduced to preserve the quality of service associated with real-time signals included in the data. In this step, the waveguide system 2006 can inform the network management system 1601 via an available backup link that the bandwidth of the data will be adjusted. The network management system 1601 can in one embodiment inform devices affected by the fault (via, for example, backup links) that communications bandwidth must be adjusted to accommodate backup services. Alternatively, the waveguide system 2006 can notify the affected devices via the backup link(s) of the change in bandwidth.

Once bandwidth has been adjusted at step 1922, the waveguide system 2006 can proceed to step 1924 and begin to redirect data via the backup link(s). If bandwidth adjustment is not necessary, the waveguide system 2006 can proceed to step 1926 and redirect data according to its original bandwidth. In another embodiment, if the bandwidth capacity of the backup link(s) cannot support the bandwidth originally used for transmission of the data on the primary communication link 2030, the waveguide system 2006 can proceed to step 1906 to select a different backup link.

In one embodiment, the backup link(s) (i.e., secondary communication links) may be shared with other communication devices (e.g., waveguide systems or other communication nodes). In one embodiment, the waveguide system 2006 can be configured to select an operating frequency for transmitting and receiving data over the backup link(s) that differs from the operating frequency used by the other communication devices. In another embodiment, the waveguide system 2006 can be configured to select time slot assignments for transmitting and receiving data over the backup link(s) that differs from time slot assignments used by the other communication devices. In yet another embodiment, the waveguide system 2006 can be configured to select a combination of one or more operating frequencies and one or more time slot assignments for transmitting and receiving data over the backup link(s) that differ from one or more operating frequencies and one or more time slot assignments used by the other communication devices.

In instances where the backup link(s) have communication access to the power grid at a point where the primary communication link 2030 is unaffected by the fault, the waveguide system 2006 can instruct at step 1928 one or more communication nodes in the backup link(s) to redirect the data back to the primary communication link 2030 at an unaffected location in the power grid determined by the waveguide system 2006 or at an unaffected location identified by the network management system 1601 and conveyed to the waveguide system 2006, thereby circumventing the fault.

While the backup link(s) are in use, the network management system 1601 can be directing personnel of a power utility or communications company to resolve the fault as previously described in the subject disclosure. Once the fault has been resolved at step 1930, the network management system 1601 can instruct at step 1932 the waveguide system 2006 (and other communication nodes in the backup link(s)) to restore or reconfigure routing of the data according a mitigation strategy used to resolve the fault. Alternatively, the waveguide system 2006 can monitor the power grid for mitigation of the fault, and autonomously determine whether it can reuse a prior routing configuration or whether it must use a new routing configuration based on a detectable change in the network topology of the power grid. It will be appreciated that faults detected by one or more waveguide systems 2006 can be the result of power outages due to broken power lines caused by weather conditions, malfunctioning transformers, or otherwise. The network management system 1601 can also be used to coordinate mitigation of power outages based on fault notices sent to the network management system 1601 by one or more waveguide systems 2006. It is also appreciated that secondary communication links (e.g., backup links) can also be represented by underground transmission mediums such as conduits, underground power lines, and so on.

While for purposes of simplicity of explanation, the respective processes are shown and described as a series of blocks in FIG. 19, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein. It is further noted that the processes of FIG. 19 can be further modified to perform any of the embodiments described in the subject disclosure, such as, for example, embodiments relating to circumventing disturbances in a power grid such as shown in FIGS. 18A and 18B.

Figure 21:
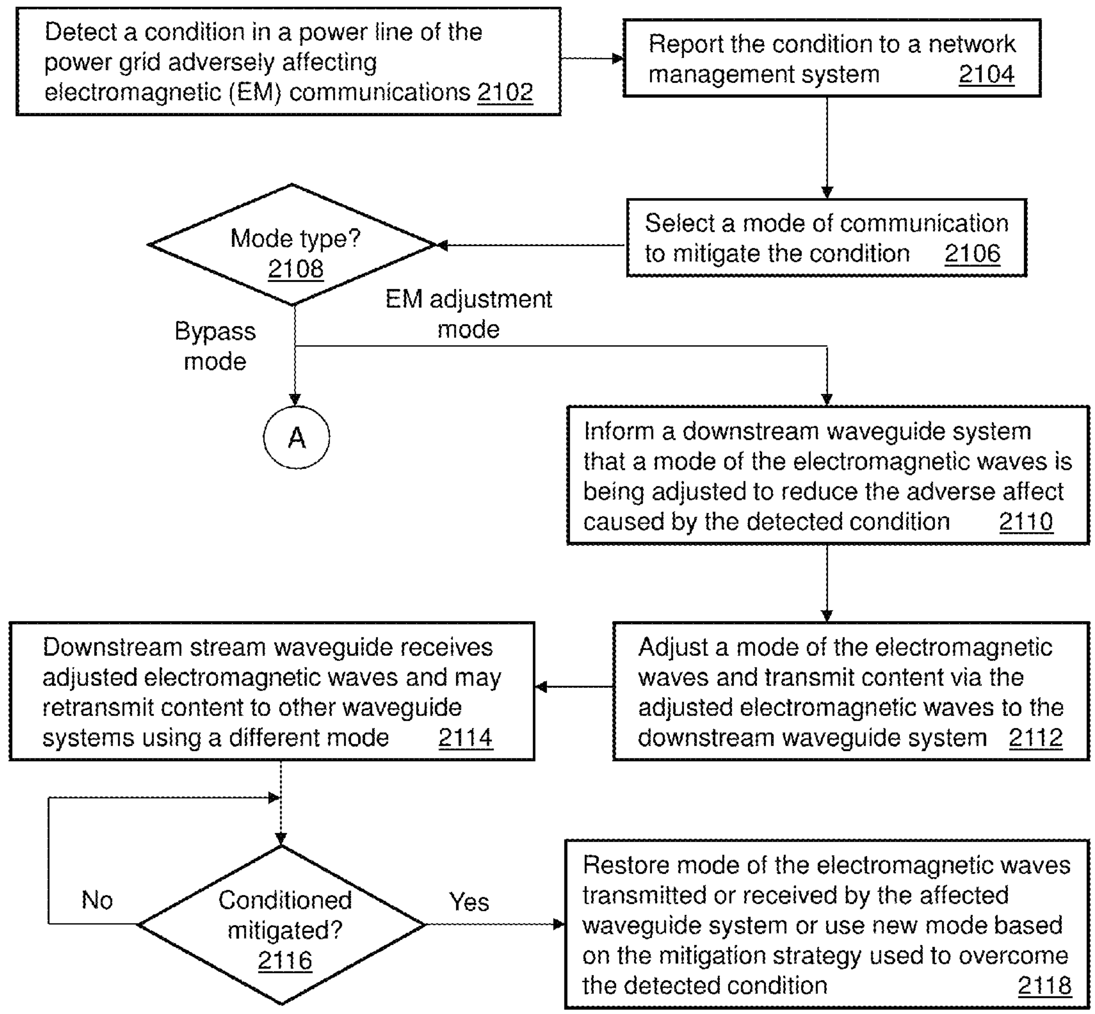
FIG. 21 illustrates a flow diagram of an example, non-limiting embodiment of a method for adjusting a communication mode in a communication system.

FIG. 21 illustrates a flow diagram of an example, non-limiting embodiment of a method 2100 for adjusting a communication mode in a communication system such as the communication system 1605 of FIG. 16. Method 2100 can begin with step 2102 in which a condition in a power line 1410 is detected by a waveguide system 1402, the condition adversely affecting electromagnetic wave communications on the power line 1410. Conditions that may adversely affect electromagnetic (EM) wave communications on the power line 1410 may include, without limitation, impairments detectable by the sensors 1404 of the waveguide system 1402 such as the obstructions depicted in FIG. 15, scheduled maintenance of the power line 1410 by field personnel, ad hoc maintenance performed by field personnel, or other conditions detectable or determinable by the waveguide system 1402 and/or the network management system 1601. When adverse condition(s) are detected or determined by the waveguide system 1402 (referred to herein as the affected waveguide system 1402) they can be reported at step 2104 to the network management system 1601 by the affected network management system 1402 and possibly by other neighboring waveguide systems detecting or determining the same condition(s).

At step 2106 a mode of communication can be selected autonomously by the affected waveguide system 1402 according to the adverse condition it has detected or determining at step 2102, or the affected waveguide system 1402 can select the mode of communication based according to instructions given by the network management system 1601. In instances where the adverse condition cannot be remedied without repairs by field personnel and the condition severely or materially affects communications between the affected waveguide system 1402 and other waveguide systems (e.g., a down power line), the type of communication mode selected at step 2108 may be a bypass mode to avoid the affected power line 1410, or portion thereof, altogether. The bypass mode can be implemented according to method 1900 of FIG. 19, in which a secondary communication link (or backup link) is used to bypass the adverse condition detected at step 2102. If, however, the adverse condition can be remedied at least in part by the affected waveguide system 1402 without a bypass mode (e.g., EM adjustment mode), the waveguide system 1402 can instead select a mode of communication at step 2106 that involves adjusting characteristics of electromagnetic waves transmitted or received by the affected waveguide system 1402 (including adjusting characteristics of the waveguide system 1402 performing the transmission or reception).

Figure 22A:
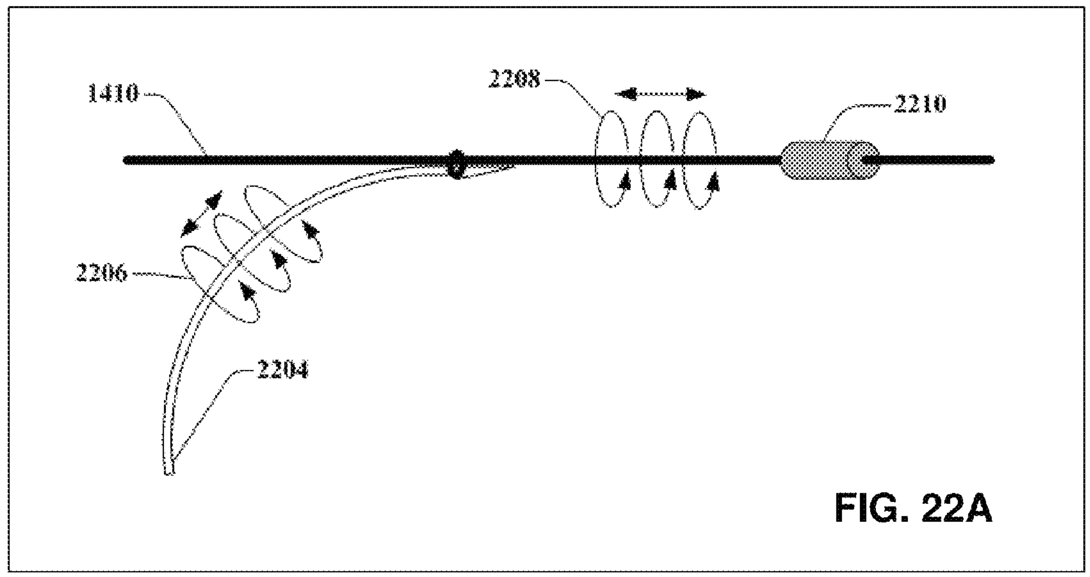
FIGS. 22A and 22B are block diagrams of example, non-limiting embodiments of a waveguide system that adjusts a communication mode in accordance with various aspects described herein.

FIG. 22A illustrates by way of example an obstruction 2210 (e.g., a joint for connecting spliced power lines) which can degrade or impair transmission or reception of electromagnetic waves 2208 propagating on an outer surface of the power line 1410. As described herein, when the waveguide system 1402 is in an operational mode that involves transmitting electromagnetic waves, it begins with the generation of electromagnetic waves 2206 propagating on an outer surface of the waveguide 2204 which in turn couple onto an outer surface of the power line 1410 to form electromagnetic waves 2208. On the other hand, when the waveguide system 1402 is in an operational mode for receiving electromagnetic waves, the electromagnetic waves 2208 propagating on the power line 1410 couple onto an outer surface of the waveguide 2204 to form electromagnetic waves 2206 also described herein.

Figure 22B:
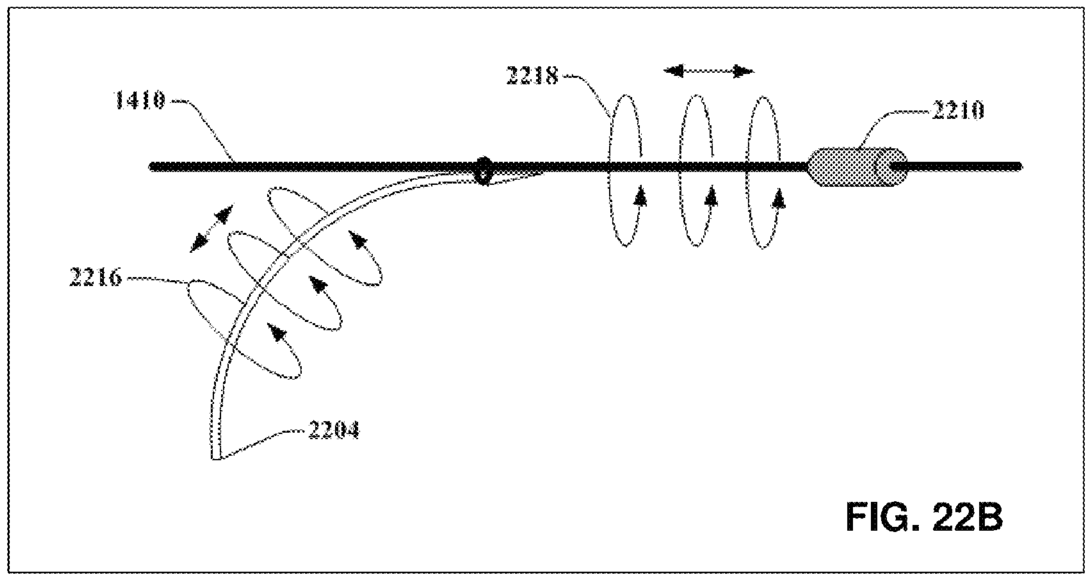

In each mode of operation, the obstruction 2210 shown in FIG. 22A can adversely affect the propagation of the electromagnetic waves by attenuating the electromagnetic waves, causing electromagnetic wave reflections, or otherwise degrading, impairing or altering the electromagnetic waves in a manner that may cause propagation losses, or other harmful effects which can reduce a quality of communication services in the communication system 1605 of FIG. 16. To remedy these effects, the affected waveguide system 1402 can be configured to adjust characteristics of the electromagnetic waves transmitted or received thereby. For example, the affected waveguide system 1402 can adjust a wave propagation mode of the electromagnetic waves transmitted or received thereby. In one embodiment, the affected waveguide system 1402 can adjust the wave propagation mode by adjusting a wavelength of the electromagnetic waves (and thus, the corresponding frequency) to generate adjusted electromagnetic waves 2216 on the waveguide 2204 which in turn couple onto the outer surface of the power line 2202 as electromagnetic waves 2218 having similar wavelengths. The affected waveguide system 1402, for example, can increase the wavelength of the electromagnetic waves to make the electromagnetic waves propagating on the power line 1410 less susceptible to attenuation by the impairment 2210 as depicted in FIG. 22B.

It will be appreciated that due to multiple effects caused by the impairment 2210 there may be circumstances when decreasing the wavelength of the electromagnetic waves may improve the propagation of the electromagnetic waves through the impairment 2210. The affected waveguide system 1410 may therefore engage in testing whether increasing or decreasing the wavelength of the electromagnetic waves improves communications.

It will be further appreciated that the affected waveguide system 1402 can also be configured to adjust the wave propagation mode of the electromagnetic waves by adjusting a fundamental mode of the electromagnetic waves, one or more asymmetric modes of the electromagnetic waves, spatial orientations of the one or more asymmetric modes (e.g., non-fundamental modes) of the electromagnetic waves, or any combination thereof. Adjusting the fundamental mode, asymmetric modes, or spatial orientations of the asymmetric modes may further include adjusting the wavelength of these modes. Additionally, other characteristics of the electromagnetic waves can be adjusted by the affected waveguide system 1402 such as, for example, amplitude, phase, energy level, carrier frequency, modulation techniques, and so on. Similarly, error correction techniques used in conjunction with data transported by the electromagnetic waves can be adjusted by the affected waveguide system 1402 to improve the ability to reconstruct portions of data corrupted by the impairment 2210. Thus, any combination of the aforementioned adjustments of the electromagnetic waves and adjustments in error correction schemes can be performed by the affected waveguide system 1402 to mitigate, eliminate and/or reduce adverse condition (s) detected at step 2102.

To validate any of the above adjustments, the affected waveguide system 1402 can be configured to transmit electromagnetic wave test signals on the power line 1410 to determine, for example, whether increasing or decreasing the wavelength of the electromagnetic waves, adjusting the fundamental and/or asymmetric modes, adjusting the error correction scheme, and/or adjusting other wave/signal characteristics improves communications on the affected power line 1410. Testing can be performed in coordination with a downstream waveguide system using loop back techniques whereby, for example, the downstream waveguide system loops back the test signals sent by the affected waveguide system 1402 so that the affected waveguide system 1402 can analyze these signals. Alternatively, the downstream waveguide system can change its termination impedance to intentionally cause signal reflections of the test signals which enables the waveguide system 1402 to analyze such signals. In yet another embodiment, the downstream waveguide system can perform measurements and communicate such measurements back to the affected waveguide system 1402 as feedback data for analysis. In other embodiments, the analysis can also be based upon analyzing the non-receipt of the test signals, or loss associated therewith. Furthermore, predictive analytics or inferential analysis can be utilized in analyzing the receipt or non-receipt of the test signals, or information associated therewith.

Returning now to FIG. 21, once the waveguide system 1402 has chosen a mitigation strategy for adjusting the electromagnetic waves based on the above tests, the affected waveguide system 1402 can inform the downstream waveguide system at step 2110 how it intends to transmit signals. The notice provided to the downstream waveguide system (e.g., a configuration, protocol, and/or handshake signal) can include information associated with parameters of the electromagnetic waves that are being adjusted by the affected waveguide system 1402 (e.g., changes to wavelength, fundamental mode, asymmetric modes, spatial orientation of asymmetric modes, carrier frequency, magnitude, phase, error correction, etc.). Once this information has been communicated to or otherwise coordinated with the downstream waveguide system, the affected waveguide system 1402 can begin at step 2112 to transmit or receive the adjusted electromagnetic waves, thereby resuming communications with the downstream waveguide system at step 2114.

In one embodiment, if the downstream waveguide system is located after the impairment 2210, the downstream waveguide system can receive the adjusted electromagnetic waves from the affected waveguide system 1402 and thereafter retransmit data retrieved from the adjusted electromagnetic waves with a different mode of communication for transmitting or receiving electromagnetic waves with other waveguide systems. The mode of communication chosen by the downstream waveguide system to communicate with other waveguide systems may be similar to or the same as the mode of communication previously used by the affected waveguide system 1402. It will be appreciated that in alternative embodiments, the downstream waveguide system can also retransmit data to other waveguide systems using the same mode of communication as that received with the adjusted electromagnetic waves. Indeed, the adjustment in step 2110 may apply to multiple downstream or neighboring waveguide systems without departing from example embodiments.

While the affected waveguide system 1402 is using the new mode of communication to mitigate the adverse condition detected at step 2102, the affected waveguide system 1402 can periodically monitor at step 2116 whether the adverse condition detected at step 2102 has been mitigated. This step can be the result of the network management system 1601 receiving information from field personnel indicating that the condition has been addressed, eliminated, removed, modified or otherwise mitigated, and then informing the affected waveguide system 1402 of this change. Alternatively, or in combination, the affected waveguide system 1402 can perform testing (via test signals sent thereby) to determine if the adverse condition has been addressed, eliminated, removed, modified or otherwise mitigated. If the adjusted mode of communication used by the affected waveguide system 1402 restores a quality of communication services that is considered satisfactory by the network management system 1601, then steps 2116-2118 may not be necessary, and any alarm condition raised by the affected waveguide system 1402 may be removed locally and at the network management system 1601.

When a source of degradation, disruption or impairment on power line 1410, such as impairment 2210, requiring repair, field personnel may utilize a passive waveguide having no active circuits (e.g., a cylindrical or rectangular strip of dielectric material) to address or remedy the effects of impairment 2210. Opposite ends of the passive waveguide can be coupled to unaffected portions of the power line 1410 located at opposite ends of the impairment 2210 to cause the electromagnetic waves to bypass the impairment 2210 and thereby propagate on an outer surface of the passive waveguide. Alternatively, a repeater 710 having active circuits such as shown in FIGS. 7 and 9 can be placed at opposite ends of the impairment 2210 to bypass the impairment. In yet another embodiment, a dielectric sleeve can be placed around the impairment 2210 so that electromagnetic waves travel on an outer surface of the sleeve. In another embodiment, field personnel can apply dielectric material on the impairment 2210 with a spray that emits a dielectric material that adheres to the impairment 2210, or by manually applying a compound of dielectric material that adheres to the impairment 2210. It will be appreciated that other materials that can be applied to the impairment 2210 to reduce propagation losses or reflections of electromagnetic waves when transitioning through the impairment 2210 can be used. For example, a material having a suspension of conductive particles in a binder may be used. It will be further appreciated that an impairment may also be repaired by field personnel with metallic jumpers. It will also be appreciated that if the impairment is not caused by the affected power line 1410, such as a fallen tree branch or other obstructions, then removal of the obstruction would be the mitigation strategy likely chosen by field personnel.

Once the adverse condition detected at step 2102 has been addressed, eliminated, removed, modified or otherwise mitigated by any of the techniques described in the subject disclosure, the affected waveguide system 1402 can restore at step 2118 an original mode of communication used by the affected waveguide system 1402 for transmitting and receiving electromagnetic waves, or a new mode of communication maybe chosen by the affected waveguide system 1402 as a result of the mitigation strategy calling for a modification of the electromagnetic wave characteristics and/or a route of communications in the power grid 1603. The change in mode of communication may be determined by testing performed by the affected waveguide system 1402 and/or in response to instructions provided by the network management system 1601 to the affected waveguide system 1402.

It will be appreciated that other conditions may adversely affect electromagnetic wave communications on a transmission medium such as a power line. For example, water droplets can accumulate on an uninsulated power line (i.e., bare wire) due to rain and/or excessive humidity. Water droplets may be present on a top side or bottom side of an outer surface of the uninsulated power line. The accumulated droplets may in turn cause an attenuation of the electromagnetic waves traveling on the outer surface of the uninsulated power line and/or cause other distortions that may result in propagation losses and/or signal distortions. The embodiments of method 2100 of FIG. 21 can be used to reduce the adverse effects of water droplets, such as by, for example, adjusting the wavelength of the electromagnetic waves. The affected waveguide system 1402 can also adjust the phase and/or magnitude of the electromagnetic waves singly or in combination with adjusting the wavelength.

Generally, electromagnetic waves on an uninsulated power line are symmetric electromagnetic waves operating according to a fundamental mode. However, the water droplets may cause asymmetric modes to arise. The affected waveguide system 1402 can take advantage of the asymmetric modes and use multiple instances of dielectric waveguides 2204 having different spatial positions (e.g., northeast, southeast, southwest and northwest) to in turn cause a spatial positioning of the asymmetric modes in a manner that may avoid water droplets located on a topside and/or bottom side of the uninsulated power line. The affected waveguide system 1402 can test one dielectric waveguide 2204 at a time, or multiple dielectric waveguides 2204 simultaneously. The affected waveguide system 1402 can also utilize an electromechanical system having, for example, linear motors that can rotate the multiple dielectric waveguides 2204 about the uninsulated power line. Additionally, a downstream waveguide system can have the same or similar configuration as the affected waveguide system 1402 (e.g., multiple and rotatable dielectric waveguides 2204). The affected waveguide system 1402 can communicate with the downstream waveguide system and coordinate any of the above tests by exchanging messages over a control channel of the affected power line 1410 (if possible), a wireless link between waveguide systems shown in FIG. 20, or by way of base station 2002.

Other or similar techniques described in the subject disclosure can be used to mitigate conditions that may be adverse to the transmission and/or reception of electromagnetic waves propagating on a surface of a transmission medium such as, without limitation, an insulated or uninsulated wire, underground wires, above or below ground conduits with a dielectric surface, and so on. It will be appreciated that a detectable condition, impairment, or degradation can result in an adverse effect on the transmission or reception of electromagnetic waves on a surface of a transmission medium. However, the terms condition, impairment, and degradation as utilized in the subject disclosure can in some embodiments differ from each other and in other instances lead to a similar result.

For example, a condition can be detected that identifies a future maintenance schedule, a predicted change in weather conditions, or otherwise which is expected will adversely affect transmitting or receiving electromagnetic waves on a surface of a transmission medium. Hence, a condition may adversely affect transmitting or receiving electromagnetic waves on a surface of a transmission medium at a future time, not necessarily a present time. An impairment, on the other hand, can be caused by a disturbance source that continuously (or at periodic or random intervals) adversely affects transmitting or receiving electromagnetic waves on a surface of a transmission medium. A degradation can lead to an impairment, but is not necessarily an impairment from its onset. For example, a deterioration of an insulator on the transmission medium, a slow accumulation of water droplets, and so on, may degrade performance factors associated with transmitting or receiving electromagnetic waves on a surface of a transmission medium. However, such degradation may be considered insufficient to be classified as an impairment if data and/or voice communication services remain unaffected or nominally impacted.

Figure 23:
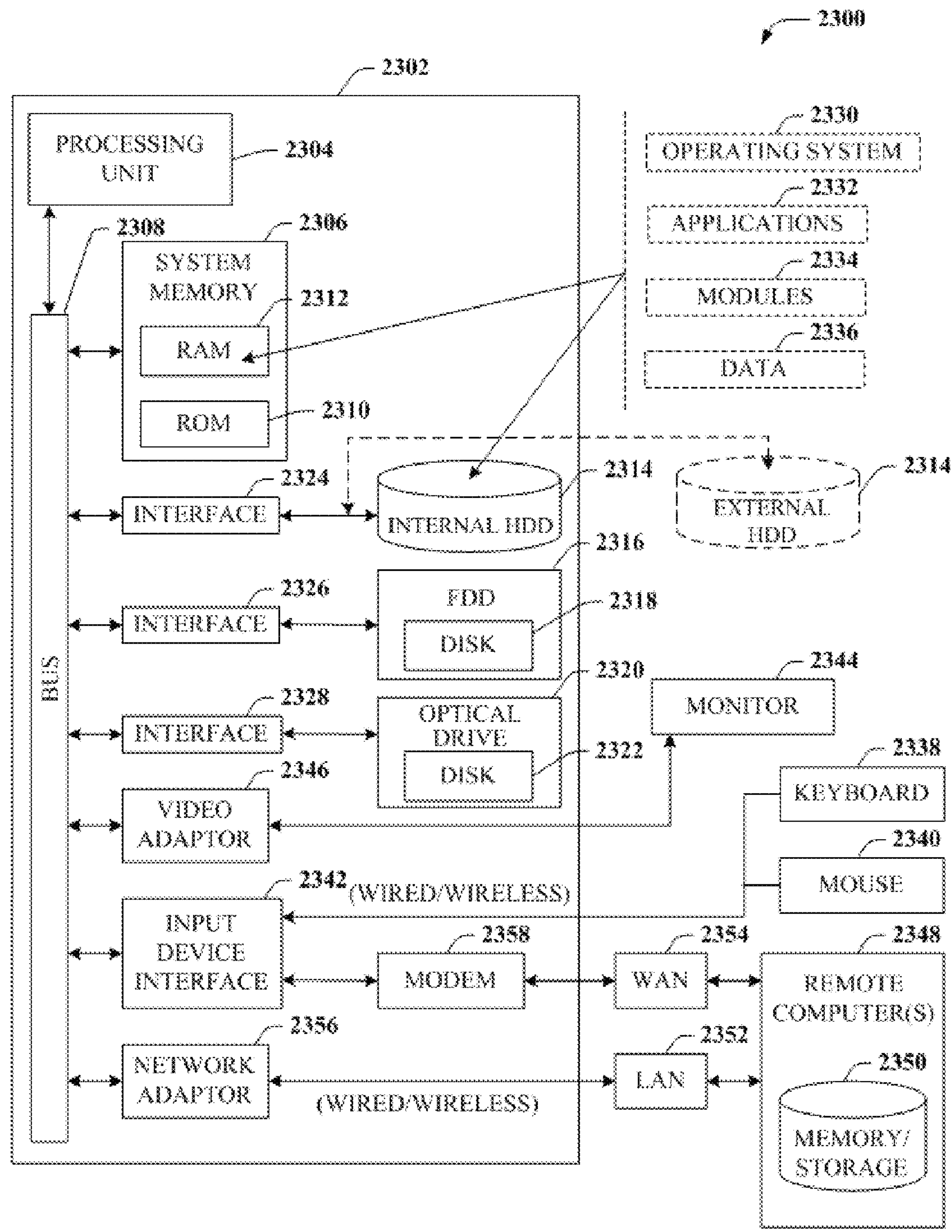
FIG. 23 is a block diagram of an example, non-limiting embodiment of a computing environment in accordance with various aspects described herein.

Referring now to FIG. 23, there is illustrated a block diagram of a computing environment in accordance with various aspects described herein. In order to provide additional context for various embodiments of the embodiments described herein, FIG. 23 and the following discussion are intended to provide a brief, general description of a suitable computing environment 2300 in which the various embodiments of the subject disclosure can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules comprise routines, programs, components, data structures, etc., that perform particular tasks or implement particular abstract data types. Moreover, those skilled in the art will appreciate that the inventive methods can be practiced with other computer system configurations, comprising single-processor or multiprocessor computer systems, minicomputers, mainframe computers, as well as personal computers, hand-held computing devices, microprocessor-based or programmable consumer electronics, and the like, each of which can be operatively coupled to one or more associated devices.

The terms "first," "second," "third," and so forth, as used in the claims, unless otherwise clear by context, is for clarity only and doesn't otherwise indicate or imply any order in time. For instance, "a first determination," "a second determination," and "a third determination," does not indicate or imply that the first determination is to be made before the second determination, or vice versa, etc.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically comprise a variety of media, which can comprise computer-readable storage media and/or communications media, which two terms are used herein differently from one another as follows. Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data or unstructured data.

Computer-readable storage media can comprise, but are not limited to, random access memory (RAM), read only memory (ROM), electrically erasable programmable read only memory (EEPROM), flash memory or other memory technology, compact disk read only memory (CD-ROM), digital versatile disk (DVD) or other optical disk storage, magnetic cassettes, magnetic tape, magnetic disk storage or other magnetic storage devices or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communication media comprise wired media, such as a wired network or direct-wired connection, and wireless media such as acoustic, RF, infrared and other wireless media.

With reference again to FIG. 23, the example environment 2300 for transmitting and receiving signals via or forming at least part of a base station (e.g., base station devices 102, 104, or 520) or central office (e.g., central office 101, 1411, or 2000). At least a portion of the example environment 2300 can also be used for repeater devices (e.g., repeater devices 710, or 806). The example environment can comprise a computer 2302, the computer 2302 comprising a processing unit 2304, a system memory 2306 and a system bus 2308. The system bus 2308 couples system components including, but not limited to, the system memory 2306 to the processing unit 2304. The processing unit 2304 can be any of various commercially available processors. Dual microprocessors and other multi-processor architectures can also be employed as the processing unit 2304.

The system bus 2308 can be any of several types of bus structure that can further interconnect to a memory bus (with or without a memory controller), a peripheral bus, and a local bus using any of a variety of commercially available bus architectures. The system memory 2306 comprises ROM 2310 and RAM 2312. A basic input/output system (BIOS) can be stored in a non-volatile memory such as ROM, erasable programmable read only memory (EPROM), EEPROM, which BIOS contains the basic routines that help to transfer information between elements within the computer 2302, such as during startup. The RAM 2312 can also comprise a high-speed RAM such as static RAM for caching data.

The computer 2302 further comprises an internal hard disk drive (HDD) 2314 (e.g., EIDE, SATA), which internal hard disk drive 2314 can also be configured for external use in a suitable chassis (not shown), a magnetic floppy disk drive (FDD) 2316, (e.g., to read from or write to a removable diskette 2318) and an optical disk drive 2320, (e.g., reading a CD-ROM disk 2322 or, to read from or write to other high capacity optical media such as the DVD). The hard disk drive 2314, magnetic disk drive 2316 and optical disk drive 2320 can be connected to the system bus 2308 by a hard disk drive interface 2324, a magnetic disk drive interface 2326 and an optical drive interface 2328, respectively. The interface 2324 for external drive implementations comprises at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 2302, the drives and storage media accommodate the storage of any data in a suitable digital format. Although the description of computer-readable storage media above refers to a hard disk drive (HDD), a removable magnetic diskette, and a removable optical media such as a CD or DVD, it should be appreciated by those skilled in the art that other types of storage media which are readable by a computer, such as zip drives, magnetic cassettes, flash memory cards, cartridges, and the like, can also be used in the example operating environment, and further, that any such storage media can contain computer-executable instructions for performing the methods described herein.

A number of program modules can be stored in the drives and RAM 2312, comprising an operating system 2330, one or more application programs 2332, other program modules 2334 and program data 2336. All or portions of the operating system, applications, modules, and/or data can also be cached in the RAM 2312. The systems and methods described herein can be implemented utilizing various commercially available operating systems or combinations of operating systems. Examples of application programs 2332 that can be implemented and otherwise executed by processing unit 2304 include the diversity selection determining performed by repeater device 806. Base station device 508 shown in FIG. 5, also has stored on memory many applications and programs that can be executed by processing unit 2304 in this exemplary computing environment 2300.

A user can enter commands and information into the computer 2302 through one or more wired/wireless input devices, e.g., a keyboard 2338 and a pointing device, such as a mouse 2340. Other input devices (not shown) can comprise a microphone, an infrared (IR) remote control, a joystick, a game pad, a stylus pen, touch screen or the like. These and other input devices are often connected to the processing unit 2304 through an input device interface 2342 that can be coupled to the system bus 2308, but can be connected by other interfaces, such as a parallel port, an IEEE 1394 serial port, a game port, a universal serial bus (USB) port, an IR interface, etc.

A monitor 2344 or other type of display device can be also connected to the system bus 2308 via an interface, such as a video adapter 2346. It will also be appreciated that in alternative embodiments, a monitor 2344 can also be any display device (e.g., another computer having a display, a smart phone, a tablet computer, etc.) for receiving display information associated with computer 2302 via any communication means, including via the Internet and cloud-based networks. In addition to the monitor 2344, a computer typically comprises other peripheral output devices (not shown), such as speakers, printers, etc.

The computer 2302 can operate in a networked environment using logical connections via wired and/or wireless communications to one or more remote computers, such as a remote computer(s) 2348. The remote computer(s) 2348 can be a workstation, a server computer, a router, a personal computer, portable computer, microprocessor-based entertainment appliance, a peer device or other common network node, and typically comprises many or all of the elements described relative to the computer 2302, although, for purposes of brevity, only a memory/storage device 2350 is illustrated. The logical connections depicted comprise wired/wireless connectivity to a local area network (LAN) 2352 and/or larger networks, e.g., a wide area network (WAN) 2354. Such LAN and WAN networking environments are commonplace in offices and companies, and facilitate enterprise-wide computer networks, such as intranets, all of which can connect to a global communications network, e.g., the Internet.

When used in a LAN networking environment, the computer 2302 can be connected to the local network 2352 through a wired and/or wireless communication network interface or adapter 2356. The adapter 2356 can facilitate wired or wireless communication to the LAN 2352, which can also comprise a wireless AP disposed thereon for communicating with the wireless adapter 2356.

When used in a WAN networking environment, the computer 2302 can comprise a modem 2358 or can be connected to a communications server on the WAN 2354 or has other means for establishing communications over the WAN 2354, such as by way of the Internet. The modem 2358, which can be internal or external and a wired or wireless device, can be connected to the system bus 2308 via the input device interface 2342. In a networked environment, program modules depicted relative to the computer 2302 or portions thereof, can be stored in the remote memory/storage device 2350. It will be appreciated that the network connections shown are example and other means of establishing a communications link between the computers can be used.

The computer 2302 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This can comprise Wireless Fidelity (Wi-Fi) and BLUETOOTH® wireless technologies. Thus, the communication can be a predefined structure as with a conventional network or simply an ad hoc communication between at least two devices.

Wi-Fi can allow connection to the Internet from a couch at home, a bed in a hotel room or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE 802.11 (a, b, g, n, ac, etc.) to provide secure, reliable, fast wireless connectivity. A Wi-Fi network can be used to connect computers to each other, to the Internet, and to wired networks (which can use IEEE 802.3 or Ethernet). Wi-Fi networks operate in the unlicensed 2.4 and 5 GHz radio bands for example or with products that contain both bands (dual band), so the networks can provide real-world performance similar to the basic 10BaseT wired Ethernet networks used in many offices.

Figure 24:
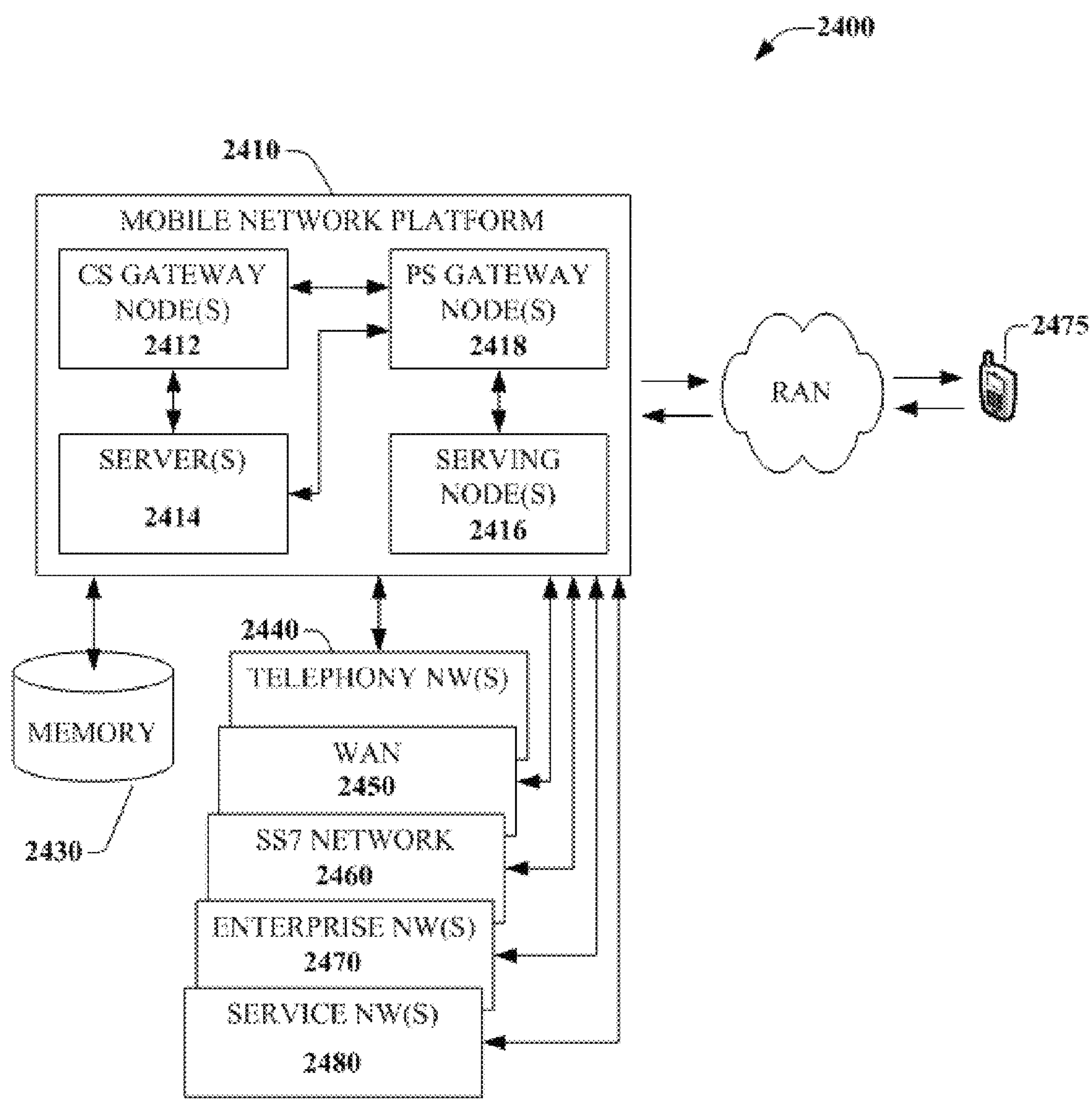
FIG. 24 is a block diagram of an example, non-limiting embodiment of a mobile network platform in accordance with various aspects described herein.

FIG. 24 presents an example embodiment 2400 of a mobile network platform 2410 that can implement and exploit one or more aspects of the disclosed subject matter described herein. In one or more embodiments, the mobile network platform 2410 can generate and receive signals transmitted and received by base stations (e.g., base station devices 102, 104 or 520), central office (e.g., central office 101, 1411, or 2000), or repeater devices (e.g., repeater devices 710, or 806) associated with the disclosed subject matter. Generally, wireless network platform 2410 can comprise components, e.g., nodes, gateways, interfaces, servers, or disparate platforms, that facilitate both packet-switched (PS) (e.g., internet protocol (IP), frame relay, asynchronous transfer mode (ATM)) and circuit-switched (CS) traffic (e.g., voice and data), as well as control generation for networked wireless telecommunication. As a non-limiting example, wireless network platform 2410 can be included in telecommunications carrier networks, and can be considered carrier-side components as discussed elsewhere herein. Mobile network platform 2410 comprises CS gateway node(s) 2412 which can interface CS traffic received from legacy networks like telephony network(s) 2440 (e.g., public switched telephone network (PSTN), or public land mobile network (PLMN)) or a signaling system #7 (SS7) network 2470. Circuit switched gateway node(s) 2412 can authorize and authenticate traffic (e.g., voice) arising from such networks. Additionally, CS gateway node(s) 2412 can access mobility, or roaming, data generated through SS7 network 2470; for instance, mobility data stored in a visited location register (VLR), which can reside in memory 2430. Moreover, CS gateway node(s) 2412 interfaces CS-based traffic and signaling and PS gateway node(s) 2418. As an example, in a 3GPP UMTS network, CS gateway node(s) 2412 can be realized at least in part in gateway GPRS support node(s) (GGSN). It should be appreciated that functionality and specific operation of CS gateway node(s) 2412, PS gateway node(s) 2418, and serving node(s) 2416, is provided and dictated by radio technology(ies) utilized by mobile network platform 2410 for telecommunication.

In addition to receiving and processing CS-switched traffic and signaling, PS gateway node(s) 2418 can authorize and authenticate PS-based data sessions with served mobile devices. Data sessions can comprise traffic, or content(s), exchanged with networks external to the wireless network platform 2410, like wide area network(s) (WANs) 2450, enterprise network(s) 2470, and service network(s) 2480, which can be embodied in local area network(s) (LANs), can also be interfaced with mobile network platform 2410 through PS gateway node(s) 2418. It is to be noted that WANs 2450 and enterprise network(s) 2460 can embody, at least in part, a service network(s) like IP multimedia subsystem (IMS). Based on radio technology layer(s) available in technology resource(s) 2417, packet-switched gateway node(s) 2418 can generate packet data protocol contexts when a data session is established; other data structures that facilitate routing of packetized data also can be generated. To that end, in an aspect, PS gateway node(s) 2418 can comprise a tunnel interface (e.g., tunnel termination gateway (TTG) in 3GPP UMTS network(s) (not shown)) which can facilitate packetized communication with disparate wireless network(s), such as Wi-Fi networks.

In embodiment 2400, wireless network platform 2410 also comprises serving node(s) 2416 that, based upon available radio technology layer(s) within technology resource(s) 2417, convey the various packetized flows of data streams received through PS gateway node(s) 2418. It is to be noted that for technology resource(s) 2417 that rely primarily on CS communication, server node(s) can deliver traffic without reliance on PS gateway node(s) 2418; for example, server node(s) can embody at least in part a mobile switching center. As an example, in a 3GPP UMTS network, serving node(s) 2416 can be embodied in serving GPRS support node(s) (SGSN).

For radio technologies that exploit packetized communication, server(s) 2414 in wireless network platform 2410 can execute numerous applications that can generate multiple disparate packetized data streams or flows, and manage (e.g., schedule, queue, format . . . ) such flows. Such application(s) can comprise add-on features to standard services (for example, provisioning, billing, customer support . . . ) provided by wireless network platform 2410. Data streams (e.g., content(s) that are part of a voice call or data session) can be conveyed to PS gateway node(s) 2418 for authorization/authentication and initiation of a data session, and to serving node(s) 2416 for communication thereafter. In addition to application server, server(s) 2414 can comprise utility server(s), a utility server can comprise a provisioning server, an operations and maintenance server, a security server that can implement at least in part a certificate authority and firewalls as well as other security mechanisms, and the like. In an aspect, security server(s) secure communication served through wireless network platform 2410 to ensure network's operation and data integrity in addition to authorization and authentication procedures that CS gateway node(s) 2412 and PS gateway node(s) 2418 can enact. Moreover, provisioning server(s) can provision services from external network(s) like networks operated by a disparate service provider; for instance, WAN 2450 or Global Positioning System (GPS) network(s) (not shown). Provisioning server(s) can also provision coverage through networks associated to wireless network platform 2410 (e.g., deployed and operated by the same service provider), such as the distributed antennas networks shown in FIG. 1(*s*) that enhance wireless service coverage by providing more network coverage. Repeater devices such as those shown in FIGS. 7, 8, and 9 also improve network coverage in order to enhance subscriber service experience by way of UE 2475.

It is to be noted that server(s) 2414 can comprise one or more processors configured to confer at least in part the functionality of macro network platform 2410. To that end, the one or more processor can execute code instructions stored in memory 2430, for example. It is should be appreciated that server(s) 2414 can comprise a content manager 2415, which operates in substantially the same manner as described hereinbefore.

In example embodiment 2400, memory 2430 can store information related to operation of wireless network platform 2410. Other operational information can comprise provisioning information of mobile devices served through wireless platform network 2410, subscriber databases; application intelligence, pricing schemes, e.g., promotional rates, flat-rate programs, couponing campaigns; technical specification(s) consistent with telecommunication protocols for operation of disparate radio, or wireless, technology layers; and so forth. Memory 2430 can also store information from at least one of telephony network(s) 2440, WAN 2450, enterprise network(s) 2460, or SS7 network 2470. In an aspect, memory 2430 can be, for example, accessed as part of a data store component or as a remotely connected memory store.

In order to provide a context for the various aspects of the disclosed subject matter, FIG. 24, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that the disclosed subject matter also can be implemented in combination with other program modules. Generally, program modules comprise routines, programs, components, data structures, etc. that perform particular tasks and/or implement particular abstract data types.

Figure 25:
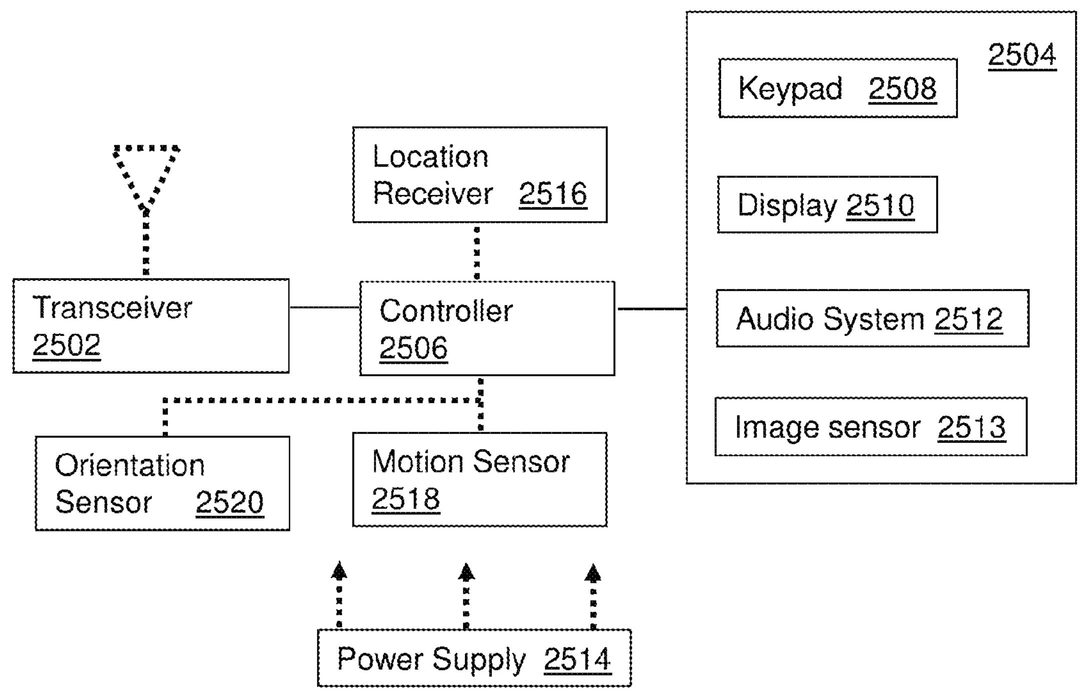
FIG. 25 is a block diagram of an example, non-limiting embodiment of a communication device in accordance with various aspects described herein.

FIG. 25 depicts an illustrative embodiment of a communication device 2500. The communication device 2500 can serve as an illustrative embodiment of devices such as mobile devices and in-building devices referred to by the subject disclosure (e.g., in FIGS. 1 and 14).

The communication device 2500 can comprise a wireline and/or wireless transceiver 2502 (herein transceiver 2502), a user interface (UI) 2504, a power supply 2514, a location receiver 2516, a motion sensor 2518, an orientation sensor 2520, and a controller 2506 for managing operations thereof. The transceiver 2502 can support short-range or long-range wireless access technologies such as Bluetooth®, ZigBee®, WiFi, DECT, or cellular communication technologies, just to mention a few (Bluetooth® and ZigBee® are trademarks registered by the Bluetooth® Special Interest Group and the ZigBee® Alliance, respectively). Cellular technologies can include, for example, CDMA-1×, UMTS/HSDPA, GSM/GPRS, TDMA/EDGE, EV/DO, WiMAX, SDR, LTE, as well as other next generation wireless communication technologies as they arise. The transceiver 2502 can also be adapted to support circuit-switched wireline access technologies (such as PSTN), packet-switched wireline access technologies (such as TCP/IP, VoIP, etc.), and combinations thereof.

The UI 2504 can include a depressible or touch-sensitive keypad 2508 with a navigation mechanism such as a roller ball, a joystick, a mouse, or a navigation disk for manipulating operations of the communication device 2500. The keypad 2508 can be an integral part of a housing assembly of the communication device 2500 or an independent device operably coupled thereto by a tethered wireline interface (such as a USB cable) or a wireless interface supporting for example Bluetooth®. The keypad 2508 can represent a numeric keypad commonly used by phones, and/or a QWERTY keypad with alphanumeric keys. The UI 2504 can further include a display 2510 such as monochrome or color LCD (Liquid Crystal Display), OLED (Organic Light Emitting Diode) or other suitable display technology for conveying images to an end user of the communication device 2500. In an embodiment where the display 2510 is touch-sensitive, a portion or all of the keypad 2508 can be presented by way of the display 2510 with navigation features.

The display 2510 can use touch screen technology to also serve as a user interface for detecting user input. As a touch screen display, the communication device 2500 can be adapted to present a user interface having graphical user interface (GUI) elements that can be selected by a user with a touch of a finger. The touch screen display 2510 can be equipped with capacitive, resistive or other forms of sensing technology to detect how much surface area of a user's finger has been placed on a portion of the touch screen display. This sensing information can be used to control the manipulation of the GUI elements or other functions of the user interface. The display 2510 can be an integral part of the housing assembly of the communication device 2500 or an independent device communicatively coupled thereto by a tethered wireline interface (such as a cable) or a wireless interface.

The UI 2504 can also include an audio system 2512 that utilizes audio technology for conveying low volume audio (such as audio heard in proximity of a human ear) and high volume audio (such as speakerphone for hands free operation). The audio system 2512 can further include a microphone for receiving audible signals of an end user. The audio system 2512 can also be used for voice recognition applications. The UI 2504 can further include an image sensor 2513 such as a charged coupled device (CCD) camera for capturing still or moving images.

The power supply 2514 can utilize common power management technologies such as replaceable and rechargeable batteries, supply regulation technologies, and/or charging system technologies for supplying energy to the components of the communication device 2500 to facilitate long-range or short-range portable communications. Alternatively, or in combination, the charging system can utilize external power sources such as DC power supplied over a physical interface such as a USB port or other suitable tethering technologies.

The location receiver 2516 can utilize location technology such as a global positioning system (GPS) receiver capable of assisted GPS for identifying a location of the communication device 2500 based on signals generated by a constellation of GPS satellites, which can be used for facilitating location services such as navigation. The motion sensor 2518 can utilize motion sensing technology such as an accelerometer, a gyroscope, or other suitable motion sensing technology to detect motion of the communication device 2500 in three-dimensional space. The orientation sensor 2520 can utilize orientation sensing technology such as a magnetometer to detect the orientation of the communication device 2500 (north, south, west, and east, as well as combined orientations in degrees, minutes, or other suitable orientation metrics).

The communication device 2500 can use the transceiver 2502 to also determine a proximity to a cellular, WiFi, Bluetooth®, or other wireless access points by sensing techniques such as utilizing a received signal strength indicator (RSSI) and/or signal time of arrival (TOA) or time of flight (TOF) measurements. The controller 2506 can utilize computing technologies such as a microprocessor, a digital signal processor (DSP), programmable gate arrays, application specific integrated circuits, and/or a video processor with associated storage memory such as Flash, ROM, RAM, SRAM, DRAM or other storage technologies for executing computer instructions, controlling, and processing data supplied by the aforementioned components of the communication device 2500.

Other components not shown in FIG. 25 can be used in one or more embodiments of the subject disclosure. For instance, the communication device 2500 can include a slot for adding or removing an identity module such as a Subscriber Identity Module (SIM) card or Universal Integrated Circuit Card (UICC). SIM or UICC cards can be used for identifying subscriber services, executing programs, storing subscriber data, and so on.

In the subject specification, terms such as "store," "storage," "data store," data storage," "database," and substantially any other information storage component relevant to operation and functionality of a component, refer to "memory components," or entities embodied in a "memory" or components comprising the memory. It will be appreciated that the memory components described herein can be either volatile memory or nonvolatile memory, or can comprise both volatile and nonvolatile memory, by way of illustration, and not limitation, volatile memory, non-volatile memory, disk storage, and memory storage. Further, nonvolatile memory can be included in read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

Moreover, it will be noted that the disclosed subject matter can be practiced with other computer system configurations, comprising single-processor or multiprocessor computer systems, mini-computing devices, mainframe computers, as well as personal computers, hand-held computing devices (e.g., PDA, phone, watch, tablet computers, netbook computers, etc.), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

Some of the embodiments described herein can also employ artificial intelligence (AI) to facilitate automating one or more features described herein. For example, artificial intelligence can be used to determine positions around a wire that dielectric waveguides 604 and 606 should be placed in order to maximize transfer efficiency. The embodiments (e.g., in connection with automatically identifying acquired cell sites that provide a maximum value/benefit after addition to an existing communication network) can employ various AI-based schemes for carrying out various embodiments thereof. Moreover, the classifier can be employed to determine a ranking or priority of the each cell site of the acquired network. A classifier is a function that maps an input attribute vector, x=(x1, x2, x3, x4, . . . , xn), to a confidence that the input belongs to a class, that is, f(x)=confidence(class). Such classification can employ a probabilistic and/or statistical-based analysis (e.g., factoring into the analysis utilities and costs) to prognose or infer an action that a user desires to be automatically performed. A support vector machine (SVM) is an example of a classifier that can be employed. The SVM operates by finding a hypersurface in the space of possible inputs, which the hypersurface attempts to split the triggering criteria from the non-triggering events. Intuitively, this makes the classification correct for testing data that is near, but not identical to training data. Other directed and undirected model classification approaches comprise, e.g., naïve Bayes, Bayesian networks, decision trees, neural networks, fuzzy logic models, and probabilistic classification models providing different patterns of independence can be employed. Classification as used herein also is inclusive of statistical regression that is utilized to develop models of priority.

As will be readily appreciated, one or more of the embodiments can employ classifiers that are explicitly trained (e.g., via a generic training data) as well as implicitly trained (e.g., via observing UE behavior, operator preferences, historical information, receiving extrinsic information). For example, SVMs can be configured via a learning or training phase within a classifier constructor and feature selection module. Thus, the classifier(s) can be used to automatically learn and perform a number of functions, including but not limited to determining according to a predetermined criteria which of the acquired cell sites will benefit a maximum number of subscribers and/or which of the acquired cell sites will add minimum value to the existing communication network coverage, etc.

As used in some contexts in this application, in some embodiments, the terms "component," "system" and the like are intended to refer to, or comprise, a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, computer-executable instructions, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components. While various components have been illustrated as separate components, it will be appreciated that multiple components can be implemented as a single component, or a single component can be implemented as multiple components, without departing from example embodiments.

Further, the various embodiments can be implemented as a method, apparatus or article of manufacture using standard programming and/or engineering techniques to produce software, firmware, hardware or any combination thereof to control a computer to implement the disclosed subject matter. The term "article of manufacture" as used herein is intended to encompass a computer program accessible from any computer-readable device or computer-readable storage/communications media. For example, computer readable storage media can include, but are not limited to, magnetic storage devices (e.g., hard disk, floppy disk, magnetic strips), optical disks (e.g., compact disk (CD), digital versatile disk (DVD)), smart cards, and flash memory devices (e.g., card, stick, key drive). Of course, those skilled in the art will recognize many modifications can be made to this configuration without departing from the scope or spirit of the various embodiments.

In addition, the words "example" and "exemplary" are used herein to mean serving as an instance or illustration. Any embodiment or design described herein as "example" or "exemplary" is not necessarily to be construed as preferred or advantageous over other embodiments or designs. Rather, use of the word example or exemplary is intended to present concepts in a concrete fashion. As used in this application, the term "or" is intended to mean an inclusive "or" rather than an exclusive "or". That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Moreover, terms such as "user equipment," "mobile station," "mobile," subscriber station," "access terminal," "terminal," "handset," "mobile device" (and/or terms representing similar terminology) can refer to a wireless device utilized by a subscriber or user of a wireless communication service to receive or convey data, control, voice, video, sound, gaming or substantially any data-stream or signaling-stream. The foregoing terms are utilized interchangeably herein and with reference to the related drawings.

Furthermore, the terms "user," "subscriber," "customer," "consumer" and the like are employed interchangeably throughout, unless context warrants particular distinctions among the terms. It should be appreciated that such terms can refer to human entities or automated components supported through artificial intelligence (e.g., a capacity to make inference based, at least, on complex mathematical formalisms), which can provide simulated vision, sound recognition and so forth.

As employed herein, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components or any combination thereof designed to perform the functions described herein. Processors can exploit nano-scale architectures such as, but not limited to, molecular and quantum-dot based transistors, switches and gates, in order to optimize space usage or enhance performance of user equipment. A processor can also be implemented as a combination of computing processing units.

As used herein, terms such as "data storage," data storage," "database," and substantially any other information storage component relevant to operation and functionality of a component, refer to "memory components," or entities embodied in a "memory" or components comprising the memory. It will be appreciated that the memory components or computer-readable storage media, described herein can be either volatile memory or nonvolatile memory or can include both volatile and nonvolatile memory.

What has been described above includes mere examples of various embodiments. It is, of course, not possible to describe every conceivable combination of components or methodologies for purposes of describing these examples, but one of ordinary skill in the art can recognize that many further combinations and permutations of the present embodiments are possible. Accordingly, the embodiments disclosed and/or claimed herein are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A method, comprising:

detecting, by a first waveguide system, an impairment that impedes a longitudinal propagation of electromagnetic waves on a surface of a transmission medium, wherein the electromagnetic waves propagate along the surface of the transmission medium without requiring and electrical return path, wherein the impairment that is detected corresponds to a physical discontinuity on the surface of the transmission medium, and wherein the physical discontinuity on the surface of the transmission medium impedes the longitudinal propagation of the electromagnetic waves on the surface of the transmission medium;

responsive to the detecting, adjusting, by the first waveguide system, a first communication mode to a second communication mode for transmitting the electromagnetic waves for propagation on the surface of the transmission medium; and transmitting, by the first waveguide system, the electromagnetic waves on the surface of the transmission medium according to the second communication mode, the electromagnetic waves directed to an antenna coupled to the transmission medium, the antenna facilitating a transmission of a wireless signal to an antenna system of a plurality of antenna systems of a distributed antenna system.

2. The method of claim 1, wherein the electromagnetic waves include a modulated signal in a frequency band of the electromagnetic waves, and wherein the physical discontinuity on the surface of the transmission medium comprises a physical object disposed on the surface of the transmission medium, a discontinuity in a physical path of the transmission medium, or a combination thereof.

3. The method of claim 2, wherein the transmitting further comprises frequency converting the modulated signal in a cellular frequency band to the modulated signal in the frequency band of the electromagnetic waves.

4. The method of claim 3, wherein the frequency converting comprises up-converting the modulated signal in the cellular frequency band to the modulated signal in the frequency band of the electromagnetic waves.

5. The method of claim 3, wherein the frequency converting comprises down-converting the modulated signal in the cellular frequency band to the modulated signal in the frequency band of the electromagnetic waves.

6. The method of claim 2, wherein the antenna system further facilitates frequency converting the modulated signal in the frequency band to the modulated signal in a cellular frequency band for wireless delivery to a mobile communication device.

7. The method of claim 6, wherein the frequency converting comprises down-converting the modulated signal in the frequency band to the modulated signal in the cellular frequency band.

8. The method of claim 6, wherein the frequency converting comprises up-converting the modulated signal in the frequency band to the modulated signal in the cellular frequency band.

9. The method of claim 1, wherein the adjusting of the first communication mode to the second communication mode comprises adjusting a wave propagation mode for transmitting the electromagnetic waves.

10. The method of claim 1, wherein the adjusting of the first communication mode to the second communication mode comprises adjusting a wavelength for transmitting the electromagnetic waves.

11. The method of claim 1, further comprising notifying, by the first waveguide system, a second waveguide system that the first communication mode has been adjusted to the second communication mode.

12. The method of claim 11, wherein the second waveguide system receives the electromagnetic waves from the first waveguide system according to the second communication mode.

13. The method of claim 1, further comprising:

detecting, by the first waveguide system, that the impairment has been modified; and restoring, by the first waveguide system, the first communication mode used by the first waveguide system for transmitting the electromagnetic waves.

14. A waveguide system, comprising:

a processing system including a processor; and a memory that stores executable instructions that, when executed by the processing system, facilitate performance of operations, comprising:

detecting an impairment that affects a propagation of electromagnetic waves on a surface of a transmission medium, wherein the electromagnetic waves propagate along the surface of the transmission medium without requiring and electrical return path, wherein the impairment that is detected corresponds to a physical discontinuity on the surface of the transmission medium, and wherein the physical discontinuity on the surface of the transmission medium impedes the propagation of the electromagnetic waves on the surface of the transmission medium;

responsive to the detecting, adjusting a first communication mode to a second communication mode for transmitting the electromagnetic waves for propagation on the surface of the transmission medium; and launching the electromagnetic waves on the surface of the transmission medium according to the second communication mode, the electromagnetic waves directed to an antenna coupled to the transmission medium to facilitate a transmission of a wireless signal.

15. The waveguide system of claim 14, wherein the wireless signal is directed to an antenna system of a plurality of antenna systems of a distributed antenna system.

16. The waveguide system of claim 14, wherein the electromagnetic waves include a modulated signal in a frequency band of the electromagnetic waves.

17. The waveguide system of claim 16, wherein the launching further comprises frequency converting the modulated signal in a cellular frequency band to the modulated signal in the frequency band of the electromagnetic waves.

18. A machine-readable device, comprising instructions, which when executed by a processor, cause the processor to perform operations comprising:

detecting a signal degradation in a longitudinal propagation of electromagnetic waves generated by a waveguide system on a surface of a transmission medium, wherein the electromagnetic waves propagate along the surface of the transmission medium without requiring and electrical return path, wherein the signal degradation that is detected corresponds to a physical discontinuity on the surface of the transmission medium, and wherein the physical discontinuity on the surface of the transmission medium impedes the longitudinal propagation of the electromagnetic waves on the surface of the transmission medium; and adjusting characteristics of the electromagnetic waves generated by the waveguide system to reduce adverse effects caused by the signal degradation, wherein the electromagnetic waves are directed to an antenna coupled to the transmission medium, the antenna facilitating a transmission of a wireless signal to an antenna system of a plurality of antenna systems of a distributed antenna system.

19. The machine-readable device of claim 18, wherein the electromagnetic waves include a modulated signal in a frequency band of the electromagnetic waves, and wherein the antenna system facilitates frequency converting the modulated signal in the frequency band of the electromagnetic waves to the modulated signal in a cellular frequency band for wireless delivery to a communication device.

20. A method, comprising:

detecting, by a first waveguide system, an impairment that affects a propagation of electromagnetic waves on a surface of a transmission medium;

responsive to the detecting, adjusting, by the first waveguide system, a first communication mode to a second communication mode for transmitting the electromagnetic waves for propagation on the surface of the transmission medium; and transmitting, by the first waveguide system, the electromagnetic waves on the surface of the transmission medium according to the second communication mode, the electromagnetic waves directed to an antenna coupled to the transmission medium, and the antenna facilitating a transmission of a wireless signal to an antenna system of a plurality of antenna systems of a distributed antenna system, wherein the electromagnetic waves include a modulated signal in a frequency band of the electromagnetic waves, wherein the transmitting further comprises frequency converting the modulated signal in a cellular frequency band to the modulated signal in the frequency band of the electromagnetic waves, and wherein the frequency converting comprises down-converting the modulated signal in the cellular frequency band to the modulated signal in the frequency band of the electromagnetic waves.

21. A method, comprising:

detecting, by a first waveguide system, an impairment that affects a propagation of electromagnetic waves on a surface of a transmission medium;

responsive to the detecting, adjusting, by the first waveguide system, a first communication mode to a second communication mode, wherein the adjusting of the first communication mode comprises rerouting the electromagnetic waves via an alternate transmission medium; and transmitting, by the first waveguide system, the electromagnetic waves along the alternate transmission medium according to the second communication mode, the electromagnetic waves directed to an antenna coupled to the alternate transmission medium, and the antenna facilitating a transmission of a wireless signal to an antenna system of a plurality of antenna systems of a distributed antenna system.

* * * * *